US010031419B2

(12) United States Patent
Takizawa et al.

(10) Patent No.: US 10,031,419 B2
(45) Date of Patent: Jul. 24, 2018

(54) PATTERN FORMING METHOD, COMPOSITION KIT AND RESIST FILM, MANUFACTURING METHOD OF ELECTRONIC DEVICE USING THESE, AND ELECTRONIC DEVICE

(71) Applicant: FUJIFILM Corporation, Tokyo (JP)

(72) Inventors: Hiroo Takizawa, Shizuoka (JP); Shuji Hirano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/921,524

(22) Filed: Oct. 23, 2015

(65) Prior Publication Data

US 2016/0048075 A1 Feb. 18, 2016

Related U.S. Application Data

(63) Continuation of application No. PCT/JP2014/060522, filed on Apr. 11, 2014.

(30) Foreign Application Priority Data

Apr. 26, 2013 (JP) ................................ 2013-094403

(51) Int. Cl.

| | |
|---|---|
| ***G03F 7/004*** | (2006.01) |
| ***G03F 7/11*** | (2006.01) |
| ***G03F 7/039*** | (2006.01) |
| ***C08F 220/28*** | (2006.01) |
| ***C08F 20/28*** | (2006.01) |
| ***G03F 7/20*** | (2006.01) |
| ***G03F 7/32*** | (2006.01) |

(52) U.S. Cl.

CPC .............. *G03F 7/039* (2013.01); *C08F 20/28* (2013.01); *C08F 220/28* (2013.01); *G03F 7/004* (2013.01); *G03F 7/0397* (2013.01); *G03F 7/11* (2013.01); *G03F 7/20* (2013.01); *G03F 7/2004* (2013.01); *G03F 7/2037* (2013.01); *G03F 7/32* (2013.01); *C08F 2220/283* (2013.01)

(58) Field of Classification Search

CPC .... G03F 7/2041; G03F 7/0397; G03F 7/2004; G03F 7/11

USPC .......... 430/270.1, 273.1, 326, 907, 942, 905

See application file for complete search history.

(56) References Cited

U.S. PATENT DOCUMENTS

| | | | | | |
|---|---|---|---|---|---|
| 8,241,832 | B2 * | 8/2012 | Wang | C09J 133/02 | 430/270.1 |
| 8,247,161 | B2 * | 8/2012 | Takeshita | C08F 220/18 | 430/270.1 |
| 8,530,598 | B2 * | 9/2013 | Takeshita | C08F 220/18 | 526/242 |
| 2006/0223008 | A1 * | 10/2006 | Yoshimura | G03F 7/091 | 430/311 |
| 2010/0255416 | A1 | 10/2010 | Kouno et al. | | |
| 2011/0236831 | A1 | 9/2011 | Hasegawa et al. | | |
| 2012/0156617 | A1 | 6/2012 | Kataoka et al. | | |
| 2012/0264053 | A1 * | 10/2012 | Wang | G03F 7/0046 | 430/273.1 |
| 2012/0328987 | A1 | 12/2012 | Hatakeyama et al. | | |
| 2013/0004740 | A1 * | 1/2013 | Kataoka | G03F 7/0045 | 428/195.1 |
| 2013/0078432 | A1 * | 3/2013 | Takahashi | B32B 3/10 | 428/195.1 |
| 2013/0209940 | A1 | 8/2013 | Sakamoto et al. | | |
| 2013/0216961 | A1 | 8/2013 | Kouno et al. | | |
| 2014/0212797 | A1 | 7/2014 | Kawabata et al. | | |
| 2014/0242518 | A1 | 8/2014 | Hatakeyama et al. | | |

FOREIGN PATENT DOCUMENTS

| | | | |
|---|---|---|---|
| JP | 2010-160283 | A | 7/2010 |
| JP | 2010-175859 | A | 8/2010 |
| JP | 2011-100105 | A | 5/2011 |
| JP | 2011-219742 | A | 11/2011 |
| JP | 2012-027453 | A | 2/2012 |
| JP | 2013-015596 | A | 1/2013 |
| JP | 2013-029823 | A | 2/2013 |
| WO | 2009/041270 | A1 | 4/2009 |
| WO | 2012/053302 | A1 | 4/2012 |
| WO | 2013/047895 | A1 | 4/2013 |

OTHER PUBLICATIONS

Search Report dated Jul. 8, 2014, issued by the International Searching Authority in counterpart International Application No. PCT/JP2014/060522 (PCT/ISA/210).

Written Opinion dated Jul. 8, 2014, issued by the International Searching Authority in counterpart International Application No. PCT/JP2014/060522 (PCT/ISA/237).

Translation of Written Opinion dated Jul. 8, 2014, issued by the International Searching Authority in counterpart International Application No. PCT/JP2014/060522 (PCT/ISA/237).

Office Action dated Oct. 25, 2016, issued by the Japanese Patent Office in counterpart Japanese Application No. 2013-094403.

Office Action dated Nov. 16, 2016 issued by the Korean Intellectual Property Office in counterpart Korean Patent Application No. 10-2015-7030825.

(Continued)

*Primary Examiner* — John S Chu

(74) *Attorney, Agent, or Firm* — Sughrue Mion, PLLC

(57) ABSTRACT

There is provided a pattern forming method comprising (i) forming a film on a substrate using an actinic ray-sensitive or radiation-sensitive resin composition which contains (A) a resin which decomposes due to an action of an acid to change its solubility with respect to a developer and (C) a specific resin, (ii) forming a top coat layer using a top coat composition which contains a resin (T) on the film, (iii) exposing the film which has the top coat layer to actinic rays or radiation, and (iv) forming a pattern by developing the film which has the top coat layer after the exposing.

18 Claims, No Drawings

(56) References Cited

OTHER PUBLICATIONS

Office Action dated Aug. 15, 2017 by the Korean Intellectual Property Office in counterpart Korean Patent Application No. 10-2015-7030825.
Office Action dated Jun. 12, 2017, by the Korean Intellectual Property Office in counterpart Korean Patent Application No. 10-2015-7030825.
Office Action dated Dec. 7, 2017, issued by the Korean Intellectual Property Office in corresponding Korean Application No. 10-2017-7026053.
Office Action issued by the Taiwan Intellectual Property Office dated Feb. 26, 2018 in counterpart Taiwan Patent Application No. 103114768.

* cited by examiner

PATTERN FORMING METHOD, COMPOSITION KIT AND RESIST FILM, MANUFACTURING METHOD OF ELECTRONIC DEVICE USING THESE, AND ELECTRONIC DEVICE

CROSS REFERENCE TO RELATED APPLICATION

This is a continuation of International Application No. PCT/JP2014/060522 filed on Apr. 11, 2014, and claims priority from Japanese Patent Application No. 2013-094403 filed on Apr. 26, 2013, the entire disclosures of which are incorporated herein by reference.

BACKGROUND OF THE INVENTION

1. Field of the Invention

The present invention relates to a pattern forming method, an actinic ray-sensitive or radiation-sensitive resin composition, a composition kit, and a resist film which are favorably used for an ultra micro-lithography process such as for manufacturing super LSI or large capacity microchips or for other photofabrication processes, and a manufacturing method of an electronic device using the above, and an electronic device. In more detail, the present invention relates to a pattern forming method, a composition kit, and a resist film which are able to be favorably used for the fine processing of semiconductor elements using electron beams or EUV light (wavelength in the vicinity of 13 nm), a manufacturing method of an electronic device using the above, and an electronic device.

2. Description of the Related Art

In the related art, in the process of manufacturing semiconductor devices such as IC or LSI, fine processing is performed by lithography using a photoresist composition. In recent years, as integrated circuits become more highly integrated, there is a demand for ultrafine pattern forming in the sub-micron region or quarter micron region. Along with this, also for the exposure wavelength, there is a tendency for the wavelength to be shortened, such as from a g-ray to an i-ray or even to KrF excimer laser light. Furthermore, currently, lithography using electron beams, X-rays, or EUV light other than excimer laser light is also being developed.

Electron beam, X-ray, or EUV light lithography is positioned as the pattern forming technique of the next generation or the following generation, and there is a demand for resist compositions with high sensitivity and high resolving power.

In particular, increasing sensitivity is an extremely important issue in order to shorten the wafer processing time; however, when pursuing increases in sensitivity, the pattern shape, the line edge roughness (LER), or the resolving power, which is represented by the limit resolution line width, decrease and there is a strong demand for the development of a resist composition which satisfies these characteristics at the same time.

High sensitivity has an inversely proportional relationship with high resolving power, LER, and pattern shape quality and how to satisfy these at the same time is important.

For example, JP2010-175859A discloses including a compound which is unevenly distributed on a film surface by film-forming in a resist composition from the viewpoint of achieving high sensitivity, high resolution, a favorable pattern shape, and favorable LER.

On the other hand, for example, JP2010-160283A discloses providing a top coat layer on a resist film from the viewpoint of preventing out gas generation for preventing exposure apparatus contamination.

Furthermore, in recent years, the need for forming fine patterns has rapidly increased and, due to this, there is a demand for further performance improvement with regard to high sensitivity, high resolving power, line width roughness (LWR), favorable pattern shape quality, and blob defect reduction in the forming of fine patterns with a line width of 50 nm or less. In particular, there is a demand for the further suppression of out gas generation for exposure apparatus contamination prevention.

SUMMARY OF THE INVENTION

An object of the present invention is to provide a pattern forming method which reduces blob defects and is particularly excellent in suppressing out gas generation without adversely affecting sensitivity, resolving power, LWR, or pattern shape in the forming of fine patterns with a line width of 50 nm or less, a composition kit, a resist film using the composition kit, a manufacturing method of an electronic device, and an electronic device.

That is, the present invention is as follows.

[1] A pattern forming method including (i) forming a film on a substrate using an actinic ray-sensitive or radiation-sensitive resin composition which contains (A) a resin which decomposes due to an action of an acid to change its solubility with respect to a developer and (C) a resin which has one or more groups selected from a group consisting of a fluorine atom, a group which has a fluorine atom, a group which has a silicon atom, an alkyl group, a cycloalkyl group, an aryl group, an aralkyl group, an aromatic ring group which is substituted with at least one alkyl group, and an aromatic ring group which is substituted with at least one cycloalkyl group, (ii) forming a top coat layer using a top coat composition which contains a resin (T) on the film, (iii) exposing the film which has the top coat layer using actinic rays or radiation, and (iv) forming a pattern by developing the film which has the top coat layer after the exposing.

[2] The pattern forming method according to [1] in which the resin (C) contains a repeating unit which has at least two or more groups which are represented by —COO— in a structure which is represented by General Formula (KA-1) or (KB-1) below, or at least one type of a repeating unit which is derived from a monomer which is represented by General Formula (aa1-1) below.

(KA-1)

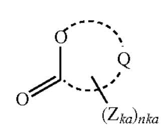

(KB-1)

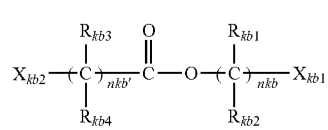

In General Formula (KA-1), $Z_{ka}$ represents an alkyl group, a cycloalkyl group, an ether group, a hydroxyl group, an amide group, an aryl group, a lactone group, or an electron-withdrawing group. When a plurality of $Z_{ka}$s are present, the plurality of $Z_{ka}$s may be the same or may be different and the $Z_{ka}$s may form a ring by linking with each other.

nka represents an integer of 0 to 10.

Q represents an atomic group which is necessary for forming a lactone ring with atoms in the formula.

In General Formula (KB-1), $X_{kb1}$ and $X_{kb2}$ each independently represent an electron-withdrawing group.

nkb and nkb' each independently represent 0 or 1.

$R_{kb1}$, $R_{kb2}$, $R_{kb3}$, and $R_{kb4}$ each independently represent a hydrogen atom, an alkyl group, a cycloalkyl group, an aryl group, or an electron-withdrawing group. At least two of $R_{kb1}$, $R_{kb2}$, and $X_{kb1}$ may form a ring by linking with each other and at least two of $R_{kb3}$, $R_{kb4}$, and $X_{kb2}$ may form a ring by linking with each other.

(aa1-1)

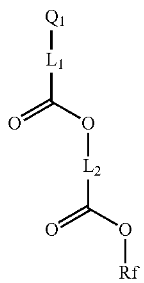

In General Formula (aa1-1) above, $Q_1$ represents an organic group which includes a polymeric group.

$L_1$ and $L_2$ each independently represent a single bond or a divalent linking group.

Rf represents an organic group which has a fluorine atom.

[3] The pattern forming method according to [2] in which the resin (C) contains a repeating unit which has at least two or more groups which are represented by —COO— in the structure which is represented by General Formula (KA-1) or (KB-1).

[4] The pattern forming method according to any one of [1] to [3] in which the resin (C) also has a repeating unit which has a group which changes its solubility with respect to a developer due to an effect of an acid.

[5] The pattern forming method according to [4] in which the repeating unit which has a group which changes its solubility with respect to a developer due to an effect of an acid is a repeating unit which is represented by any of General Formulas (Ca1) to (Ca4) below.

(Ca1)

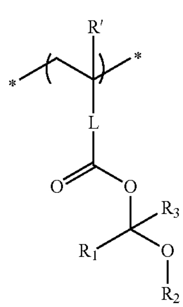

-continued (Ca2)

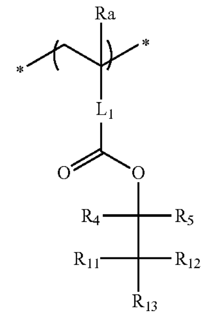

(Ca3)

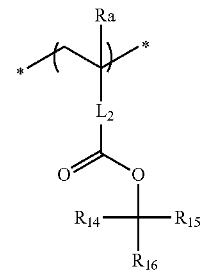

(Ca4)

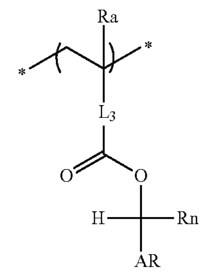

In General Formula (Ca1), R' represents a hydrogen atom or an alkyl group.

L represents a single bond or a divalent linking group.

$R_1$ represents a hydrogen atom or a monovalent substituent group.

$R_2$ represents a monovalent substituent group. $R_1$ and $R_2$ may bond with each other and form a ring with an oxygen atom in the formula.

$R_3$ represents a hydrogen atom, an alkyl group, or a cycloalkyl group.

In General Formula (Ca2), Ra represents a hydrogen atom, an alkyl group, a cyano group, or a halogen atom.

$L_1$ represents a single bond or a divalent linking group.

$R_4$ and $R_5$ each independently represent an alkyl group.

$R_{11}$ and $R_{12}$ each independently represent an alkyl group and $R_{13}$ represents a hydrogen atom or an alkyl group. $R_{11}$ and $R_{12}$ may form a ring by linking with each other and $R_{11}$ and $R_{13}$ may form a ring by linking with each other.

In General Formula (Ca3), Ra represents a hydrogen atom, an alkyl group, a cyano group, or a halogen atom.

$L_2$ represents a single bond or a divalent linking group.

$R_{14}$, $R_{15}$, and $R_{16}$ each independently represent an alkyl group. Two of $R_{14}$ to $R_{16}$ may form a ring by linking with each other.

In General Formula (Ca4), Ra represents a hydrogen atom, an alkyl group, a cyano group, or a halogen atom.

$L_3$ represents a single bond or a divalent linking group.

AR represents an aryl group. Rn represents an alkyl group, a cycloalkyl group, or an aryl group. Rn and AR may form a non-aromatic ring by bonding with each other.

[6] The pattern forming method according to any one of [1] to [5] in which the resin (C) has a repeating unit which is represented by any of General Formulas (C-Ia) to (C-Id) below.

(C-Ia)

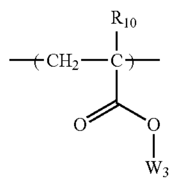

(C-Ib)

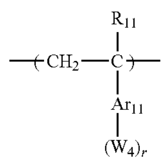

(C-Ic)

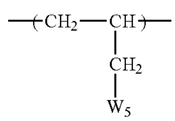

(C-Id)

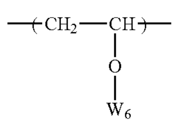

In the General Formula above, $R_{10}$ and $R_{11}$ each independently represent a hydrogen atom, a fluorine atom, or an alkyl group.

$W_3$, $W_5$, and $W_6$ each independently represent an organic group which has one or more selected from a group consisting of a group which has a fluorine atom, a group which has a silicon atom, an alkyl group, a cycloalkyl group, an aryl group, and an aralkyl group.

$W_4$ represents an organic group which has one or more selected from a group consisting of a group which has a fluorine atom, a group which has a silicon atom, an alkyl group, and a cycloalkyl group.

$Ar_{11}$ represents an (r+1)valent aromatic ring group.

r represents an integer of 1 to 10.

[7] The pattern forming method according to any one of [1] to [6] in which the content of the resin (C) is in a range of 0.01 mass % to 10 mass % based on the total solid content in the composition.

[8] The pattern forming method according to any one of [1] to [7] in which the resin (A) has a repeating unit which is represented by General Formula (1) below and a repeating unit which is represented by General Formula (3) or (4) below.

(1)

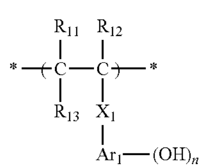

In General Formula (1), $R_{11}$, $R_{12}$, and $R_{13}$ each independently represent a hydrogen atom, an alkyl group, a cycloalkyl group, a halogen atom, a cyano group, or an alkoxycarbonyl group. $R_{13}$ may form a ring by bonding with $Ar_1$ and $R_{13}$ in this case represents an alkylene group.

$X_1$ represents a single bond or a divalent linking group.

$Ar_1$ represents an (n+1)valent aromatic ring group and represents an (n+2)valent aromatic ring group in a case of forming a ring by bonding with $R_{13}$.

n represents an integer of 1 to 4.

(3)

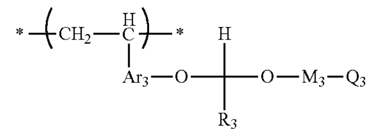

In General Formula (3), $Ar_3$ represents an aromatic ring group.

$R_3$ represents an alkyl group, a cycloalkyl group, an aryl group, an aralkyl group, an alkoxy group, an acyl group, or a hetero ring group.

$M_3$ represents a single bond or a divalent linking group.

$Q_3$ represents an alkyl group, a cycloalkyl group, an aryl group, or a hetero ring group.

At least two of $Q_3$, $M_3$, and $R_3$ may form a ring by bonding with each other.

(4)

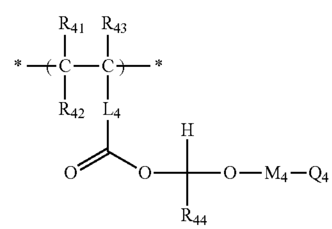

In General Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may form a ring by bonding with $L_4$ and $R_{42}$ in this case represents an alkylene group.

$L_4$ represents a single bond or a divalent linking group and represents a trivalent linking group when forming a ring with $R_{42}$.

$R_{44}$ represents an alkyl group, a cycloalkyl group, an aryl group, an aralkyl group, an alkoxy group, an acyl group, or a hetero ring group.

$M_4$ represents a single bond or a divalent linking group.

$Q_4$ represents an alkyl group, a cycloalkyl group, an aryl group, or a hetero ring group.

At least two of $Q_4$, $M_4$, and $R_{44}$ may form a ring by bonding with each other.

[9] The pattern forming method according to [8] in which the resin (A) has a repeating unit which is represented by General Formula (1) and a repeating unit which is represented by General Formula (3), and $R_3$ in General Formula (3) is a group with 2 or more carbon atoms.

[10] The pattern forming method according to [9] in which the resin (A) has a repeating unit which is represented by General Formula (1) and a repeating unit which is represented by General Formula (3), and $R_3$ in General Formula (3) is a group which is represented by General Formula (3-2) below.

(3-2)

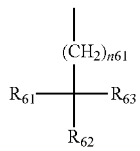

In General Formula (3-2) above, $R_{61}$, $R_{62}$, and $R_{63}$ each independently represent an alkyl group, an alkenyl group, a cycloalkyl group, or an aryl group. n61 represents 0 or 1.

At least two of $R_{61}$ to $R_{63}$ may form a ring by linking with each other.

[11] The pattern forming method according to any one of [1] to [10] in which the resin (T) has a repeating unit which has an aromatic ring.

[12] The pattern forming method according to any one of [1] to [11] in which the resin (T) has a repeating unit which has an acidic group.

[13] The pattern forming method according to any one of [1] to [12] in which the actinic ray-sensitive or radiation-sensitive resin composition further contains a compound (B) which generates an acid by actinic rays or radiation, and the compound (B) is a compound which generates an acid with a size of 240 $Å^3$ or more.

[14] The pattern forming method according to any one of [1] to [13] in which the exposing is performed using electron beams or EUV.

[15] The pattern forming method according to any one of [1] to [14] in which an optical image resulting from the exposing has a line section with a line width of 50 nm or less or a hole section with a hole diameter of 50 nm or less as an exposed section or an unexposed section.

[16] A composition kit which includes a top coat composition and an actinic ray-sensitive or radiation-sensitive resin composition which are used for the pattern forming method according to any one of [1] to [15].

[17] A resist film which is formed using the composition kit according to [16].

[18] A manufacturing method of an electronic device which includes the pattern forming method according to any one of [1] to [15].

[19] An electronic device which is manufactured using the manufacturing method of an electronic device according to [18].

The present invention preferably also has the configuration described below.

[20] A pattern forming method according to any one of [1] to [15] in which one or more groups selected from a group consisting of a fluorine atom, a group which has a fluorine atom, a group which has a silicon atom, an alkyl group, a cycloalkyl group, an aryl group, an aralkyl group, an aromatic ring group which is substituted with at least one alkyl group, and an aromatic ring group which is substituted with at least one cycloalkyl group in the resin (C) are one or more groups selected from a group consisting of a fluorine atom, a group which has a fluorine group, a group which has a silicon atom, an alkyl group with 6 or more carbon atoms, a cycloalkyl group with 5 or more carbon atoms, an aryl group with 6 or more carbon atoms, an aralkyl group with 7 or more carbon atoms, an aromatic ring group which is substituted with at least one alkyl group with 3 or more carbon atoms, and an aromatic ring group which is substituted with at least one cycloalkyl group with 5 or more carbon atoms.

[21] The pattern forming method according to any one of [1] to [15] and [20] in which the resin (T) also has a repeating unit (d) which has a plurality of aromatic rings which are represented by General Formula (d1) below.

(d1)

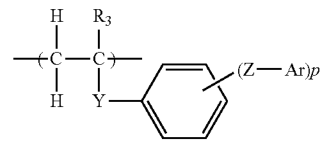

In General Formula (d1), $R_3$ represents a hydrogen atom, an alkyl group, a halogen atom, a cyano group, or a nitro group, Y represents a single bond or a divalent linking group, Z represents a single bond or a divalent linking group, Ar represents an aromatic ring group, and p represents an integer of 1 or more.

According to the present invention, it is possible to provide a pattern forming method which reduces blob defects and is particularly excellent in suppressing out gas generation without adversely affecting sensitivity, resolving power, LWR, or pattern shape in the forming of fine patterns with a line width of 50 nm or less, a composition kit, a resist film using the composition kit, a manufacturing method of an electronic device, and an electronic device.

DESCRIPTION OF THE PREFERRED EMBODIMENTS

In the notation of the groups (atomic groups) in the present specification, notation which does not indicate being substituted or unsubstituted encompasses having a substituent group as well as not having a substituent group. For example, an "alkyl group" encompasses not only an alkyl group which does not have a substituent group (an unsubstituted alkyl group), but also an alkyl group which has a substituent group (a substituted alkyl group).

"Actinic rays" or "radiation" in the present specification has the meaning of, for example, a bright line spectrum of a mercury lamp, far ultraviolet rays which are represented by an excimer laser, extreme ultraviolet rays (EUV light), X-rays, electron beams (EB), and the like. In addition, light in the present invention has the meaning of actinic rays or radiation.

In addition, "exposure" in the present specification includes not only exposure by a mercury lamp, far ultraviolet rays which are represented by an excimer laser, extreme ultraviolet rays, X-rays, EUV light, and the like, but also drawing by particle beams such as electron beams and ion beams unless otherwise stated.

<Pattern Forming Method>

The pattern forming method of the present invention includes (i) a step of forming a film on a substrate using an actinic ray-sensitive or radiation-sensitive resin composition which contains (A) a resin which decomposes due to an action of an acid to change its solubility with respect to a developer and (C) a resin which has one or more groups selected from a group consisting of a fluorine atom, a group which has a fluorine atom, a group which has a silicon atom, an alkyl group, a cycloalkyl group, an aryl group, an aralkyl group, an aromatic ring group which is substituted with at least one alkyl group, and an aromatic ring group which is substituted with at least one cycloalkyl group, (ii) a step of forming a top coat layer using a top coat composition which contains a resin (T) on the film, (iii) a step of exposing the film which has the top coat layer using actinic rays or radiation, and (iv) a step of forming a pattern by developing the film which has the top coat layer after the exposing.

The reason why the pattern forming method of the present invention reduces blob defects and is particularly excellent in suppressing out gas generation without adversely affecting sensitivity, resolving power, LWR, or pattern shape in the forming of fine patterns with a line width of 50 nm or less is not clear but is assumed to be as follows.

It is assumed that out gas generation is further suppressed not only by the top coat layer covering the resist film, but also by the resin (C) being unevenly distributed in the resist film front layer section in the resist film.

In addition, it is considered that the resist film surface is probably made to be hydrophilic by the top coat layer covering the resist film front layer section where the resin (C) is unevenly distributed compared to a case where the top coat layer is not provided and it is assumed that blob defects are reduced.

In particular, when the resin (C) has a specific repeating unit (for example, a repeating unit which has at least two or more groups which are represented by —COO— in a structure which is represented by General Formula (KA-1) or (KB-1) or at least one type of a repeating unit which is derived from a monomer which is represented by General Formula (aa1-1)), it is assumed that both the reduction in out gas generation and reduction in blob defects are more effectively achieved in the forming of fine patterns with a line width of 50 nm or less.

The resist film is formed from an actinic ray-sensitive or radiation-sensitive resin composition which will be described below and more specifically, is preferably formed on a substrate.

The method for coating the actinic ray-sensitive or radiation-sensitive resin composition on the substrate is preferably spin coating and the rotation speed is preferably 1000 rpm to 3000 rpm.

For example, the actinic ray-sensitive or radiation-sensitive resin composition is coated on a substrate which is used for manufacturing precisely integrated circuit elements (example: silicon/silicon dioxide coating) using an appropriate coating method with a spinner, a coater, or the like and dried to form the resist film. Here, it is also possible to coat an antireflection film which is known in the art thereon in advance. In addition, the resist film is preferably dried before forming the top coat layer.

Subsequently, it is possible to coat a top coat composition, carry out drying as necessary, and form a top coat layer on the obtained resist film by the same means as the method for forming the resist film described above.

The film thickness of the resist film is preferably 10 nm to 200 nm from the viewpoint of improving resolving power and more preferably 10 nm to 100 nm.

It is possible to set such a film thickness by setting the solid content concentration in the composition to be in an appropriate range so as to have an appropriate viscosity and by improving the coating property and film-forming property.

The film thickness of the top coat layer is preferably 10 nm to 200 nm, more preferably 20 nm to 100 nm, and particularly preferably 30 nm to 80 nm.

Developing is carried out by irradiating a resist film which has a top coat layer on an upper layer with electron beams (EB), X-rays, or EUV light through a mask as necessary and preferably performing baking (heating). Due to this, it is possible to obtain a favorable pattern.

The substrate on which a film is formed in the present invention is not particularly limited and it is possible to use inorganic substrates such as silicon, SiN, and $SiO_2$ and coating type inorganic substrates such as SOG, substrates which are generally used in steps of manufacturing semiconductors such as IC, steps of manufacturing circuit boards of liquid crystal, thermal heads, or the like, and moreover, other photofabrication lithography steps. Furthermore, an organic antireflection film may be formed between the film and the substrate as necessary.

An antireflection film may be coated on the substrate in advance before forming the resist film.

It is possible to use either of an inorganic film type such as titanium, titanium dioxide, titanium nitride, chromium oxide, carbon, and amorphous silicon, or an organic film type formed of a light absorbing agent and polymer material as the antireflection film. In addition, it is also possible to use commercially available organic antireflection films such as DUV 30 series or DUV-40 series manufactured by Brewer Science Inc. and AR-2, AR-3, and AR-5 manufactured by Shipley Japan Ltd., as the organic antireflection film.

The pattern forming method of the present invention preferably includes (v) a step of heating after (iii) the step of exposing.

It is also preferable to include a prebaking (PB) step after the film-forming and before the exposing step. In addition, it is also preferable to include a heating step after the exposing (PEB; Post Exposure Bake) after the exposing step and before the developing step.

The heating is preferably performed at a temperature of 70° C. to 120° C. in both the PB and PEB and more preferably performed at 80° C. to 110° C.

The heating time is preferably 30 seconds to 300 seconds, more preferably 30 seconds to 180 seconds, and even more preferably 30 seconds to 90 seconds.

It is possible for the heating to be performed by means which is provided in an ordinary exposure and developing machine and the heating may be performed using a hot plate and the like.

The reaction in the exposed section is promoted by baking and the sensitivity or pattern profile is improved.

In addition, it is also preferable to include the heating step (Post Bake) after a rinsing step. Developer and rinsing liquid which remain between patterns and in the pattern are removed by baking.

In the pattern forming method of the present invention, the optical image according to the exposure in the step (iii) is an optical image which has a line section with a line width of 50 nm or less or a hole section with a hole diameter of 50 nm or less as an exposed section or an unexposed section, which is favorable for forming a fine pattern. In particular, it is also possible to form a fine pattern with a line width of 40 nm or less by using extreme ultraviolet rays (EUV light) or electron beams (EB) and it is preferable to form a fine pattern with a line width of 30 nm or less and it is more preferable to form a fine pattern with a line width of 20 nm or less.

Examples of actinic rays or radiation which may be used for the exposure in the step (iii) include a KrF excimer laser, an ArF excimer laser, electron beams, X-rays, and extreme ultraviolet rays (EUV light). Exposure using electron beams, X-rays, or EUV light is preferable and exposure using EUV light or electron beams is more preferable from the view point of forming a fine pattern in particular.

In a case where extreme ultraviolet rays (EUV light) are the exposure source, it is preferable to irradiate the formed film with the EUV light (in the vicinity of 13 nm) through a predetermined mask. In the irradiation of electron beams (EB), drawing (direct drawing) which is not through a mask being interposed is preferable. Extreme ultraviolet rays are preferably used for the exposure.

In addition, the exposure in step (iii) described above may be liquid immersion exposure.

The developer in step (iv) described above may be an alkaline developing solution or may be a developer which includes an organic solvent, but is preferably an alkaline developing solution.

In the pattern forming method of the present invention, a step in which developing is carried out using a developer which includes an organic solvent (an organic solvent developing step) and a step in which developing is performed using an alkaline aqueous solution (an alkali developing step) may be used in combination. Due to this, it is possible to form finer patterns.

In the present invention, a portion where the exposure strength is weak is removed by the organic solvent developing step; however, a portion where the exposure strength is strong is also removed by further performing the alkali developing step. Since it is possible to perform the pattern forming without dissolving only a region where the exposure strength is intermediate by a multiple development process which performs developing a plurality of times in this manner, it is possible to form finer patterns than usual (the same mechanism as in of JP2008-292975A).

In the pattern forming method of the present invention, the order of the alkali developing step and the organic solvent developing step is not particularly limited; however, the alkali developing is more preferably performed before the organic solvent developing step.

In a case where the pattern forming method of the present invention has a step in which developing is carried out using an alkaline developing solution, it is possible to use, an alkaline aqueous solution of, for example, inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethyl ammonium hydroxide and tetraethyl ammonium hydroxide, cyclic amines such as pyrrole and piperidine, and the like as the alkaline developing solution.

Furthermore, it is also possible to use the alkaline aqueous solution described above by adding an appropriate amount of alcohols and a surfactant thereto.

The alkali concentration of the alkaline developing solution is generally 0.1 mass % to 20 mass %.

The pH of the alkaline developing solution is generally 10.0 to 15.0.

In particular, an aqueous solution of 2.38 mass % of tetramethyl ammonium hydroxide is desirable.

Pure water is used as a rinsing liquid in a rinsing process which is performed after the alkali developing and it is also possible to use the pure water by adding an appropriate amount of a surfactant thereto.

In addition, it is possible to perform a process of removing a developer or a rinsing liquid which is attached on a pattern using a supercritical fluid after the developing process or the rinsing process.

In a case where the pattern forming method of the present invention includes a step of carrying out developing using a developer which contains an organic solvent, it is possible to use a polar solvent such as a ketone-based solvent, an ester-based solvent, an alcohol-based solvent, an amide-based solvent, and an ether-based solvent and a hydrocarbon-based solvent as the developer (also referred to below as an organic-based developer) in this developing step.

Examples of the ketone-based solvents include 1-octanone, 2-octanone, 1-nonanone, 2-nonanone, acetone, 2-heptanone(methylamyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate, and the like.

Examples of the ester-based solvents include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, and the like.

Examples of the alcohol-based solvents include alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol, and the like.

Examples of the ether-based solvents include dioxane, tetrahydrofuran, and the like other than the glycol ether-based solvents described above.

It is possible to use, for example, N-methyl-2-pyrrolidone, N,N-dimethyl acetamide, N,N-dimethyl formamide, hexamethylphosphoric triamide, 1,3-dimethyl-2-imidazolidinone, and the like as the amide-based solvent.

Examples of the hydrocarbon-based solvents include aromatic hydrocarbon-based solvents such as toluene and xylene and aliphatic hydrocarbon-based solvents such as pentane, hexane, octane, and decane.

A plurality of the solvents described above may be mixed or the solvents may be used in a mixture with solvents other than the described above or water. However, in order to sufficiently exhibit the effects of the present invention, the water content for the entire developer is preferably less than 10 mass % and water is more preferably substantially not contained.

That is, the usage amount of the organic solvent with respect to the organic-based developer is preferably 90 mass % to 100 mass % with respect to the total amount of the developer and more preferably 95 mass % to 100 mass %.

In particular, the organic-based developer is preferably a developer which contains at least one type of an organic solvent selected from a group consisting of a ketone-based solvent, an ester-based solvent, an alcohol-based solvent, an amide-based solvent, and an ether-based solvent.

In addition, the organic-based developer may contain an appropriate amount of basic compounds as necessary. Examples of the basic compounds include the basic compounds which will be described below in [6] Basic Compounds.

As the developing method, it is possible to apply, for example, a method in which a substrate is dipped in a tank which is filled with a developer for a certain time (a dipping method), a method in which developing is carried out by raising the developer onto the substrate surface by surface tension and leaving the developer to stand for a certain time (a paddle method), a method in which the developer is sprayed onto the substrate surface (a spraying method), a method in which the developer is continuously ejected while scanning a developer ejecting nozzle on the substrate, which is rotating at a certain speed, at a certain speed (a dynamic dispensing method), and the like.

Actinic Ray-Sensitive or Radiation-Sensitive Resin Composition

In the pattern forming method of the present invention, the actinic ray-sensitive or radiation-sensitive resin composition contains (A) a resin which decomposes due to an action of an acid to change its solubility with respect to a developer and (C) a resin which has one or more groups selected from a group consisting of a fluorine atom, a group which has a fluorine atom, a group which has a silicon atom, an alkyl group, a cycloalkyl group, an aryl group, an aralkyl group, an aromatic ring group which is substituted with at least one alkyl group, and an aromatic ring group which is substituted with at least one cycloalkyl group.

The actinic ray-sensitive or radiation-sensitive resin composition preferably further contains (B) a compound which generates an acid when irradiated with actinic rays or radiation which will be described below.

The actinic ray-sensitive or radiation-sensitive resin composition is typically a resist composition and is also able to be used for negative type developing (developing where, when exposed, the solubility with respect to a developer decreases, an exposed section remains as a pattern, and an unexposed section is removed); however, a positive type resist composition is preferable particularly from the point that it is possible to obtain high-level effects. In addition, the composition according to the present invention is typically a chemical amplification-type resist composition.

The actinic ray-sensitive or radiation-sensitive resin composition according to the present invention is also able to be an actinic ray-sensitive or radiation-sensitive resin composition which is used for developing which uses a developer which includes an organic solvent, but is preferably an actinic ray-sensitive or radiation-sensitive resin composition which is used for developing which uses an alkaline developing solution.

[1] Resin (A) of which a Solubility with Respect to a Developer Changes Due to being Decomposed by an Effect of an Acid The actinic ray-sensitive or radiation-sensitive resin composition contains a resin (A) of which the solubility with respect to a developer changes due to being decomposed by an effect of an acid (also referred to below as a "resin (A)").

The resin (A) is more preferably a resin (A) which has a group (also referred to below as an "acid-decomposable group") which decomposes due to an effect of an acid and generates a polar group in the main chain or a side chain of the resin or both the main chain and side chain. The resin (A) more preferably has a repeating unit which has an acid-decomposable group.

In addition, the definition of a polar group is the same as the definition described for a repeating unit (c) which will be described below; however, examples of polar groups which are generated by an acid-decomposable group decomposing include an alkali-soluble group, an amino group, an acidic group, and the like, and an alkali-soluble group is preferable.

The alkali-soluble group is not particularly limited as long as the group is soluble in an alkaline developing solution; however, preferable examples thereof include a phenolic hydroxyl group, a carbonic acidic group, a sulfonic acidic group, a fluorinated alcohol group, a sulfonamide group, a sulfonylimide group, an (alkyl sulfonyl) (alkyl carbonyl) methylene group, an (alkyl sulfonyl) (alkyl carbonyl)imide group, a bis(alkyl carbonyl)methylene group, a bis(alkyl carbonyl)imide group, a bis(alkyl sulfonyl)methylene group, a bis(alkyl sulfonyl)imide group, a tris(alkyl carbonyl)methylene group, and a tris(alkyl sulfonyl)methylene group, and more preferable examples thereof include an acidic group (a group which dissociates in a 2.38 mass % tetramethyl ammonium hydroxide aqueous solution which is used as a developer for resists in the related art) such as a carbonic acidic group, a fluorinated alcohol group (preferably hexafluoroisopropanol), a phenolic hydroxyl group, and a sulfonic acidic group.

A preferable group as an acid-decomposable group is a group in which hydrogen atoms thereof are substituted with groups which are desorbed by acid.

Examples of the group which desorbs by an acid include $-C(R_{36})(R_{37})(R_{38})$, $-C(R_{36})(R_{37})(OR_{39})$, $-C(R_{01})(R_{02})(OR_{39})$, and the like.

In the formulas, $R_{36}$ to $R_{39}$ each independently represent an alkyl group, a cycloalkyl group, an aryl group, a group in which an alkylene group and an aryl group are combined, or an alkenyl group. $R_{36}$ and $R_{37}$ may form a ring by bonding with each other.

$R_{01}$ and $R_{02}$ each independently represent a hydrogen atom, an alkyl group, a cycloalkyl group, an aryl group, a group in which an alkylene group and an aryl group are combined, or an alkenyl group.

The acid-decomposable group is preferably a cumyl ester group, an enol ester group, an acetal ester group, a tertiary alkyl ester group, and the like.

(a) Repeating Unit which has an Acid-Decomposable Group

In addition, the resin (A) preferably includes a repeating unit which is represented by General Formula (VI) below as a repeating unit (a) which has an acid-decomposable group.

(VI)

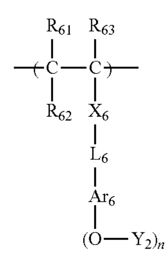

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. However, $R_{62}$ may form a ring by bonding with $Ar_6$ and $R_{62}$ in this case represents a single bond or an alkylene group.

$X_6$ represents a single bond, —COO—, or $-CONR_{64}-$. $R_{64}$ represents a hydrogen atom or an alkyl group.

$L_6$ represents a single bond or an alkylene group.

$Ar_6$ represents an (n+1)valent aromatic ring group and represents an (n+2)valent aromatic ring group in a case of forming a ring by bonding with $R_{62}$.

In a case where n≥2, $Y_2$s each independently represent hydrogen atoms or groups which are desorbed due to an effect of an acid. However, at least one $Y_2$ represents a group which is desorbed due to an effect of an acid.

n represents an integer of 1 to 4.

Description will be given of General Formula (VI) in more detail.

Preferable examples of the alkyl groups of $R_{61}$ to $R_{63}$ in General Formula (VI) include an alkyl group with 20 or less carbon atoms such as a methyl group, an ethyl group, a propyl group, an isopropyl group, an n-butyl group, a sec-butyl group, a hexyl group, a 2-ethylhexyl group, an octyl group, and a dodecyl group which may have a substituent group, more preferable examples thereof include an alkyl group with 8 or less carbon atoms, and particularly preferable examples thereof include an alkyl group with 3 or less carbon atoms.

An alkyl group which is included in an alkoxycarbonyl group is preferably the same as the alkyl group in $R_{61}$ to $R_{63}$ described above.

The cycloalkyl group may be a monocyclic type or a polycyclic type. Preferable examples thereof include monocyclic type cycloalkyl groups with 3 to 10 carbon atoms such as a cyclopropyl group, a cyclopentyl group, and a cyclohexyl group which may have a substituent group.

Examples of the halogen atom include a fluorine atom, a chlorine atom, a bromine atom, and an iodine atom, and a fluorine atom is particularly preferable.

Examples of preferable substituent groups in each of the groups described above include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, and the like and the number of carbon atoms of the substituent group is preferably 8 or less.

In a case where $R_{62}$ represents an alkylene group, preferable examples of the alkylene group include an alkylene group with 1 to 8 carbon atoms such as a methylene group, an ethylene group, a propylene group, a butylene group, a hexylene group, and an octylene group which may have a substituent group.

$R_{61}$ and $R_{63}$ in Formula (VI) are more preferably a hydrogen atom, an alkyl group, and a halogen atom, and particularly preferably a hydrogen atom, a methyl group, an ethyl group, a trifluoromethyl group (—$CF_3$), a hydroxy methyl group (—$CH_2$—OH), a chloromethyl group (—$CH_2$—Cl), or a fluorine atom (—F). $R_{62}$ is more preferably a hydrogen atom, an alkyl group, a halogen atom, or an alkylene group (which forms a ring with $L_5$), and particularly preferably a hydrogen atom, a methyl group, an ethyl group, a trifluoromethyl group (—$CF_3$), a hydroxy methyl group (—$CH_2$—OH), a chloromethyl group (—$CH_2$—Cl), a fluorine atom (—F), a methylene group (which forms a ring with $Ar_6$), or an ethylene group (which forms a ring with $Ar_6$).

Examples of an alkyl group of $R_{64}$ in —$CONR_{64}$— ($R_{64}$ represents a hydrogen atom or an alkyl group) which is represented by $X_6$ include the same examples as the alkyl groups of $R_{61}$ to $R_{63}$.

$X_6$ is preferably a single bond, —COO—, or —CONH—, and more preferably a single bond or —COO—.

Preferable examples of an alkylene group in $L_6$ include an alkylene group with 1 to 8 carbon atoms such as a methylene group, an ethylene group, a propylene group, a butylene group, a hexylene group, and an octylene group which may have a substituent group. A ring which is formed by $R_{62}$ and $L_6$ by bonding with each other is particularly preferably a ring with 5 or 6 members.

$Ar_6$ represents an (n+1)valent aromatic ring group. A divalent aromatic ring group in a case where n is 1 may have a substituent group and preferable examples thereof include an arylene group with 6 to 18 carbon atoms such as a phenylene group, a tolylene group, and a naphthylene group or a divalent aromatic ring which includes a hetero ring of thiophene, furan, pyrrole, benzothiophene, benzofuran, benzopyrrole, triazine, imidazole, benzimidazole, triazole, thiadiazole, thiazole, and the like.

Specific examples of an (n+1)valent aromatic ring group in a case where n is an integer of 2 or more favorably include a group formed by removing (n−1) arbitrary hydrogen atoms from the specific examples of the divalent aromatic ring group described above.

The (n+1)valent aromatic ring group may further have a substituent group.

Examples of the substituent group which the alkyl group, the cycloalkyl group, the alkoxycarbonyl group, the alkylene group, and the (n+1)valent aromatic ring group described above may have include the same specific examples as the substituent groups which each of the groups which are represented by $R_{61}$ to $R_{63}$ in General Formula (VI) above may have.

n is preferably 1 or 2 and more preferably 1.

n of $Y_2$ each independently represents a hydrogen atom or a group which is desorbed due to an effect of an acid. However, at least one of n $Y_2$s represents a group which is desorbed due to an effect of an acid.

Examples of a group $Y_2$ which is desorbed due to an effect of an acid include —C($R_{36}$)($R_{37}$)($R_{38}$), —C(=O)—O—C($R_{36}$)($R_{37}$)($R_{38}$), —C($R_{01}$)($R_{02}$)($OR_{39}$), —C($R_{01}$)($R_{02}$)—C(=O)—O—C($R_{36}$)($R_{37}$)($R_{38}$), —CH($R_{36}$)(Ar), and the like.

In the formulas, $R_{36}$ to $R_{39}$ each independently represent an alkyl group, a cycloalkyl group, an aryl group, a group in which an alkylene group and an aryl group are combined, or an alkenyl group. $R_{36}$ and $R_{37}$ may form a ring by bonding with each other.

$R_{01}$ to $R_{02}$ each independently represent a hydrogen atom, an alkyl group, a cycloalkyl group, an aryl group, a group in which an alkylene group and an aryl group are combined, or an alkenyl group.

Ar represents an aryl group.

The alkyl group of $R_{36}$ to $R_{39}$, $R_{01}$, and $R_{02}$ may have a straight-chain form or a branched form and is preferably an alkyl group with 1 to 8 carbon atoms and examples thereof include a methyl group, an ethyl group, a propyl group, an n-butyl group, a sec-butyl group, a hexyl group, an octyl group, and the like.

The cycloalkyl group of $R_{36}$ to $R_{39}$, $R_{01}$, and $R_{02}$ may be a monocyclic type or a polycyclic type. A monocyclic type is preferably a cycloalkyl group with 3 to 10 carbon atoms and examples thereof include a cyclopropyl group, a cyclobutyl group, a cyclopentyl group, a cyclohexyl group, a cyclooctyl group, and the like. A polycyclic type is preferably a cycloalkyl group with 6 to 20 carbon atoms and examples thereof include an adamantyl group, a norbornyl group, an isobornyl group, a canphanyl group, a dicyclopentyl group, an α-pinel group, a tricyclodecanyl group, a tetracyclododecyl group, an androstanyl group, and the like. Here, some of the carbon atoms in the cycloalkyl group may be substituted with hetero atoms such as oxygen atoms.

An aryl group of $R_{36}$ to $R_{39}$, $R_{01}$, $R_{02}$, and Ar is preferably an aryl group with 6 to 10 carbon atoms and examples thereof include an aryl group such as a phenyl group, a naphthyl group, and an anthryl group, and a divalent aromatic ring group which includes a hetero ring of thiophene, furan, pyrrole, benzothiophene, benzofuran, benzopyrrole, triazine, imidazole, benzimidazole, triazole, thiadiazole, thiazole or the like.

A group in which the alkylene group and the aryl group of $R_{36}$ to $R_{39}$, $R_{01}$, and $R_{02}$ are combined is preferably an aralkyl group with 7 to 12 carbon atoms and examples thereof include a benzyl group, a phenethyl group, a naphthylmethyl group, and the like.

An alkenyl group of $R_{36}$ to $R_{39}$, $R_{01}$, and $R_{02}$ is preferably an alkenyl group with 2 to 8 carbon atoms and examples thereof include a vinyl group, an aryl group, a butenyl group, a cyclohexenyl group, and the like.

A ring which is formed by $R_{36}$ and $R_{37}$ bonding with each other may be a monocyclic type or a polycyclic type. The monocyclic type is preferably a cycloalkyl structure with 3 to 10 carbon atoms and examples thereof include a cyclopropane structure, a cyclobutane structure, a cyclopentane structure, a cyclohexane structure, a cycloheptane structure, a cyclooctane structure, and the like. The polycyclic type is preferably a cycloalkyl structure with 6 to 20 carbon atoms and examples thereof include an adamantane structure, a norbornane structure, a dicyclopentane structure, a tricyclodecane structure, a tetracyclododecane structure, and the like. Here, some of the carbon atoms in the cycloalkyl structure may be substituted with hetero atoms such as oxygen atoms.

Each of the groups described above as $R_{36}$ to $R_{39}$, $R_{01}$, $R_{02}$, and Ar may have a substituent group and examples of the substituent groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, and the like and the number of carbon atoms of the substituent group is preferably 8 or less.

The group $Y_2$ which is desorbed due to an effect of an acid is more preferably a structure which is represented by General Formula (VI-A) below.

(VI-A)

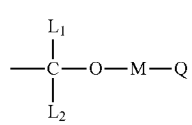

Here, $L_1$ and $L_2$ each independently represent a hydrogen atom, an alkyl group, a cycloalkyl group, an aryl group, or a group in which an alkylene group and an aryl group are combined.

M represents a single bond or a divalent linking group.

Q represents an alkyl group, a cycloalkyl group which may include a hetero atom, an aryl group, an amino group, an ammonium group, a mercapto group, a cyano group, or an aldehyde group which may include a hetero atom.

A ring (preferably a ring with 5 members or 6 members) may be formed by at least two of Q, M, and $L_1$ being bonded with each other.

An alkyl group as $L_1$ and $L_2$ is, for example, an alkyl group with 1 to 8 carbon atoms and specific preferable examples thereof include a methyl group, an ethyl group, a propyl group, an n-butyl group, a sec-butyl group, a hexyl group, and an octyl group.

A cycloalkyl group as $L_1$ and $L_2$ is, for example, a cycloalkyl group with 3 to 15 carbon atoms and specific preferable examples thereof include a cyclopentyl group, a cyclohexyl group, a norbornyl group, an adamantyl group, and the like.

An aryl group as $L_1$ and $L_2$ is, for example, an aryl group with 6 to 15 carbon atoms and specific preferable examples thereof include a phenyl group, a tolyl group, a naphthyl group, an anthryl group, and the like.

A group in which an alkylene group and an aryl group are combined as $L_1$ and $L_2$ is, for example, a group with 6 to 20 carbon atoms and examples thereof include an aralkyl group such as a benzyl group and a phenethyl group.

A divalent linking group as M is, for example, an alkylene group (for example, a methylene group, an ethylene group, a propylene group, a butylene group, a hexylene group, an octylene group, and the like), a cycloalkylene group (for example, a cyclopentylene group, a cyclohexylene group, an adamantylene group, and the like), an alkenylene group (for example, an ethenylene group, a propenylene group, a butenylene group, and the like), a divalent aromatic ring group (for example, a phenylene group, a tolylene group, a naphthylene group, and the like), —S—, —O—, —CO—, —$SO_2$—, —$N(R_0)$—, and a divalent linking group in which a plurality of the above are combined. $R_0$ is a hydrogen atom or an alkyl group (for example, an alkyl group with 1 to 8 carbon atoms and specifically a methyl group, an ethyl group, a propyl group, an n-butyl group, a sec-butyl group, a hexyl group, an octyl group, and the like).

An alkyl group as Q is the same as each of the groups as $L_1$ and $L_2$ described above.

Examples of an aliphatic hydrocarbon ring group, which does not include a hetero atom, and an aryl group, which does not include a hetero atom, in the cycloalkyl group, which may include a hetero atom, and the aryl group, which may include a hetero atom as Q, include the cycloalkyl groups, the aryl groups, and the like as $L_1$ and $L_2$ described above and the number of the carbon atoms is preferably 3 to 15.

Examples of a cycloalkyl group which includes a hetero atom and an aryl group which includes a hetero atom include a group which has a hetero ring structure such as thiirane, cyclothiolane, thiophene, furan, pyrrole, benzothiophene, benzofuran, benzopyrrole, triazine, imidazole, benzimidazole, triazole, thiadiazole, thiazole, and pyrrolidone; however, the present invention is not limited thereto as long as the structure is generally called a hetero ring (a ring which is formed of carbon atoms and hetero atoms or a ring which is formed of hetero atoms).

Examples of a ring which may be formed by at least two of Q, M, and $L_1$ being bonded with each other include a case where at least two of Q, M, and $L_1$ are bonded with each other, for example, form a propylene group and a butylene group, and form a ring with 5 members or 6 members which has an oxygen atom.

Each of the groups which are represented by $L_1$, $L_2$, M, and Q in General Formula (VI-A) may have a substituent group and examples thereof include the groups described as the substituent groups which $R_{36}$ to $R_{39}$, $R_{01}$, $R_{02}$, and Ar may have and the number of carbon atoms of the substituent groups is preferably 8 or less.

A group which is represented by -M-Q is preferably a group which is configured of 1 to 30 carbon atoms.

From the viewpoint of improving the sensitivity, resolving power, LWR, and pattern shape and, in particular, improving the sensitivity among these, the repeating unit which is represented by General Formula (VI) above is preferably a repeating unit which is represented by General Formula (3) below.

(3)

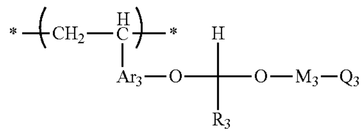

In General Formula (3), $Ar_3$ represents an aromatic ring group.

$R_3$ represents an alkyl group, a cycloalkyl group, an aryl group, an aralkyl group, an alkoxy group, an acyl group, or a hetero ring group.

$M_3$ represents a single bond or a divalent linking group.

$Q_3$ represents an alkyl group, a cycloalkyl group, an aryl group, or a hetero ring group.

At least two of $Q_3$, $M_3$, and $R_3$ may form a ring by bonding with each other.

An aromatic ring group which is represented by $Ar_3$ is the same as $Ar_6$ in General Formula (VI) above in a case where n in General Formula (VI) above is 1 and is more preferably a phenylene group and a naphthylene group, and even more preferably a phenylene group.

$Ar_3$ may have a substituent group and examples of the substituent group which $Ar_3$ may have include the same substituent groups as the substituent groups which $Ar_6$ in General Formula (IV) above may have.

The alkyl group or a cycloalkyl group which is represented by $R_3$ is the same as the alkyl group or the cycloalkyl group which is represented by $R_{36}$ to $R_{39}$, $R_{01}$, and $R_{02}$ described above.

The aryl group which is represented by $R_3$ is the same as the aryl group which is represented by $R_{36}$ to $R_{39}$, $R_{01}$, and $R_{02}$ described above and additionally, the preferable ranges thereof are also the same.

The aralkyl group which is represented by $R_3$ is preferably an aralkyl group with 7 to 12 carbon atoms and examples thereof include a benzyl group, a phenethyl group, a naphthylmethyl group, and the like.

The alkyl group portion of an alkoxy group which is represented by $R_3$ is the same as the alkyl group which is represented by $R_{36}$ to $R_{39}$, $R_{01}$, and $R_{02}$ described above and additionally, the preferable ranges thereof are also the same.

Examples of an acyl group which is represented by $R_3$ include an aliphatic acyl group with 1 to 10 carbon atoms such as a formyl group, an acetyl group, a propionyl group, a butyryl group, an isobutyryl group, a valeryl group, a pivaloyl group, a benzoyl group, a naphthoyl group, and the like, and an acetyl group or a benzoyl group is preferable.

Examples of a hetero ring group which is represented by $R_3$ include the cycloalkyl group which includes a hetero atom and the aryl group which includes a hetero atom described above and a pyridine ring group or a pyran ring group is preferable.

$R_3$ is preferably a straight-chain or branched alkyl group with 1 to 8 carbon atoms (in detail, a methyl group, an ethyl group, a propyl group, an i-propyl group, an n-butyl group, a sec-butyl group, a tert-butyl group, a neopentyl group, a hexyl group, a 2-ethylhexyl group, and an octyl group) and a cycloalkyl group with 3 to 15 carbon atoms (in detail, a cyclopentyl group, a cyclohexyl group, a norbornyl group, an adamantyl group, and the like), and is preferably a group with 2 or more carbon atoms. $R_3$ is more preferably an ethyl group, an ethyl group, an i-propyl group, a sec-butyl group, a tert-butyl group, a neopentyl group, a cyclohexyl group, an adamantyl group, a cyclohexyl methyl group, or an adamantane methyl group, and even more preferably a tert-butyl group, a sec-butyl group, a neopentyl group, a cyclohexyl methyl group, or an adamantane methyl group.

The alkyl group, the cycloalkyl group, the aryl group, the aralkyl group, the alkoxy group, the acyl group, or the hetero ring group may further have a substituent group and examples of the substituent groups which these may have include the substituent groups described as the substituent groups which $R_{36}$ to $R_{39}$, $R_{01}$, $R_{02}$, and Ar described above may have.

The divalent linking group which is represented by $M_3$ is the same as M in the structure which is represented by General Formula (VI-A) above and additionally, the preferable ranges thereof are also the same. $M_3$ may have a substituent group and examples of the substituent group which $M_3$ may have include the same group as the substituent groups which M in the group which is represented by General Formula (VI-A) above may have.

An alkyl group, a cycloalkyl group, and an aryl group which are represented by $Q_3$ are the same as Q in the structure which is represented by General Formula (VI-A) above and additionally, the preferable ranges thereof are also the same.

Examples of a hetero ring group which is represented by $Q_3$ include a cycloalkyl group which includes a hetero atom and an aryl group which includes a hetero atom as Q in the structure which is represented by General Formula (VI-A) above and additionally, the preferable ranges thereof are also the same.

$Q_3$ may have a substituent group and examples of the substituent group which $Q_3$ may have include the same groups as the substituent groups which Q may have in the group which is represented by General Formula (VI-A) above.

A ring which is formed by at least two of $Q_3$, $M_3$, and $R_3$ being bonded with each other is the same as the ring which may be formed by at least two of Q, M, and $L_1$ being bonded with each other in General Formula (VI-A) above and additionally, the preferable ranges thereof are also the same.

From the viewpoint of improving the sensitivity, resolving power, LWR, and pattern shape and, in particular, improving the sensitivity among these, $R_3$ in General Formula (3) is preferably a group which is represented by General Formula (3-2) below.

(3-2)

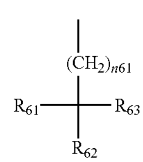

In General Formula (3-2) above, $R_{61}$, $R_{62}$, and $R_{63}$ each independently represent an alkyl group, an alkenyl group, a cycloalkyl group, or an aryl group. n61 represents 0 or 1.

At least two of $R_{61}$ to $R_{63}$ may form a ring by linking with each other.

An alkyl group which is represented by $R_{61}$ to $R_{63}$ may be straight-chain or branched and is preferably an alkyl group with 1 to 8 carbon atoms.

An alkenyl group which is represented by $R_{61}$ to $R_{63}$ may be straight-chain or branched and is preferably an alkenyl group with 1 to 8 carbon atoms.

A cycloalkyl group which is represented by $R_{61}$ to $R_{63}$ is the same as the cycloalkyl group which is represented by $R_{36}$ to $R_{39}$, $R_{01}$, and $R_{02}$ described above.

An aryl group which is represented by $R_{61}$ to $R_{63}$ is the same as the aryl group which is represented by $R_{36}$ to $R_{39}$, $R_{01}$, and $R_{02}$ described above and additionally, the preferable ranges thereof are also the same.

$R_{61}$ to $R_{63}$ are preferably an alkyl group and more preferably a methyl group.

The ring which at least two of $R_{61}$ to $R_{63}$ may form is preferably a cyclopentyl group, a cyclohexyl group, a norbornyl group, or an adamantyl group.

Specific examples of the repeating unit which is represented by General Formula (VI) will be given below as preferable specific examples of the repeating unit (a); however, the present invention is not limited thereto.

(VI-1)

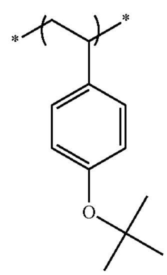

(VI-2)

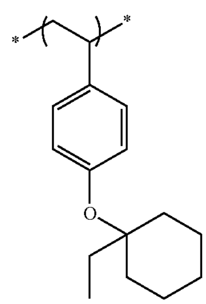

(VI-3)

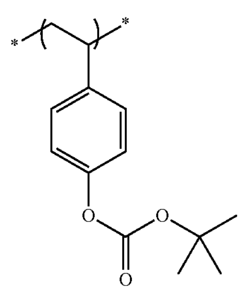

(VI-4)

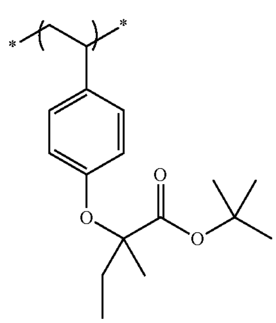

-continued (VI-5)

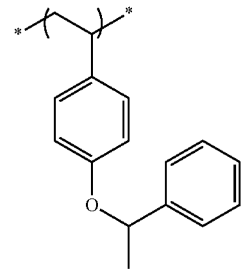

(VI-6)

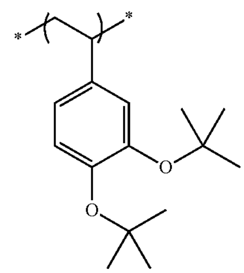

(VI-7)

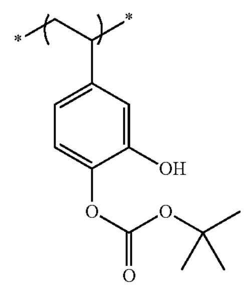

(VI-8)

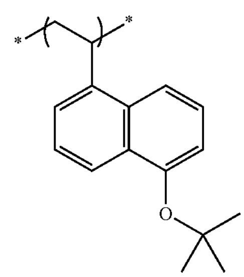

(VI-9)

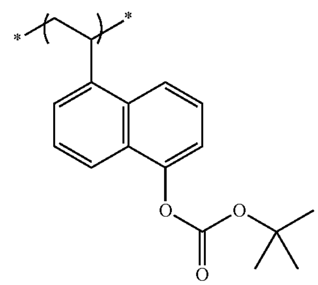

-continued
(VI-10)
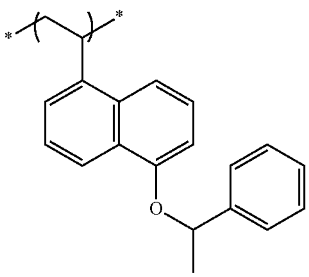
(VI-11)
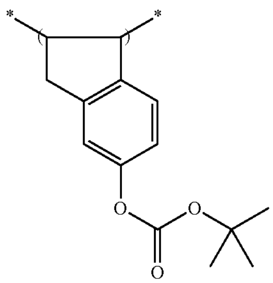
(VI-12)
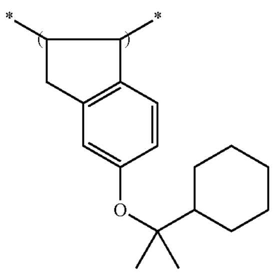
(VI-13)
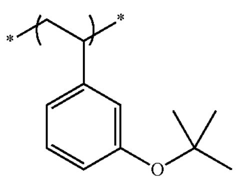
(VI-14)
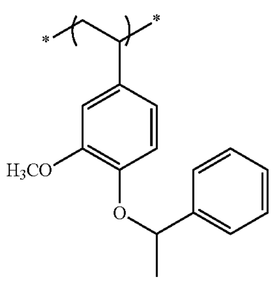
(VI-15)
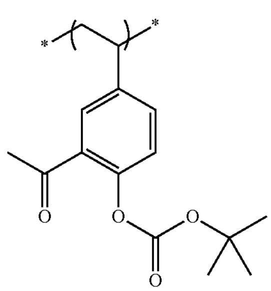
-continued
(VI-16)
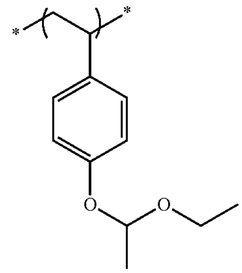
(VI-17)
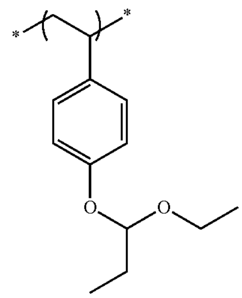
(VI-18)
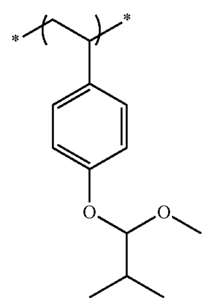
(VI-19)
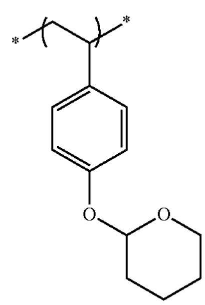
(VI-20)
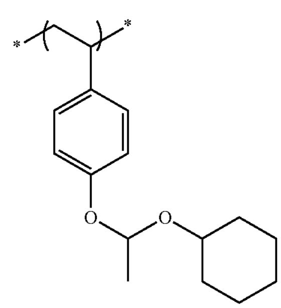

-continued
(VI-21)
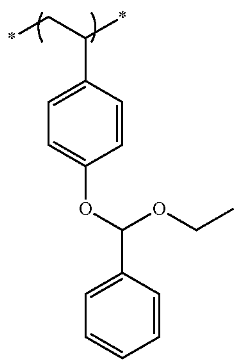
(VI-22)
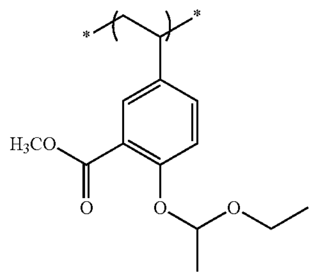
(VI-23)
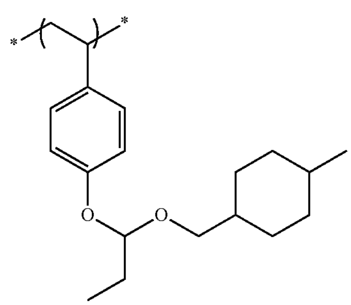
(VI-24)
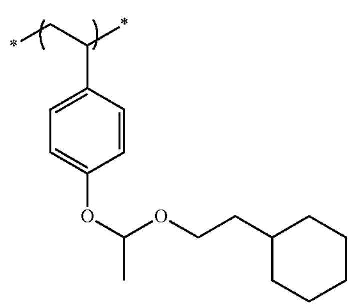
(VI-25)
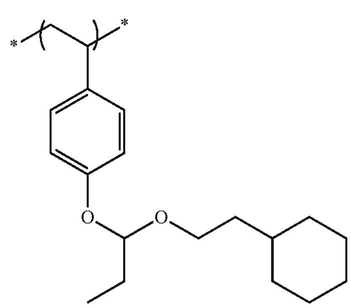
-continued
(VI-26)
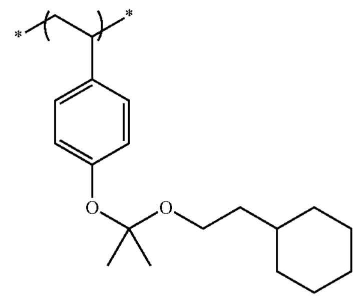
(VI-27)
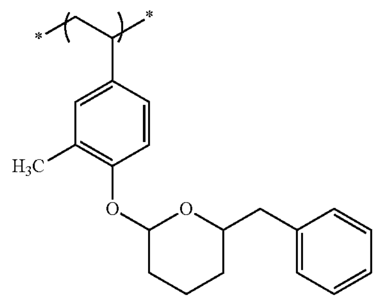
(VI-28)
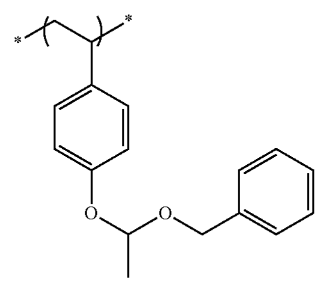
(VI-29)
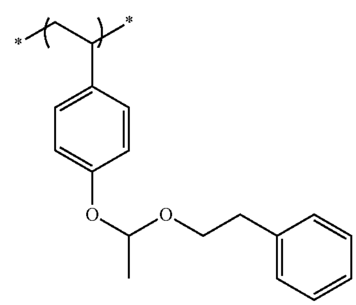
(VI-30)
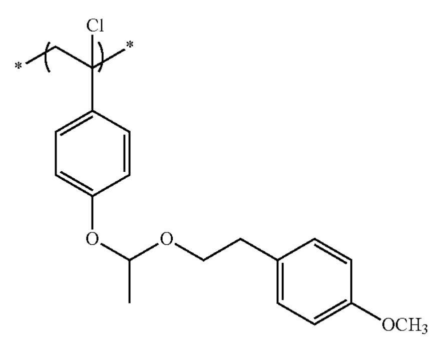

(VI-31)
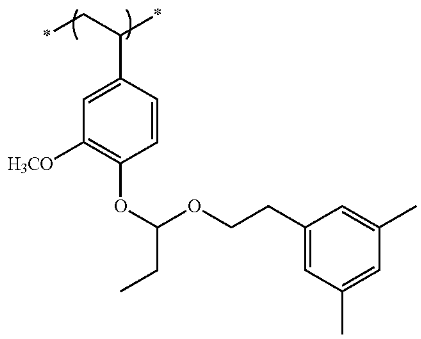
(VI-32)
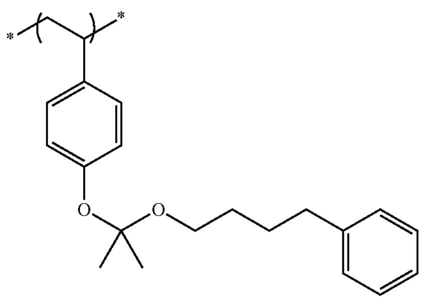
(VI-33)
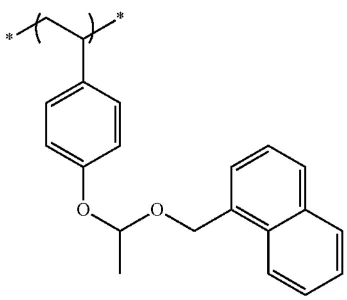
(VI-34)
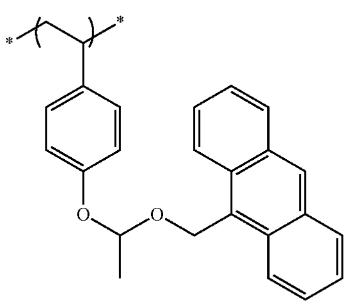
(VI-35)
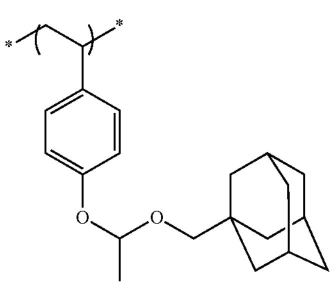
(VI-36)
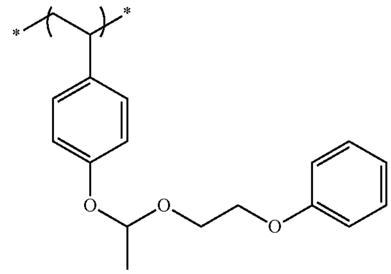
(VI-37)
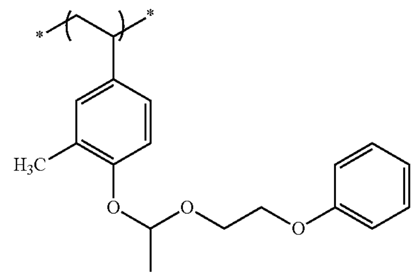
(VI-38)
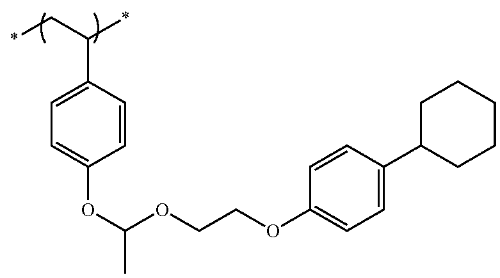
(VI-39)
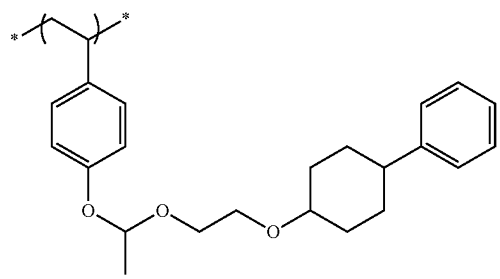
(VI-40)
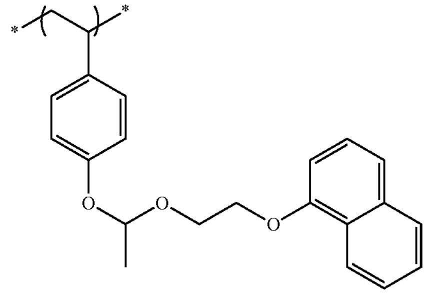

-continued
(VI-41)
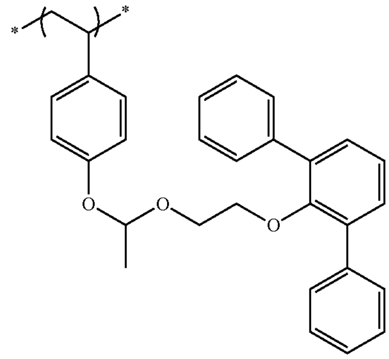
(VI-42)
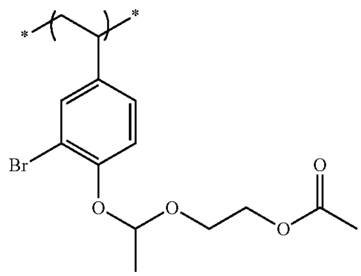
(VI-43)
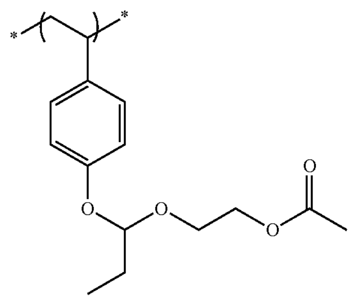
(VI-44)
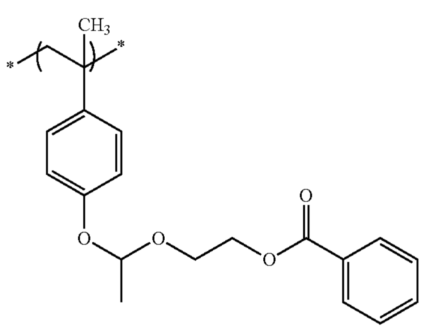
(VI-45)
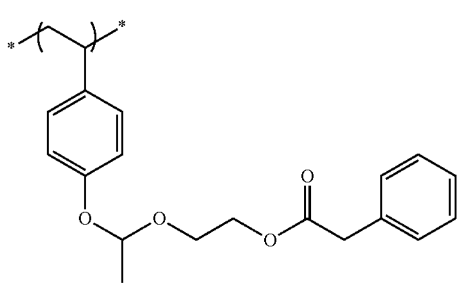
-continued
(VI-46)
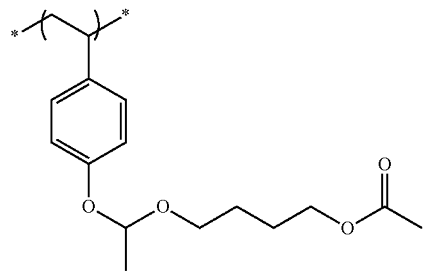
(VI-47)
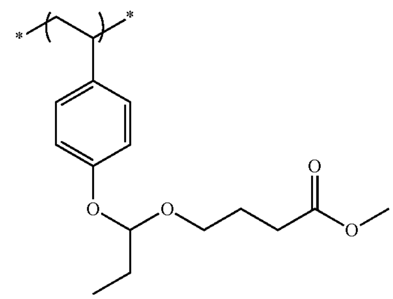
(VI-48)
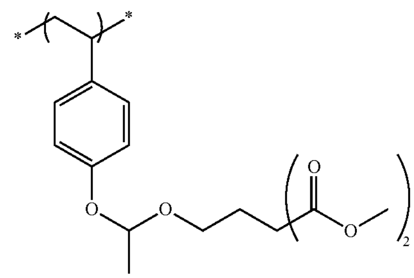
(VI-49)
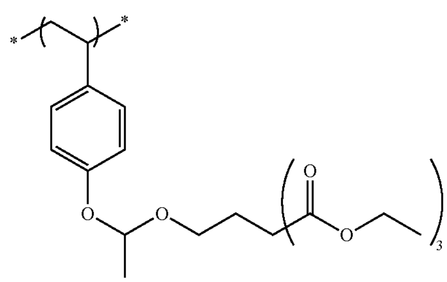
(VI-50)
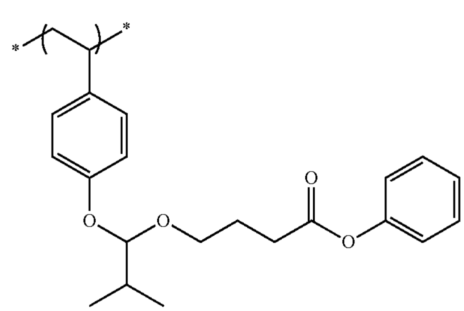

-continued
(VI-51)
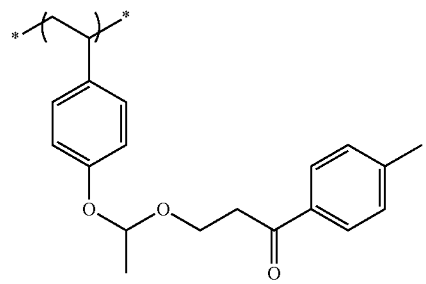
(VI-52)
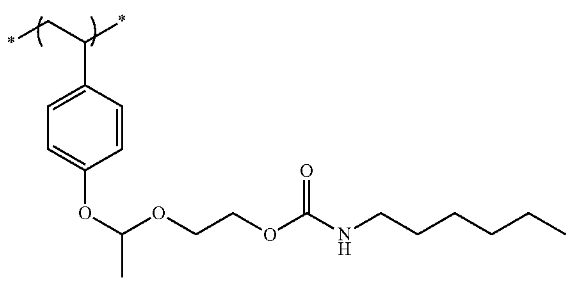
(VI-53)
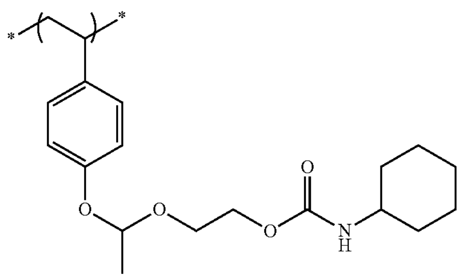
(VI-54)
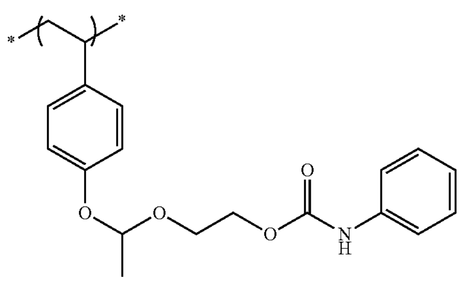
(VI-55)
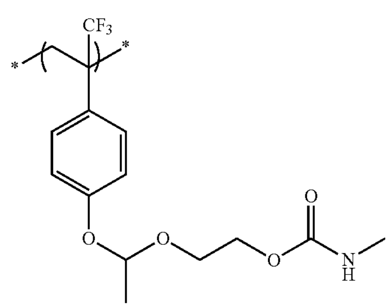
-continued
(VI-56)
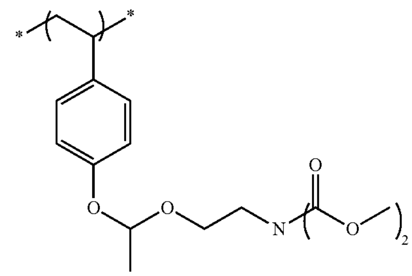
(VI-57)
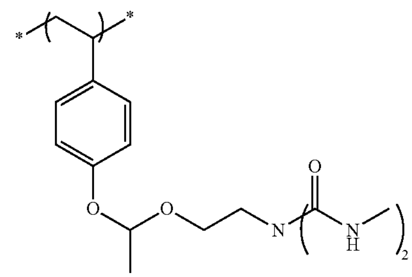
(VI-58)
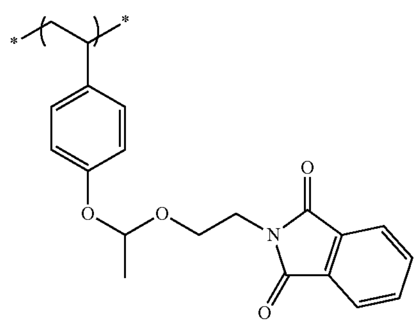
(VI-59)
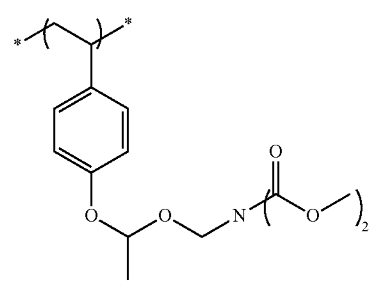
(VI-60)
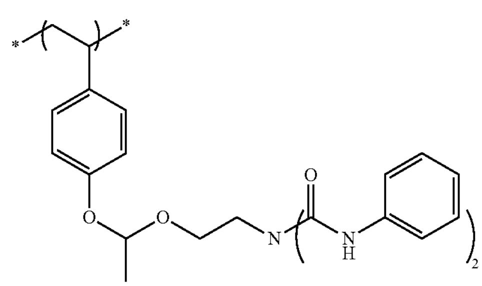

-continued
(VI-61)
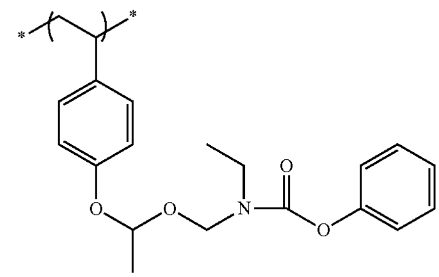
(VI-62)
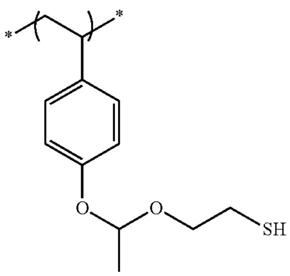
(VI-63)
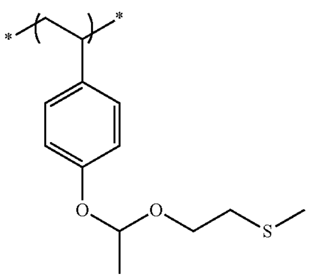
(VI-64)
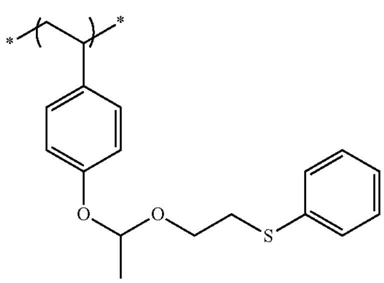
(VI-65)
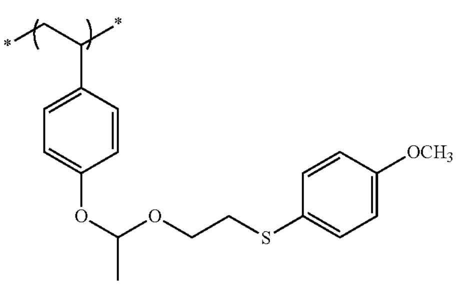
-continued
(VI-66)
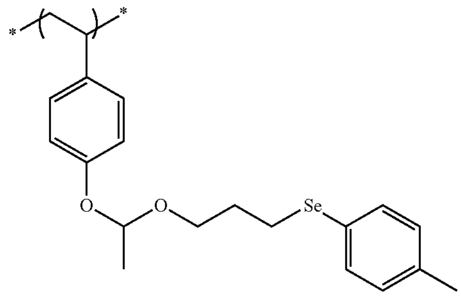
(VI-67)
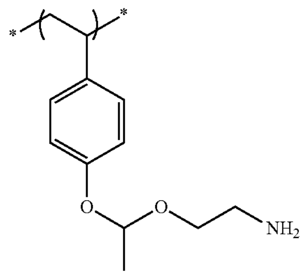
(VI-68)
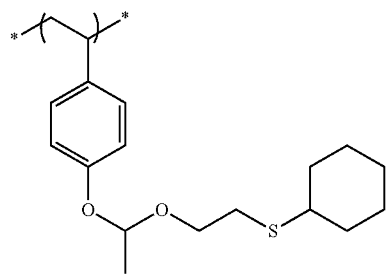
(VI-69)
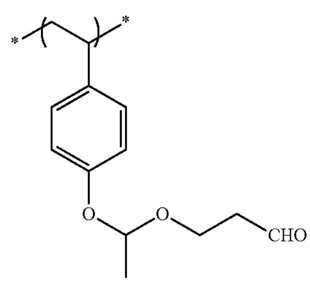
(VI-70)
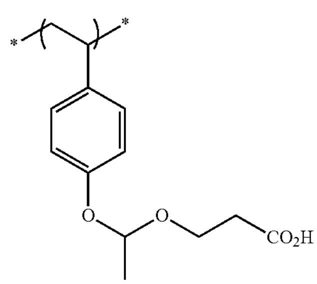

-continued
(VI-71)
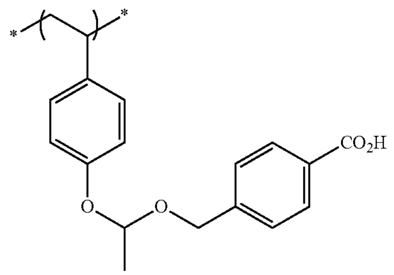
(VI-72)
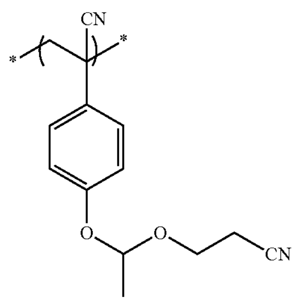
(VI-73)
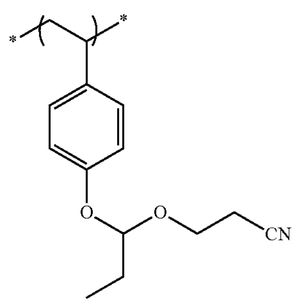
(VI-74)
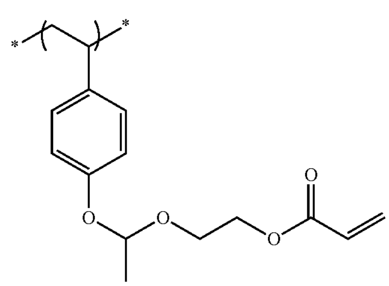
(VI-75)
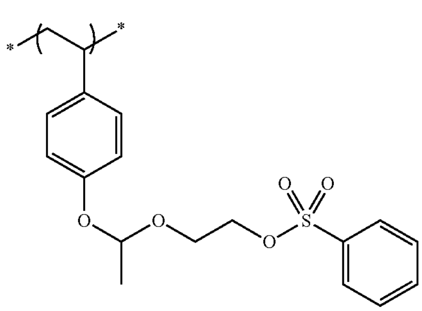
-continued
(VI-76)
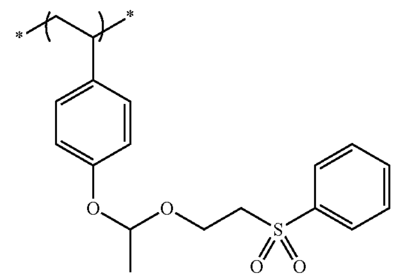
(VI-77)
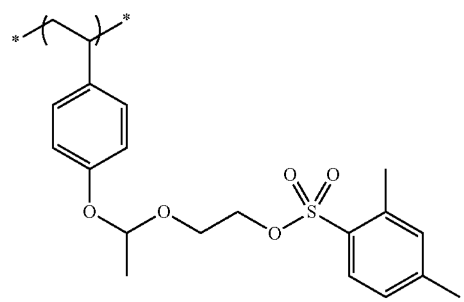
(VI-78)
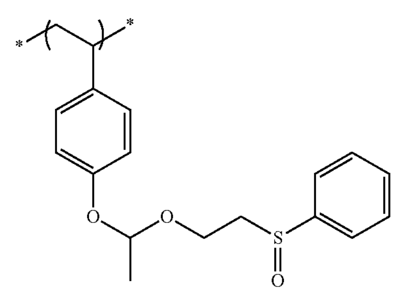
(VI-79)
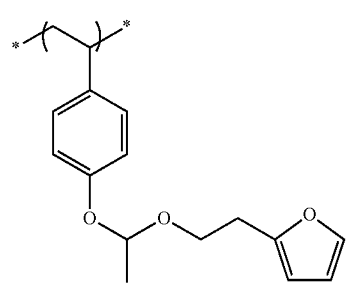
(VI-80)
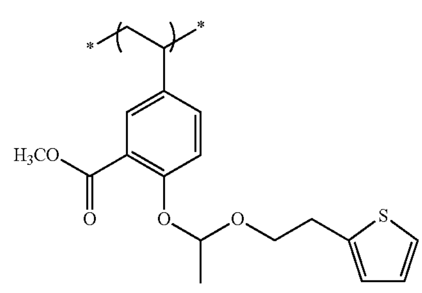

-continued
(VI-81)
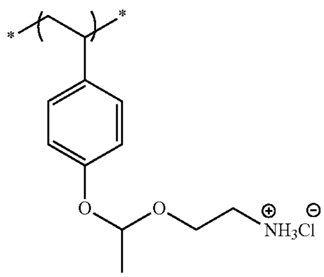
(VI-82)
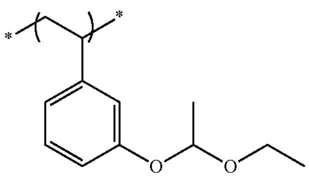
(VI-83)
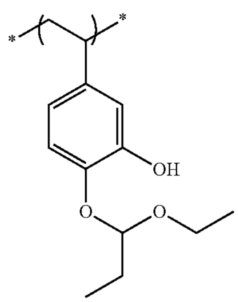
(VI-84)
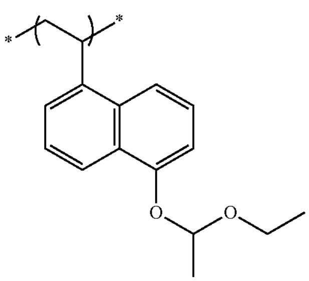
(VI-85)
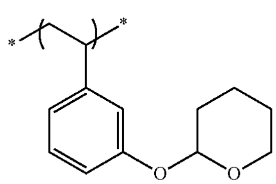
(VI-86)
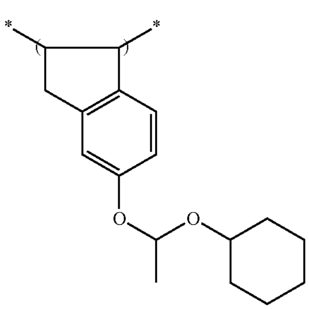
-continued
(VI-87)
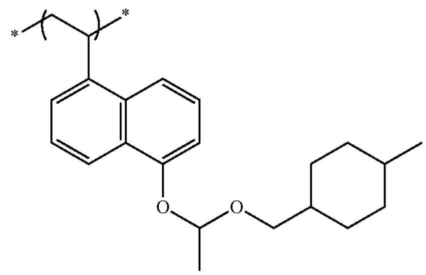
(VI-88)
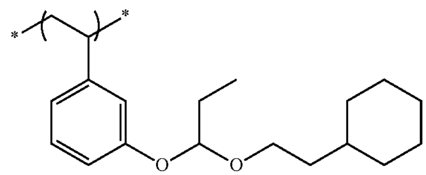
(VI-89)
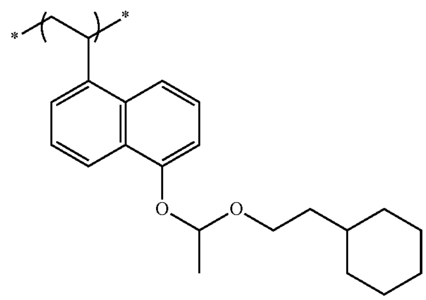
(VI-90)
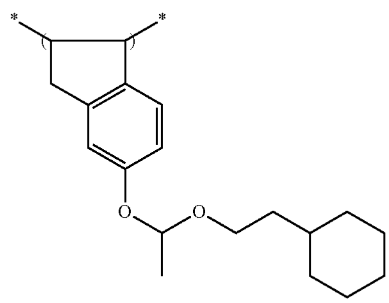
(VI-91)
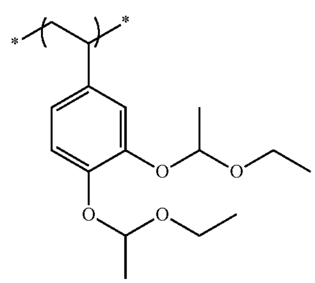
(VI-92)
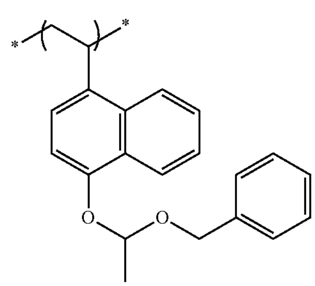

-continued
(VI-93)
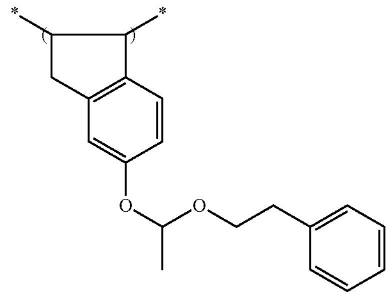
(VI-94)
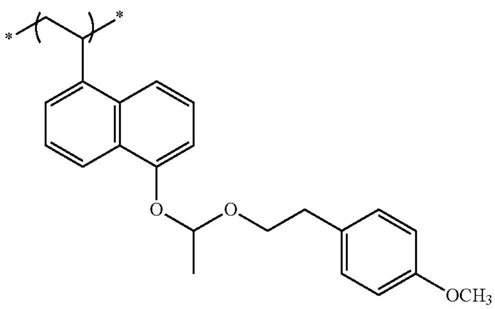
(VI-95)
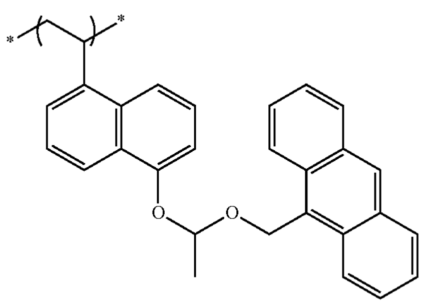
(VI-96)
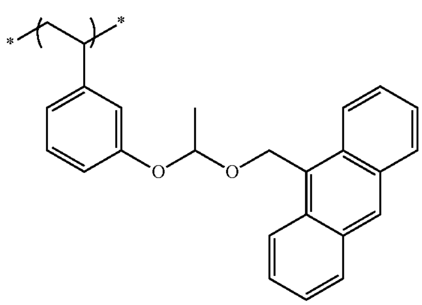
(VI-97)
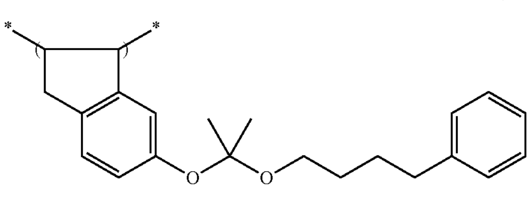
-continued
(VI-98)
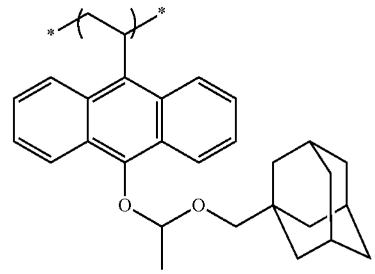
(VI-99)
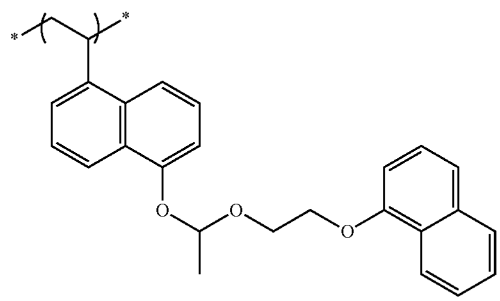
(VI-100)
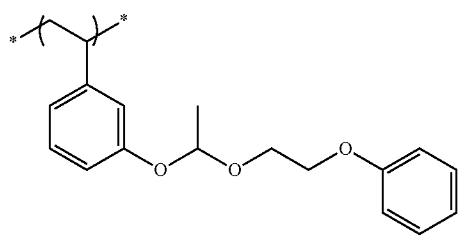
(VI-101)
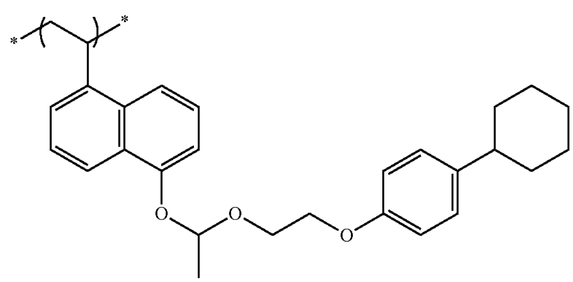
(VI-102)
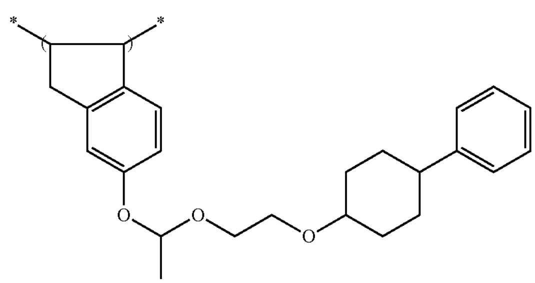

-continued
(VI-103)
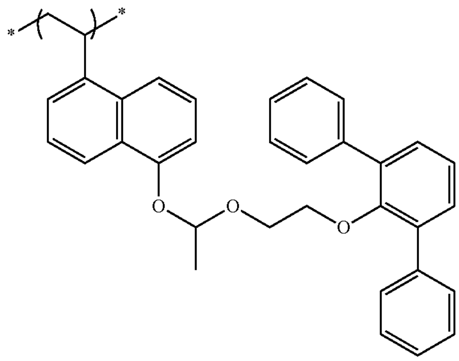
(VI-104)
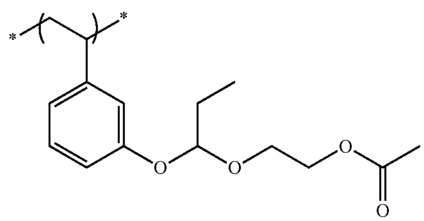
(VI-105)
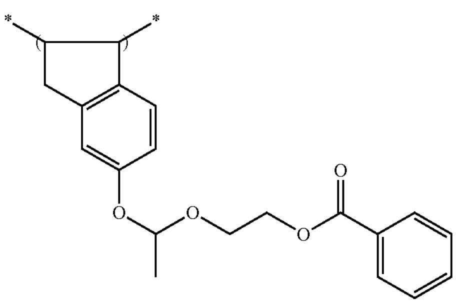
(VI-106)
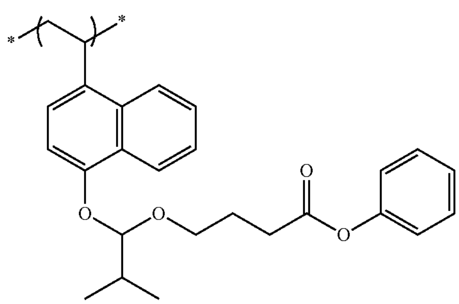
(VI-107)
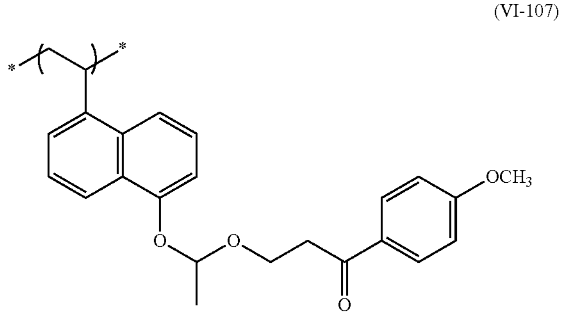
-continued
(VI-108)
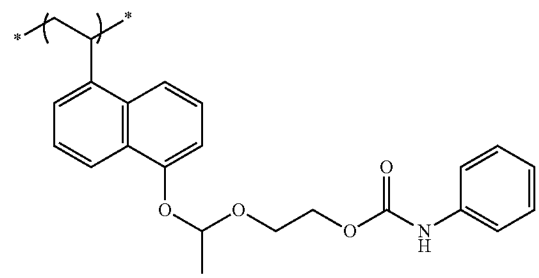
(VI-109)
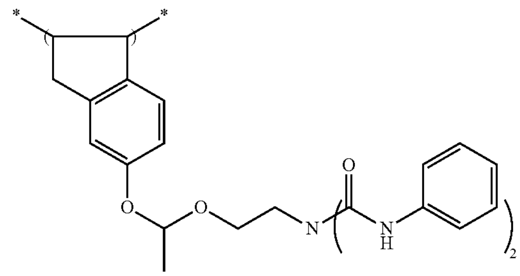
(VI-110)
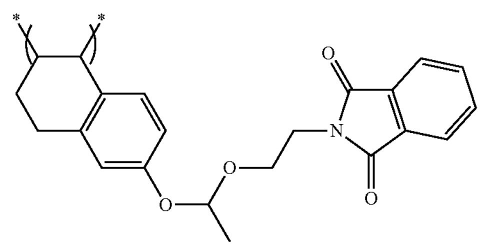
(VI-111)
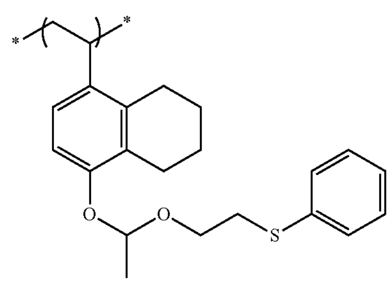
(VI-112)
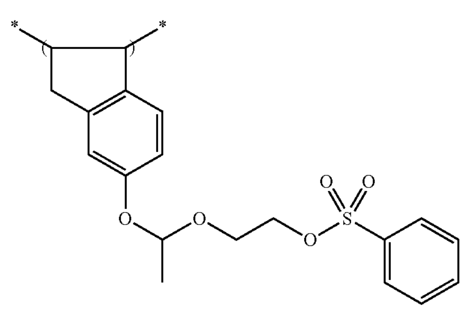

-continued
(VI-113)
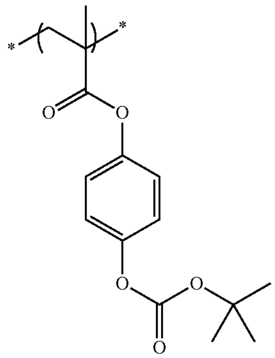
(VI-114)
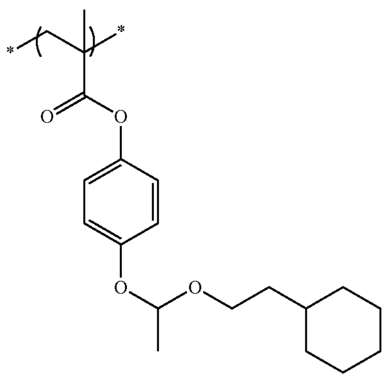
(VI-115)
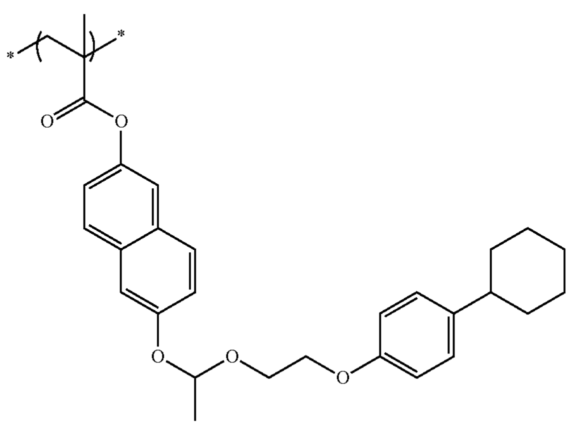
(VI-116)
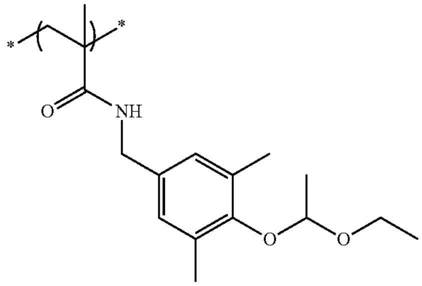
-continued
(VI-117)
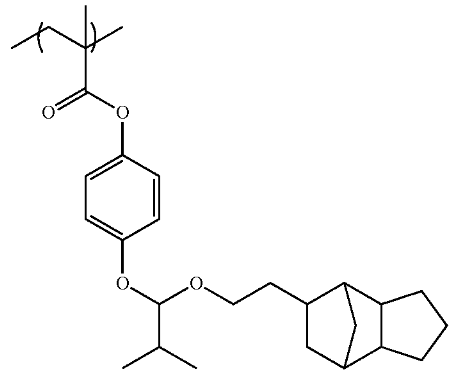
(VI-118)
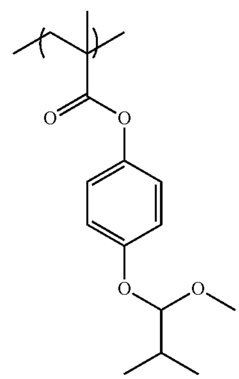
(VI-119)
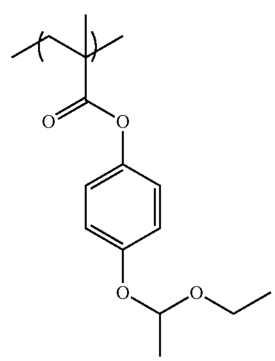
(VI-120)
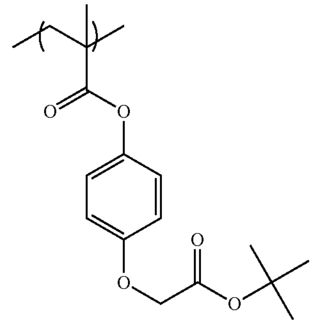

-continued
(VI-121)
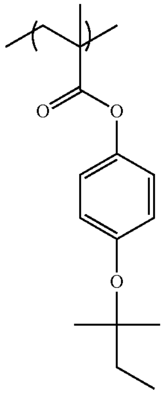
(VI-122)
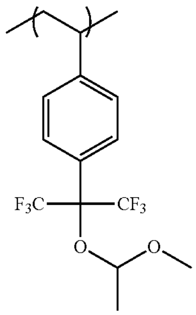
(VI-123)
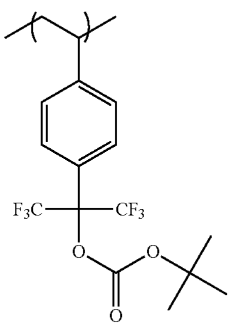
(VI-124)
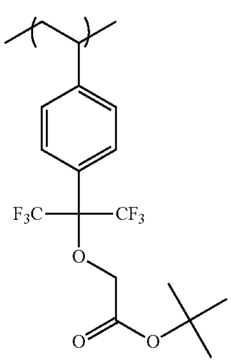
-continued
(VI-125)
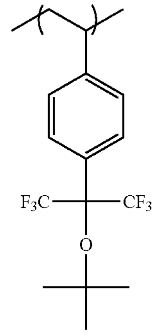
(VI-126)
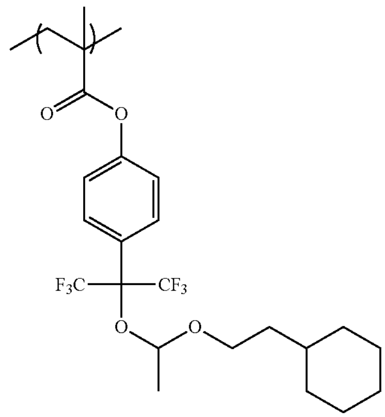
(VI-127)
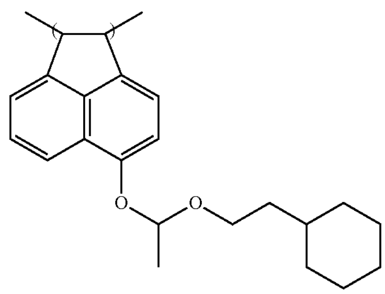
(VI-128)
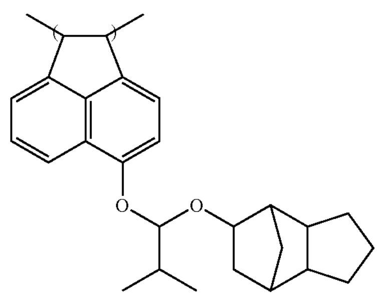
(VI-129)
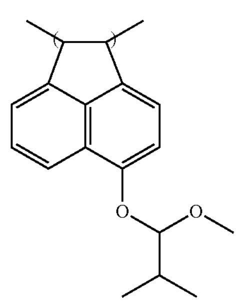

-continued
(VI-130)
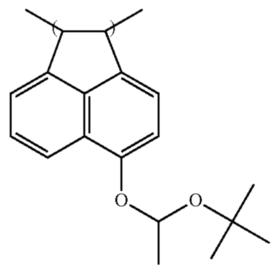
(VI-131)
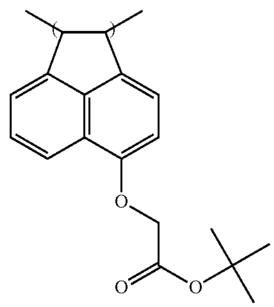
(VI-132)
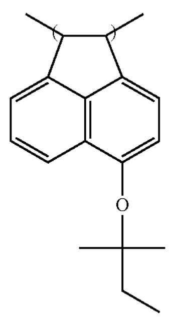
(VI-133)
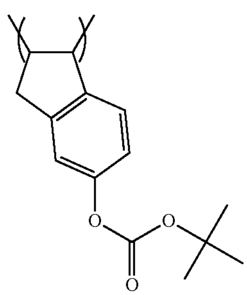
(VI-134)
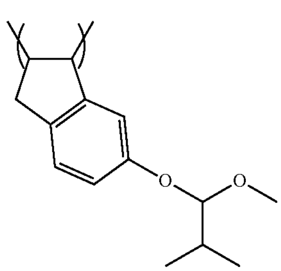
-continued
(VI-135)
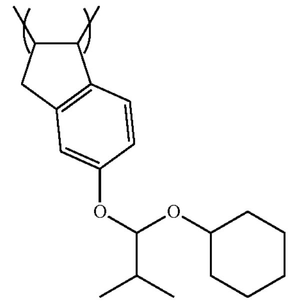
(VI-136)
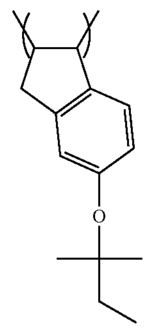
(VI-137)
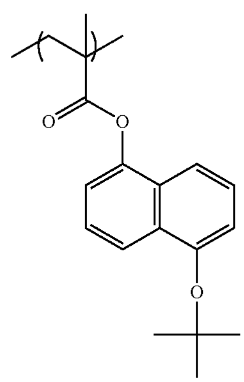
(VI-138)
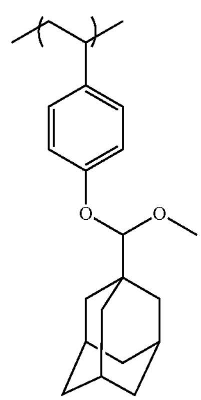

-continued
(VI-139)
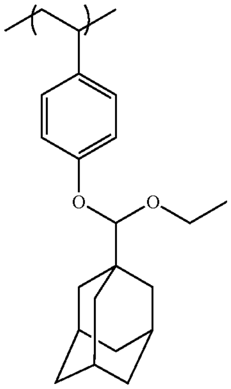
(VI-140)
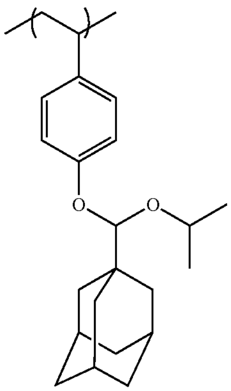
(VI-141)
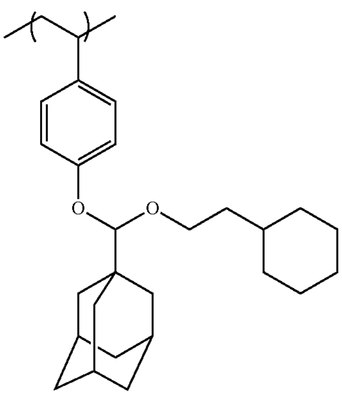
(VI-142)
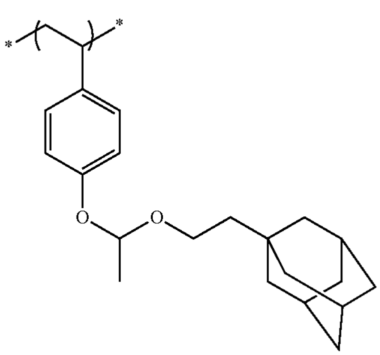
-continued
(VI-143)
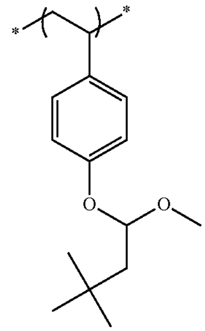
(VI-144)
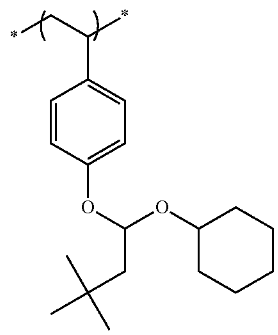
(VI-145)
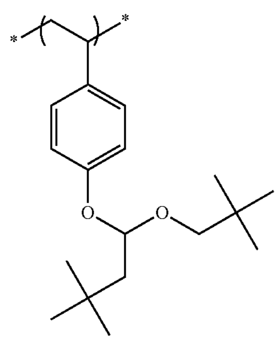
(VI-146)
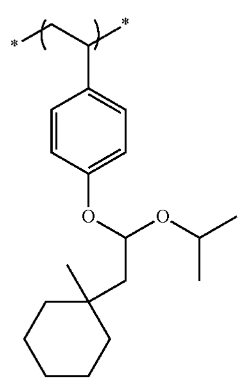

-continued (VI-147)

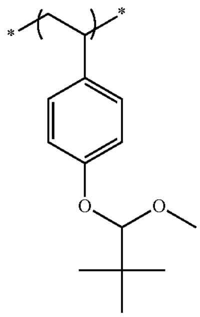

(VI-148)

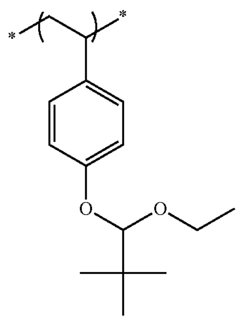

(VI-149)

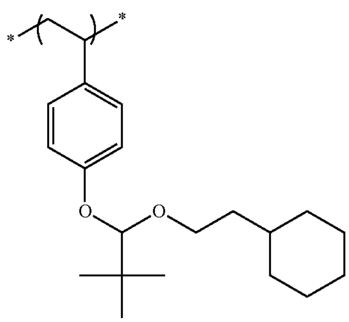

(VI-150)

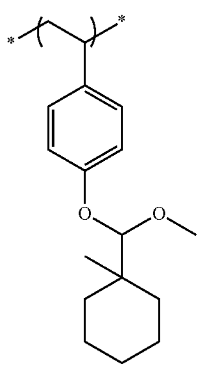

(VI-151)

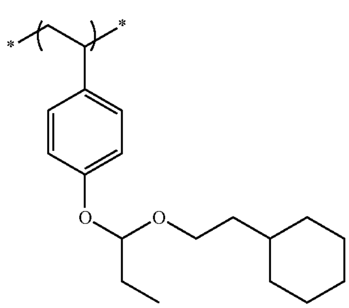

-continued (VI-152)

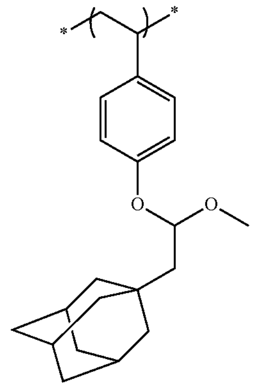

From the viewpoint of improving the sensitivity, resolving power, LWR, and pattern shape and, in particular, improving the sensitivity among these, the resin (A) preferably also includes a repeating unit which is represented by General Formula (4) below.

(4)

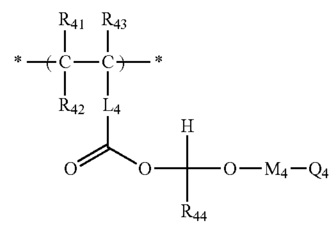

In General Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may form a ring by bonding with $L_4$ and $R_{42}$ in this case represents an alkylene group.

$L_4$ represents a single bond or a divalent linking group and represents a trivalent linking group when forming a ring with $R_{42}$.

$R_{44}$ represents an alkyl group, a cycloalkyl group, an aryl group, an aralkyl group, an alkoxy group, an acyl group, or a hetero ring group.

$M_4$ represents a single bond or a divalent linking group.

$Q_4$ represents an alkyl group, a cycloalkyl group, an aryl group, or a hetero ring group.

At least two of $Q_4$, $M_4$, and $R_{44}$ may form a ring by bonding with each other.

$R_{41}$, $R_{42}$, and $R_{43}$ are the same as $R_{61}$, $R_{62}$, and $R_{63}$ in General Formula (VI) above and additionally, the preferable ranges thereof are also the same.

Examples of the divalent linking group which is represented by $L_4$ include an alkylene group, a divalent aromatic ring group, —COO-$L_1$-, —O-$L_1$-, and a group which is formed by combining two or more thereof. Here, $L_1$ represents an alkylene group, a cycloalkylene group, a divalent aromatic ring group, or a group in which an alkylene group and a divalent aromatic ring group are combined.

$L_4$ is preferably a single bond, a group which is represented by —COO-$L_1$-, or a divalent aromatic ring group. $L_1$ is preferably an alkylene group with 1 to 5 carbon atoms and more preferably a methylene group and a propylene group. The divalent aromatic ring group is preferably a 1,4-phenylene group, a 1,3-phenylene group, a 1,2-phenylene group, and a 1,4-naphthylene group, and more preferably a 1,4-phenylene group.

Examples of the trivalent linking group which is represented by $L_4$ in a case where $L_4$ forms a ring by bonding with $R_{42}$ favorably include a group formed by removing one arbitrary hydrogen atom from the specific examples of the divalent linking groups which are represented by $L_4$ described above.

$R_{44}$ is the same as $R_3$ in General Formula (3) above and additionally, the preferable ranges thereof are also the same.

$M_4$ is the same as $M_3$ in General Formula (3) above and additionally, the preferable ranges thereof are also the same.

$Q_4$ is the same as $Q_3$ in General Formula (3) above and additionally, the preferable ranges thereof are also the same. Examples of a ring which is formed by at least two of $Q_4$, $M_4$, and $R_{44}$ being bonded with each other include a ring which is formed by at least two of $Q_3$, $M_3$, and $R_3$ being bonded with each other and additionally, the preferable ranges thereof are also the same.

Specific examples of the repeating unit which is represented by General Formula (4) will be given below; however, the present invention is not limited thereto.

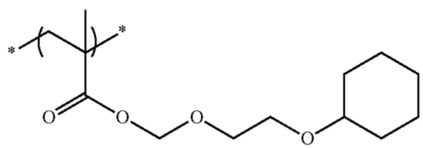

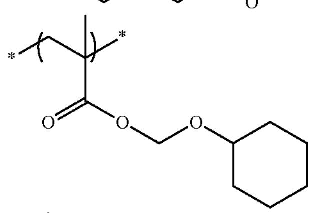

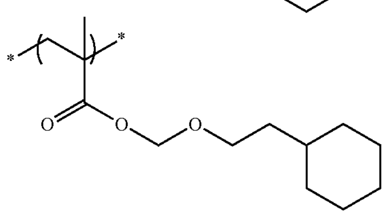

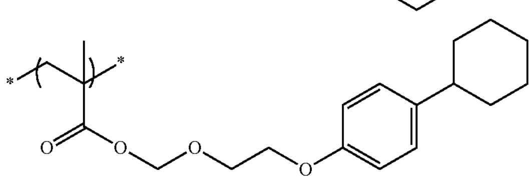

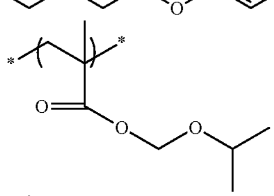

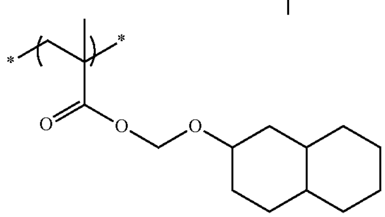

-continued

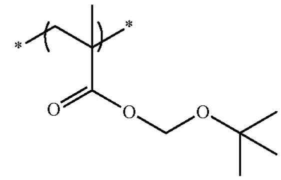

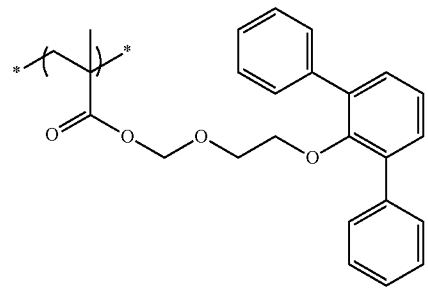

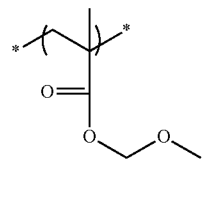

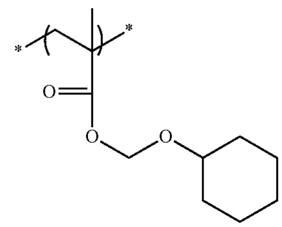

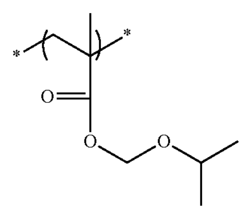

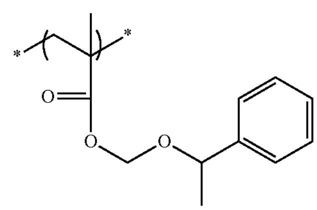

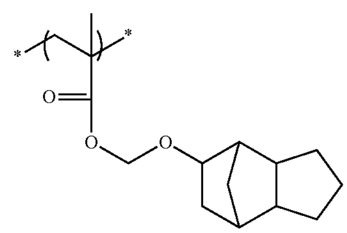

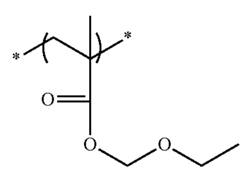

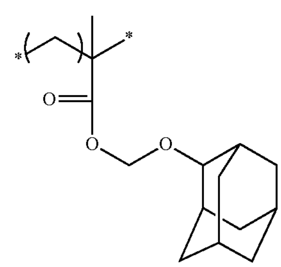

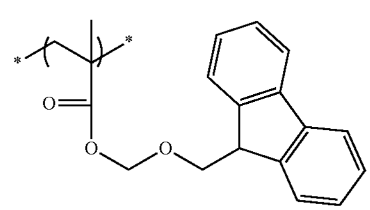

-continued
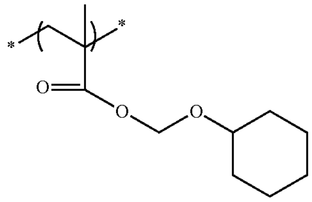
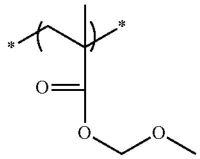
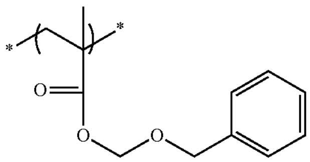
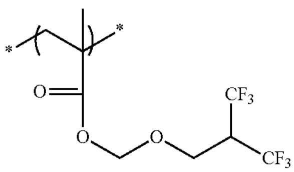
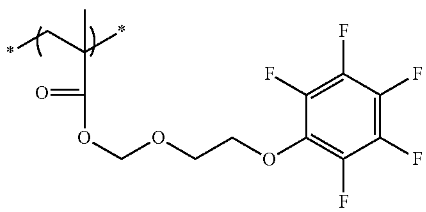
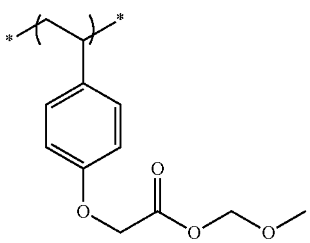
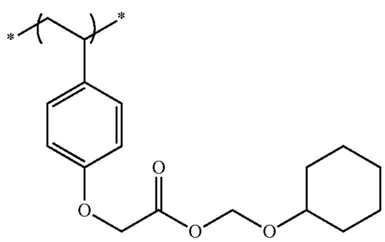
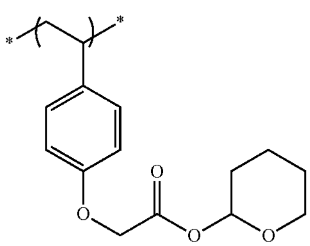
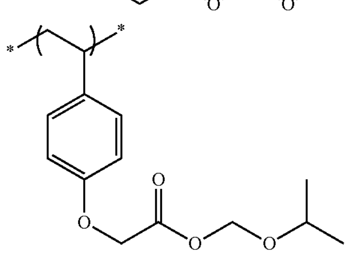
-continued
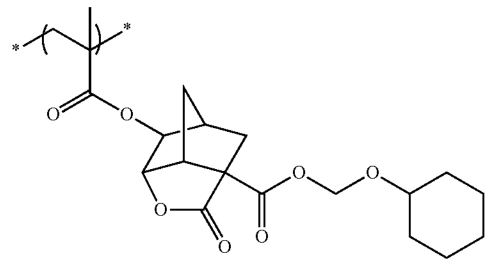
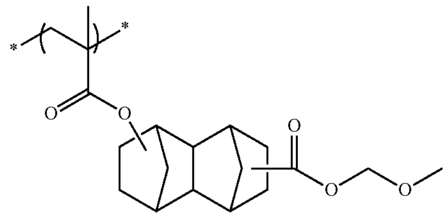
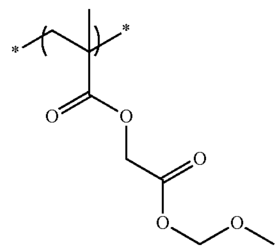
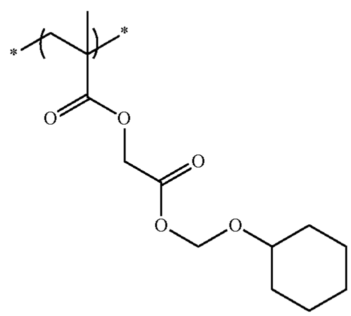
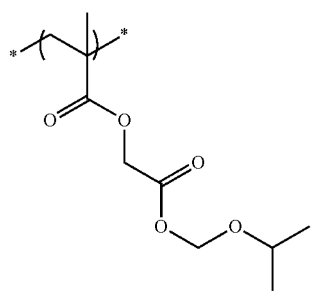
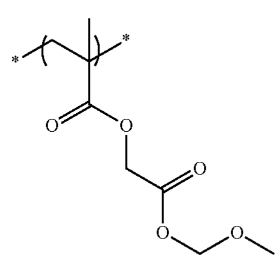

-continued
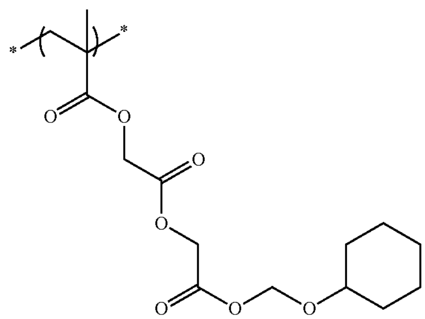
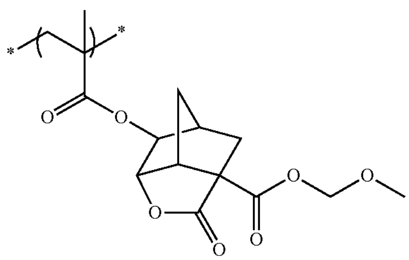
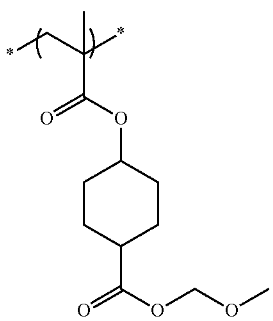
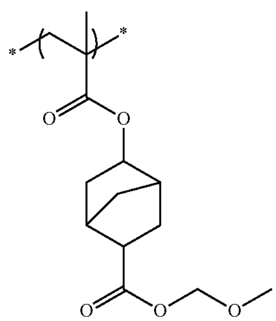
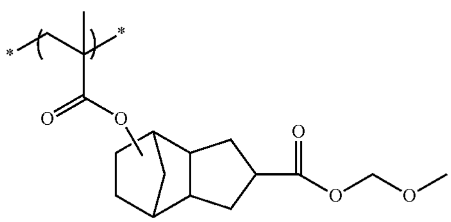
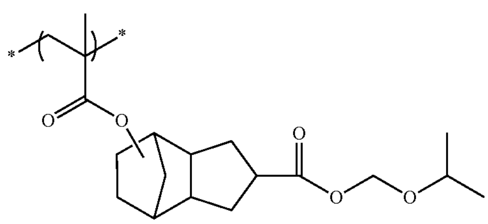
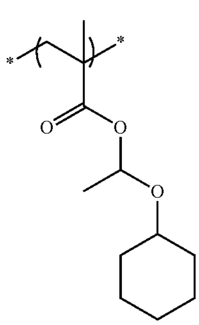
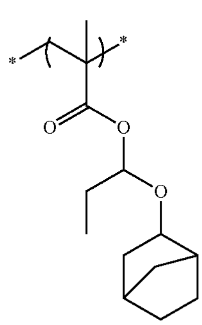
-continued
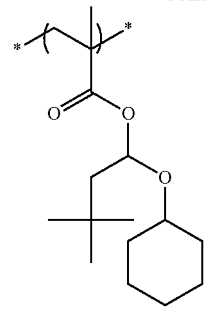
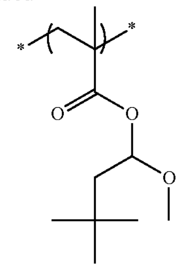
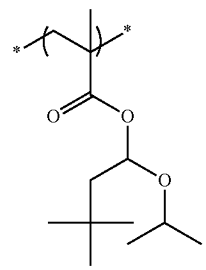
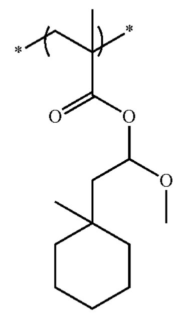
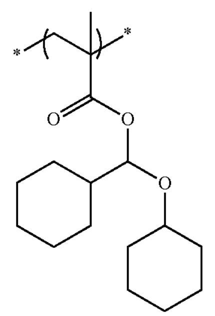
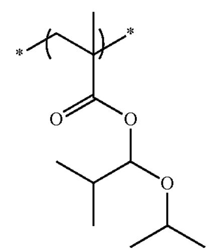
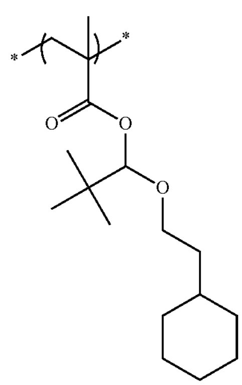
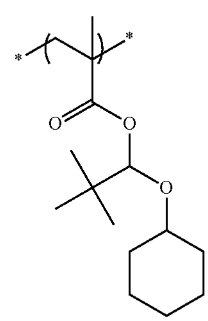
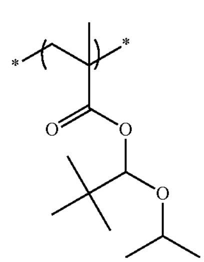
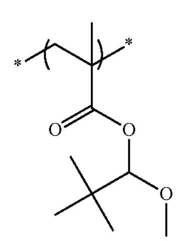

-continued

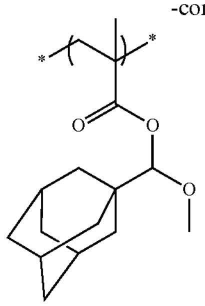

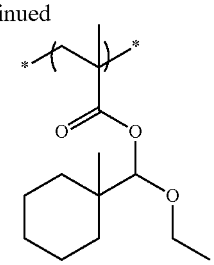

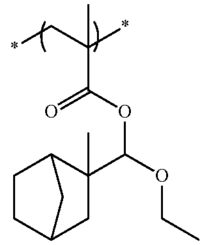

The repeating unit (a) which has an acid-decomposable group may be a repeating unit which is represented by General Formula (V) below.

(V)

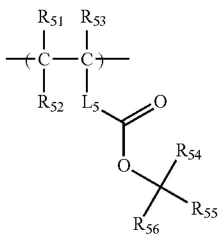

In General Formula (V), $R_{51}$, $R_{52}$, and $R_{53}$ each independently represent a hydrogen atom, an alkyl group, a cycloalkyl group, a halogen atom, a cyano group, or an alkoxycarbonyl group. $R_{52}$ may form a ring by bonding with $L_5$ and $R_{52}$ in this case represents an alkylene group.

$L_5$ represents a single bond or a divalent linking group and represents a trivalent linking group in a case of forming a ring with $R_{52}$.

$R_{54}$ represents an alkyl group and $R_{55}$ and $R_{56}$ each independently represent a hydrogen atom, an alkyl group, a cycloalkyl group, an aryl group, or an aralkyl group. $R_{55}$ and $R_{56}$ may form a ring by bonding with each other. However, $R_{55}$ and $R_{56}$ are not hydrogen atoms at the same time.

Description will be given of General Formula (V) in more detail.

$R_{51}$ to $R_{53}$ in General Formula (V) are the same as $R_{61}$, $R_{62}$, and $R_{63}$ in General Formula (VI) above and additionally, the preferable ranges thereof are also the same.

In addition, in a case where $R_{52}$ is an alkylene group and forms a ring with $L_5$, examples of the alkylene group preferably include an alkylene group with 1 to 8 carbon atoms such as a methylene group, an ethylene group, a propylene group, a butylene group, a hexylene group, and an octylene group.

An alkylene group with 1 to 4 carbon atoms is more preferable and an alkylene group with 1 or 2 carbon atoms is particularly preferable. The ring which is formed by $R_{52}$ and $L_5$ by bonding with each other is particularly preferably a ring with 5 or 6 members.

$L_5$ is the same as $L_4$ in General Formula (4) above and additionally, the preferable ranges thereof are also the same.

The alkyl group of $R_{54}$ to $R_{56}$ is preferably an alkyl group with 1 to 20 carbon atoms, more preferably with 1 to 10 carbon atoms, and particularly preferably with 1 to 4 carbon atoms such as a methyl group, an ethyl group, an n-propyl group, an isopropyl group, an n-butyl group, an isobutyl group, and a t-butyl group.

The cycloalkyl groups which are represented by $R_{55}$ and $R_{56}$ are preferably a cycloalkyl group with 3 to 20 carbon atoms and may be a monocyclic cycloalkyl group such as a cyclopentyl group and a cyclohexyl group, or may be a polycyclic cycloalkyl group such as a norbornyl group, an adamantyl group, a tetracyclodecanyl group, and a tetracyclododecanyl group.

In addition, the ring which is formed by $R_{55}$ and $R_{56}$ being bonded with each other is preferably a ring with 3 to 20 carbon atoms and may be a monocyclic ring such as a cyclopentyl group and a cyclohexyl group or may be a polycyclic ring such as a norbornyl group, an adamantyl group, a tetracyclodecanyl group, and a tetracyclododecanyl group. In a case where $R_{55}$ and $R_{56}$ form a ring by bonding with each other, $R_{54}$ is preferably an alkyl group with 1 to 3 carbon atoms and more preferably a methyl group or an ethyl group.

The aryl group which is represented by $R_{55}$ and $R_{56}$ is preferably an aryl group with 6 to 20 carbon atoms and may be monocyclic or polycyclic and may have a substituent group. Examples thereof include a phenyl group, a 1-naphthyl group, a 2-naphthyl group, a 4-methylphenyl group, a 4-methoxyphenyl group, and the like. In a case where either one of $R_{55}$ and $R_{56}$ is a hydrogen atom, the other is preferably an aryl group.

The aralkyl group which is represented by $R_{55}$ and $R_{56}$ may be monocyclic or polycyclic and may have a substituent group. The number of carbon atoms is preferably 7 to 21 and examples thereof include a benzyl group, a 1-naphthylmethyl group, and the like.

It is possible to apply a general synthesis method of polymerizable group-containing ester as the method of synthesizing a monomer which is equivalent to the repeating unit which is represented by General Formula (V) and the method is not particularly limited.

Specific examples of the repeating unit (a) which is represented by General Formula (V) will be given below; however, the present invention is not limited thereto.

In the specific examples, Rx and $Xa_1$ represent a hydrogen atom, $CH_3$, $CF_3$, or $CH_2OH$. Rxa and Rxb each independently represent an alkyl group with 1 to 4 carbon atoms, an aryl group with 6 to 18 carbon atoms, or an aralkyl group with 7 to 19 carbon atoms. Z represents a substituent group. p represents 0 or a positive integer and is preferably 0 to 2 and more preferably 0 or 1. In a case where a plurality of Zs are present, the Zs may be the same as each other or may be different. Examples of Z favorably include a group consisting only of hydrogen atoms and carbon atoms from the viewpoint of increasing the dissolution contrast with respect to the developer which contains an organic solvent before and after acid decomposition and, for example, a straight-chain or branched alkyl group or cycloalkyl group is preferable.

-continued
1
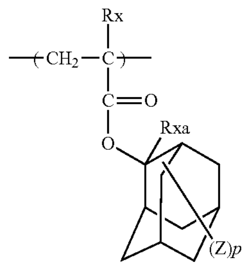
2
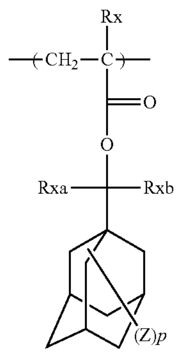
3
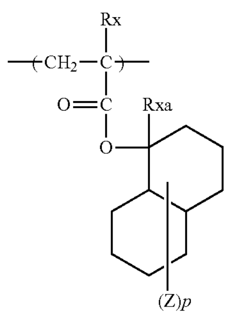
4
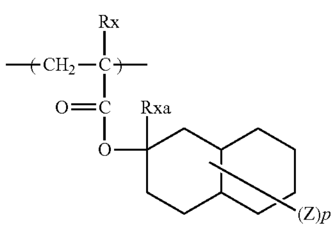
5
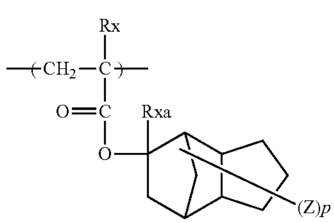
6
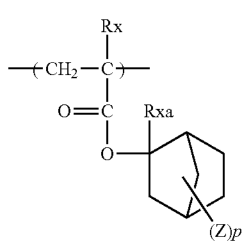
7
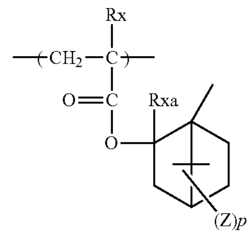
8
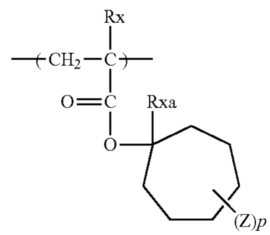
9
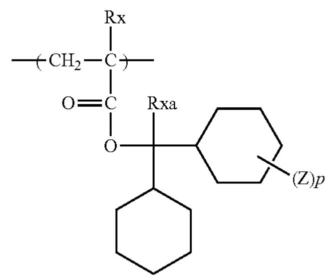
10
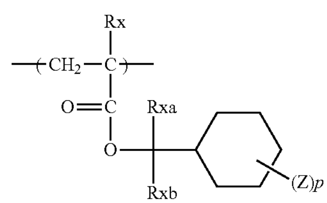
11
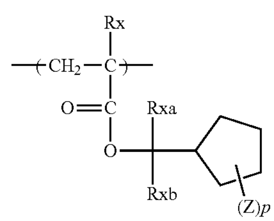
12
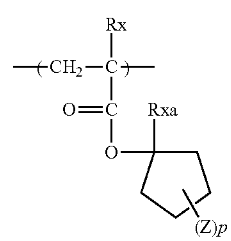
13
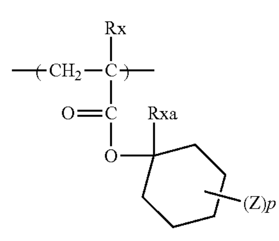

-continued
14
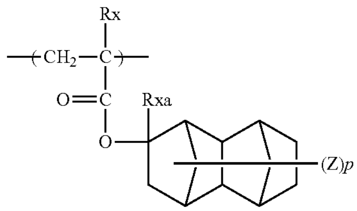
15
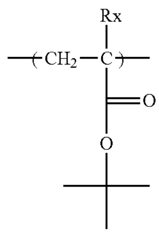
16
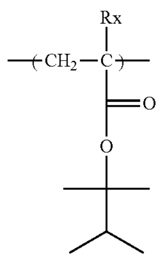
17
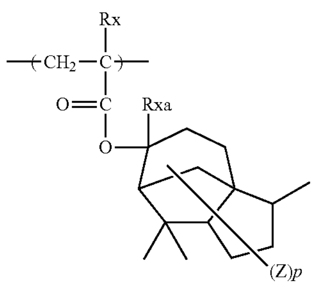
18
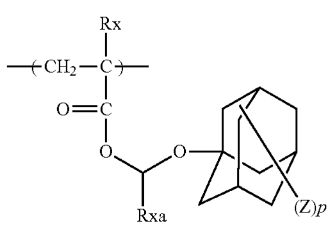
19
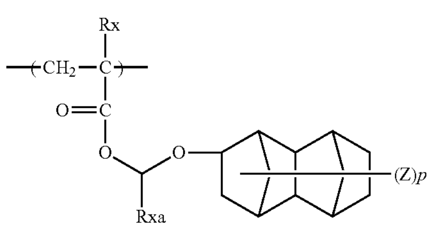
20
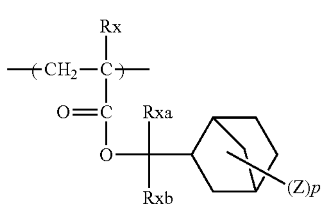
-continued
21
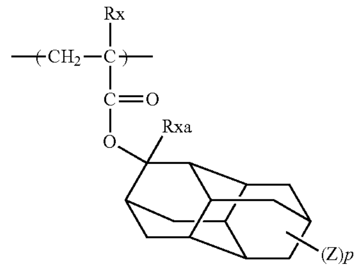
22
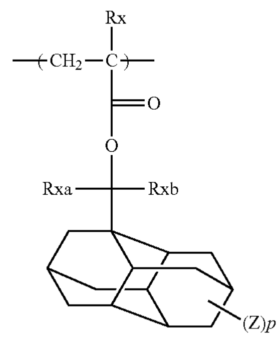
23
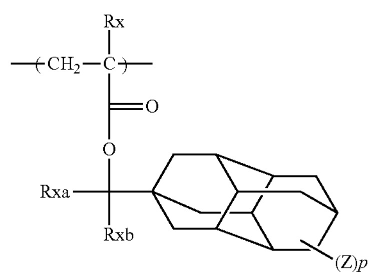
24
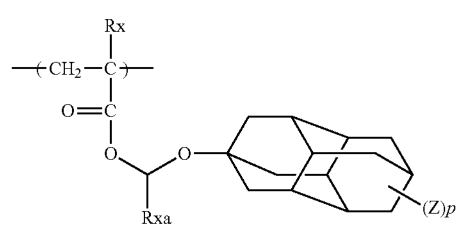
25
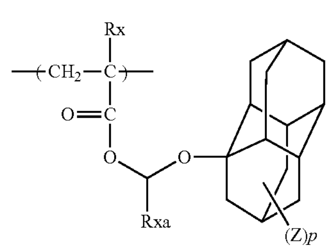

-continued
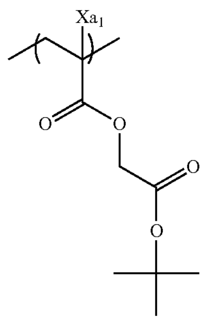
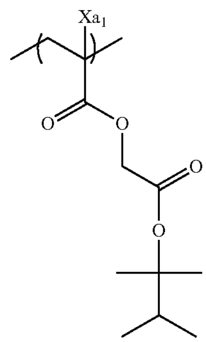
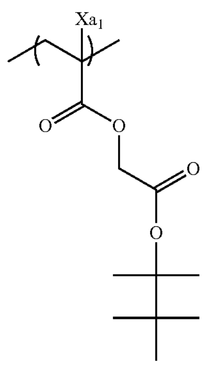
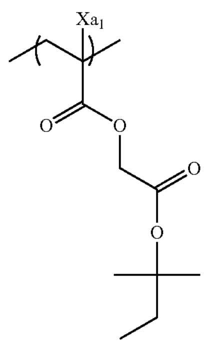
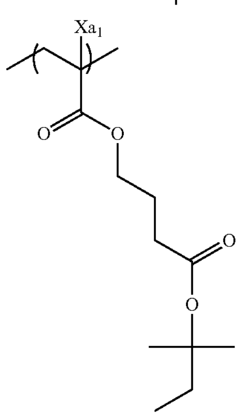
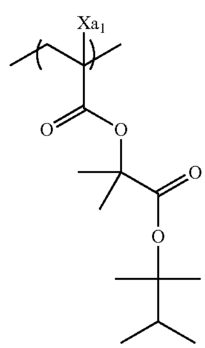
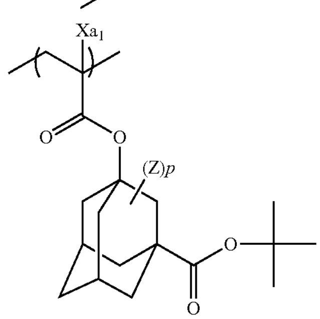
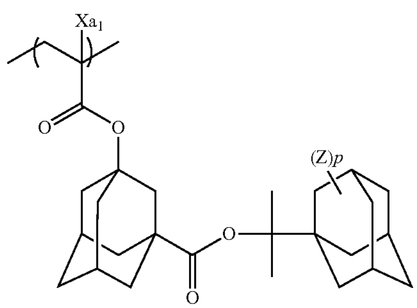
-continued
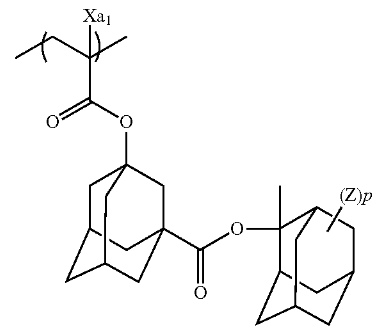
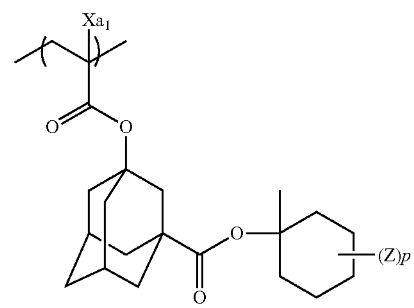
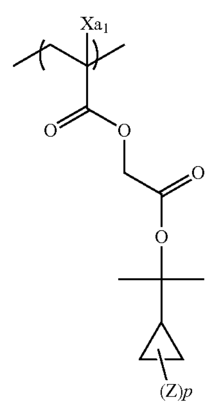
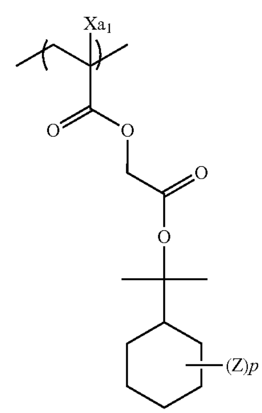
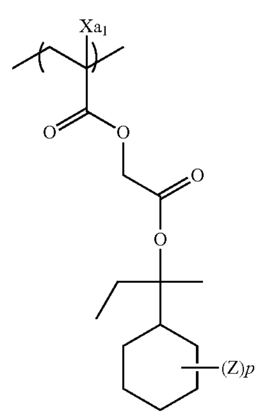
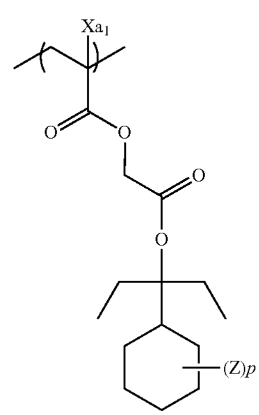

-continued
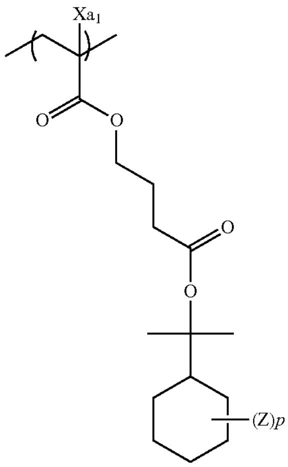
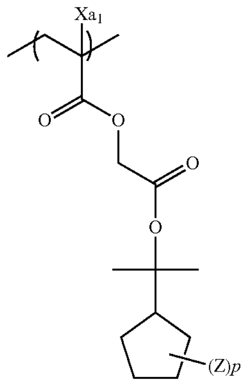
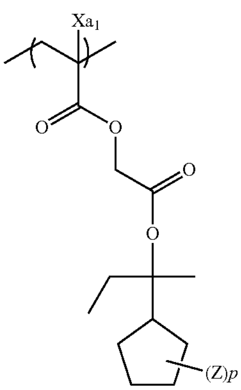
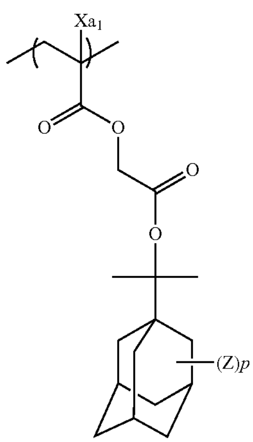
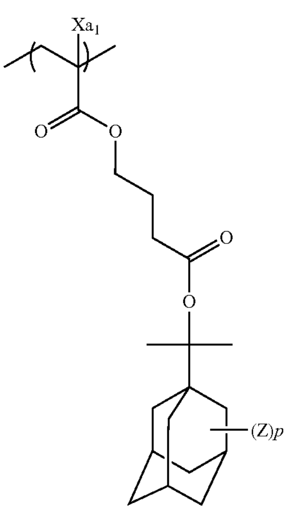
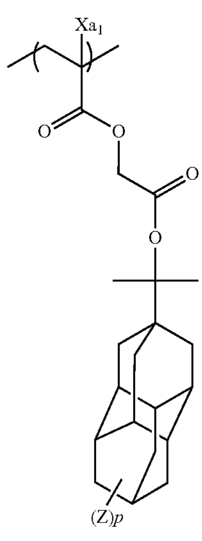
-continued
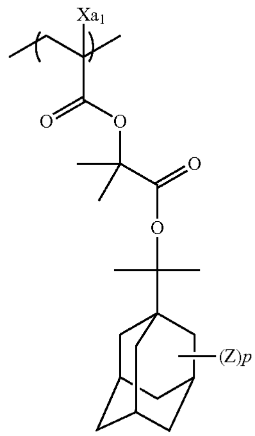
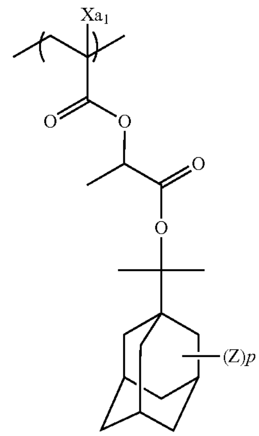
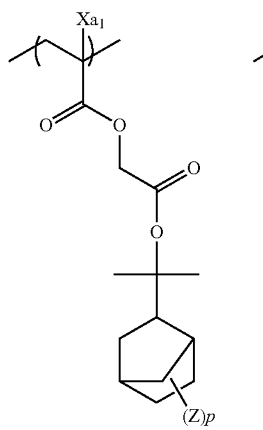
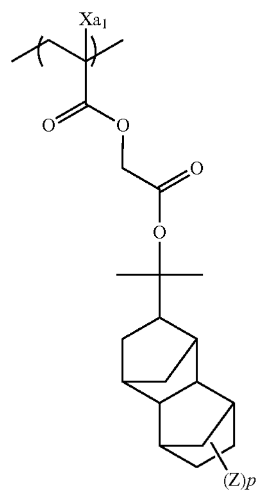
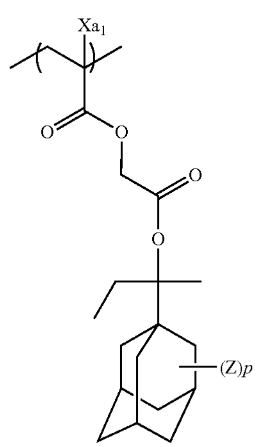
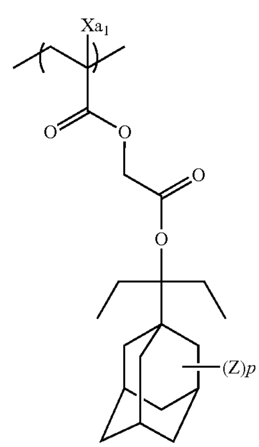

-continued
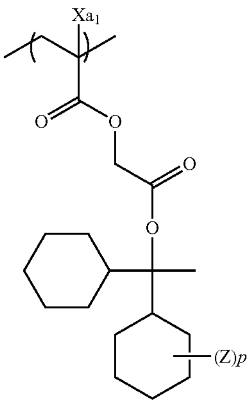
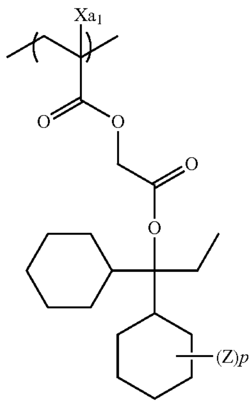
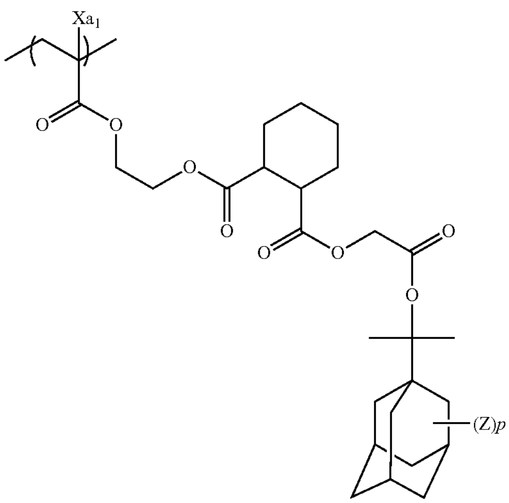
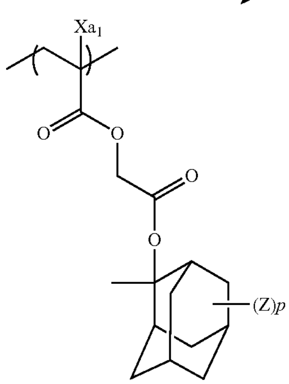
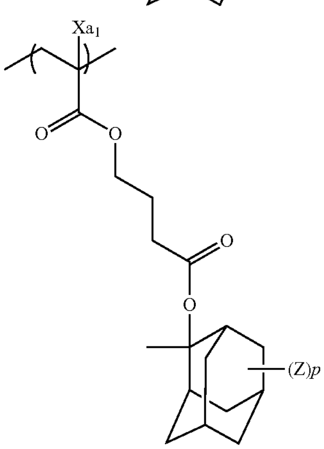
-continued
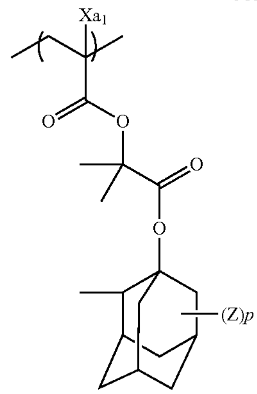
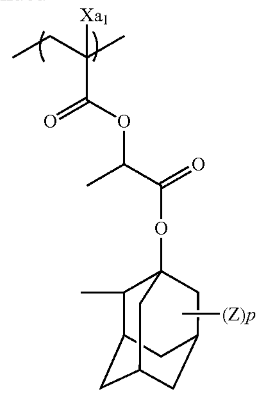
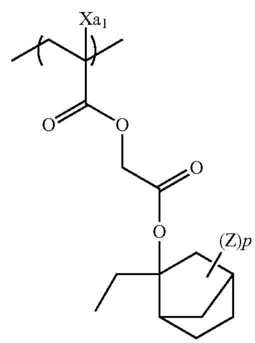
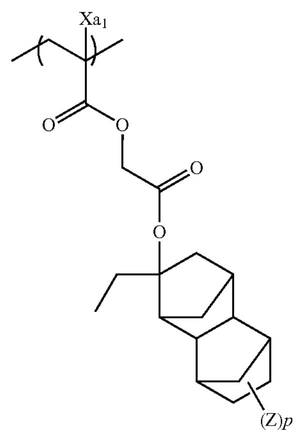
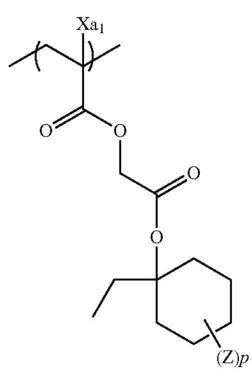
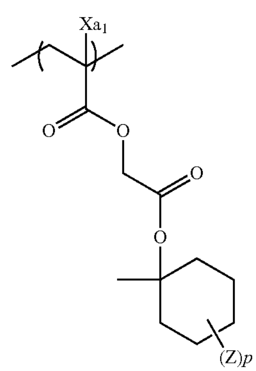
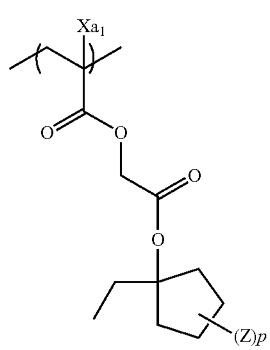
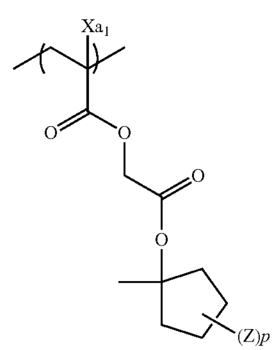

-continued
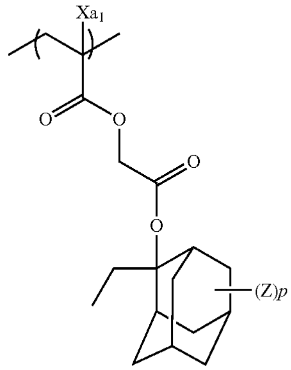
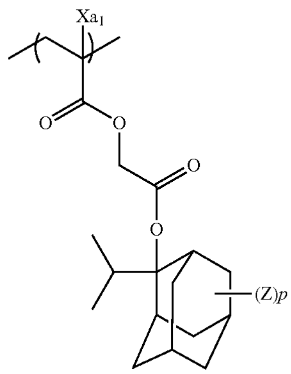
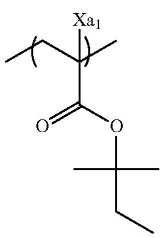
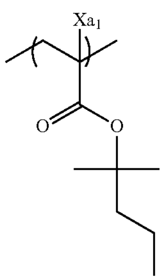
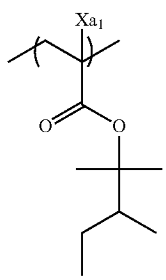
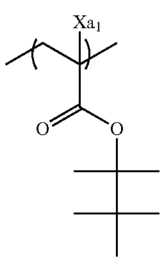
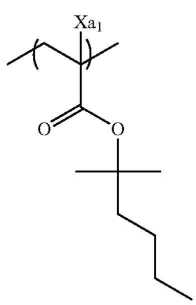
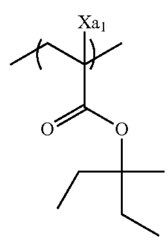
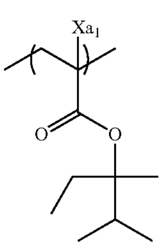
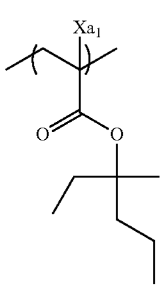
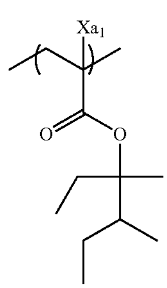
-continued
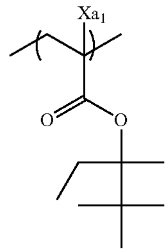
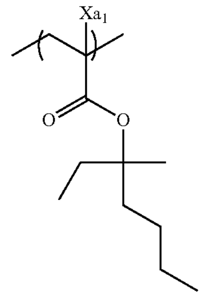
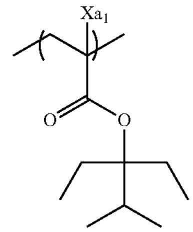
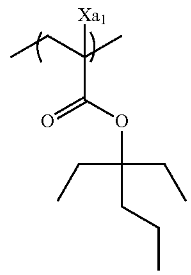
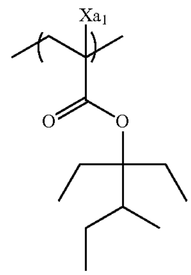
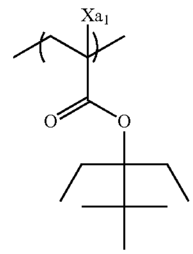
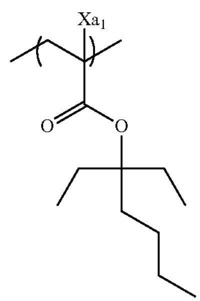
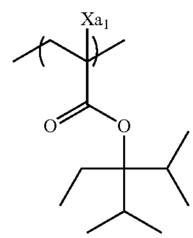
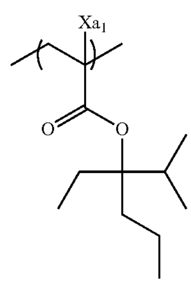
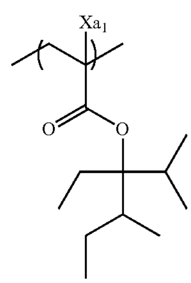
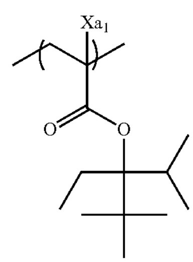
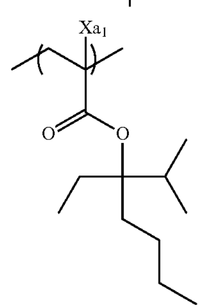
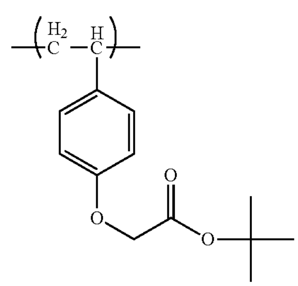
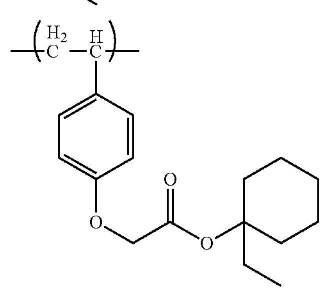

-continued

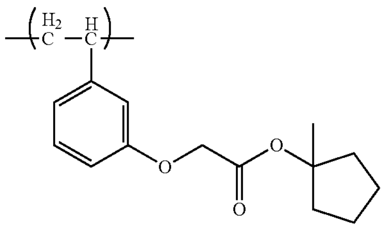

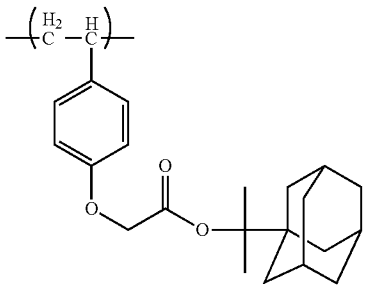

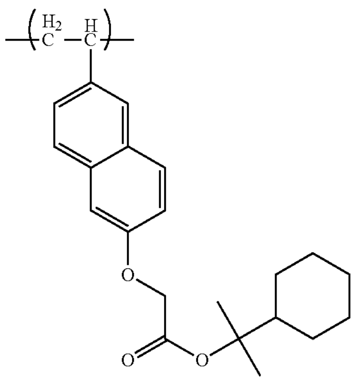

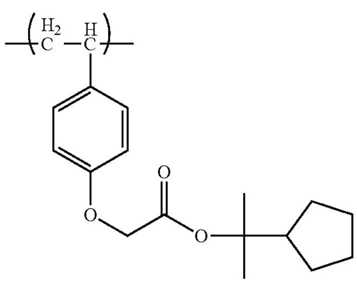

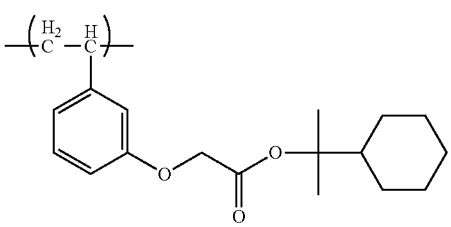

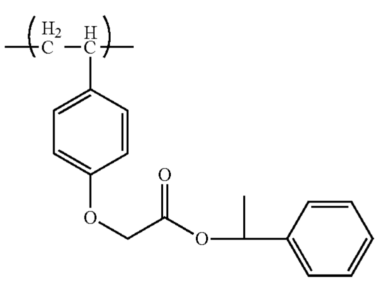

-continued

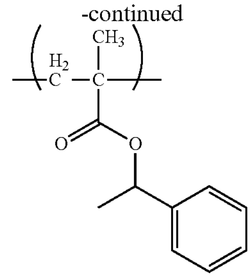

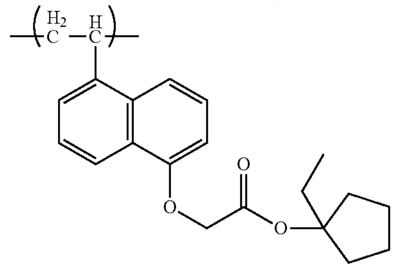

In addition, the resin (A) may include a repeating unit which is represented by General Formula (BZ) below as the repeating unit (a).

(BZ)

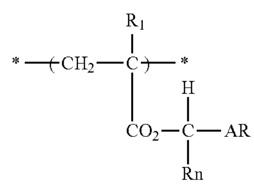

In General Formula (BZ), AR represents an aryl group. Rn represents an alkyl group, a cycloalkyl group, or an aryl group. Rn and AR may form a non-aromatic ring by bonding with each other.

$R_1$ represents a hydrogen atom, an alkyl group, a cycloalkyl group, a halogen atom, a cyano group, or an alkyloxycarbonyl group.

For description of the repeating unit which is represented by General Formula (BZ) (description of each group, the specific examples and the like of the repeating unit which is represented by General Formula (BZ)), refer to the description of the repeating unit which is represented by General Formula (BZ) according to paragraphs [0101] to [0131] of JP2012-208447A and this content is included in the present specification.

The repeating unit which has an acid-decomposable group described above may be one type or two or more types may be used together.

The content of repeating units which have an acid-decomposable group in the resin (A) (the total in a case where a plurality of types are contained) is preferably 5 mol % to 80 mol % with respect to all of the repeating units in the resin (A), more preferably 5 mol % to 75 mol %, and even more preferably 10 mol % to 65 mol %.

From the viewpoint of the sensitivity, resolving power, LWR, and pattern shape, the resin (A) is preferably a resin which has a repeating unit which is represented by General Formula (1) below and the repeating unit which is represented by General Formula (3) or (4), more preferably a resin which has a repeating unit which is represented by General Formula (1) below and the repeating unit which is represented by General Formula (3) in which $R_3$ in General Formula (3) is a group with 2 or more carbon atoms, and even more preferably a resin which has a repeating unit which is represented by General Formula (1) below and the repeating unit which is represented by General Formula (3) in which $R_3$ in General Formula (3) is a group which is represented by General Formula (3-2).

(b) Repeating Unit which is Represented by General Formula (1)

The resin (A) of the present invention preferably has a repeating unit which is represented by General Formula (1) below.

(1)

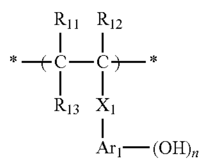

In General Formula (1), $R_{11}$, $R_{12}$, and $R_{13}$ each independently represent a hydrogen atom, an alkyl group, a cycloalkyl group, a halogen atom, a cyano group, or an alkoxycarbonyl group. $R_{13}$ may form a ring by bonding with $Ar_1$ and $R_{13}$ in this case represents an alkylene group.

$X_1$ represents a single bond or a divalent linking group.

$Ar_1$ represents an (n+1)valent aromatic ring group and represents an (n+2)valent aromatic ring group in a case of forming a ring by bonding with $R_{13}$.

n represents an integer of 1 to 4.

Specific examples of an alkyl group, a cycloalkyl group, a halogen atom, an alkoxycarbonyl group of $R_{11}$, $R_{12}$, and $R_{13}$ in Formula (1), and the substituent groups which these groups may have are the same as the specific examples described for each of the groups which are represented by $R_{61}$, $R_{62}$, and $R_{63}$ in General Formula (VI) described above.

$Ar_1$ represents an (n+1)valent aromatic ring group. A divalent aromatic ring group in a case where n is 1 may have a substituent group and preferable examples thereof include an arylene group with 6 to 18 carbon atoms such as a phenylene group, a tolylene group, a naphthylene group, and an anthrasilylene group, or an aromatic ring group which includes a hetero ring of thiophene, furan, pyrrole, benzothiophene, benzofuran, benzopyrrole, triazine, imidazole, benzimidazole, triazole, thiadiazole, thiazole, and the like.

Specific examples of an (n+1)valent aromatic ring group in a case where n is an integer of 2 or more favorably include a group formed by removing (n−1) arbitrary hydrogen atoms from the specific examples of the divalent aromatic ring group described above.

The (n+1)valent aromatic ring group may further have a substituent group.

Examples of a substituent group which the alkylene group and the (n+1)valent aromatic ring group described above may have include the alkoxy groups such as an alkyl group, an ethoxy group, a hydroxyethoxy group, a propoxy group, a hydroxypropoxy group, and a butoxy group, and aryl groups such as a phenyl group, which are described in $R_{61}$ to $R_{63}$ in General Formula (VI).

Examples of the divalent linking group of $X_1$ include —COO— or —$CONR_{64}$—.

Examples of the alkyl group of $R_{64}$ in —$CONR_{64}$— ($R_{64}$ represents a hydrogen atom and an alkyl group) which is represented by $X_1$ include the same examples as the alkyl group of $R_{61}$ to $R_{63}$.

$X_1$ is preferably a single bond, —COO—, or —CONH— and more preferably a single bond or —COO—.

$Ar_1$ is more preferably an aromatic ring group with 6 to 18 carbon atoms which may have a substituent group and particularly preferably a benzene ring group, a naphthalene ring group, or a biphenylene ring group.

The repeating unit (b) is preferably provided with a hydroxystyrene structure. That is, $Ar_1$ is preferably a benzene ring group.

n represents an integer of 1 to 4, preferably represents 1 or 2, and more preferably represents 1.

Specific examples of the repeating unit which is represented by General Formula (1) will be shown below; however, the present invention is not limited thereto. In the formula, a represents 1 or 2.

(B-1)

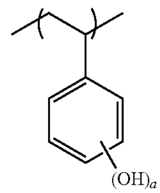

(B-2)

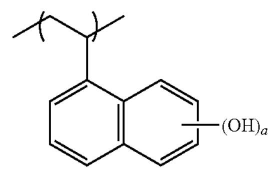

(B-3)

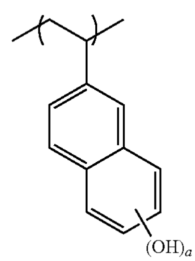

(B-4)

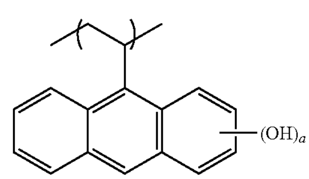

(B-5)

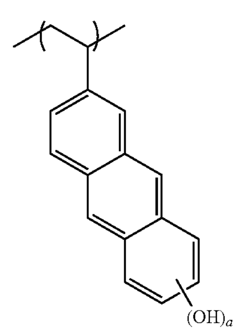

-continued
(B-6)
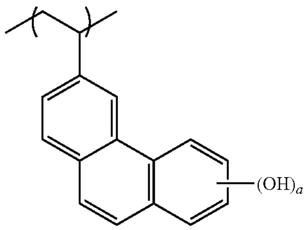
(B-7)
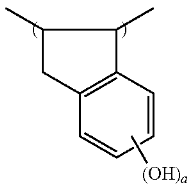
(B-8)
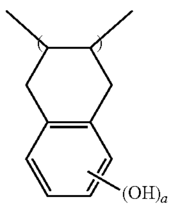
(B-9)
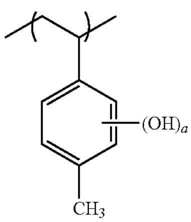
(B-10)
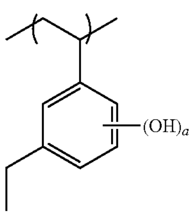
(B-11)
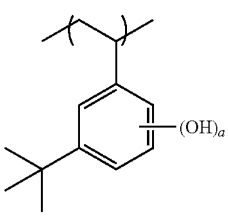
(B-12)
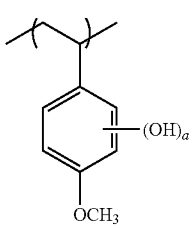
-continued
(B-13)
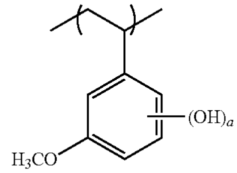
(B-14)
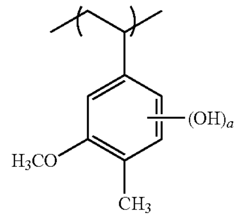
(B-15)
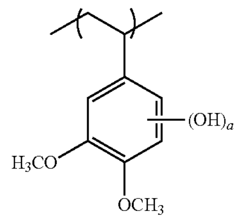
(B-16)
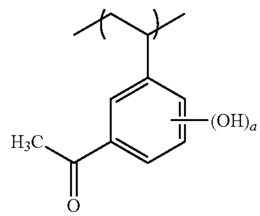
(B-17)
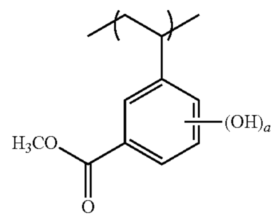
(B-18)
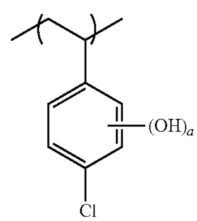
(B-19)
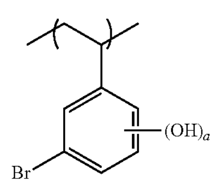

(B-20)
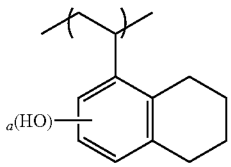
(B-21)
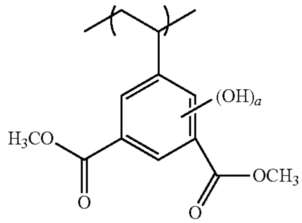
(B-22)
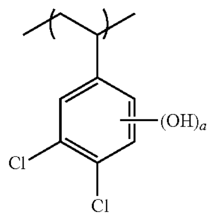
(B-23)
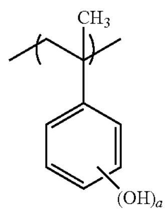
(B-24)
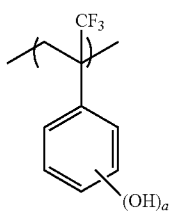
(B-25)
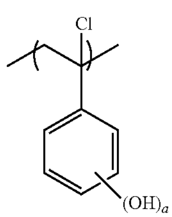
(B-26)
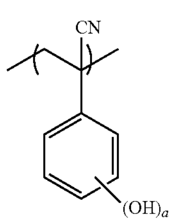
(B-27)
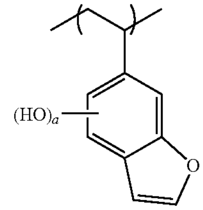
(B-28)
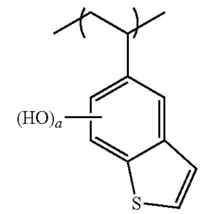
(B-29)
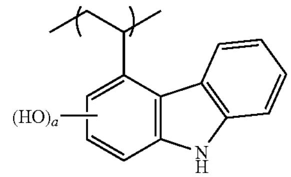
(B-30)
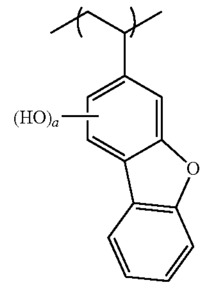
(B-31)
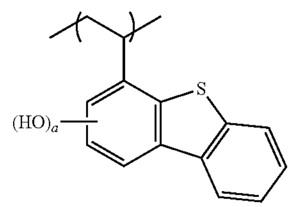
(B-32)
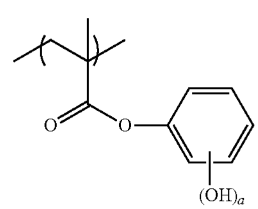
(B-33)
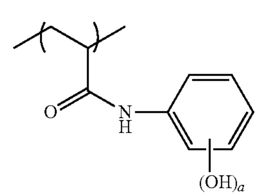

-continued (B-34)

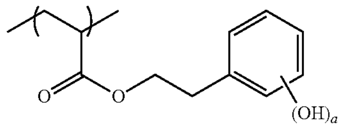

(B-35)

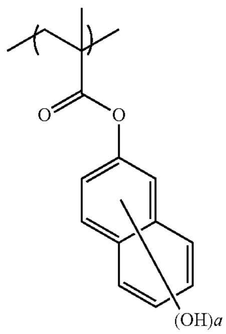

(B-36)

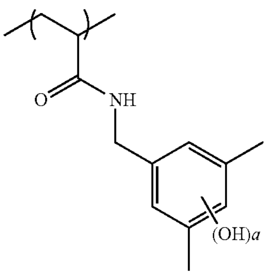

(B-37)

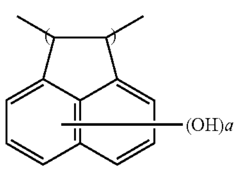

(B-38)

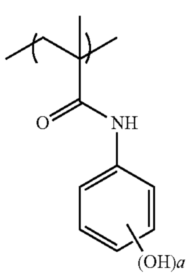

The resin (A) may include two or more types of repeating units which are represented by General Formula (1).

The content of the repeating units (the total thereof when plurality of types are contained) which are represented by General Formula (1) is preferably within a range of 3 mol % to 98 mol % with respect to all of the repeating units in the resin (A), more preferably within a range of 10 mol % to 80 mol %, and even more preferably within a range of 25 mol % to 70 mol %.

(c) Repeating Unit which has a Polar Group Other than the Repeating Unit which is Represented by General Formula (1)

The resin (A) preferably includes a repeating unit (c) which has a polar group. By including the repeating unit (c), for example, it is possible to improve the sensitivity of the composition which includes a resin. The repeating unit (c) is preferably a non-acid-decomposable repeating unit (that is, does not have an acid-decomposable group).

Examples of a "polar group", which the repeating unit (c) may include, include (1) to (4) below. Here, "electronegativity" below has the meaning of the Pauling value.

(1) Functional Group which Includes a Structure where an Oxygen Atom and an Atom of which a Difference in the Electronegativity with the Oxygen Atom is 1.1 or More are Bonded by a Single Bond Examples of the polar group include a group which includes a structure which is represented by O—H such as a hydroxy group.

(2) Functional Group which Includes a Structure where a Nitrogen Atom and an Atom of which a Difference in the Electronegativity with the Nitrogen Atom is 0.6 or More are Bonded by a Single Bond Examples of the polar group include a group which includes a structure which is represented by N—H such as an amino group.

(3) Functional Group which Includes a Structure where Two Atoms of which a Difference in the Electronegativity is 0.5 or More are Bonded by a Double Bond or a Triple Bond Examples of the polar group include a group which includes a structure which is represented by C≡N, C═O, N═O, S═O, or C═N.

(4) Functional Group which has an Ionic Site

Examples of the polar group include a group which has a site which is represented by N+ or S+.

Specific examples of a partial structure which the "polar group" may include will be given below.

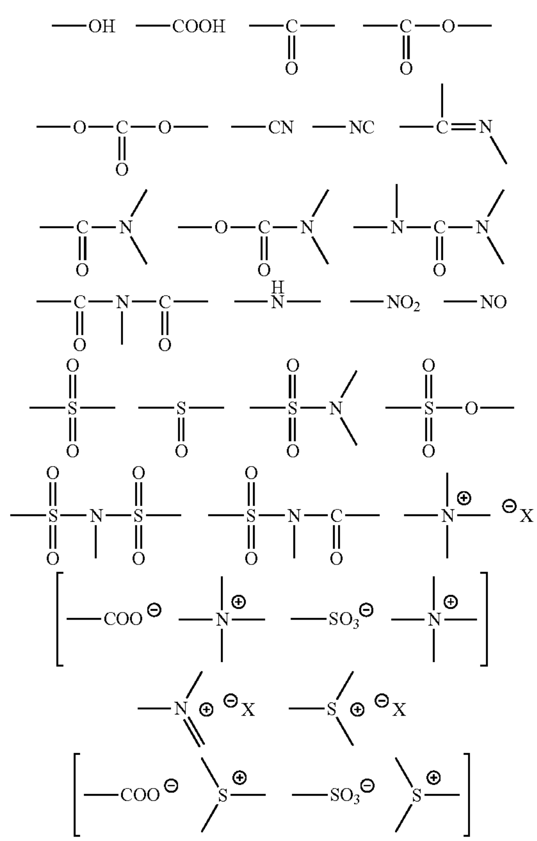

A polar group which the repeating unit (c) may include is preferably selected from a hydroxyl group, a cyano group, a lactone group, a sultone group, a carbonic acidic group, a sulfonic acidic group, an amide group, a sulfonamide group, an ammonium group, a sulfonium group, a carbonate group (—O—CO—O—) (for example, a cyclic carbonic ester structure and the like), and a group formed by combining two or more thereof, and particularly preferably an alcoholic hydroxy group, a cyano group, a lactone group, a sultone group, or a group which includes a cyanolactone structure.

When a repeating unit which is provided with an alcoholic hydroxy group is further contained in the resin, it is possible to further improve the exposure latitude (EL) of the composition which includes a resin.

When a repeating unit which is provided with a cyano group is further contained in the resin, it is possible to further improve the sensitivity of a composition which includes a resin.

When a repeating unit which is provided with a lactone group is further contained in a resin, it is possible to further improve the dissolution contrast with respect to the developer which includes an organic solvent. In addition, by doing this, it is also possible to further improve the dry etching resistance, the coating property, and the adhesion with a substrate of the composition which includes a resin.

When a repeating unit which is provided with a group which includes a lactone structure which has a cyano group is further contained in the resin, it is possible to further improve the dissolution contrast with respect to a developer which includes an organic solvent. In addition, by doing this, it is also possible to further improve the sensitivity, the dry etching resistance, the coating property, and the adhesion with a substrate of the composition which includes a resin. In addition, by doing this, it is possible to place the functions which are respectively provided by a cyano group and a lactone group on a single repeating unit and it is also possible to further increase the degree of freedom in terms of the design of the resin.

In a case where the polar group which the repeating unit (c) has is an alcoholic hydroxy group, it is preferably represented by at least one selected from a group formed of General Formulas (I-1H) to (I-10H) below. In particular, the polar group is more preferably represented by at least one selected from a group consisting of General Formulas (I-1H) to (I-3H) below and it is even more preferably represented by General Formula (I-1H) below.

(I-1H)

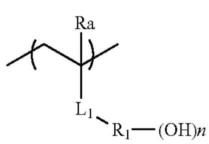

(I-2H)

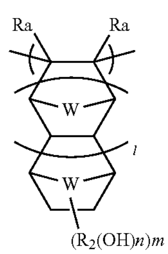

(I-3H)

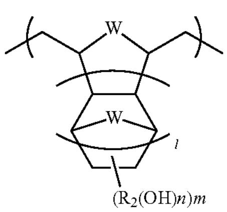

-continued (I-4H)

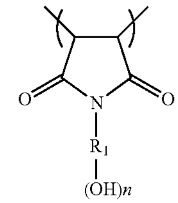

(I-5H)

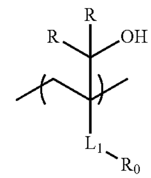

(I-6H)

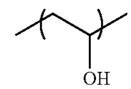

(I-7H)

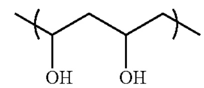

(I-8H)

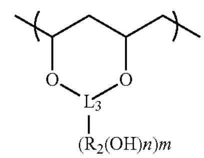

(I-9H)

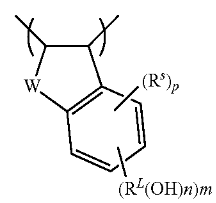

(I-10H)

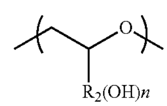

In the formula, Ras each independently represents a hydrogen atom, an alkyl group, or a group which is represented by $—CH_2—O—Ra_2$. Here, $Ra_2$ represents a hydrogen atom, an alkyl group, or an acyl group.

$R_1$ represents an (n+1)valent organic group.

$R_2$ each independently represents a single bond or an (n+1)valent organic group in a case where m≥2.

W represents a methylene group, an oxygen atom, or a sulfur atom.

n and m represent an integer of 1 or more. Here, in a case where $R_2$ represents a single bond in General Formula (I-2H), (I-3H), or (I-8H), n is 1.

l represents an integer of 0 or more.

$L_1$ represents a linking group which is represented by —COO—, —OCO—, —CONH—, —O—, —Ar—, $—SO_3—$, or $—SO_2NH—$. Here, Ar represents a divalent aromatic ring group.

Rs each independently represents a hydrogen atom or an alkyl group.

$R_0$ represents a hydrogen atom or an organic group.

$L_3$ represents an (m+2)valent linking group.

$R^L$'s each independently represents an (n+1)valent linking group in a case where m≥2.

$R^S$s each independently represents a substituent group in a case where p≥2. In a case where p≥2, a plurality of $R^S$s may form a ring by bonding with each other.

p represents an integer of 0 to 3.

Ra represents a hydrogen atom, an alkyl group, or a group which is represented by —$CH_2$—O—$Ra_2$. Ra is preferably a hydrogen atom or an alkyl group with 1 to 10 carbon atoms and more preferably a hydrogen atom or a methyl group.

W represents a methylene group, an oxygen atom, or a sulfur atom. W is preferably a methylene group or an oxygen atom.

$R_1$ represents an (n+1)valent organic group. $R_1$ is preferably a non-aromatic hydrocarbon group. In this case, $R_1$ may be a chain hydrocarbon group or may be an alicyclic hydrocarbon group. $R_1$ is more preferably an alicyclic hydrocarbon group.

$R_2$ represents a single bond or an (n+1)valent organic group. $R_2$ is preferably a single bond or a non-aromatic hydrocarbon group. In this case, $R_2$ may be a chain hydrocarbon group or may be an alicyclic hydrocarbon group.

In a case where $R_1$ and/or $R_2$ is a chain hydrocarbon group, the chain hydrocarbon group may be in a straight-chain form or may be in a branched chain form. In addition, the number of carbon atoms of the chain hydrocarbon group is preferably 1 to 8. For example, in a case where $R_1$ and/or $R_2$ is an alkylene group, $R_1$ and/or $R_2$ is preferably a methylene group, an ethylene group, an n-propylene group, an isopropylene group, an n-butylene group, an isobutylene group, or a sec-butylene group.

In a case where $R_1$ and/or $R_2$ is an alicyclic hydrocarbon group, the alicyclic hydrocarbon group may be monocyclic or may be polycyclic. The alicyclic hydrocarbon group is provided with, for example, a monocyclo, bicyclo, tricyclo, or tetracyclo structure. The number of carbon atoms of the alicyclic hydrocarbon group is generally 5 or more, preferably 6 to 30, and more preferably 7 to 25.

Examples of the alicyclic hydrocarbon group include alicyclic hydrocarbon groups which are provided with partial structures exemplified below. Each of the partial structures may have a substituent group. In addition, in each of the partial structures, a methylene group (—$CH_2$—) may be substituted with an oxygen atom (—O—), a sulfur atom (—S—), a carbonyl group [—C(═O)—], a sulfonyl group [—S(═O)$_2$—], a sulfinyl group [—S(═O)—], or an imino group [—N(R)—] (R is a hydrogen atom or an alkyl group).

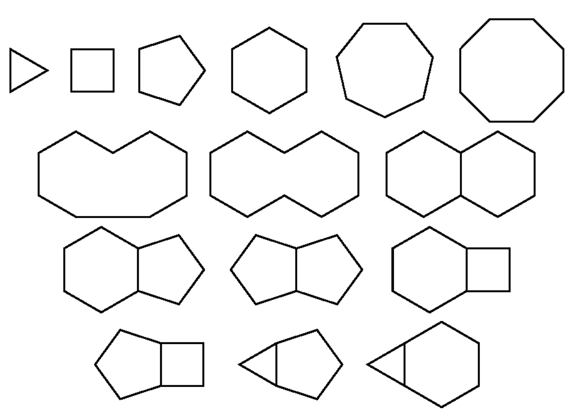

-continued

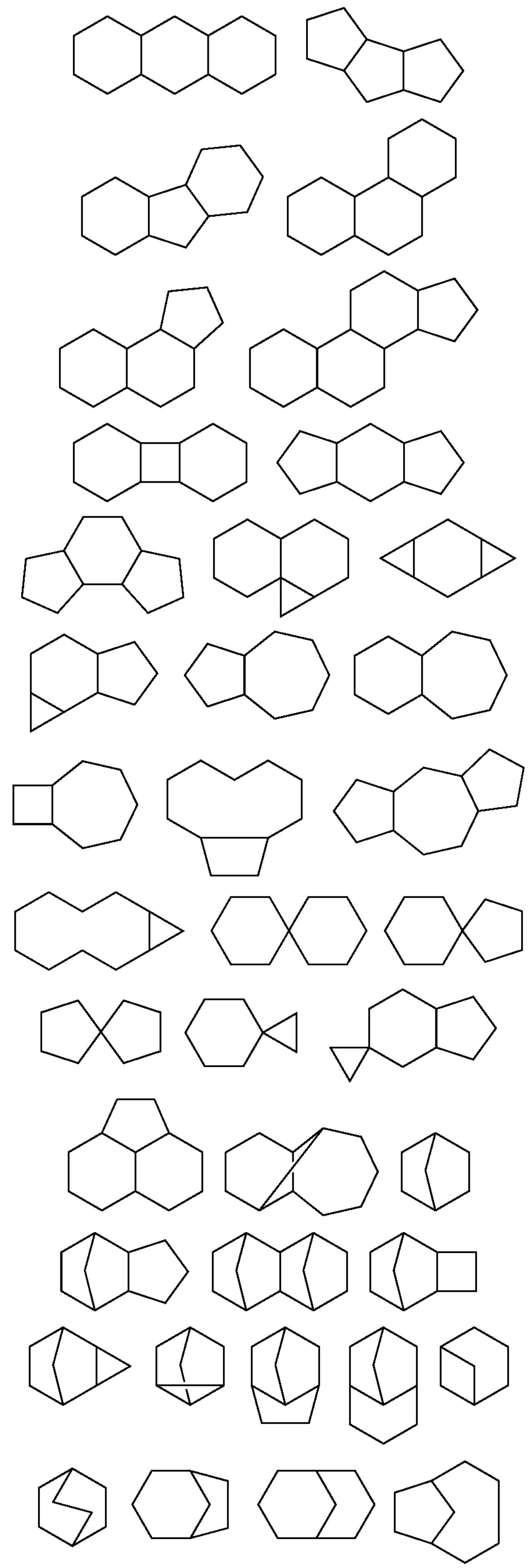

-continued

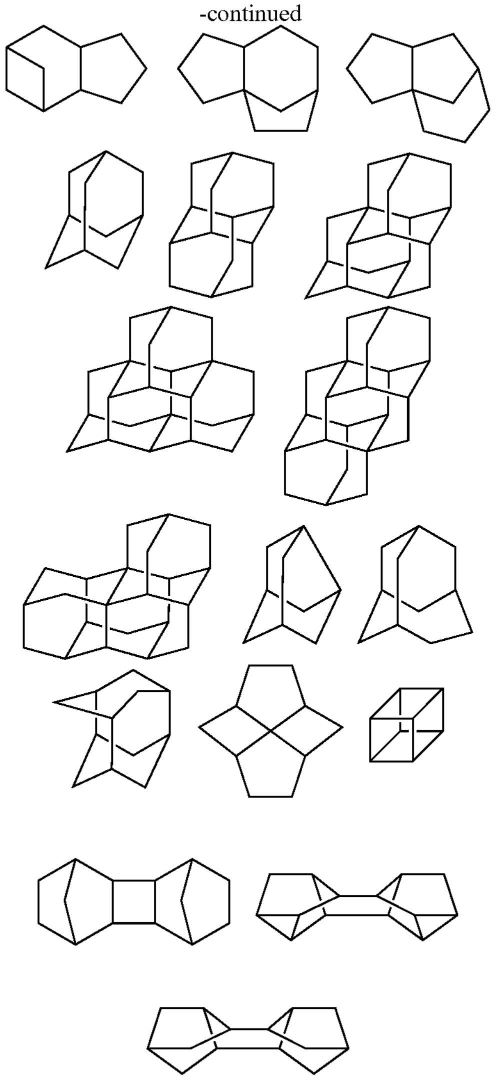

For example, in a case where $R_1$ and/or $R_2$ is a cycloalkylene group, $R_1$ and/or $R_2$ is preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group, or a cyclododecanylene group and more preferably an adamantylene group, a norbornylene group, a cyclohexylene group, a cyclopentylene group, a tetracyclododecanylene group, or a tricyclodecanylene group.

A non-aromatic hydrocarbon group of $R_1$ and/or $R_2$ may have a substituent group. Examples of the substituent group include an alkyl group with 1 to 4 carbon atoms, a halogen atom, a hydroxy group, an alkoxy group with 1 to 4 carbon atoms, a carboxy group, and an alkoxycarbonyl group with 2 to 6 carbon atoms. The alkyl group, the alkoxy group, and the alkoxycarbonyl group described above may further have a substituent group. Examples of the substituent group include a hydroxy group, a halogen atom, and an alkoxy group.

$L_1$ represents a linking group which is represented by —COO—, —OCO—, —CONH—, —O—, —Ar—, —$SO_3$—, or —$SO_2$NH—. Here, Ar represents a divalent aromatic ring group. $L_1$ is preferably a linking group which is represented by —COO—, —CONH—, or —Ar— and more preferably a linking group which is represented by —COO— or —CONH—.

R represents a hydrogen atom or an alkyl group. The alkyl group may be in a straight-chain form or may be in a branched chain form. The number of carbon atoms of the alkyl group is preferably 1 to 6 and more preferably 1 to 3. R is preferably a hydrogen atom or a methyl group and more preferably a hydrogen atom.

$R_0$ represents a hydrogen atom or an organic group. Examples of the organic group include an alkyl group, a cycloalkyl group, an aryl group, an alkynyl group, and an alkenyl group. $R_0$ is preferably a hydrogen atom or an alkyl group and more preferably a hydrogen atom or a methyl group.

$L_3$ represents an (m+2)valent linking group. That is, $L_3$ represents a trivalent or higher linking group. Examples of the linking group include a group which corresponds to the specific examples below.

$R^L$ represents an (n+1)valent linking group. That is, $R^L$ represents a divalent or higher linking group. Examples of the linking group include an alkylene group, a cycloalkylene group, and a group which corresponds to the specific examples below. $R^L$ may form a ring structure by bonding with each other or by bonding with $R^S$ below.

$R^S$ represents a substituent group. Examples of the substituent group include an alkyl group, an alkenyl group, an alkynyl group, an aryl group, an alkoxy group, an acyloxy group, an alkoxycarbonyl group, and a halogen atom.

n is an integer of 1 or more. n is preferably an integer of 1 to 3 and more preferably 1 or 2. In addition, when n is 2 or more, it is possible to further improve the dissolution contrast with respect to a developer which includes an organic solvent. Therefore, by doing this, it is possible to further improve the limit resolving power and roughness characteristics.

m is an integer of 1 or more. m is preferably an integer of 1 to 3 and more preferably 1 or 2.

l is an integer of 0 or more. l is preferably 0 or 1.

p is an integer of 0 to 3.

When using a repeating unit which is provided with a group which decomposes due to an effect of an acid and generates an alcoholic hydroxy group together with a repeating unit which is represented by at least one selected from a group formed of General Formulas (I-1H) to (I-10H) above, it is possible to improve the exposure latitude (EL) without deteriorating other performances, for example, by suppressing acid diffusion through the alcoholic hydroxy group and increasing the sensitivity through a group which decomposes due to an effect of an acid and generates an alcoholic hydroxy group.

The content ratio of repeating units which have an alcoholic hydroxy group is preferably 1 mol % to 60 mol % with respect to all of the repeating units in the resin (A), more preferably 3 mol % to 50 mol %, and even more preferably 5 mol % to 40 mol %.

Specific examples of the repeating unit which is represented by any of General Formulas (I-1H) to (I-10H) will be shown below. Here, in the specific examples, Ra is the same as in General Formulas (I-1H) to (I-10H).

-continued
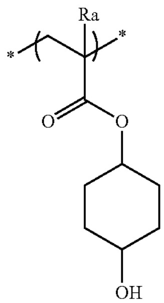
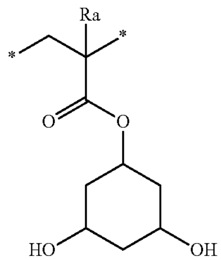
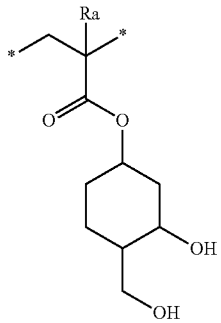
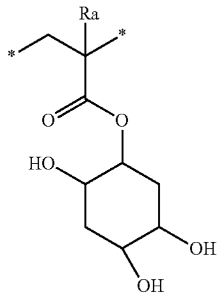
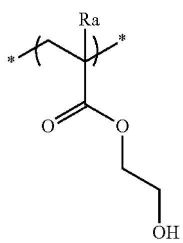
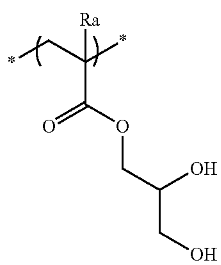
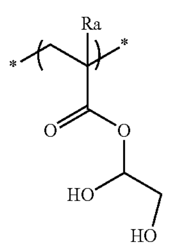
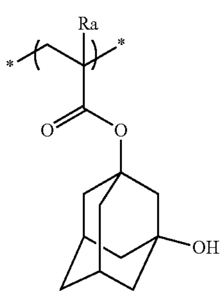
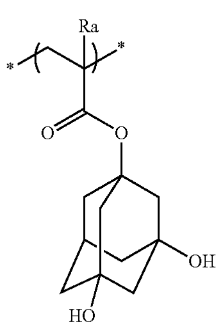
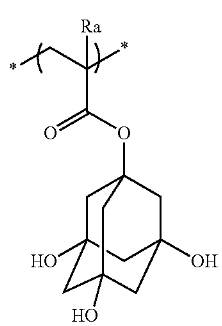
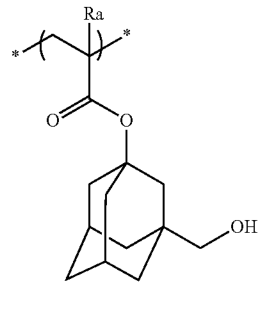
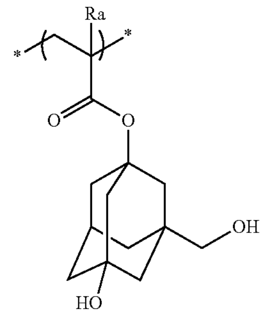
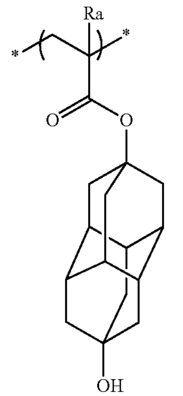
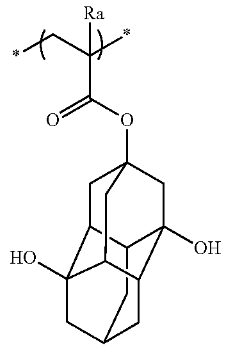
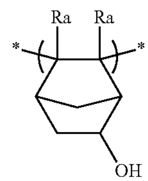
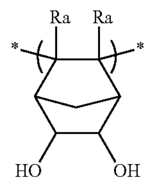
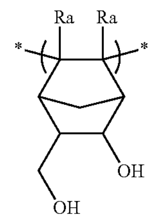
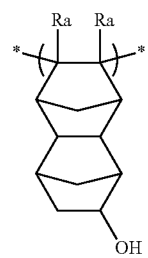
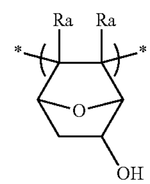
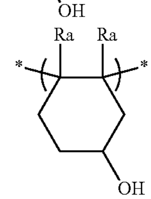
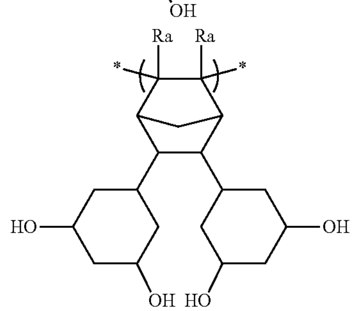
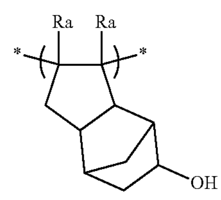
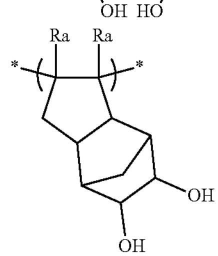
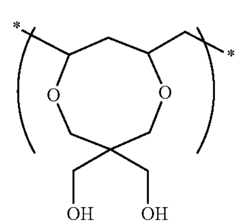

In a case where a polar group which the repeating unit (c) has is an alcoholic hydroxy group or a cyano group, examples of one aspect of a preferable repeating unit include a repeating unit which has an alicyclic hydrocarbon structure which is substituted with a hydroxyl group or a cyano group. At this time, it is preferable not to have an acid-decomposable group. An alicyclic hydrocarbon structure in an alicyclic hydrocarbon structure which is substituted with a hydroxyl group or a cyano group is preferably an adamantyl group, a diamantyl group, and a norbornane group. A preferable alicyclic hydrocarbon structure which is substituted with a hydroxyl group or a cyano group is preferably a partial structure which is represented by General Formulas (VIIa) to (VIIc) below. Due to this, the substrate adhesion and development solution compatibility are improved.

(VIIa)

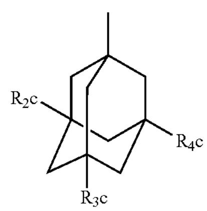

(VIIb)

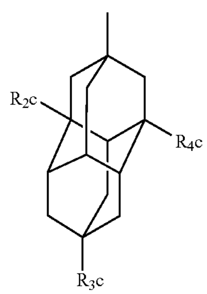

(VIIc)

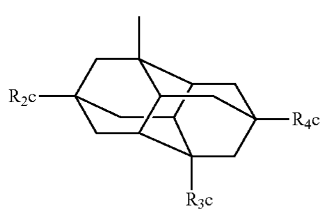

In General Formulas (VIIa) to (VIIc), $R_2c$ to $R_4c$ each independently represents a hydrogen atom, a hydroxyl group, or a cyano group. However, at least one of $R_2c$ to $R_4c$ represents a hydroxyl group. One or two out of $R_2c$ to $R_4c$ are preferably a hydroxyl group and the remainder are hydrogen atoms. In General Formula (VIIa), two out of $R_2c$ to $R_4c$ are more preferably hydroxyl groups and the remainder are hydrogen atoms.

Examples of the repeating unit which has a partial structure which is represented by General Formulas (VIIa) to (VIIc) include repeating units which are represented by General Formulas (AIIa) to (AIIc) below.

(AIIa)

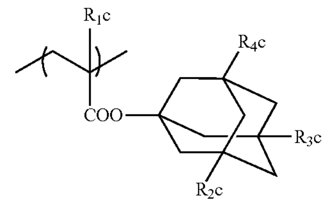

(AIIb)

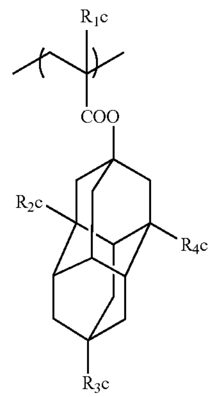

(AIIc)

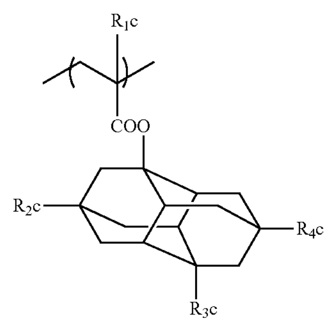

In General Formulas (AIIa) to (AIIc), $R_1c$ represents a hydrogen atom, a methyl group, a trifluoromethyl group, or a hydroxy methyl group.

$R_2c$ to $R_4c$ are the same as $R_2c$ to $R_4c$ in General Formulas (VIIa) to (VIIc).

The resin (A) may or may not contain a repeating unit which has a hydroxyl group or a cyano group; however, when contained, the content of the repeating units which have a hydroxyl group or a cyano group is preferably 1 mol % to 60 mol % with respect to all of the repeating units in the resin (A), more preferably 3 mol % to 50 mol %, and even more preferably 5 mol % to 40 mol %.

Specific examples of the repeating unit which has a hydroxyl group or a cyano group will be given below; however, the present invention is not limited thereto.

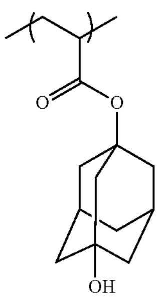
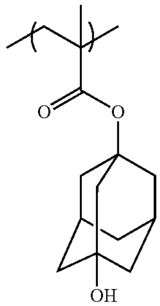
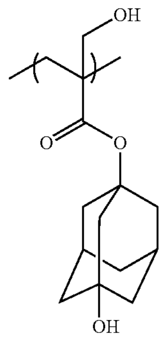
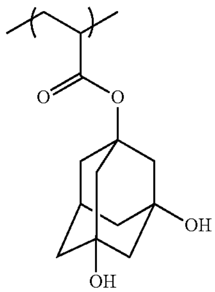
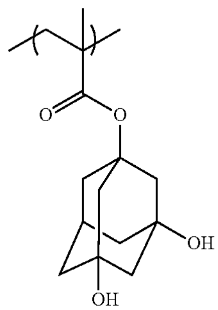
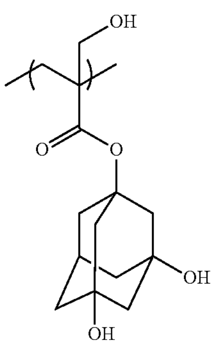
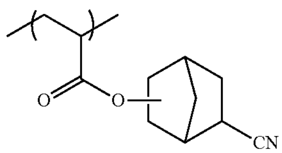
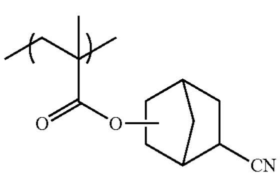
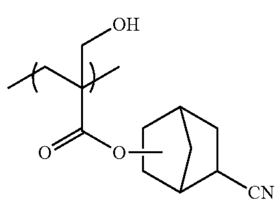
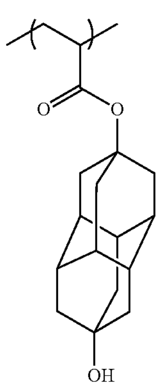
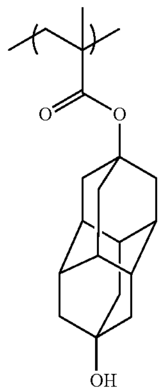

-continued

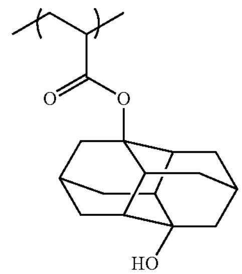
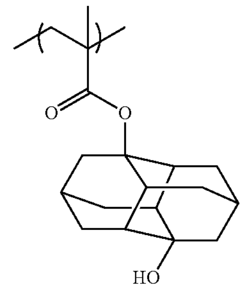

The repeating unit (c) may be a repeating unit which has a lactone structure as a polar group.

The repeating unit which has a lactone structure is more preferably a repeating unit which is represented by General Formula (AII) below.

(AII)

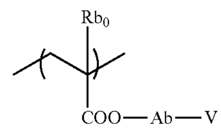

In General Formula (AII), $Rb_0$ represents a hydrogen atom, a halogen atom, or an alkyl group (preferably with 1 to 4 carbon atoms) which may have a substituent group.

Examples of a preferable substituent group which the alkyl group of $Rb_0$ may have include a hydroxyl group and a halogen atom. Examples of the halogen atom of $Rb_0$ include a fluorine atom, a chlorine atom, a bromine atom, and an iodine atom.

$Rb_0$ is preferably a hydrogen atom, a methyl group, a hydroxy methyl group, and a trifluoromethyl group and particularly preferably a hydrogen atom and a methyl group.

Ab represents a single bond, an alkylene group, a divalent linking group which has a monocyclic or polycyclic cycloalkyl structure, an ether bond, an ester bond, a carbonyl group, or a divalent linking group combining the above. Ab is preferably a single bond or a divalent linking group which is represented by $-Ab_1-CO_2-$.

$Ab_1$ is a straight-chain or branched alkylene group and a monocyclic or polycyclic cycloalkylene group and preferably a methylene group, an ethylene group, a cyclohexylene group, an adamantylene group, and a norbornylene group.

V represents a group which has a lactone structure.

As the group which has a lactone structure, it is possible to use any group as long as the group has a lactone structure; however, a ring lactone structure with 5 to 7 members is preferable and a lactone structure where another ring structure is condensed in a form in which a bicyclo structure and a spiro structure are formed in a ring lactone structure with 5 to 7 members is preferable. It is more preferable to have a repeating unit which has a lactone structure which is represented by any of General Formulas (LC1-1) to (LC1-17) below. In addition, the lactone structure may be directly bonded with the main chain. Preferable lactone structures are (LC1-1), (LC1-4), (LC1-5), (LC1-6), (LC1-8), (LC1-13), and (LC1-14).

-continued
LC1-1
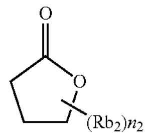
LC1-2
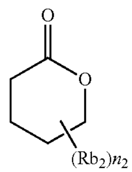
LC1-3
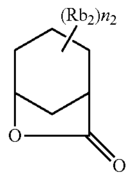
LC1-4
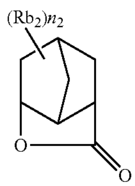
LC1-5
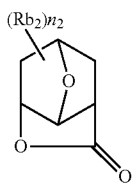
LC1-6
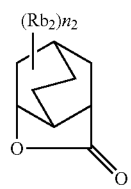
LC1-7
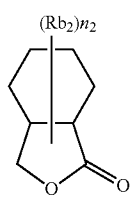
LC1-8
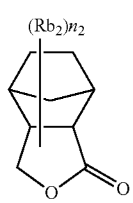
LC1-9
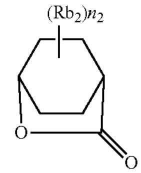
LC1-10
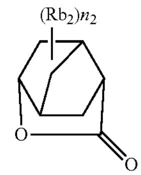
LC1-11
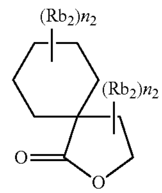
LC1-12
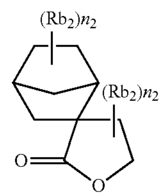
LC1-13
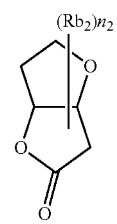
LC1-14
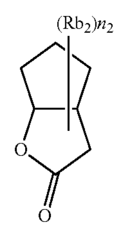
LC1-15
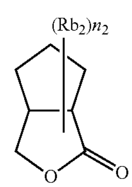
LC1-16
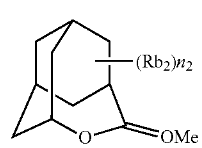

-continued

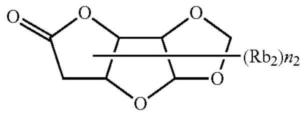

LC1-17

The lactone structure portion may or may not have a substituent group ($Rb_2$). Examples of a preferable substituent group ($Rb_2$) include an alkyl group with 1 to 8 carbon atoms, a monovalent cycloalkyl group with 4 to 7 carbon atoms, an alkoxy group with 1 to 8 carbon atoms, an alkoxycarbonyl group with 2 to 8 carbon atoms, a carboxyl group, a halogen atom, a hydroxyl group, a cyano group, an acid-decomposable group, and the like. An alkyl group with 1 to 4 carbon atoms, a cyano group, and an acid-decomposable group are more preferable. $n_2$ represents an integer of 0 to 4. When $n_2$ is 2 or more, a plurality of the present substituent groups ($Rb_2$) may be the same or may be different and, additionally, a plurality of the substituent groups ($Rb_2$) which are present may form a ring by bonding with each other.

Normally, optical isomers are present in a repeating unit which has a lactone group; however, any optical isomers may be used. In addition, one type of optical isomer may be used individually or a plurality of optical isomers may also be mixed and used. In a case of mainly using one type of optical isomer, the optical purity (ee) thereof is preferably 90% or more and more preferably 95% or more.

The resin (A) may or may not contain a repeating unit which has a lactone structure; however, in a case where a repeating unit which has a lactone structure is contained, the content of the repeating units in the resin (A) is preferably in a range of 1 mol % to 70 mol % with respect to all of the repeating units, more preferably in a range of 3 mol % to 65 mol %, and even more preferably in a range of 5 mol % to 60 mol %.

Specific examples of the repeating unit which has a lactone structure in the resin (A) will be shown below; however, the present invention is not limited thereto. In the formulas, Rx represents H, $CH_3$, $CH_2OH$, or $CF_3$.

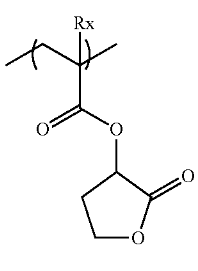
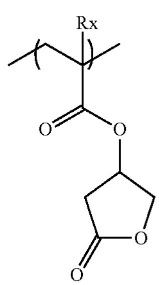
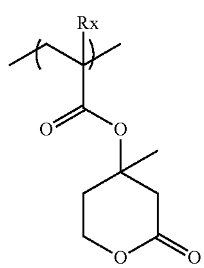
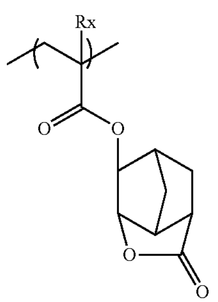
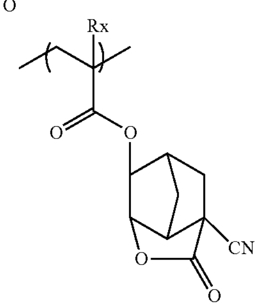

-continued

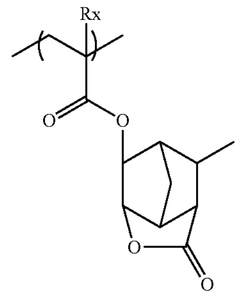
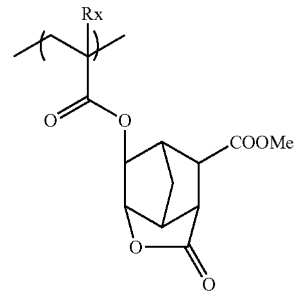
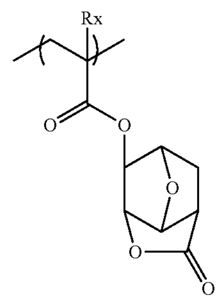
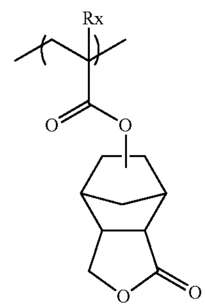
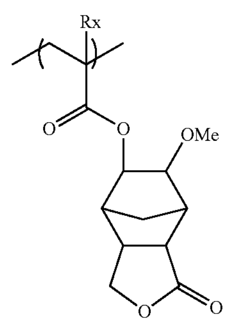
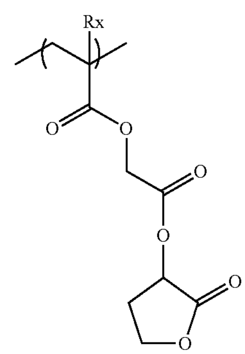
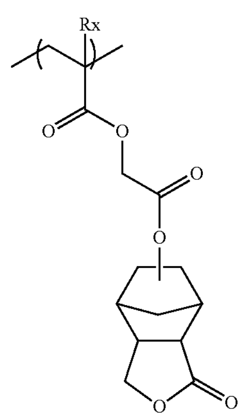
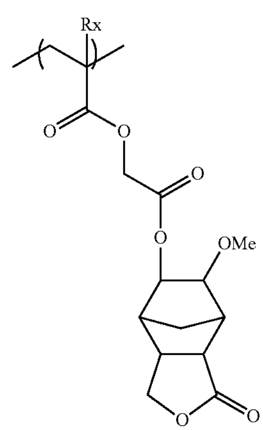

-continued

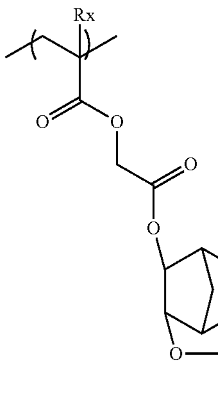

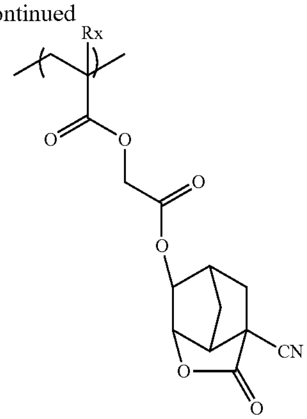

In addition, as the sultone group of the resin (A), General Formulas (SL-1) and (SL-2) below are preferable. $Rb_2$ and $n_2$ in the formulas are the same as in General Formulas (LC1-1) to (LC1-17) described above.

SL1-1

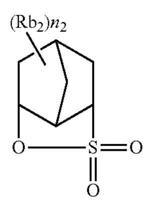

SL1-2

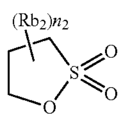

The repeating unit which includes the sultone group of the resin (A) is preferably a repeating unit where the lactone group in the repeating unit which has the lactone group described above is substituted with a sultone group.

In addition, an aspect where a polar group which the repeating unit (c) may have is an acidic group is also a particularly preferable aspect. Examples of a preferable acidic group include a phenolic hydroxyl group, a carbonic acidic group, a sulfonic acidic group, a fluorinated alcohol group (for example, a hexafluoroisopropanol group), a sulfonamide group, a sulfonylimide group, an (alkyl sulfonyl) (alkyl carbonyl)methylene group, an (alkyl sulfonyl) (alkyl carbonyl)imide group, a bis(alkyl carbonyl)methylene group, a bis(alkyl carbonyl)imide group, a bis(alkyl sulfonyl)methylene group, a bis(alkyl sulfonyl)imide group, a tris(alkyl carbonyl)methylene group, and a tris(alkyl sulfonyl)methylene group, and the like. The repeating unit (c) is more preferably a repeating unit which has a carboxyl group among these. As the repeating unit which has an acidic group, a repeating unit where an acidic group is directly bonded with a main chain of a resin such as a repeating unit by acrylic acid and methacrylic acid, a repeating unit where an acidic group is bonded with a main chain of a resin via a linking group, or any repeating unit which is used when copolymerizing a polymerization initiator or a chain transfer agent which has an acidic group and introduced to an end of a polymer chain is preferable. A repeating unit using acrylic acid and methacrylic acid is particularly preferable.

The acidic group which the repeating unit (c) may have may or may not include an aromatic ring; however, in a case of having an aromatic ring, the aromatic ring is preferably selected from other acidic groups than a phenolic hydroxyl group. In a case where the repeating unit (c) has an acidic group, the content of the repeating unit which has an acidic group is preferably 30 mol % or less with respect to all of the repeating units in the resin (A) and more preferably 20 mol % or less. In a case where the resin (A) contains a repeating unit which has an acidic group, the content of the repeating unit which has an acidic group in the resin (A) is normally 1 mol % or more.

Specific examples of the repeating unit which has an acidic group will be shown below; however, the present invention is not limited thereto.

In the specific examples, Rx represents H, $CH_3$, $CH_2OH$, or $CF_3$.

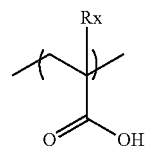

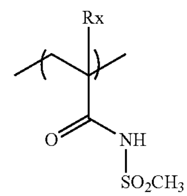

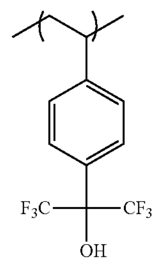

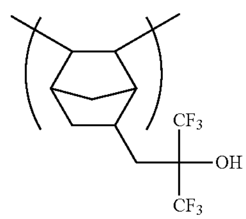

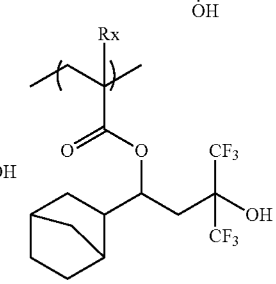

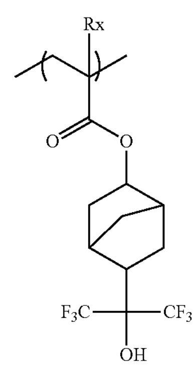

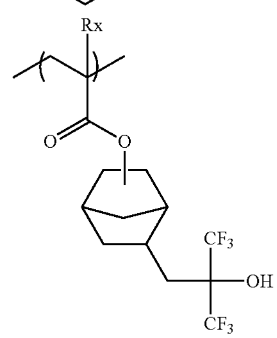

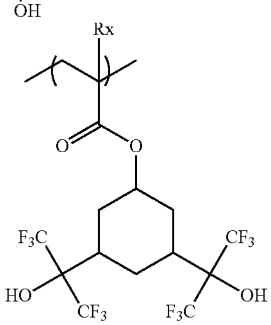

(d) Repeating Unit which has a Plurality of Aromatic Rings

The resin (A) may have a repeating unit (d) which has a plurality of aromatic rings.

It is preferable to further have a repeating unit (d) which has a plurality of aromatic rings which are represented by General Formula (d1) below among these.

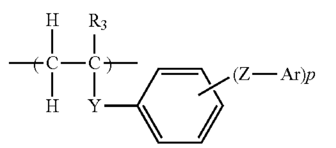

(d1)

In General Formula (d1), $R_3$ represents a hydrogen atom, an alkyl group, a halogen atom, a cyano group, or a nitro group, Y represents a single bond or a divalent linking group, Z represents a single bond or a divalent linking group, Ar represents an aromatic ring group, and p represents an integer of 1 or more.

For description of the repeating unit (d) which has a plurality of aromatic rings which are represented by General Formula (d1) (description of each group, specific examples and the like of the repeating unit (d) which has a plurality of aromatic rings which are represented by General Formula (d1)), refer to the description of a repeating unit (B) which is represented by General Formula ($B_1$) or ($B_2$) according to paragraphs [0028] to [0045] of JP2012-255845A and this content is included in the present specification.

The resin (A) may or may not contain the repeating unit (d); however, when contained, the content ratio of the repeating unit (d) is preferably in a range of 1 mol % to 30 mol % with respect to all of the repeating units in the resin (A), more preferably in a range of 1 mol % to 20 mol %, and even more preferably in a range of 1 mol % to 15 mol %. The repeating unit (d) which is included in the resin (A) may be included by combining two or more types.

The resin (A) in the present invention may have a repeating unit other than the repeating units (a) to (d) as appropriate. One example of the repeating units is a repeating unit which has an alicyclic hydrocarbon structure which does not also have a polar group (for example, the acidic group, the hydroxyl group, and the cyano group) and does not exhibit acid decomposability. Due to this, it is possible to appropriately adjust the solubility of the resin when carrying out developing using a developer which includes an organic solvent. Examples of the repeating unit include a repeating unit which is represented by General Formula (IV).

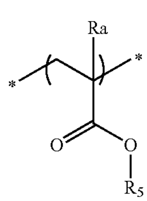

(IV)

In General Formula (IV), $R_5$ represents a hydrocarbon group which has at least one ring structure and does not have a polar group.

Ra represents a hydrogen atom, an alkyl group, or a —$CH_2$—O—$Ra_2$ group. In the formula, $Ra_2$ represents a hydrogen atom, an alkyl group, or an acyl group. Ra is preferably a hydrogen atom, a methyl group, a hydroxy methyl group, or a trifluoromethyl group, and particularly preferably a hydrogen atom or a methyl group.

A monocyclic hydrocarbon group and a polycyclic hydrocarbon group are included in a ring structure of $R_5$. Examples of the monocyclic hydrocarbon group include cycloalkyl groups with 3 to 12 carbon atoms such as a cyclopentyl group, a cyclohexyl group, a cycloheptyl group, and a cyclooctyl group, and cycloalkenyl groups with 3 to 12 carbon atoms such as a cyclohexenyl group. A preferable monocyclic hydrocarbon group is a monocyclic hydrocarbon group with 3 to 7 carbon atoms and more preferable examples thereof include a cyclopentyl group and a cyclohexyl group.

A ring aggregating hydrocarbon group and a cross-linked cyclic hydrocarbon group are included in the polycyclic hydrocarbon group and examples of the ring aggregating hydrocarbon group include a bicyclohexyl group, a perhydronaphthalenyl group, and the like. Examples of the cross-linked cyclic hydrocarbon group include a 2-ring type hydrocarbon ring such as a pinane, bornane, norpinane, norbornane, and bicyclooctane ring (a bicyclo [2.2.2] octane ring, bicyclo [3.2.1] octane ring, and the like), a three-ring type hydrocarbon ring such as a homobredene, adamantane, tricyclo [$5.2.1.0^{2,6}$] decane, and tricyclo [$4.3.1.1^{2,5}$] undecane ring, a four-ring type hydrocarbon ring such as a tetracyclo [$4.4.0.1^{2,5}.1^{7,10}$] dodecane and perhydro-1,4-methano-5,8-methano naphthalene ring, and the like. In addition, examples of the cross-linked cyclic hydrocarbon ring also include a condensed cyclic ring hydrocarbon ring, for example, a condensed ring where a plurality of cycloalkane rings with 5 to 8 members are condensed such as perhydronaphthalene (decaline), perhydroanthracene, perhydrophenanthrene, perhydroacenaphthene, perhydrofluorene, perhydroindene, and perhydrophenalene ring.

Examples of preferable cross-linked cyclic hydrocarbon rings include a norbornyl group, an adamantyl group, a bicyclooctanyl group, a tricyclo [$5.2.1.0^{2,6}$] decanyl group, and the like. Examples of more preferable cross-linked cyclic hydrocarbon rings include a norbornyl group and an adamantyl group.

The alicyclic hydrocarbon groups may have a substituent group and examples of a preferable substituent group include a hydroxyl group in which a halogen atom, an alkyl group, and a hydrogen atom are substituted and an amino group in which a hydrogen atom is substituted, and the like. Examples of preferable halogen atoms include a bromine, chlorine, and fluorine atom and examples of preferable alkyl groups include methyl, ethyl, butyl, and t-butyl groups. The alkyl groups described above may further have a substituent group and examples of the substituent group, which the alkyl groups may further have, include a halogen atom, an alkyl group, a hydroxyl group in which a hydrogen atom is substituted and an amino group in which a hydrogen atom is substituted.

Examples of the substituent group of a hydrogen atom described above include an alkyl group, a cycloalkyl group, an aralkyl group, a substituted methyl group, a substituted ethyl group, an alkoxycarbonyl group, and an aralkyloxycarbonyl group. Examples of preferable alkyl groups include an alkyl group with 1 to 4 carbon atoms, examples of preferable substituted methyl groups include methoxymethyl, methoxythiomethyl, benzyloxymethyl, t-butoxymethyl, and 2-methoxyethoxymethyl groups, examples of preferable substituted ethyl groups include 1-ethoxyethyl and 1-methyl-1-methoxyethyl, examples of preferable acyl groups include an aliphatic acyl group with 1 to 6 carbon atoms such as formyl, acetyl, propionyl, butyryl, isobutyryl, valeryl, and pivaloyl groups, and examples of alkoxycarbonyl groups include an alkoxycarbonyl group with 1 to 4 carbon atoms and the like.

The resin (A) may or may not contain a repeating unit which has an alicyclic hydrocarbon structure which does not have a polar group and does not exhibit acid decomposability; however, when contained, the content of the repeating units is preferably 1 mol % to 20 mol % with respect to all of the repeating units in the resin (A) and more preferably 5 mol % to 15 mol %.

Specific examples of the repeating unit which has an alicyclic hydrocarbon structure which does not have a polar group and does not exhibit acid decomposability; however, the present invention is not limited thereto. In the formula, Ra represents H, $CH_3$, $CH_2OH$, or $CF_3$.

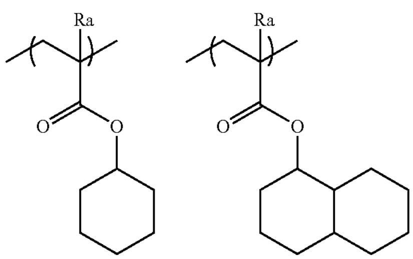

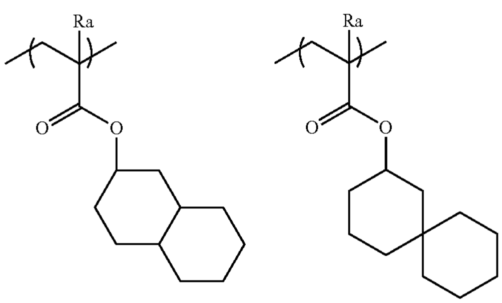

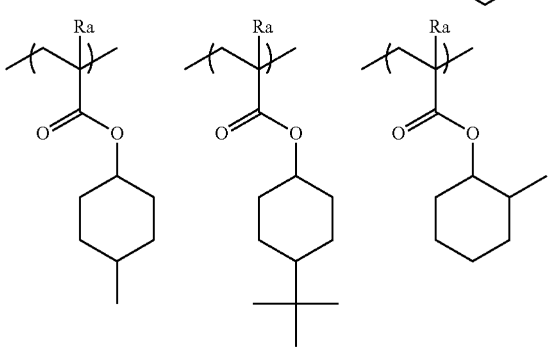

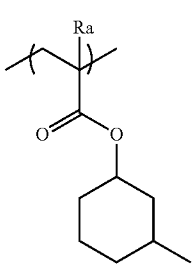

-continued

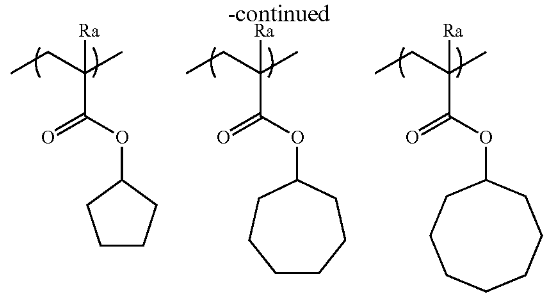

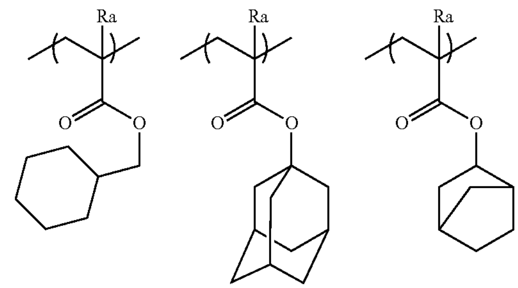

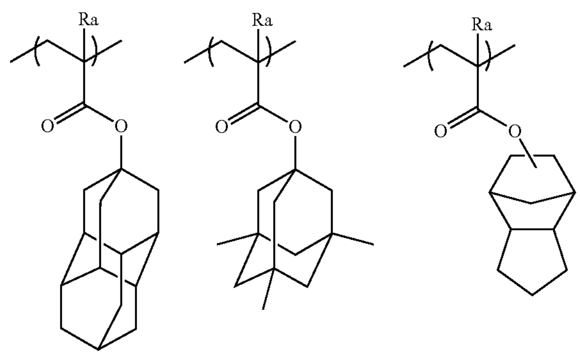

In addition, the resin (A) may further include a repeating unit which is represented by General Formula (P) below.

(P)

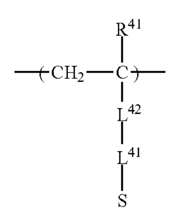

$R^{41}$ represents a hydrogen atom or a methyl group. $L^{41}$ represents a single bond or a divalent linking group. $L^{42}$ represents a divalent linking group. S represents a structure site which decomposes when irradiated with actinic rays or radiation to generate an acid on a side chain.

Specific examples of the repeating unit which is represented by General Formula (P) will be shown below; however, the present invention is not limited thereto.

-continued
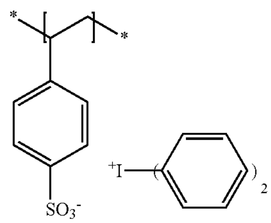
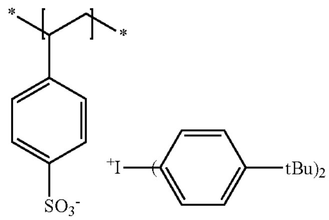
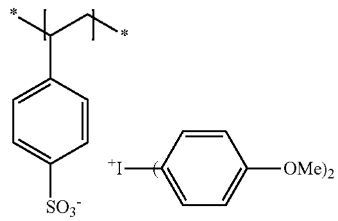
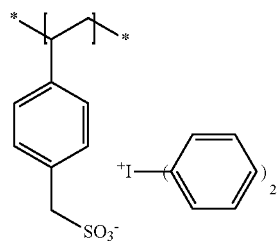
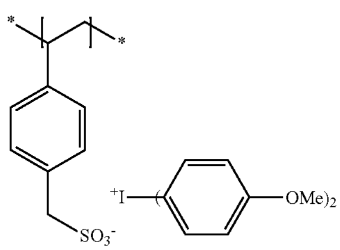
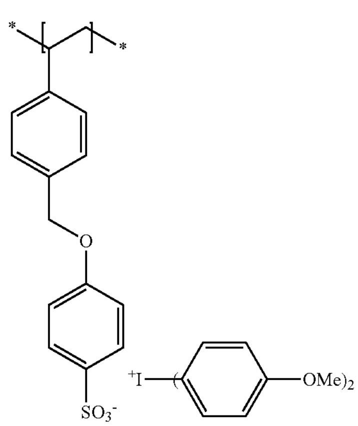
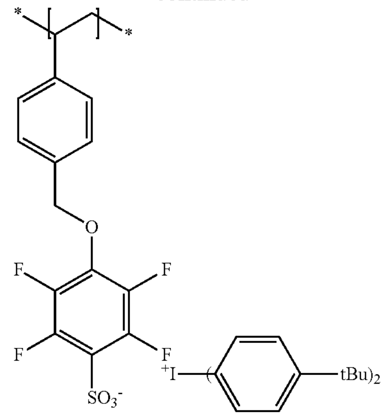
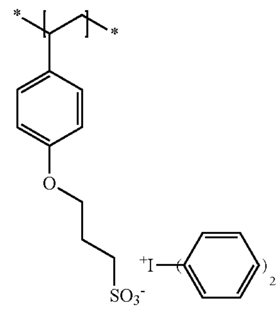
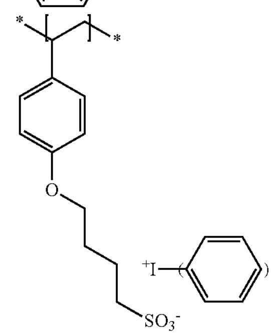
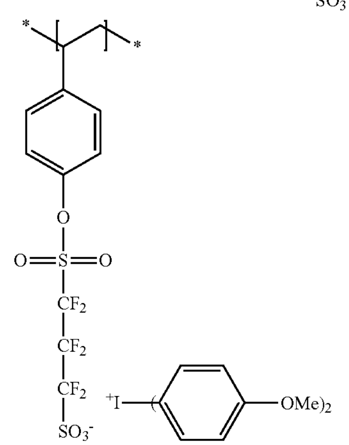
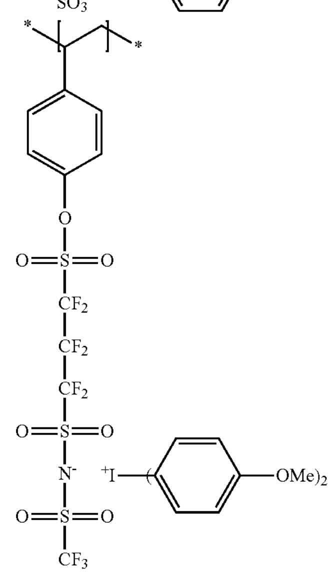

-continued
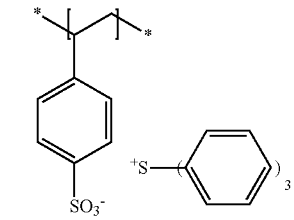
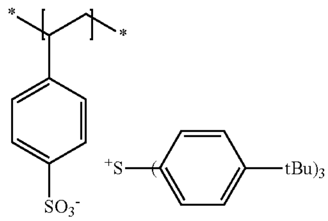
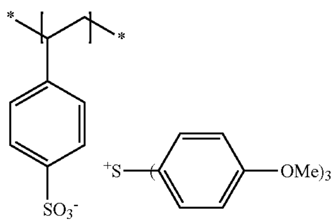
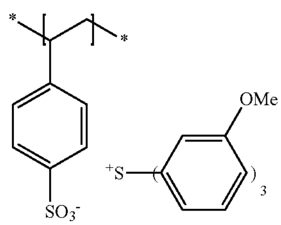
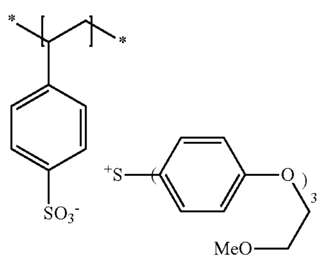
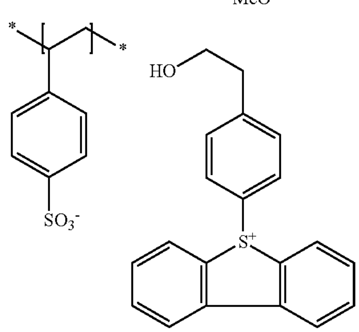
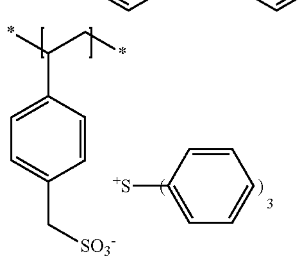
-continued
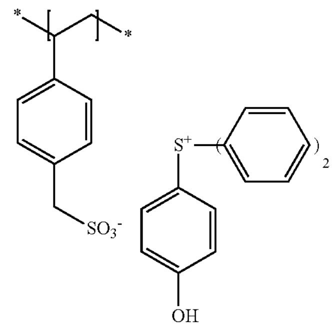
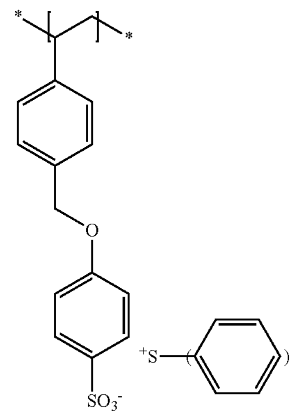
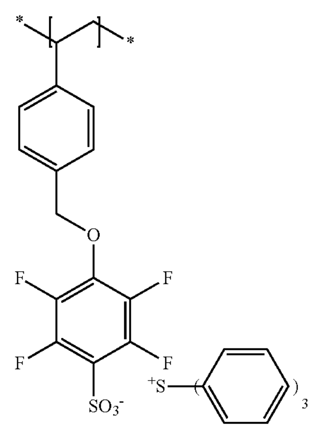
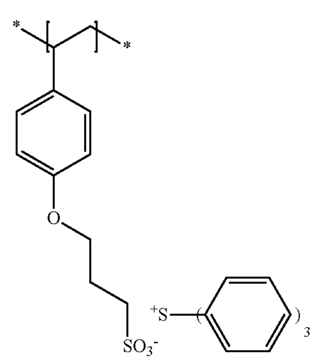

-continued
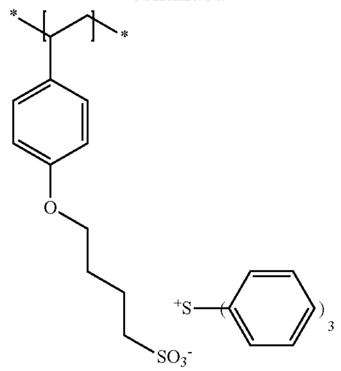
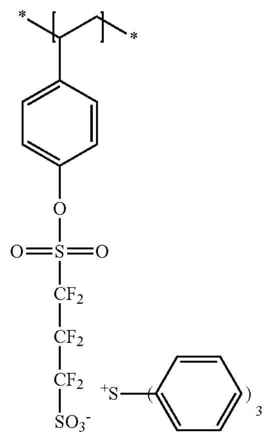
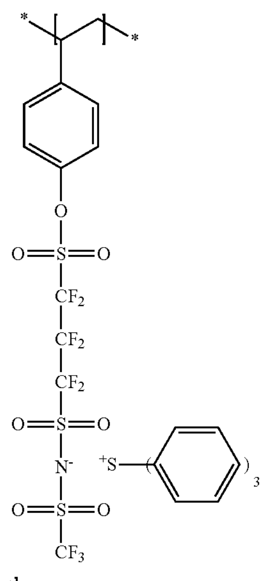
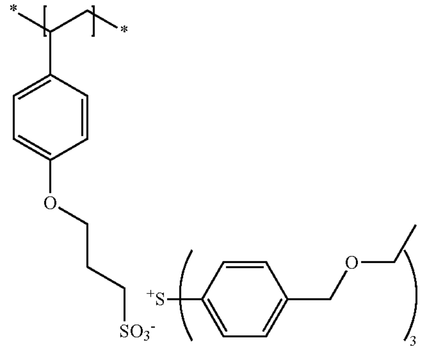
-continued
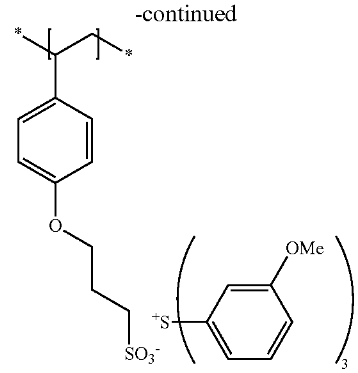
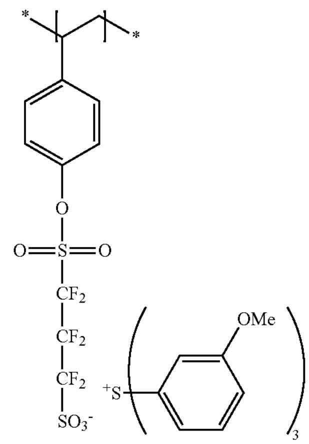
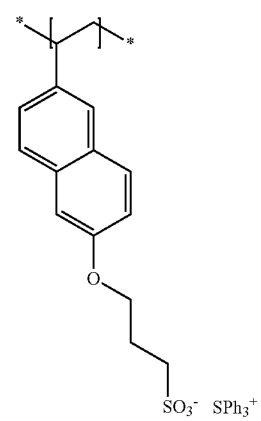
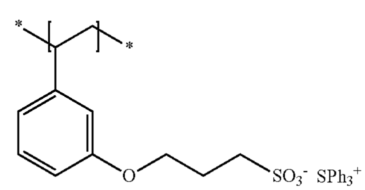
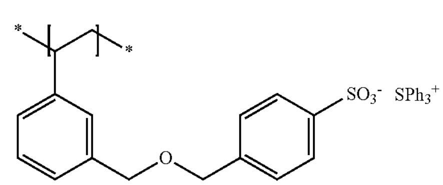

-continued
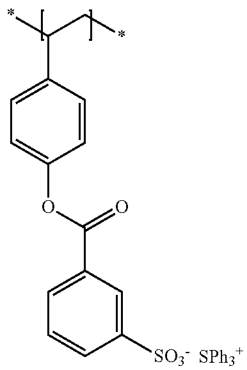
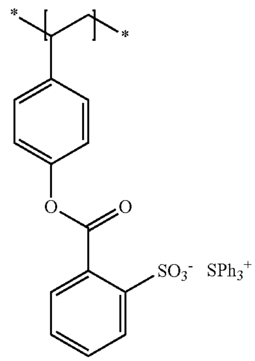
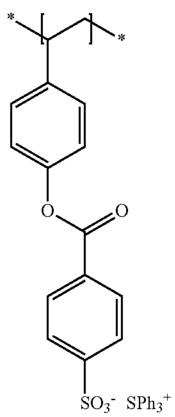
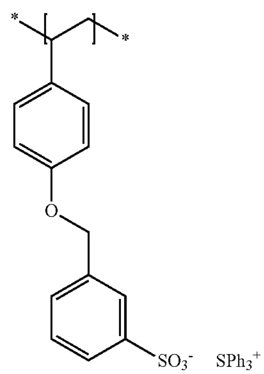
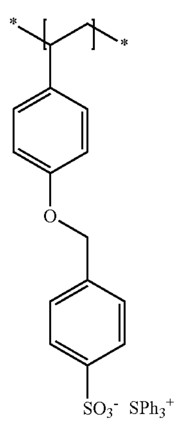
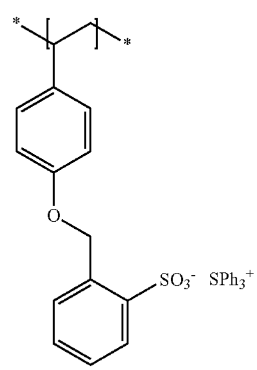
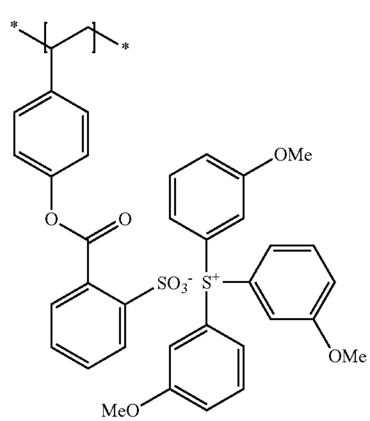
-continued
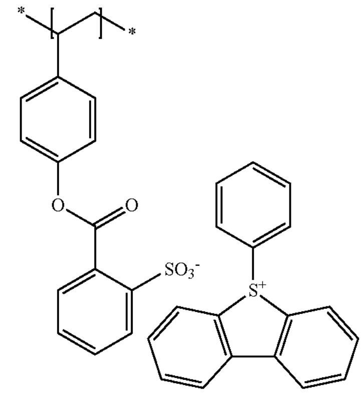
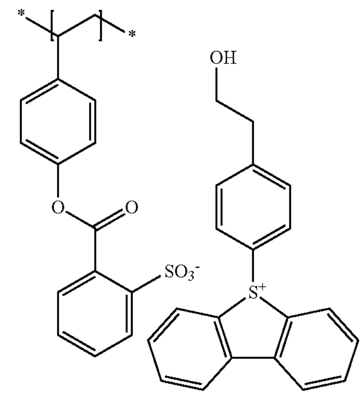
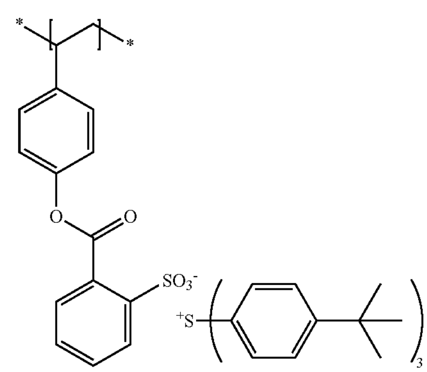
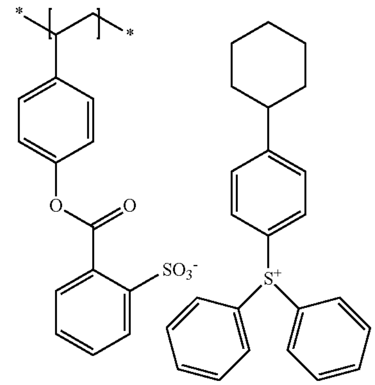

-continued
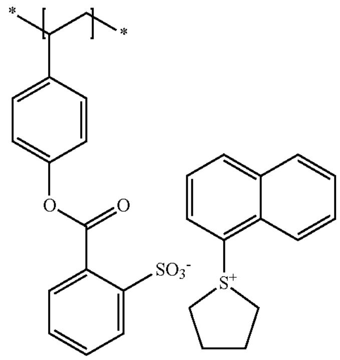
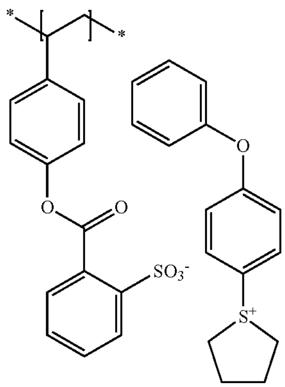
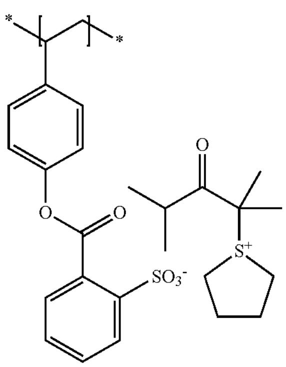
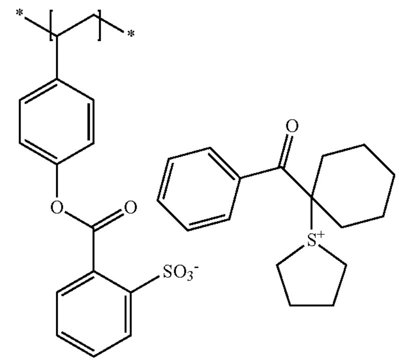
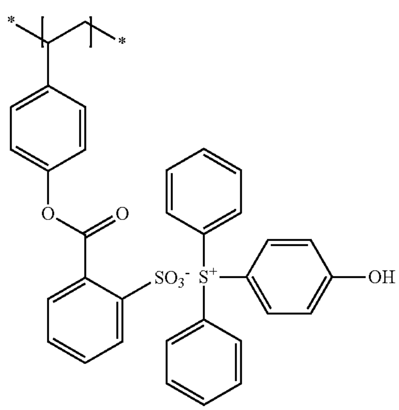
-continued
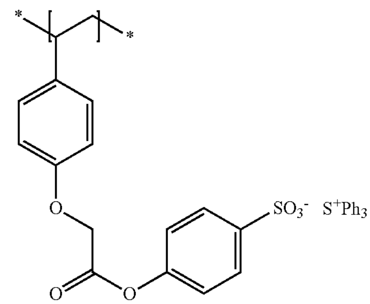
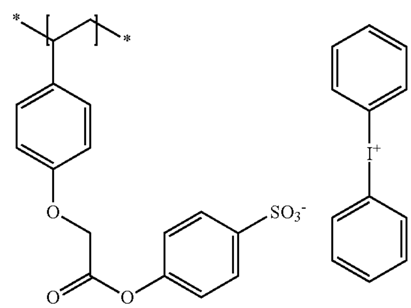
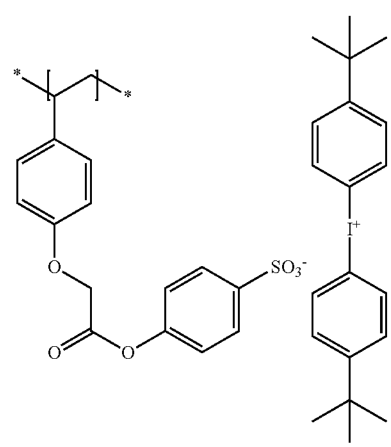

-continued
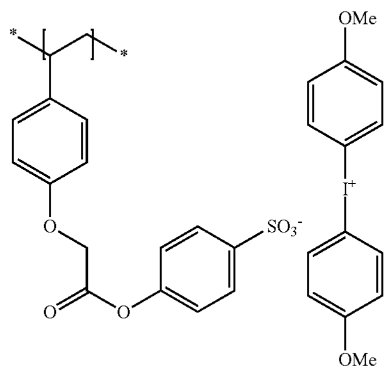
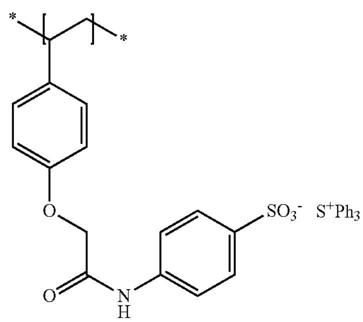
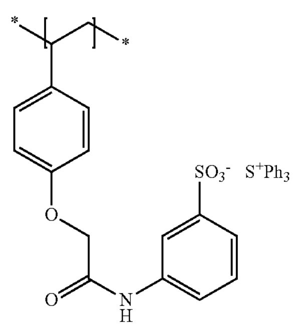
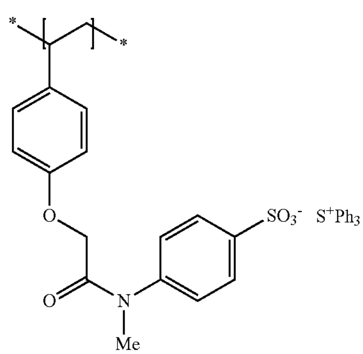
-continued
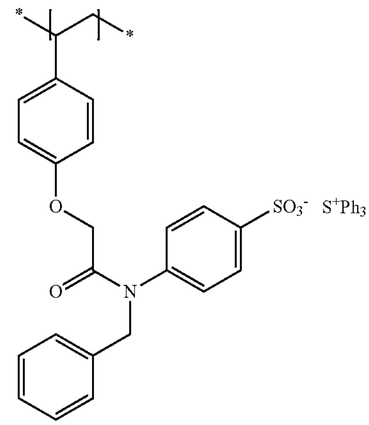
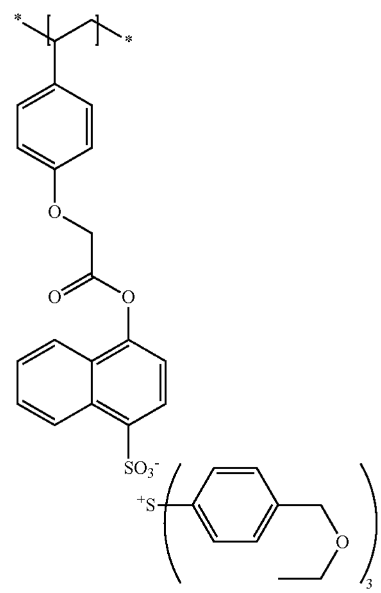
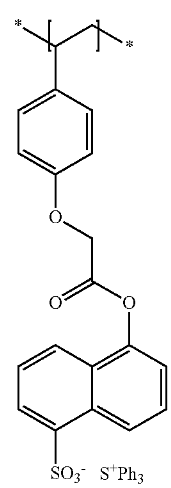
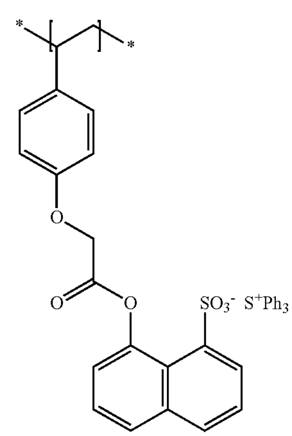

-continued
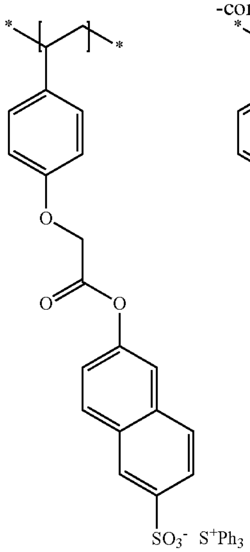
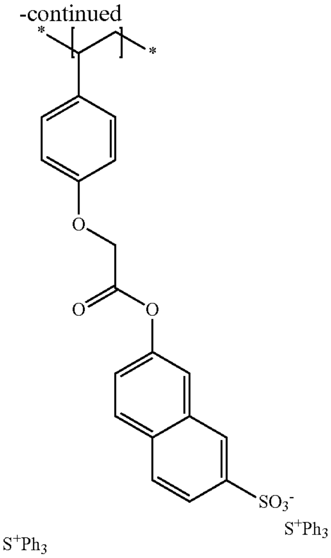
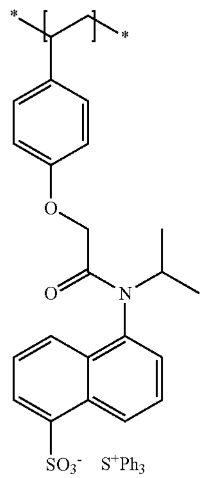
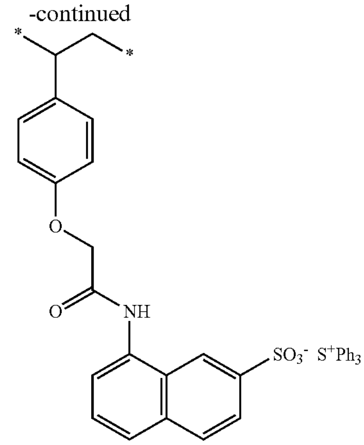
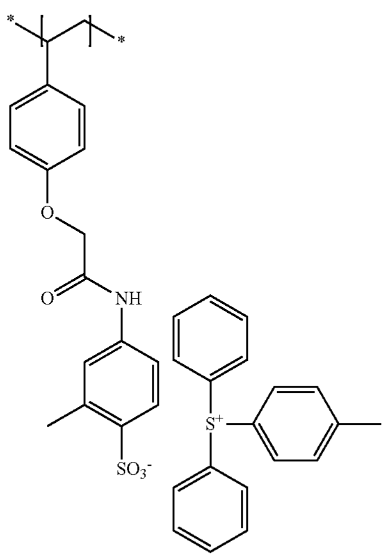
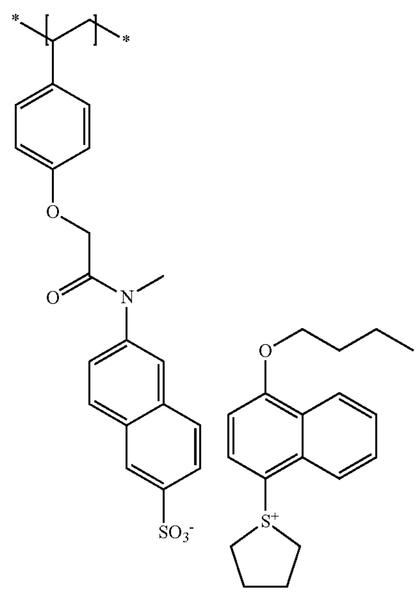
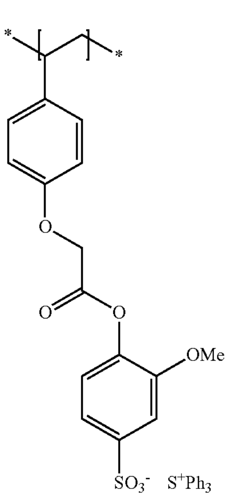
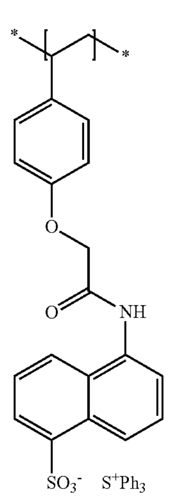
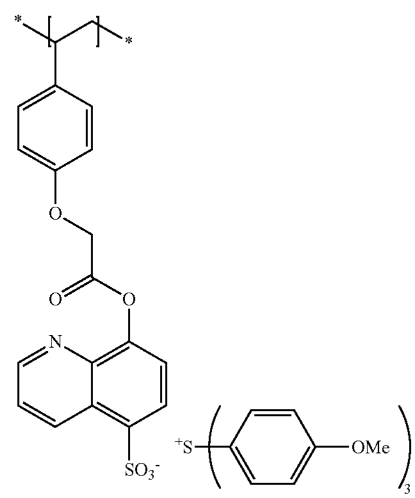

-continued
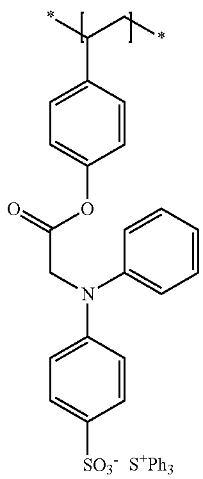
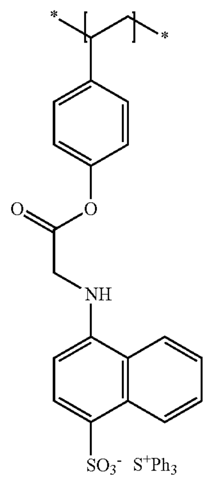
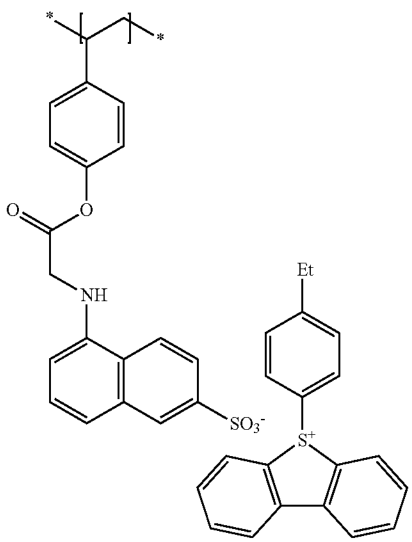
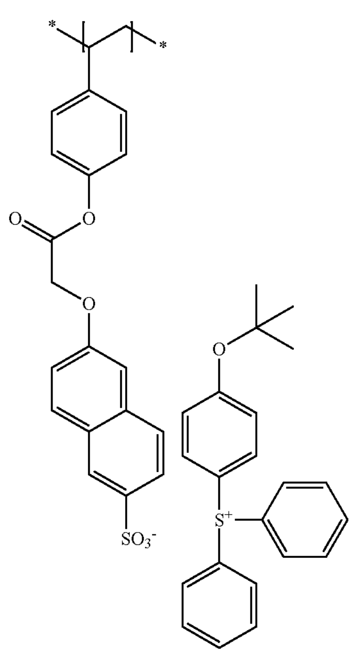
-continued
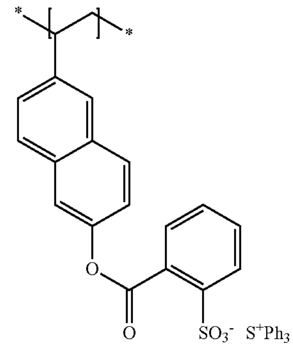
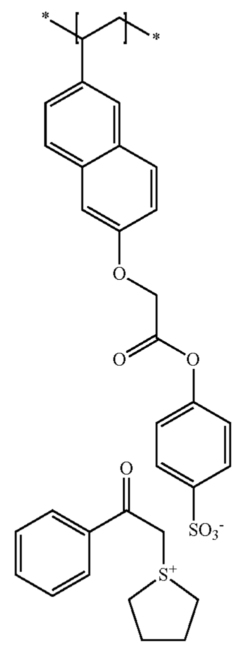
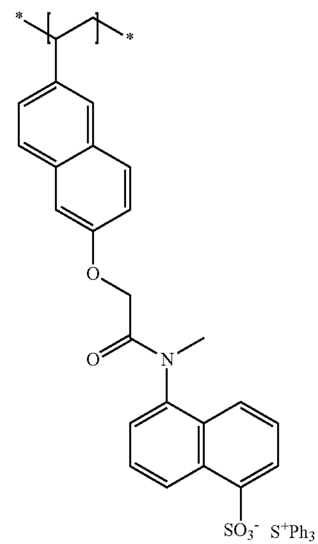
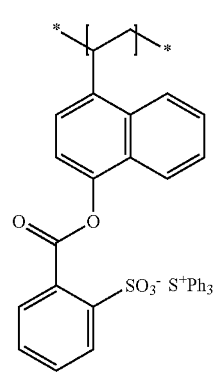
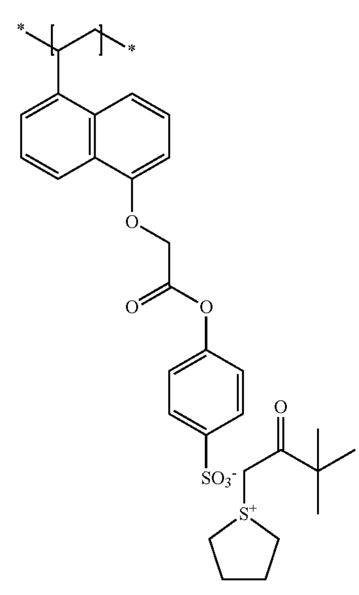

-continued
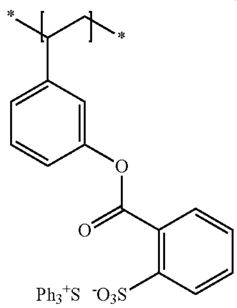
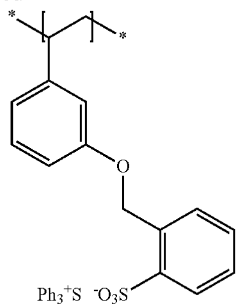
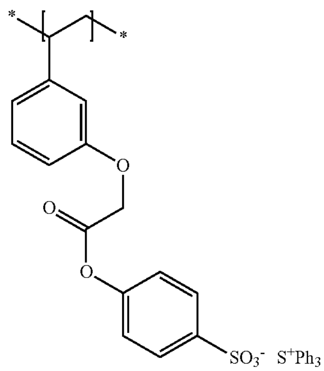
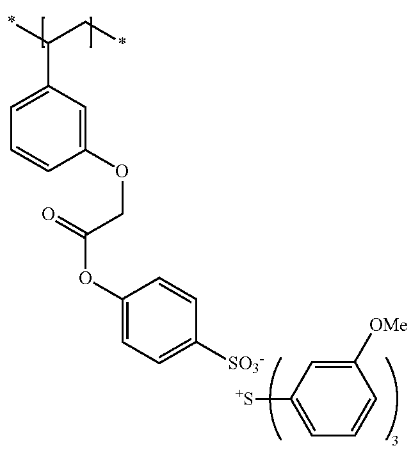
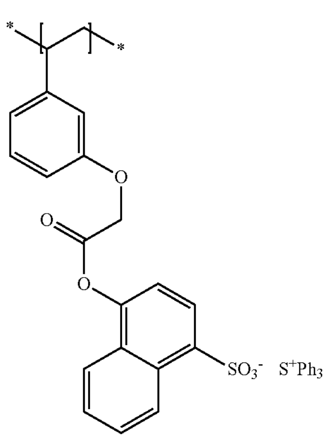
-continued
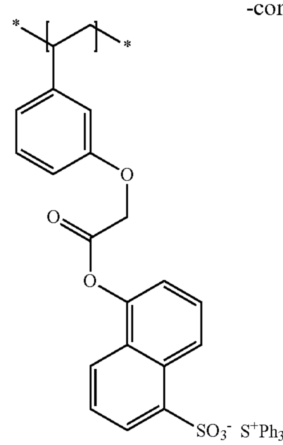
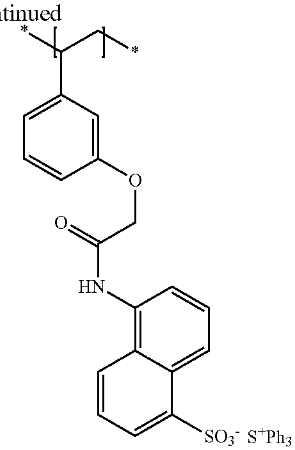
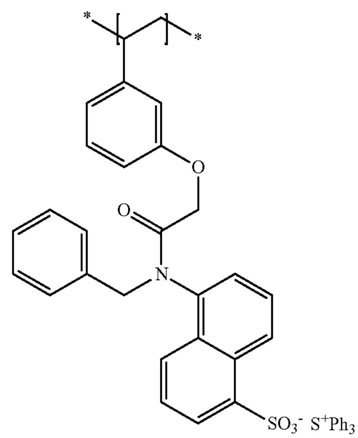
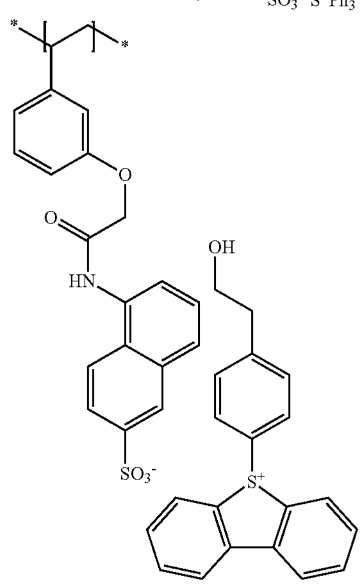
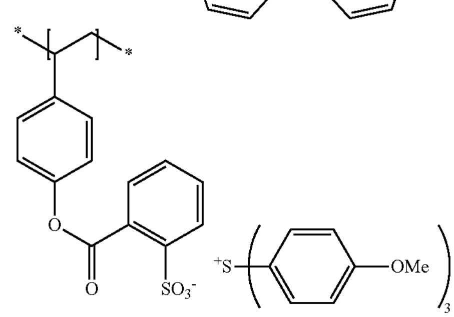

-continued
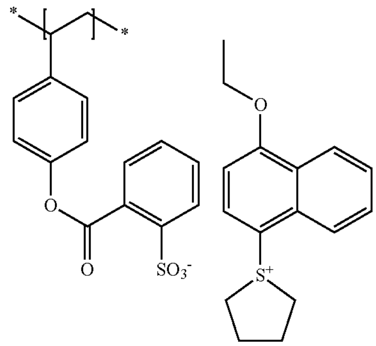
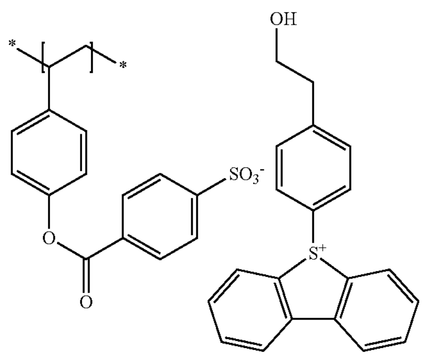
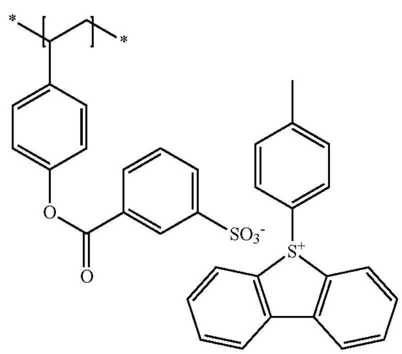
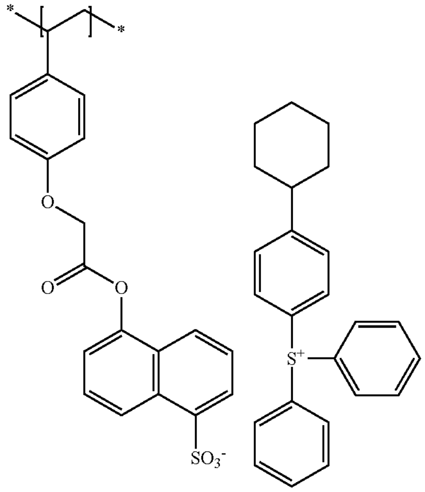
-continued
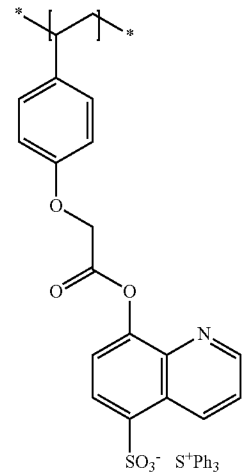
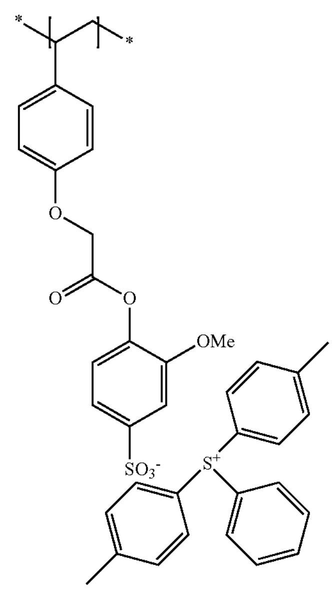
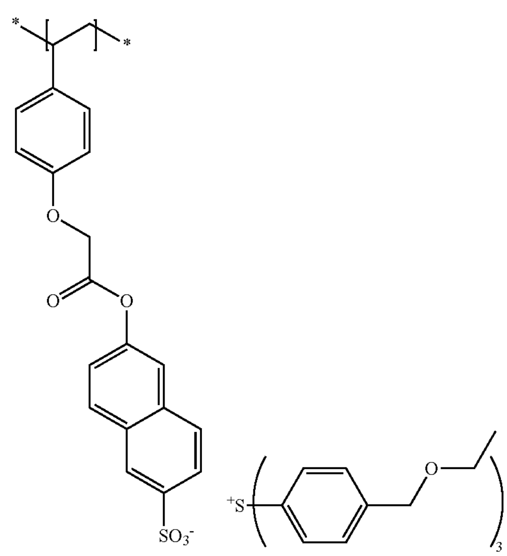

-continued
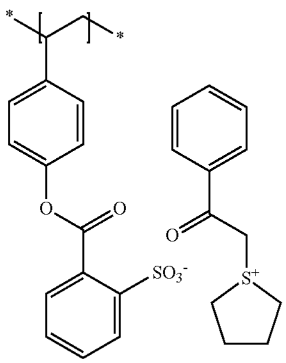
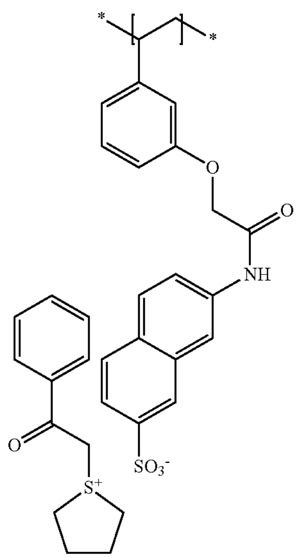
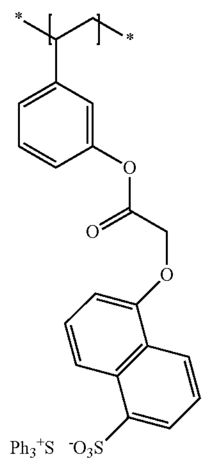
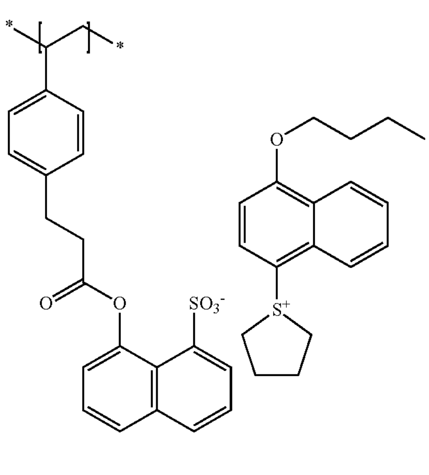
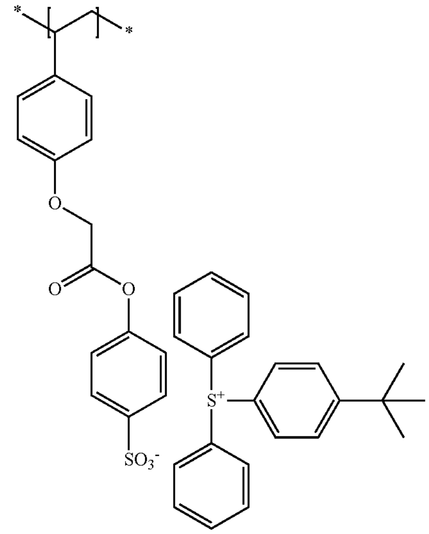
-continued
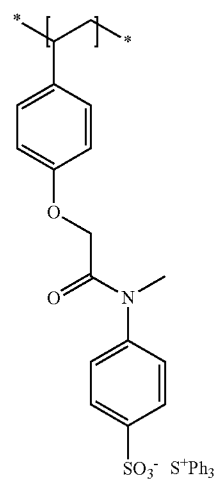
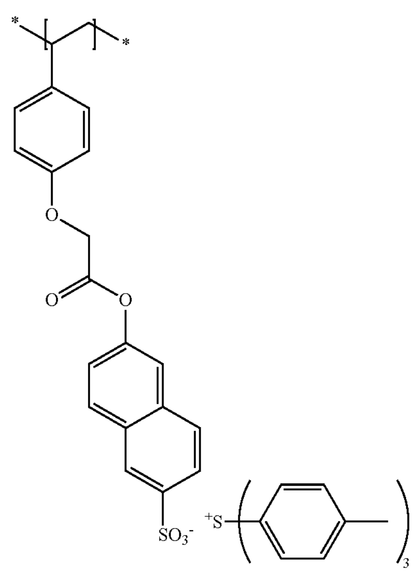

-continued
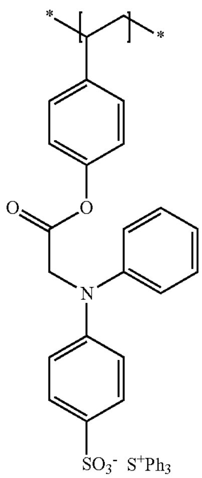
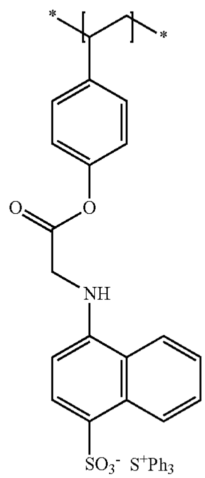
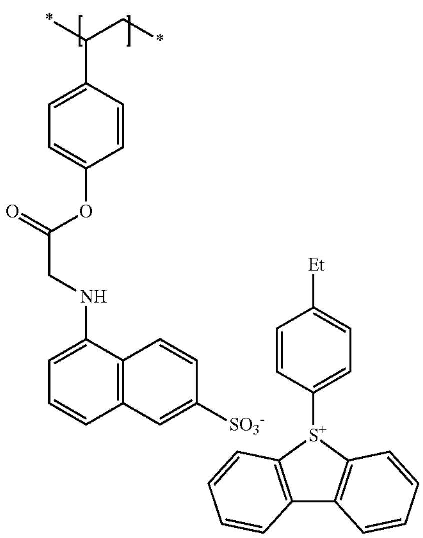
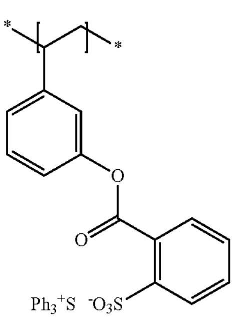
-continued
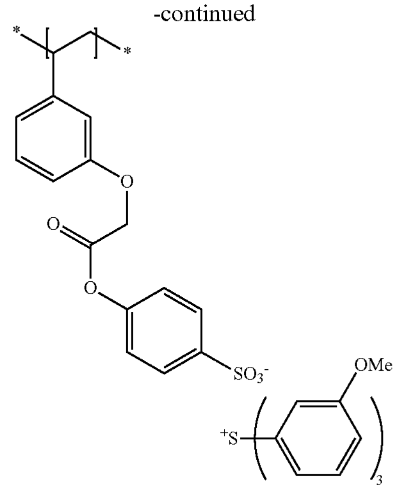
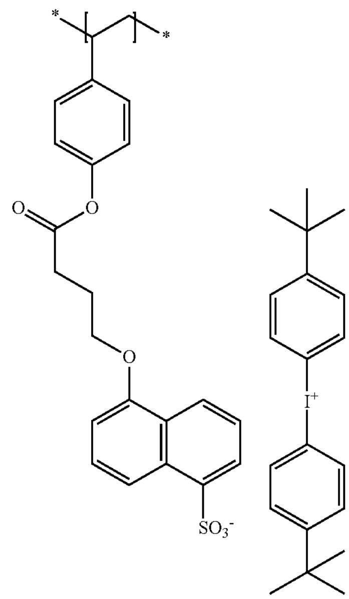
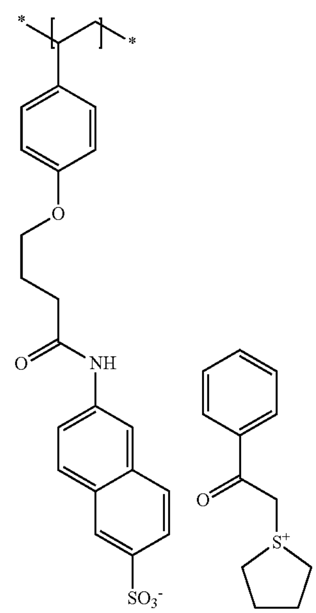

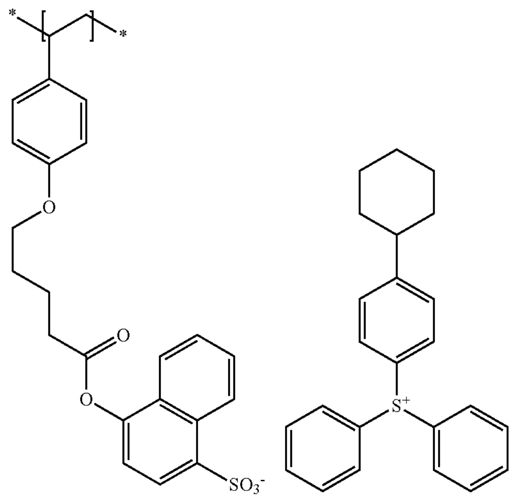
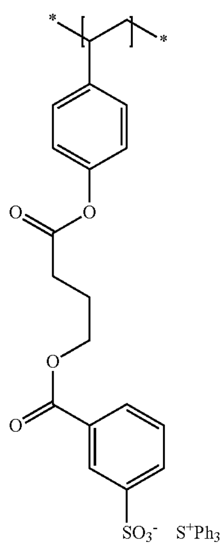
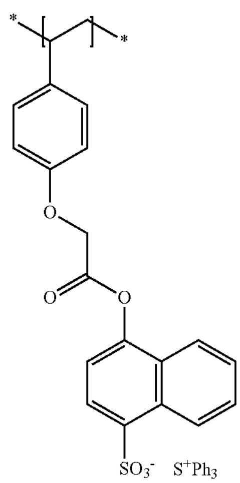
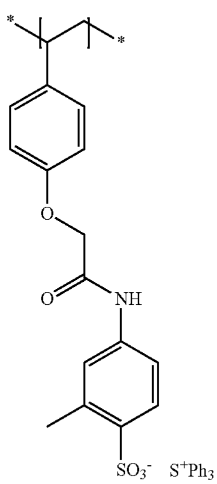
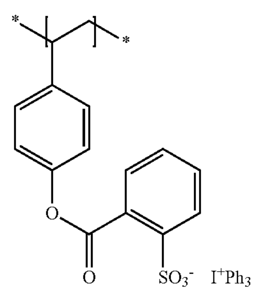
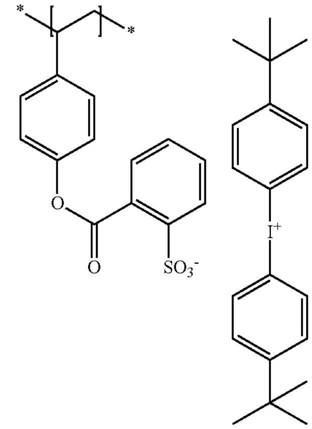
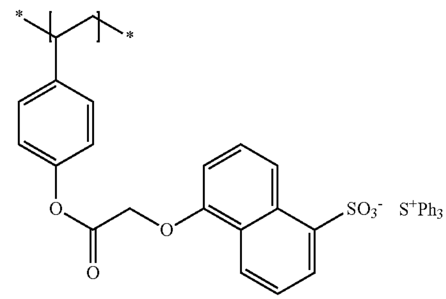
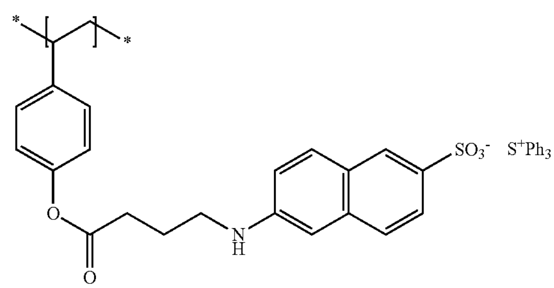
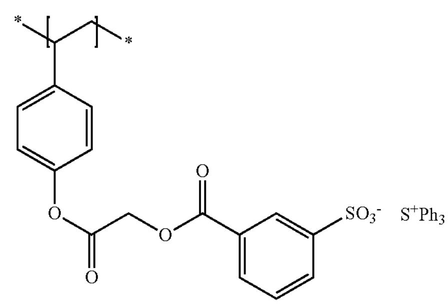

-continued
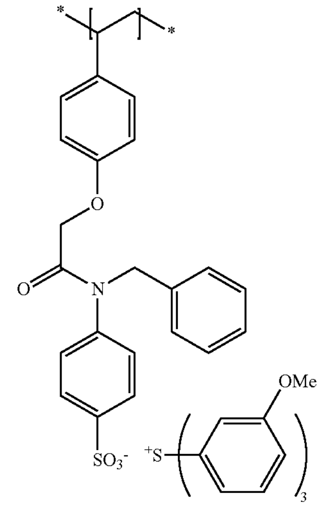
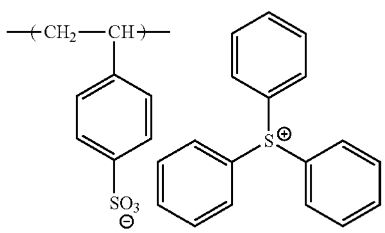
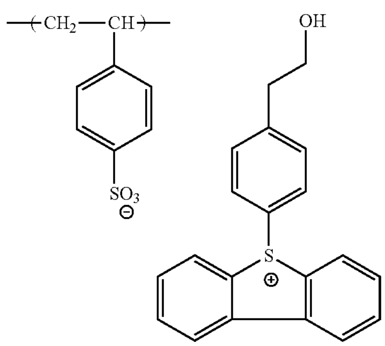
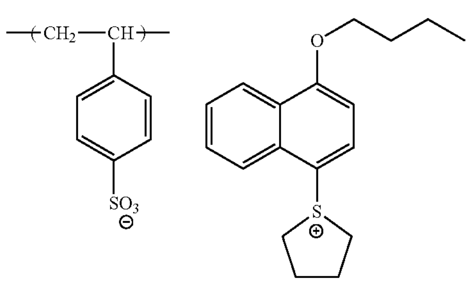
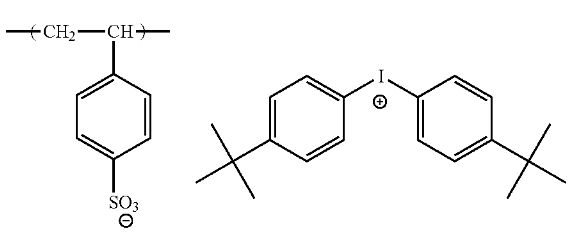
-continued
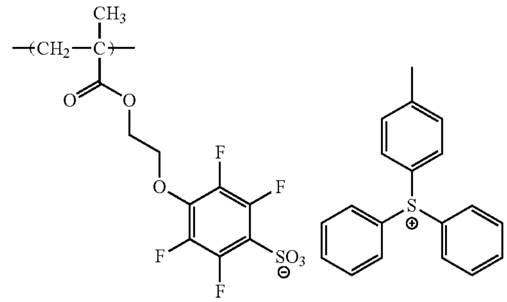
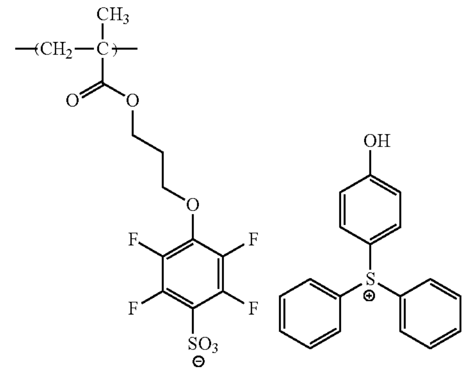
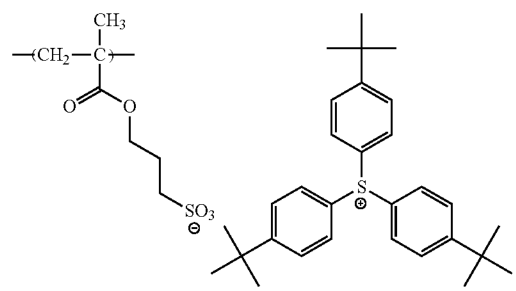
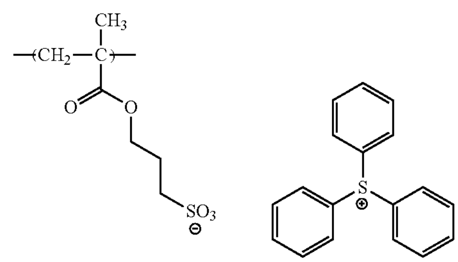
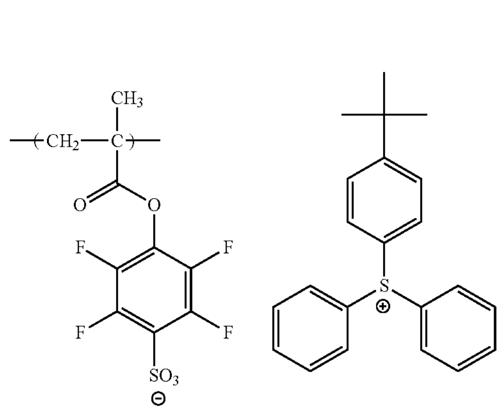

-continued
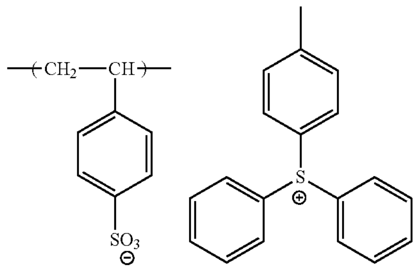
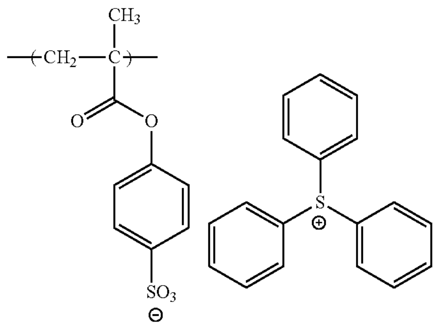
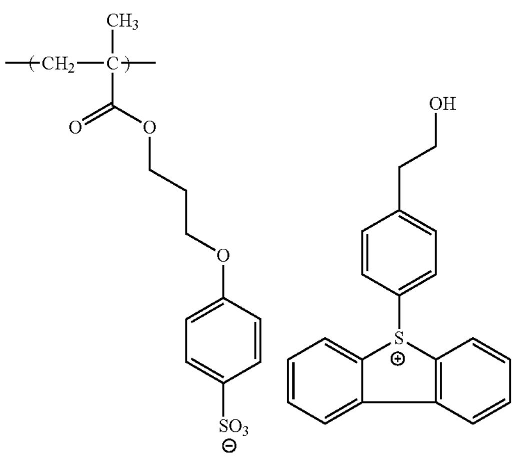
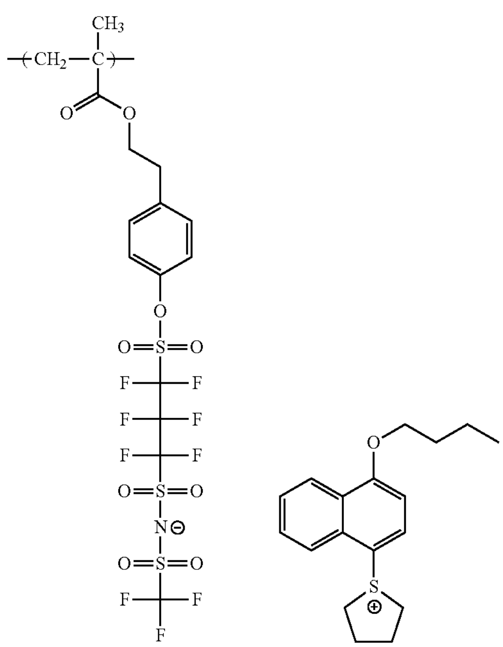
-continued
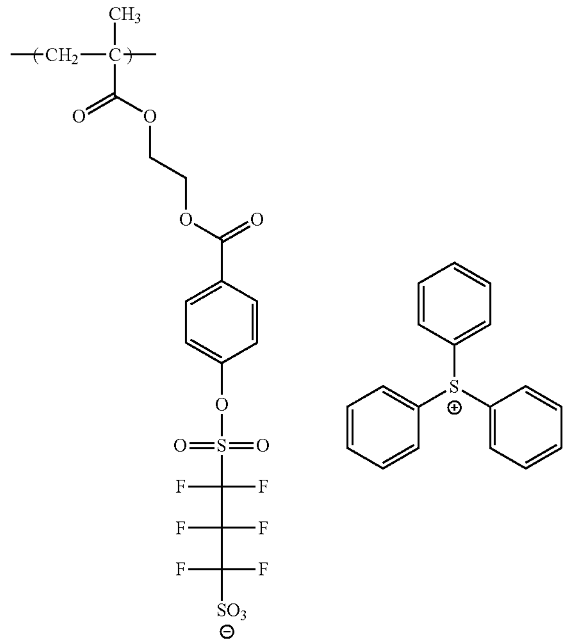
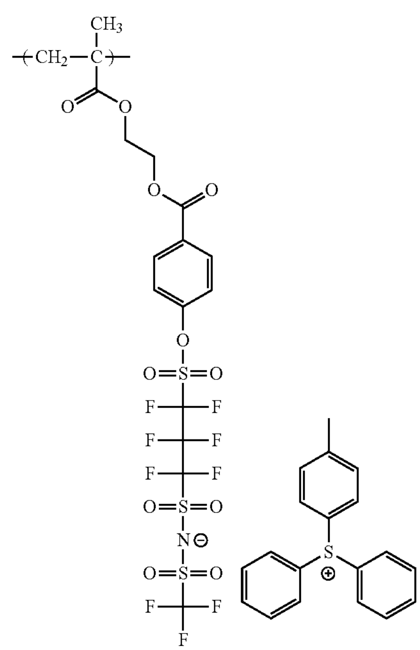

-continued
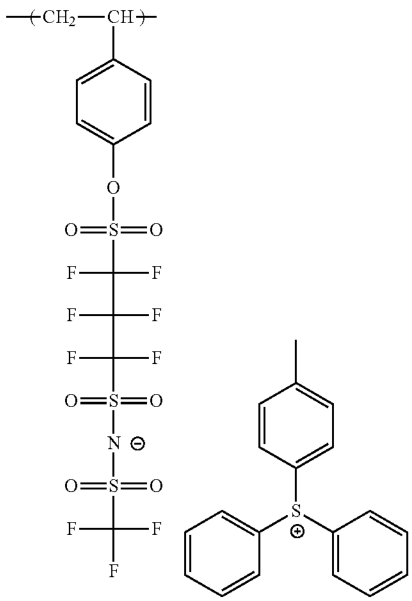
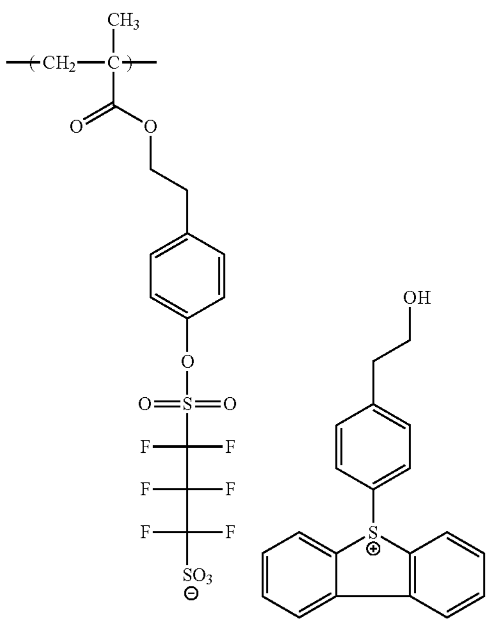
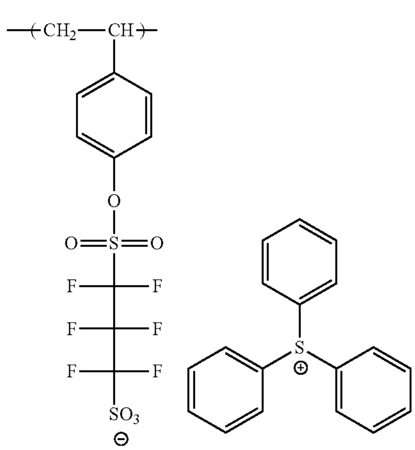
-continued
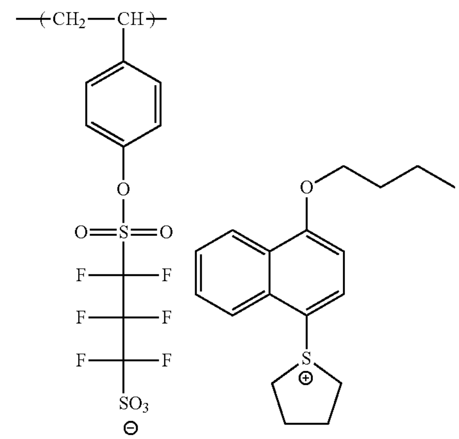
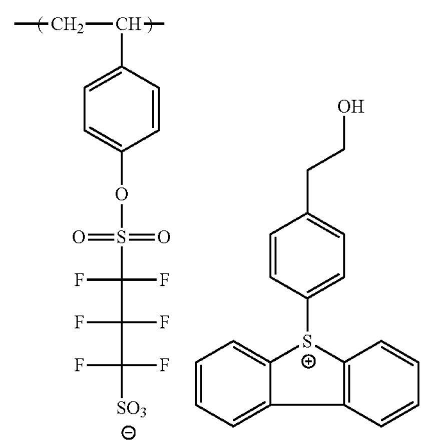
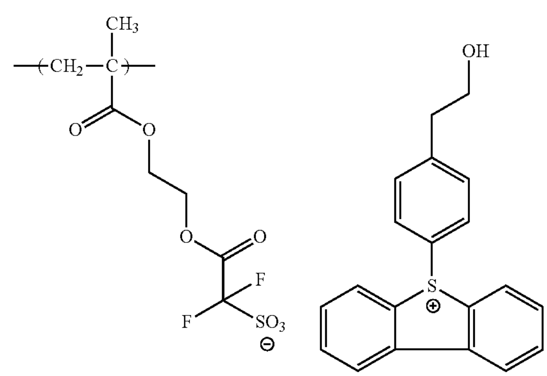
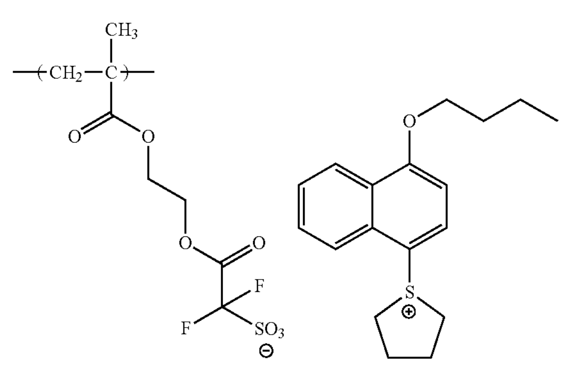

-continued
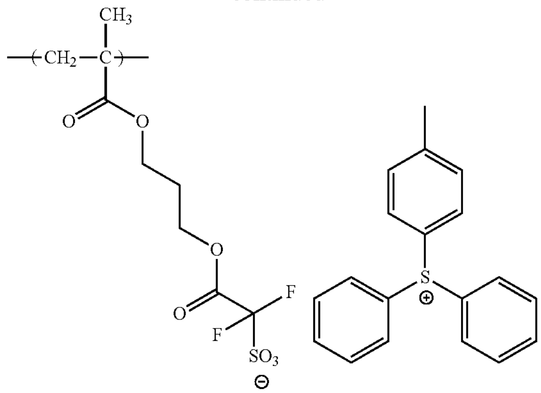
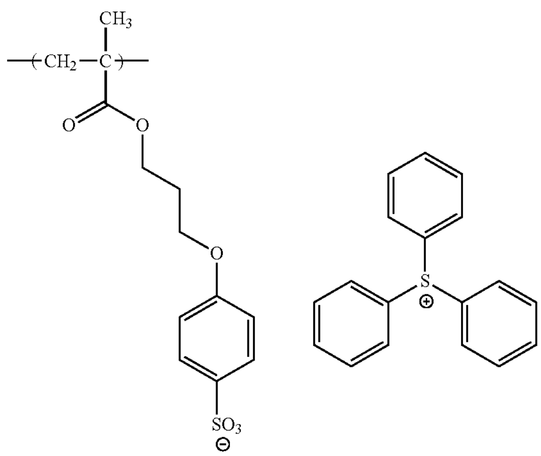
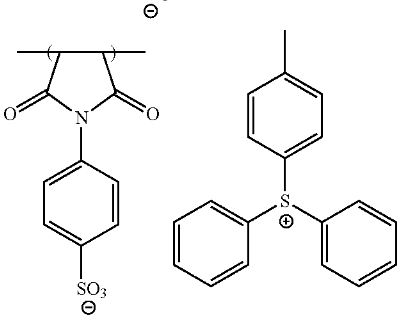
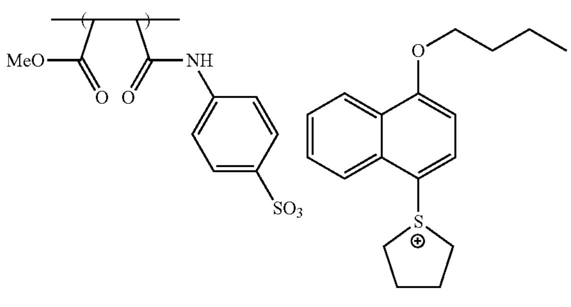
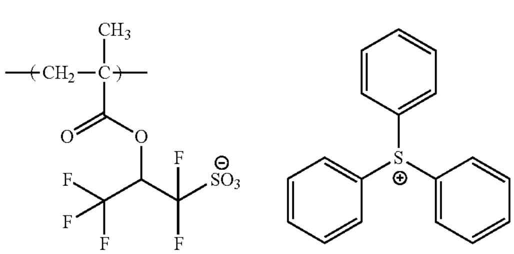
-continued
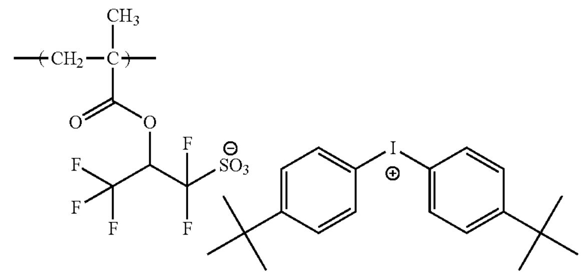
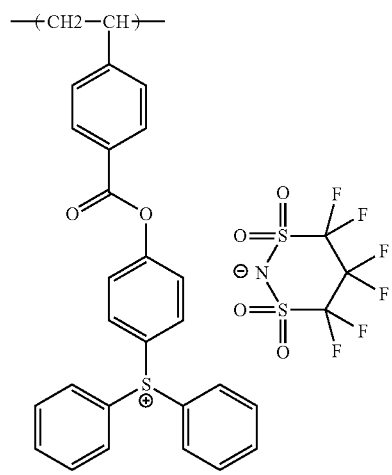
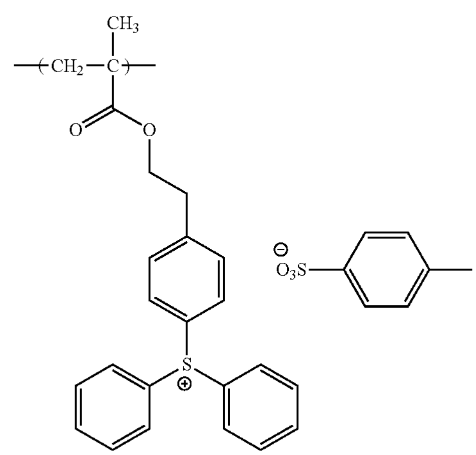
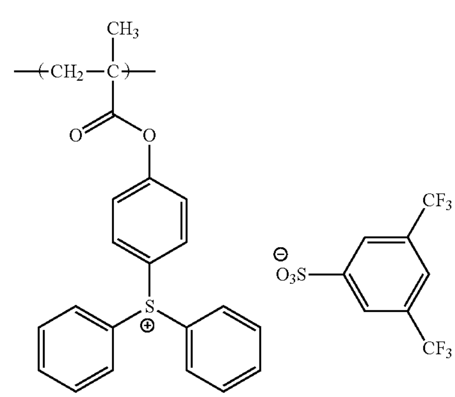

-continued
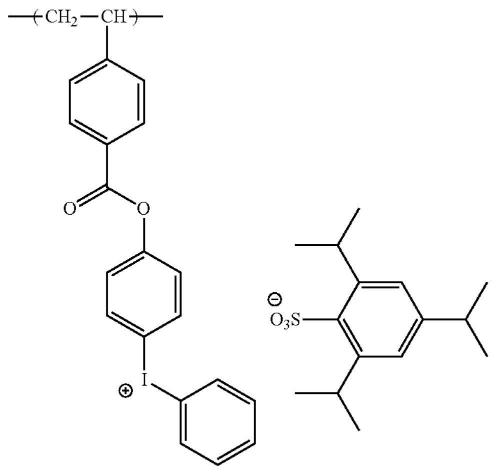
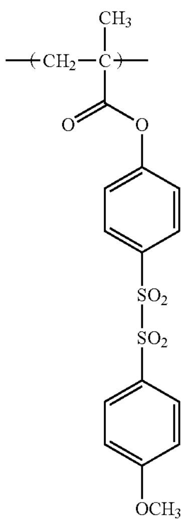
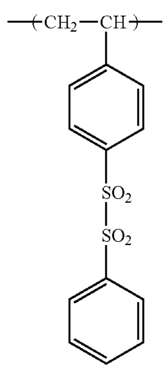
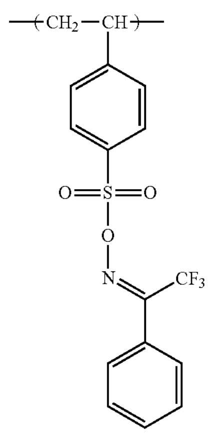
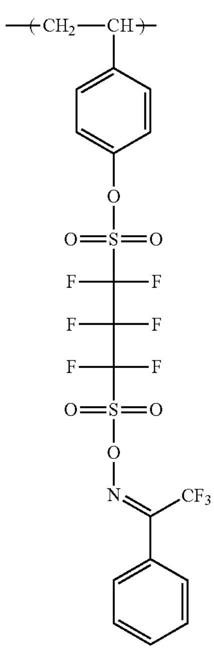
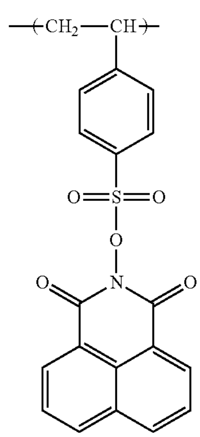
-continued
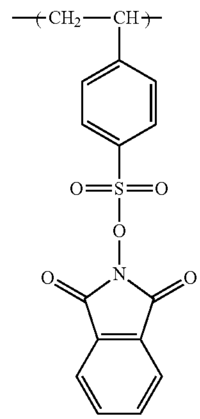
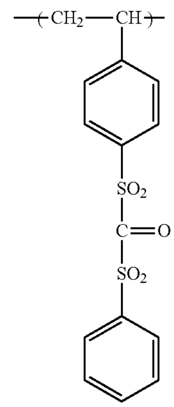
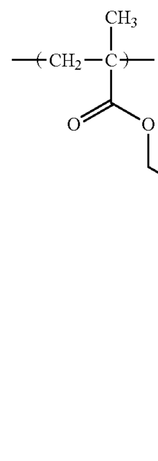
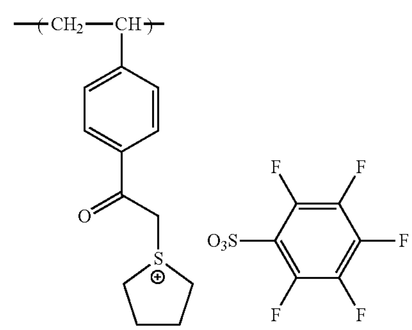
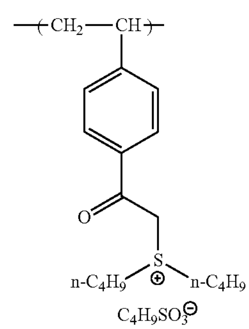

-continued
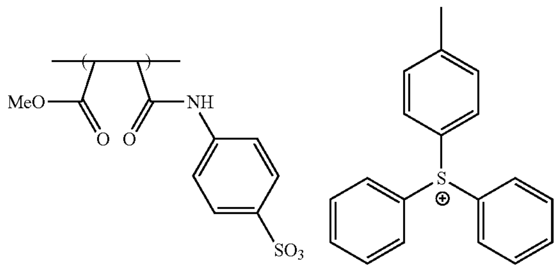
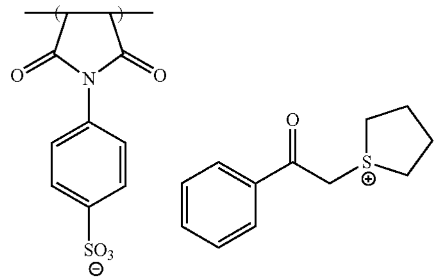
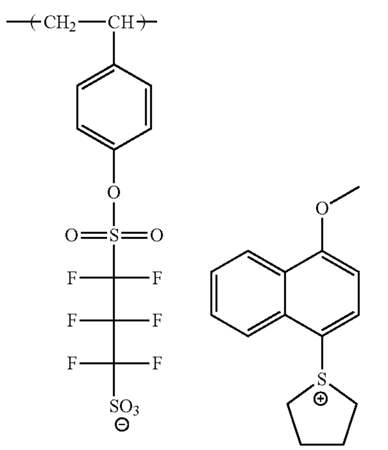
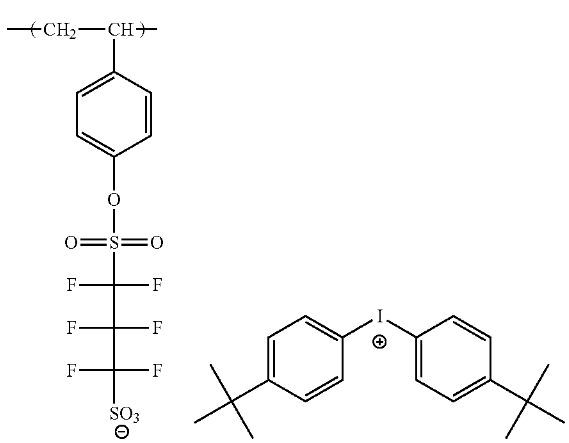
-continued
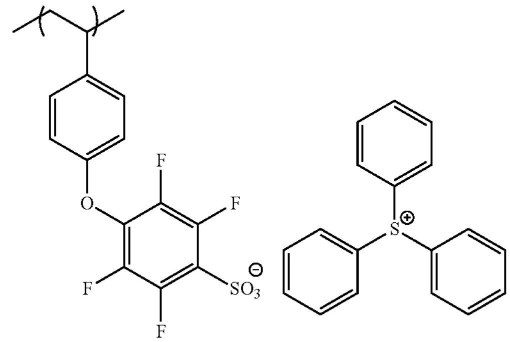
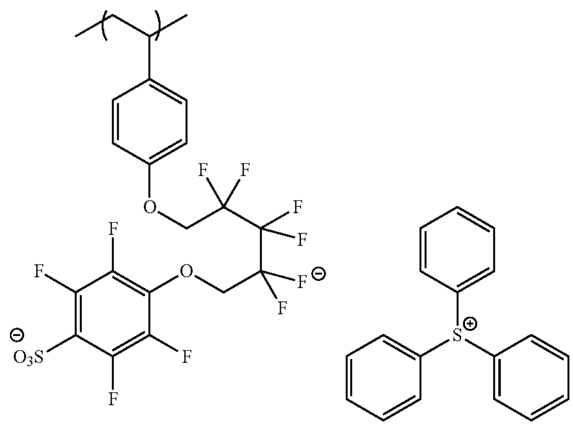
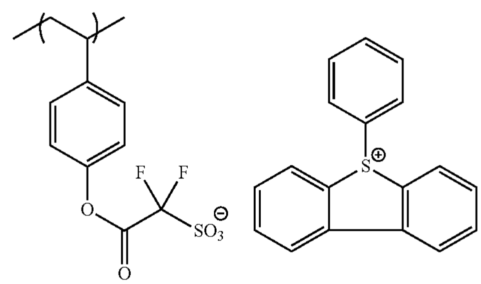
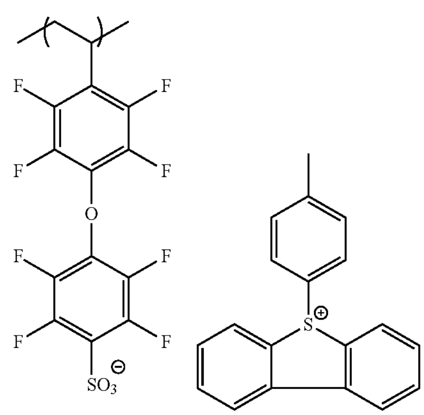

-continued
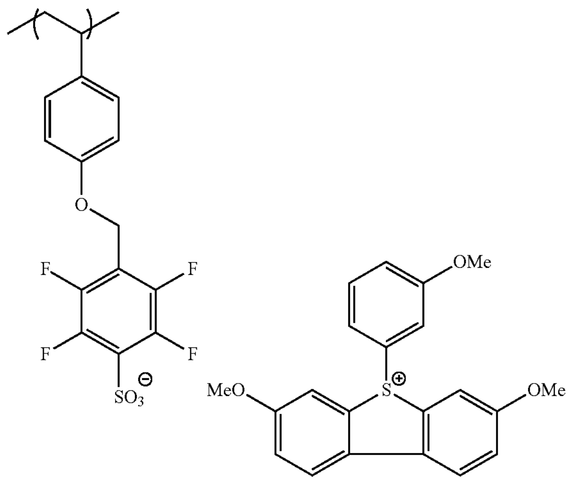
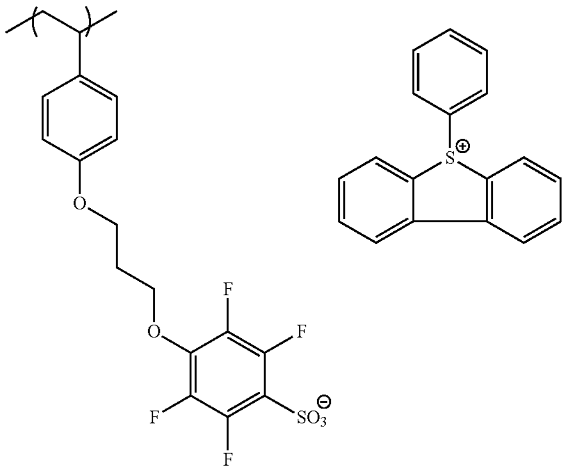
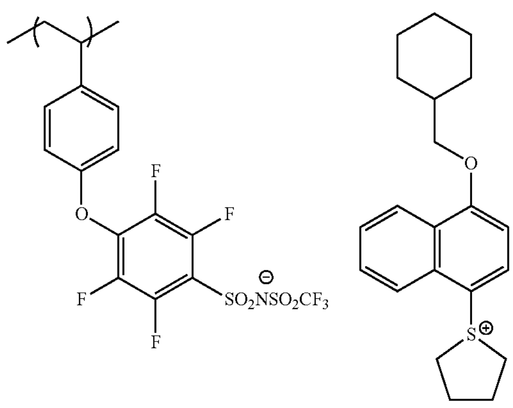
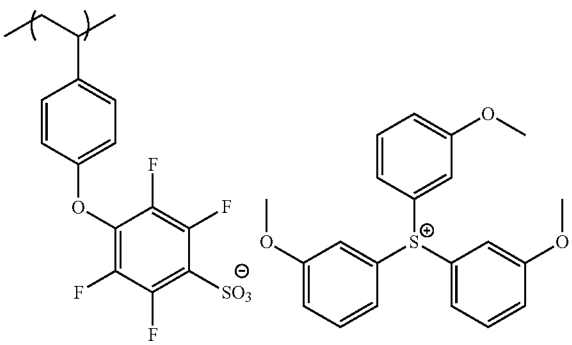
-continued
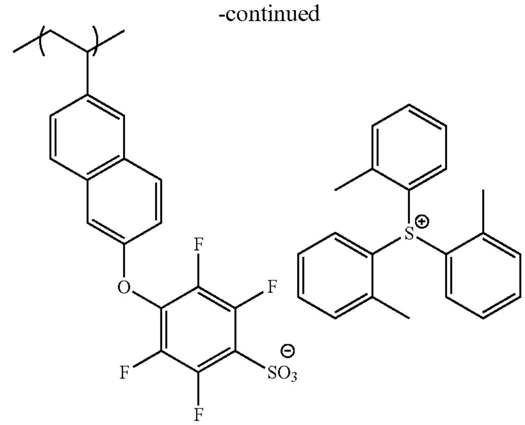
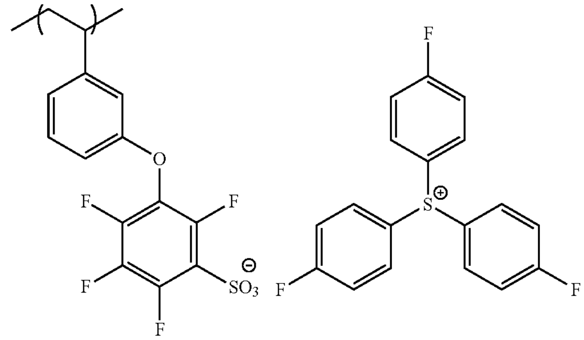
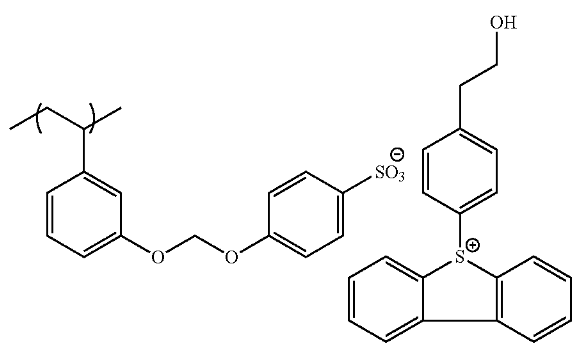
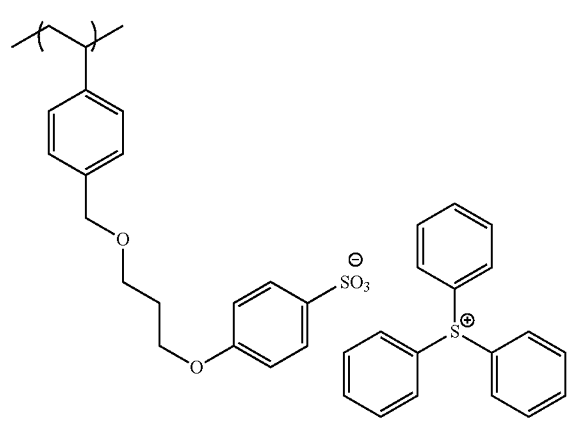

-continued

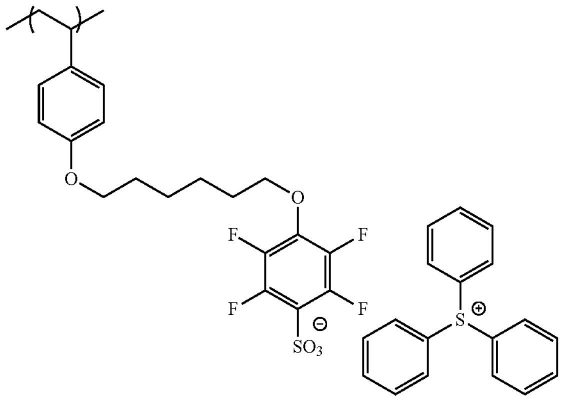

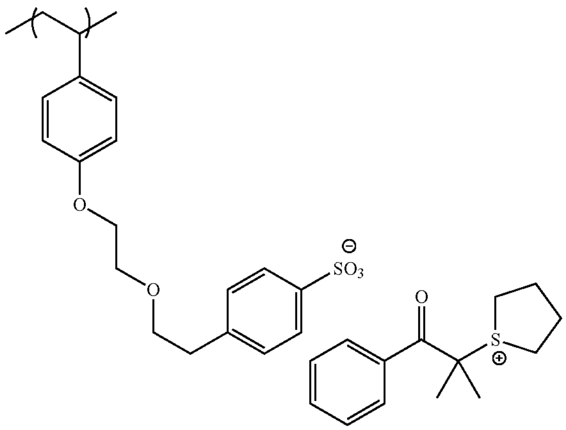

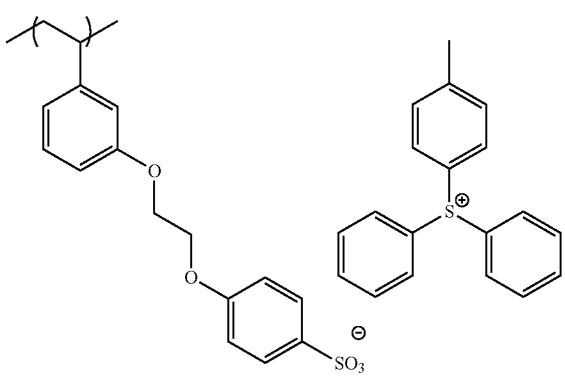

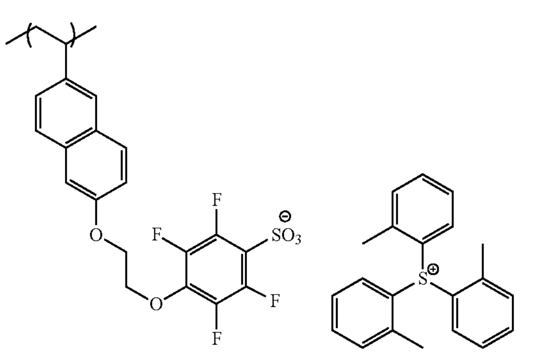

-continued

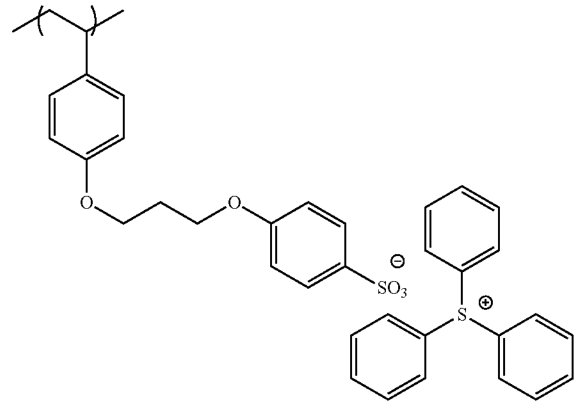

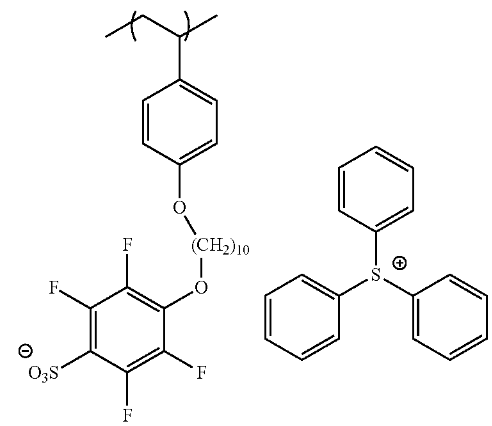

The content of the repeating units which are represented by General Formula (P) in the resin (A) is preferably in a range of 1 mol % to 40 mol % with respect to all of the repeating units in the resin (A), more preferably in a range of 2 mol % to 30 mol %, and particularly preferably 5 mol % to 25 mol %.

In addition, the resin (A) may include the monomer components described below in consideration of effects such as the improvement of Tg, improvement of the dry etching resistance, and internally filtering out-of-band light described above.

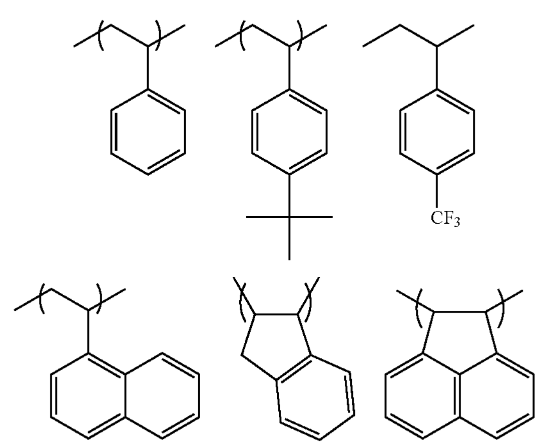

-continued

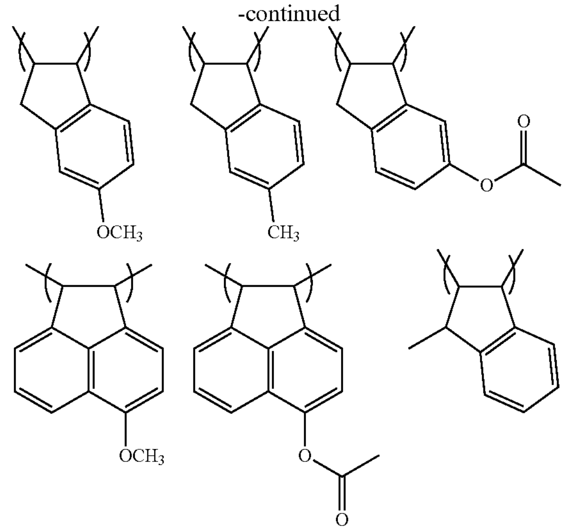

In the resin (A) which is used for the composition of the present invention, the content mol ratio of each repeating structure unit is appropriately set in order to adjust the dry etching resistance, standard developer suitability, substrate adhesion, and resist profile of a resist and, additionally, the resolving power, heat resistance, and sensitivity, and the like, which are typical necessary performances for resists.

The form of the resin (A) of the present invention may be any of a random type, a block type, a comb type, and a star type.

For example, it is possible to synthesize the resin (A) by radical, cation, or anion polymerization of unsaturated monomers which correspond to each structure. In addition, it is also possible to obtain a desired resin by performing a polymer reaction after polymerizing using unsaturated monomers which are equivalent to the precursor bodies of each structure.

Examples of general synthesizing methods include a collective polymerization method in which polymerization is performed by dissolving unsaturated monomers and a polymerization initiator in a solvent and heating the resultant, a dripping polymerization method in which a solution of unsaturated monomers and a polymerization initiator is dropwise added to a heated solvent over 1 to 10 hours, and the like, and the dripping polymerization method is preferable.

For the reaction solvent, the polymerization initiator, the reaction conditions (temperature, concentration, and the like) and the purifying method after reaction in the manufacturing of the resin (A), refer to the description according to paragraphs [0173] to [0183] of JP2012-208447A and this content is included in the present specification.

The molecular weight of the resin (A) according to the present invention is not particularly limited; however, the weight average molecular weight is preferably in a range of 1000 to 100000, more preferably in a range of 1500 to 60000, and particularly preferably in a range of 2000 to 30000. By setting the weight average molecular weight to be in a range of 1000 to 100000, it is possible to prevent deterioration in the heating resistance or dry etching resistance and it is possible to prevent the developing property from deteriorating or the film-forming property from deteriorating due to the viscosity increasing. Here, the weight average molecular weight of the resin indicates a polystyrene conversion molecular weight which is measured by GPC (carrier: THF or N-methyl-2-pyrrolidone (NMP)).

In addition, the dispersity (Mw/Mn) is preferably 1.00 to 5.00, more preferably 1.00 to 3.50, and even more preferably 1.00 to 2.50. As the molecular weight distribution is smaller, the resolution and the resist shape are superior, a side wall of a resist pattern is smoother, and roughness is superior.

It is possible to use the resin (A) as one type individually or in a combination of two or more types. The content ratio of the resin (A) is preferably 20 mass % to 99 mass % on the basis of the total solid content in an actinic ray-sensitive or radiation-sensitive resin composition, more preferably 30 mass % to 99 mass %, and even more preferably 40 mass % to 99 mass %.

[2] Resin (C)

The actinic ray-sensitive or radiation-sensitive resin composition which is used for the pattern forming method of the present invention contains a resin which has one or more groups selected from a group consisting of a fluorine atom, a group which has a fluorine atom, a group which has a silicon atom, an alkyl group (from the viewpoint of improving the hydrophobicity of the resin (C), preferably with 6 or more carbon atoms), a cycloalkyl group, an aryl group, an aralkyl group, an aromatic ring group which is substituted with at least one alkyl group, and an aromatic ring group which is substituted with at least one cycloalkyl group (also referred to below as simply a "resin (C)").

Here, the resin (C) is a resin which is different from the resin (A) described above.

The resin (C) may be unevenly distributed on a resist film surface after film-forming and function as a compound which forms a protective film.

Here, with regard to whether or not the resin (C) is unevenly distributed after film-forming on the film surface and forms a protective film, for example, in a case where, when comparing a surface static contact angle of a resist film to which the resin (C) is not added (the contact angle according to pure water) and a surface static contact angle of a resist film to which the resin (C) is added, the contact angle is increased, it is possible to consider that a protective layer is formed.

Since the atoms or groups described above of the resin (C) have a high hydrophobicity, it is possible to unevenly distribute the resin (C) on a surface of a resist film regardless of the exposed sections or unexposed sections of the resist film.

Since the contact angle is improved by the resin (C), capillary force is reduced, it is possible to suppress pattern collapsing, and the resolving power may be improved.

The resin (C) preferably has a repeating unit (also referred to below as simply a repeating unit ($\alpha$)) which has one or more groups selected from a group consisting of a fluorine atom, a group which has a fluorine atom, a group which has a silicon atom, an alkyl group, a cycloalkyl group, an aryl group, an aralkyl group, an aromatic ring group which is substituted with at least one alkyl group, and an aromatic ring group which is substituted with at least one cycloalkyl group, and more preferably has a repeating unit which has one or more groups selected from a group consisting of a fluorine atom, a group which has a fluorine atom, a group which has a silicon atom, an alkyl group with 6 or more carbon atoms, a cycloalkyl group with 5 or more carbon atoms, an aryl group with 6 or more carbon atoms, an aralkyl group with 7 or more carbon atoms, an aromatic ring group which is substituted with at least one alkyl group with 3 or more carbon atoms, and an aromatic ring group which is substituted with at least one cycloalkyl group with 5 or more carbon atoms.

However, a fluorine atom is excellent in the function of unevenly distributing the resin (C) on a surface of a resist film but, on the other hand, the sensitivity is high with respect to extreme ultraviolet rays (EUV light) and, since unexposed sections are also easily light-sensitive due to this, in a case where the exposure source is extreme ultraviolet rays (EUV light), the resin (C) preferably has one or more groups selected from a group consisting of a group which has a silicon atom, an alkyl group with 6 or more carbon atoms, a cycloalkyl group with 5 or more carbon atoms, an aryl group with 6 or more carbon atoms, an aralkyl group with 7 or more carbon atoms, an aromatic ring group which is substituted with at least one alkyl group with 3 or more carbon atoms, and an aromatic ring group which is substituted with at least one cycloalkyl group with 5 or more carbon atoms.

Examples of a group which has a fluorine atom include an alkyl group which has a fluorine atom, a cycloalkyl group which has a fluorine atom, an aryl group which has a fluorine atom, or the like.

Examples of an alkyl group which has a fluorine atom include an alkyl group which has a fluorine atom preferably with 1 to 10 carbon atoms and more preferably with 1 to 4 carbon atoms, the alkyl group is a straight-chain or branched alkyl group in which at least one hydrogen atom is substituted with a fluorine atom and may further have a substituent group other than a fluorine atom.

A cycloalkyl group which has a fluorine atom is a monocyclic or polycyclic cycloalkyl group in which at least one hydrogen atom is substituted with a fluorine atom and may further have a substituent group other than a fluorine atom.

Examples of an aryl group which has a fluorine atom include an aryl group such as a phenyl group and a naphthyl group in which at least one hydrogen atom is substituted with a fluorine atom and the aryl group may further have a substituent group other than a fluorine atom.

Examples of an alkyl group which has a fluorine atom, a cycloalkyl group which has a fluorine atom, and an aryl group which has a fluorine atom preferably include the groups which are represented by General Formulas (F2) to (F4); however, the present invention is not limited thereto.

(F2)

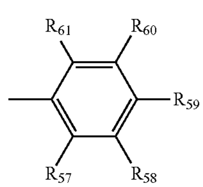

(F3)

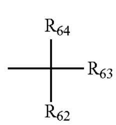

(F4)

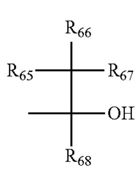

In General Formulas (F2) to (F4), $R_{57}$ to $R_{68}$ each independently represent a hydrogen atom, a fluorine atom, or an alkyl group (straight-chain or branched). However, at least one of $R_{57}$ to $R_{61}$, at least one of $R_{62}$ to $R_{64}$, and at least one of $R_{65}$ to $R_{68}$ each independently represent an alkyl group (preferably with 1 to 4 carbon atoms) where a fluorine atom or at least one hydrogen atom is substituted with a fluorine atom.

$R_{57}$ to $R_{61}$ and $R_{65}$ to $R_{67}$ are preferably all fluorine atoms. $R_{62}$, $R_{63}$, and $R_{68}$ are preferably an alkyl group (preferably with 1 to 4 carbon atoms) where at least one hydrogen atom is substituted with a fluorine atom and more preferably a perfluoroalkyl group with 1 to 4 carbon atoms. $R_{62}$ and $R_{63}$ may form a ring by linking with each other.

Specific examples of a group which is represented by General Formula (F2) include a p-fluorophenyl group, a pentafluorophenyl group, 3,5-di(trifluoromethyl)phenyl group, and the like.

Specific examples of a group which is represented by General Formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, 2,2,3,3-tetrafluorocyclobutyl group, a perfluorocyclohexyl group, and the like. A hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferable and a hexafluoroisopropyl group and a heptafluoroisopropyl group are more preferable.

Specific examples of a group which is represented by General Formula (F4) include —$C(CF_3)_2OH$, —$C(C_2F_5)_2OH$, —$C(CF_3)(CH_3)OH$, —$CH(CF_3)OH$, and the like, and —$C(CF_3)_2OH$ is preferable.

Examples of a group which has a silicon atom include an alkylsilyl structure (preferably a trialkylsilyl group), a cyclic siloxane structure, and the like.

In detail, examples of an alkylsilyl structure or a cyclic siloxane structure for $W_3$ to $W_6$ include a group which is represented by General Formulas (CS-1) to (CS-3) below, and the like.

(CS-1)

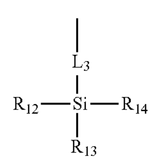

(CS-2)

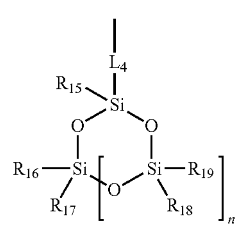

-continued (CS-3)

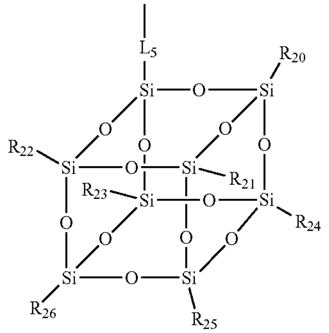

In General Formulas (CS-1) to (CS-3), $R_{12}$ to $R_{26}$ each independently represent a straight-chain or branched alkyl group (preferably with 1 to 20 carbon atoms) or a cycloalkyl group (preferably 3 to 20 carbon atoms).

$L_3$ to $L_5$ represent a single bond or a divalent linking group. Examples of the divalent linking group include individuals or combinations of two or more selected from a group formed of an alkylene group, a phenylene group, an ether bond, a thioether bond, a carbonyl group, an ester bond, an amide bond, a urethane bond, and a urea bond (preferably with a total number of carbon atoms of 12 or less).

n represents an integer of 1 to 5. n is preferably is an integer of 2 to 4.

Examples of an alkyl group which the resin (C) may have include a straight-chain or branched alkyl group preferably with 6 or more carbon atoms, more preferably with 6 to 20 carbon atoms, and even more preferably 6 to 15 carbon atoms from the viewpoint of further improving the hydrophobicity of the resin (C), and the alkyl group may further have a substituent group (however, the substituent group does not correspond to the fluorine atom, the group which has a fluorine atom, and the group which has a silicon atom).

Examples of a cycloalkyl group which the resin (C) may have include a cycloalkyl group preferably with 5 or more carbon atoms, more preferably with 6 to 20 carbon atoms, and even more preferably 6 to 15 carbon atoms and the cycloalkyl group may further have a substituent group (however, the substituent group does not correspond to the fluorine atom, the group which has a fluorine atom, and the group which has a silicon atom).

Examples of an aryl group which the resin (C) may have include an aryl group preferably with 6 or more carbon atoms, more preferably with 9 to 20 carbon atoms, and even more preferably 9 to 15 carbon atoms from the viewpoint of further improving the hydrophobicity of the resin (C) and the aryl group may further have a substituent group (however, the substituent group does not correspond to the fluorine atom, the group which has a fluorine atom, and the group which has a silicon atom).

Examples of an aralkyl group which the resin (C) may have include an aralkyl group preferably with 7 or more carbon atoms, more preferably with 7 to 20 carbon atoms, and even more preferably 10 to 20 carbon atoms and the aralkyl group may further have a substituent group (however, the substituent group does not correspond to the fluorine atom, the group which has a fluorine atom, and the group which has a silicon atom).

Examples of the aromatic ring in an aromatic ring group which is substituted with at least one alkyl group and an aromatic ring group which is substituted with at least one cycloalkyl group include an aromatic ring preferably with 6 to 20 carbon atoms and more preferably 6 to 15 carbon atoms and the aromatic ring may further have a substituent group other than an alkyl group and a cycloalkyl group (however, the substituent group does not correspond to the fluorine atom, the group which has a fluorine atom, and the group which has a silicon atom).

Examples of the alkyl group include a straight-chain or branched alkyl group preferably with 3 or more carbon atoms, more preferably with 3 to 15 carbon atoms, and even more preferably with 3 to 10 carbon atoms from the viewpoint of further improving the hydrophobicity of the resin (C). In an aromatic ring group which is substituted with at least one alkyl group, an aromatic ring is preferably substituted with 1 to 9 alkyl groups (preferably with 3 or more carbon atoms), more preferably substituted with 1 to 7 alkyl groups with 3 or more carbon atoms, and even more preferably substituted with 1 to 5 alkyl groups with 3 or more carbon atoms.

Examples of the cycloalkyl group include a cycloalkyl group preferably with 5 or more carbon atoms, more preferably with 5 to 20 carbon atoms, and even more preferably with 5 to 15 carbon atoms. In an aromatic ring group which is substituted with at least one cycloalkyl group (preferably with 5 or more carbon atoms), the aromatic ring is preferably substituted with 1 to 5 cycloalkyl groups with 5 or more carbon atoms, more preferably substituted with 1 to 4 cycloalkyl groups with 5 or more carbon atoms, and even more preferably substituted with 1 to 3 cycloalkyl groups with 5 or more carbon atoms.

The resin (C) preferably has at least one type of repeating unit which is represented by any of General Formulas (C-Ia) to (C-Id) below as the repeating unit (α) described above.

(C-Ia)

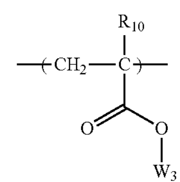

(C-Ib)

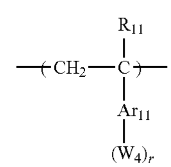

(C-Ic)

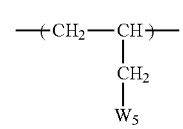

(C-Id)

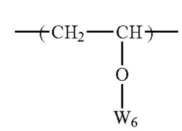

In General Formulas above, $R_{10}$ and $R_{11}$ each independently represent a hydrogen atom, a fluorine atom, or an alkyl group. The alkyl group is preferably a straight-chain or branched alkyl group with 1 to 4 carbon atoms and may have a substituent group and examples of alkyl groups which have a substituent group include a fluorinated alkyl group in particular. $R_{10}$ and $R_{11}$ are preferably each independently a hydrogen atom or a methyl group.

$W_3$, $W_5$, and $W_6$ each independently represent an organic group which has one or more selected from a group consisting of a group which has a fluorine atom, a group which has a silicon atom, an alkyl group (from the viewpoint of further improving the hydrophobicity of the resin (C), preferably with 6 or more carbon atoms), a cycloalkyl group, an aryl group, and an aralkyl group.

$W_4$ represents an organic group which has one or more selected from a group consisting of a group which has a fluorine atom, a group which has a silicon atom, an alkyl group, and a cycloalkyl group.

$Ar_{11}$ represents an (r+1)valent aromatic ring group.

r represents an integer of 1 to 10.

As an (r+1)valent aromatic ring group $Ar_{11}$, a divalent aromatic ring group in a case where r is 1 may have a substituent group and examples thereof include an arylene group with 6 to 18 carbon atoms such as a phenylene group, a tolylene group, a naphthylene group, and an anthracenilen group and the like.

Specific examples of an (r+1)valent aromatic ring group in a case where r is an integer of 2 or more preferably include a group formed by removing (r−1) of arbitrary hydrogen atoms from the specific examples of the divalent aromatic ring group described above.

With regard to $W_3$ to $W_6$, the group which has a fluorine atom is the same as in the examples of the group which has a fluorine atom described above.

With regard to $W_3$ to $W_6$, a group which has a fluorine atom may be directly bonded with a repeating unit which is represented by General Formulas (C-Ia) to (C-Id) and, additionally, may be bonded with a repeating unit which is represented by General Formulas (C-Ia) to (C-Id) via a group selected from a group formed of an alkylene group, a phenylene group, an ether bond, a thioether bond, a carbonyl group, an ester bond, an amide bond, a urethane bond, and a ureylene bond, or a group combining two or more thereof.

With regard to $W_3$ to $W_6$, a group which has a silicon atom is the same as in the examples of the group which has a silicon atom described above.

With regard to $W_3$, $W_5$, and $W_6$, an alkyl group, a cycloalkyl group, an aryl group, and an aralkyl group are respectively the same as the alkyl group, the cycloalkyl group, the aryl group, and the aralkyl group described above which the resin (C) may have, and the specific examples and the preferable examples thereof are also the same.

With regard to $W_4$, the alkyl group and the cycloalkyl group are respectively the same as the groups described above in relation to the alkyl group in an aromatic ring group which is substituted with at least one alkyl group and the cycloalkyl group in an aromatic ring group which is substituted with at least one cycloalkyl group.

In a case where the exposure source is extreme ultraviolet rays (EUV light), due to the reasons described above, $W_3$, $W_5$, and $W_6$ also preferably each independently represent an organic group which has one or more selected from a group consisting of a group which has a silicon atom, an alkyl group with 6 or more carbon atoms, a cycloalkyl group with 5 or more carbon atoms, an aryl group with 6 or more carbon atoms, and an aralkyl group with or more carbon atoms, and $W_4$ also preferably represents an organic group which has one or more selected from a group consisting of a group which has a silicon atom, an alkyl group with 3 or more carbon atoms, and a cycloalkyl group with 5 or more carbon atoms.

$W_3$, $W_5$, and $W_6$ are preferably each independently an organic group which has a fluorine atom, an organic group which has a silicon atom, an alkyl group with 6 or more carbon atoms, a cycloalkyl group with 5 or more carbon atoms, an aryl group with 6 or more carbon atoms, or an aralkyl group with 7 or more carbon atoms and, in a case where the exposure source is extreme ultraviolet rays (EUV light), due to the reasons described above, $W_3$, $W_5$, and $W_6$ are also preferably an organic group which has a silicon atom, an alkyl group with 6 or more carbon atoms, a cycloalkyl group with 6 or more carbon atoms, an aryl group with 9 or more carbon atoms, or an aralkyl group with 10 or more carbon atoms.

$W_4$ is preferably an organic group which has a fluorine atom, an organic group which has a silicon atom, an alkyl group with 3 or more carbon atoms, or a cycloalkyl group with 5 or more carbon atoms and, in a case where the exposure source is extreme ultraviolet rays (EUV light), due to the reason described above, $W_4$ is also preferably an organic group which has a silicon atom, an alkyl group with 3 or more carbon atoms, or a cycloalkyl group with 5 or more carbon atoms.

Specific examples of a repeating unit which is represented by any of General Formulas (C-Ia) to (C-Id) will be shown below; however, the present invention is not limited thereto.

In the specific examples, $X_1$ represents a hydrogen atom, —$CH_3$, —F, or —$CF_3$.

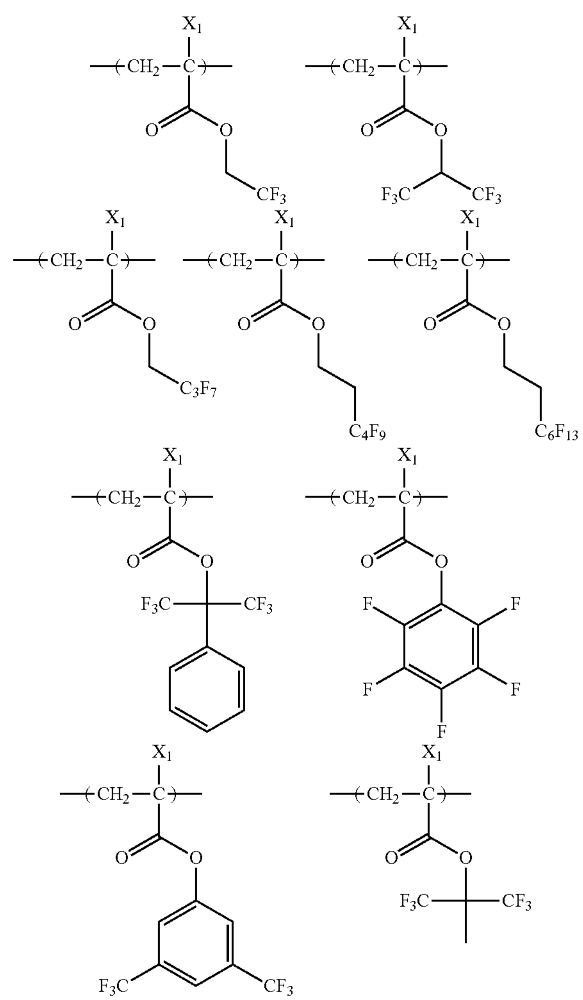

-continued
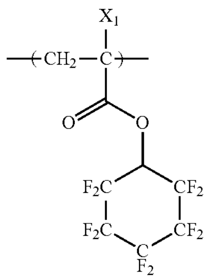
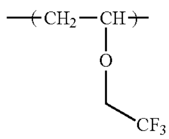
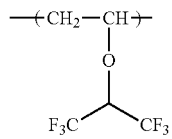
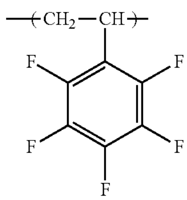
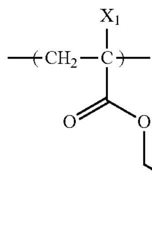
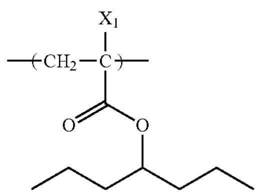
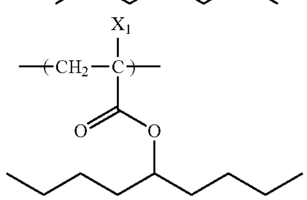
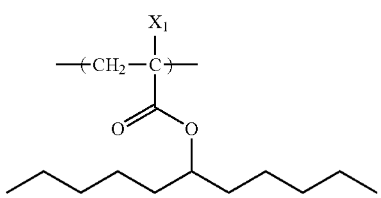
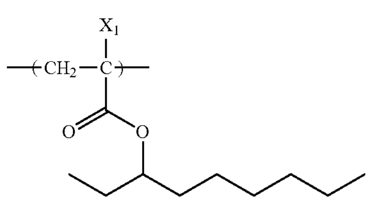
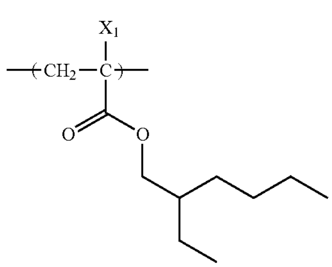
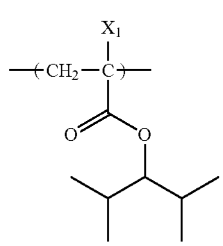
-continued
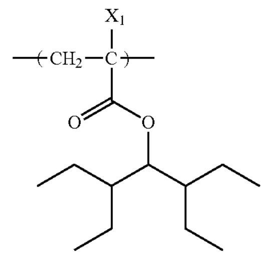
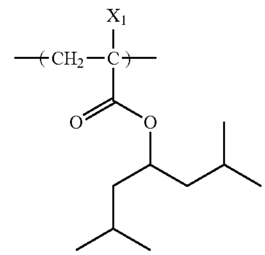
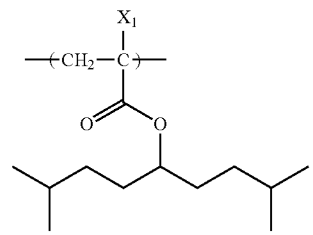
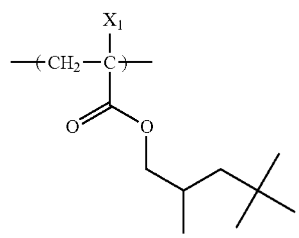
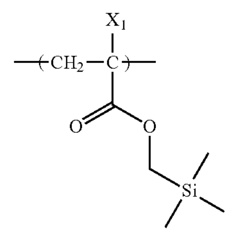
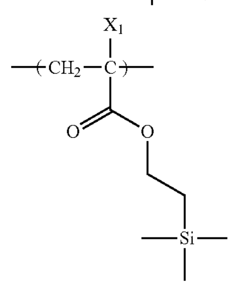
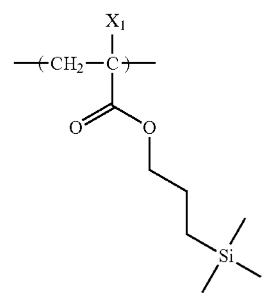
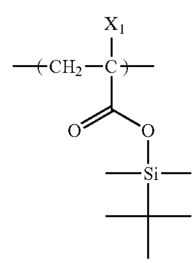
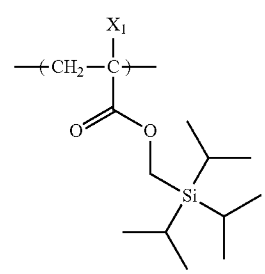
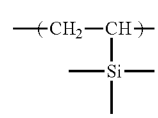
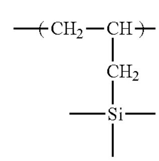
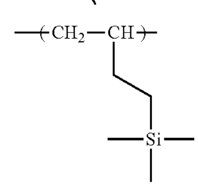
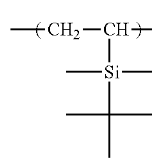
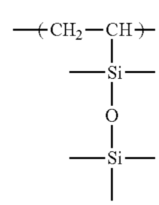
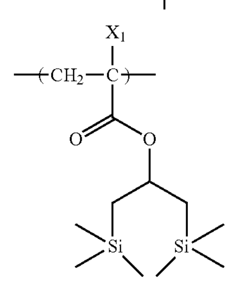

-continued

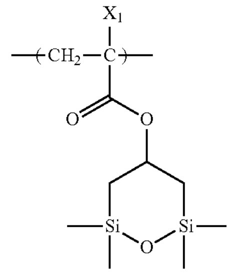

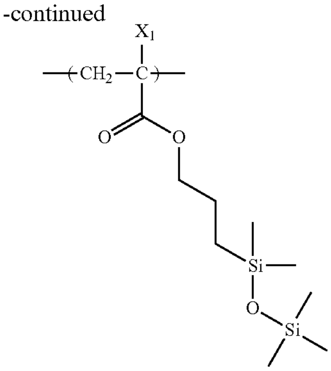

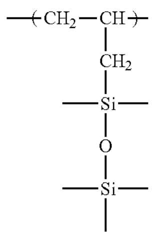

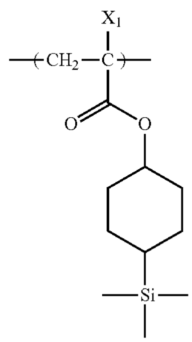

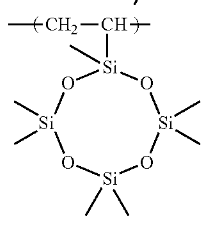

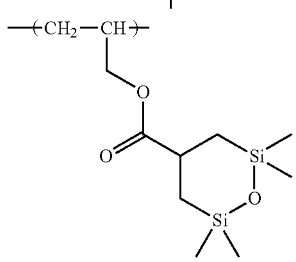

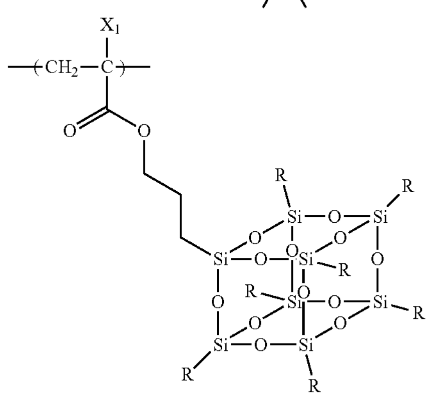

$R = CH_3, C_2H_5, C_3H_7, C_4H_9$

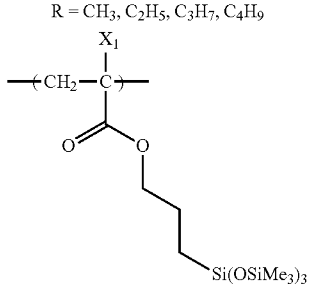

The resin (C) preferably has an aromatic ring group and more preferably has a repeating unit which has an aromatic ring group. By the resin (C) having an aromatic ring group, it is possible to further suppress the defects where, due to the aromatic ring group absorbing out-of-band light of EUV light and only the surface of an exposed section being photosensitive to the out-of-band light, the surface of the pattern is rough (in particular, in a case of EUV exposure), the cross-sectional shape of the pattern is a T-top shape or a reverse taper shape, or the surfaces of the pattern which are to be separated are not separated and bridge sections are generated.

In this case, the repeating unit (α) may have an aromatic ring group or the repeating unit may have an aromatic ring group as well as the resin (C) further having a repeating unit other than the repeating unit (α).

A repeating unit (α) in a case where the repeating unit (α) has an aromatic ring group is preferably a repeating unit which is represented by General Formula (C-II) below.

(C-II)

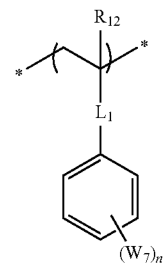

In the General Formula above, $R_{12}$ represents a hydrogen atom, a methyl group, a trifluoromethyl group, or a fluorine atom.

$W_7$ represents an organic group which has one of more selected from a group consisting of a group which has a fluorine atom, a group which has a silicon atom, an alkyl group, and a cycloalkyl group.

$L_1$ represents a single bond or a —COOL2- group. $L_2$ represents a single bond or an alkylene group.

n represents an integer of 1 to 5.

With regard to $W_7$, the group which has a fluorine atom and the group which has a silicon atom are respectively the same as the group which has a fluorine atom and the group which has a silicon atom described above.

With regard to $W_7$, the alkyl group and the cycloalkyl group are respectively the same as the groups described above in relation to the alkyl group in an aromatic ring group which is substituted with at least one alkyl group and the cycloalkyl group in an aromatic ring group which is substituted with at least one cycloalkyl group.

$W_7$ is preferably a trialkylsilyl group, a trialkoxysilyl group, an alkyl group which has a trialkylsilyl group, an alkyl group which has a trialkoxysilyl group, an alkyl group with 3 or more carbon atoms, or a cycloalkyl group with 5 or more carbon atoms.

In a trialkylsilyl group, a trialkoxysilyl group, an alkyl group which has a trialkylsilyl group, and an alkyl group which has a trialkoxysilyl group as $W_7$, the number of carbon atoms of the alkyl group or the alkoxy group which is bonded with the silicon atom is preferably 1 to 5 and more preferably 1 to 3.

In addition, in an alkyl group which has a trialkylsilyl group and an alkyl group which has a trialkoxysilyl group as $W_7$, the number of carbon atoms of the alkyl group which is bonded with the trialkylsilyl group or the trialkoxysilyl group is preferably 1 to 5 and more preferably 1 to 3.

$R_{12}$ is preferably a hydrogen atom or a methyl group.

An alkylene group as $L_2$ is preferably an alkylene group with 1 to 5 carbon atoms and more preferably an alkylene group with 1 to 3 carbon atoms. $L_2$ is preferably a single bond.

$W_7$ is preferably an organic group which has a fluorine atom, an organic group which has a silicon atom, an alkyl group with 3 or more carbon atoms, or a cycloalkyl group with 5 or more carbon atoms.

Specific examples of a repeating unit which is represented by General Formula (C-II) will be shown below; however, the present invention is not limited thereto.

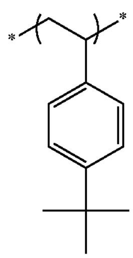

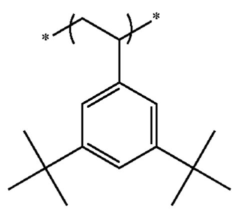

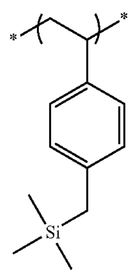

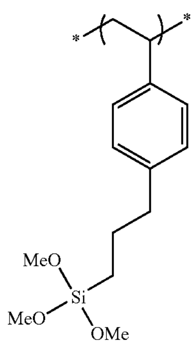

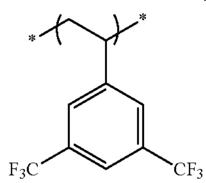

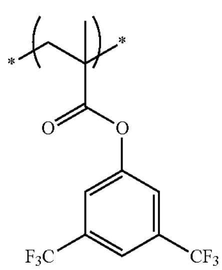

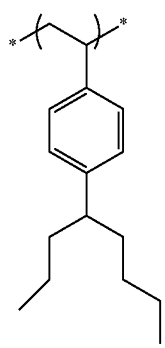

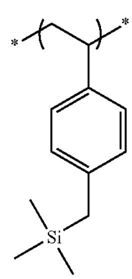

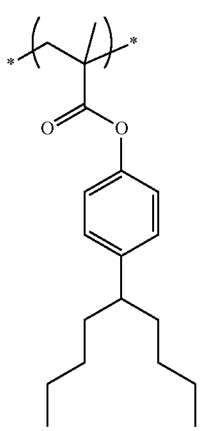

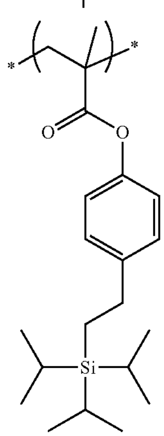

-continued

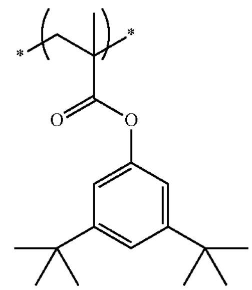

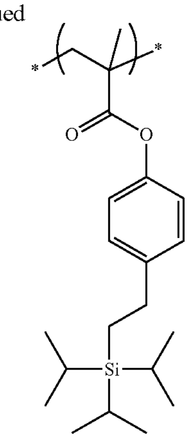

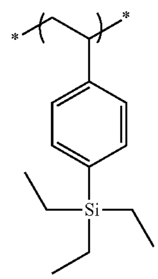

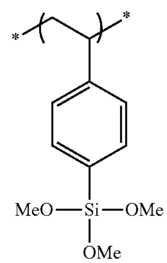

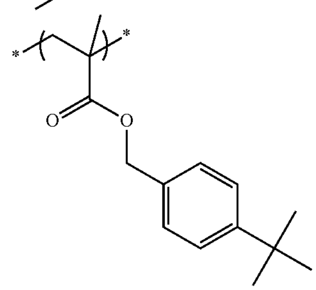

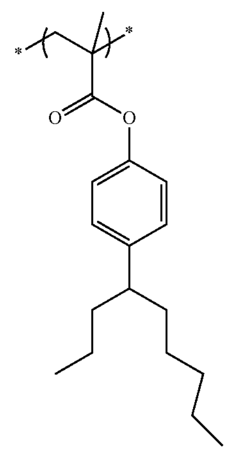

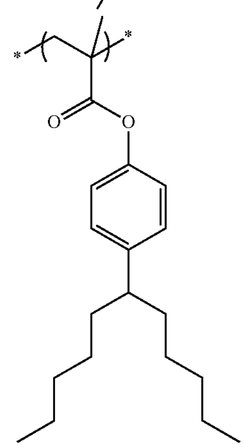

The content of the repeating unit (α) with respect to all of the repeating units of the resin (C) is preferably 5 mol % to 100 mol %, more preferably 10 mol % to 90 mol %, and even more preferably 10 mol % to 80 mol %.

In addition, in a case where the repeating unit has an aromatic ring group as well as the resin (C) further having a repeating unit other than the repeating unit (α), examples of the resin (C) include a copolymer which includes a repeating unit which is represented by any of General Formula (C-Ia) to (C-Id) and a repeating unit which has an aromatic ring group.

The repeating unit which has an aromatic ring group is preferably a repeating unit which is represented by General Formula (II) below.

(II)

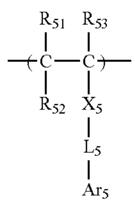

In the General Formula, $R_{51}$, $R_{52}$, and $R_{53}$ each independently represent a hydrogen atom, an alkyl group, a halogen atom, a cyano group, or an alkoxycarbonyl group. However, $R_{52}$ may form a ring by bonding with $Ar_5$ and $R_{52}$ in this case represents a single bond or an alkylene group.

$X_5$ represents a single bond, —COO— or —$CONR_{64}$— and $R_{64}$ represents a hydrogen atom or an alkyl group.

$L_5$ represents a single bond or an alkylene group.

$Ar_5$ represents a monovalent aromatic ring group and represents a divalent aromatic ring group in a case of forming a ring by bonding with $R_{52}$.

Specific examples of the alkyl group, the cycloalkyl group, the halogen atom, the alkoxycarbonyl group, and the substituent group which the groups of $R_{51}$, $R_{52}$, and $R_{53}$ in Formula (II) may have are the same as the specific examples described for each group which is represented by $R_{61}$, $R_{62}$, and $R_{63}$ in General Formula (VI) above.

A monovalent aromatic ring group $Ar_5$ may have a substituent group and preferable examples thereof include an aromatic ring group which includes an arylene group with 6 to 18 carbon atoms such as a phenyl group, a tolyl group, a naphthyl group, and an anthracenyl group or an aromatic ring group which includes a hetero ring of thiophene, furan, pyrrole, benzothiophene, benzofuran, benzopyrrole, triazine, imidazole, benzimidazole, triazole, thiadiazole, thiazole, and the like.

Specific examples of a divalent aromatic ring group favorably include a group formed by removing one arbitrary hydrogen atom from the specific examples of the monovalent aromatic ring group described above.

Examples of a substituent group which the alkyl group, the cycloalkyl group, the alkoxycarbonyl group, the alkylene group, and the monovalent aromatic ring group described above may have include an alkoxy group such as an alkyl group, a methoxy group, an ethoxy group, a hydroxyethoxy group, a propoxy group, a hydroxypropoxy group, and a butoxy group and an aryl group such as a phenyl group exemplified by $R_{61}$ to $R_{63}$ in General Formula (VI) with regard to the resin (A).

Examples of an alkyl group of $R_{64}$ in —$CONR_{64}$— which is represented by $X_5$ ($R_{64}$ represents a hydrogen atom or an alkyl group) include the same examples as the alkyl groups of $R_{51}$ to $R_{53}$.

$X_5$ is preferably a single bond, —COO— or —CONH—, and more preferably a single bond or —COO—.

Examples of an alkylene group in $L_5$ preferably include an alkylene group with 1 to 8 carbon atoms such as a methylene group, an ethylene group, a propylene group, a butylene group, a hexylene group, and an octylene group, which may have a substituent group.

$Ar_5$ is more preferably an aromatic ring group with 6 to 18 carbon atoms which may have a substituent group and is particularly preferably a phenyl group, a naphthyl group, and a biphenyl group.

Specific examples of a repeating unit which is represented by General Formula (II) will be shown below; however, the present invention is not limited thereto.

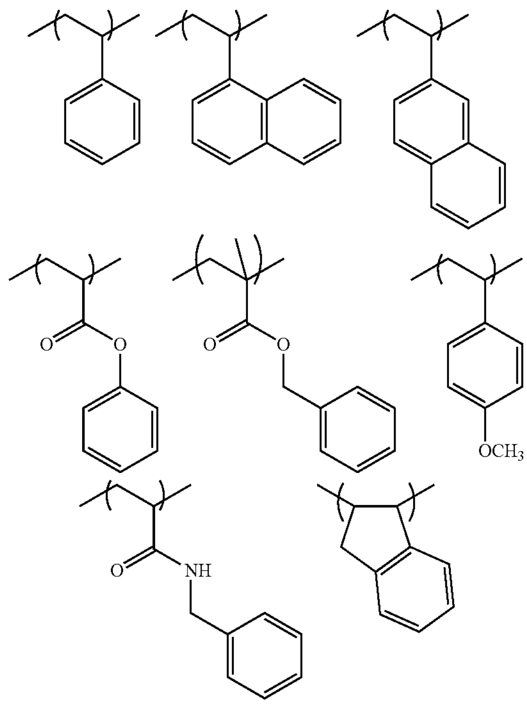

The resin (C) may or may not contain a repeating unit which is represented by General Formula (II); however, when contained, the content of the repeating unit which is represented by General Formula (II) with respect to all of the repeating units of the resin (C) is preferably 1 mol % to 40 mol %, more preferably 1 mol % to 35 mol %, and even more preferably 1 mol % to 30 mol %.

Repeating Unit (β) or (γ)

The resin (C) preferably contains a repeating unit (also referred to below as a "repeating unit (β)") which has at least two or more groups (also referred to below as "polarity conversion groups") which are represented by —COO— in a structure which is represented by General Formulas (KA-1) or (KB-1) below, or at least one type of a repeating unit (also referred to below as a "repeating unit (γ)") which is derived from a monomer which is represented by General Formula (aa1-1) below, and more preferably contains a repeating unit (β) which has at least two or more groups which are represented by —COO— in a structure which is represented by General Formulas (KA-1) or (KB-1) below.

(KA-1)

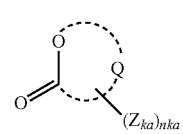

-continued (KB-1)

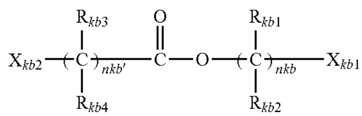

In General Formula (KA-1), $Z_{ka}$ represents an alkyl group, a cycloalkyl group, an ether group, a hydroxyl group, an amide group, an aryl group, a lactone group, or an electron-withdrawing group. When a plurality of $Z_{ka}$s are present, the plurality of $Z_{ka}$s may be the same or may be different and the $Z_{ka}$s may form a ring by linking with each other.

nka represents an integer of 0 to 10.

Q represents an atomic group which is necessary for forming a lactone ring with atoms in the formula.

In General Formula (KB-1), $X_{kb1}$ and $X_{kb2}$ each independently represent an electron-withdrawing group.

nkb and nkb' each independently represent 0 or 1.

$R_{kb1}$, $R_{kb2}$, $R_{kb3}$, and $R_{kb4}$ each independently represent a hydrogen atom, an alkyl group, a cycloalkyl group, an aryl group, or an electron-withdrawing group. At least two of $R_{kb1}$, $R_{kb2}$, and $X_{kb1}$ may form a ring by linking with each other and at least two of $R_{kb3}$, $R_{kb4}$, and $X_{kb2}$ may form a ring by linking with each other.

(aa1-1)

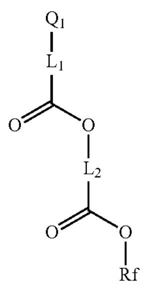

In General Formula (aa1-1) above, $Q_1$ represents an organic group which includes a polymeric group.

$L_1$ and $L_2$ each independently represent a single bond or a divalent linking group.

Rf represents an organic group which has a fluorine atom.

A polarity conversion group is a group which is decomposed due to the effect of an alkaline developing solution and of which the degree of solubility is increased in the alkaline developing solution and, by components which are decomposed due to an alkaline developing solution being unevenly distributed in a film surface layer section, the compatibility with the developer is increased and it is possible to reduce blob defects. In addition, since at least one type of the repeating unit (γ) which is derived from the monomer which is represented by General Formula (aa1-1) also has a polarity conversion group in the same manner, it is possible to reduce blob defects. It may be considered that one of the reasons therefor is that, for example, a fluorine-containing ester group which is present at the end of a side chain is hydrolyzed by an alkaline developing solution and hydrophilization of the resin occurs.

The repeating unit (β) is preferably a repeating unit (β') which has at least two or more polarity conversion groups and at least one of a fluorine atom and a silicon atom on one side chain. That is, the repeating unit (β) has a structure which has at least one of a fluorine atom and a silicon atom on a side chain which has a plurality of polarity conversion groups. Here, the fluorine atom may be the fluorine atom which is the electron-withdrawing group in the polarity conversion group which will be described below, or may be a fluorine atom which is different from the fluorine atom which is the electron-withdrawing group.

In addition, it is also preferable that the repeating unit (β) is a repeating unit (β*) which has at least two or more polarity conversion groups and does not have a fluorine atom or a silicon atom, and that the resin (C) further has a repeating unit which has at least one of a fluorine atom and a silicon atom.

Alternatively, it is also preferable that the repeating unit (β) is a repeating unit (β") which has at least two or more polarity conversion groups on one side chain and has at least one of a fluorine atom and a silicon atom on a side chain which is different from the above side chain in the same repeating unit. In this case, a side chain which has a polarity conversion group and a side chain which has at least one of a fluorine atom or a silicon atom preferably have a positional relationship at the α-position via a carbon atom of a main chain, that is, a positional relationship as in Formula (4) below. In the formula, B1 represents a partial structure which has a polarity conversion group and B2 represents a partial structure which has at least one of a fluorine atom and a silicon atom.

(4)

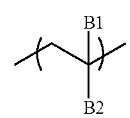

Among the aspects of the resin (C), it is more preferable to have a repeating unit (β').

Here, a polarity conversion group is a group which is decomposed due to an effect of an alkaline developing solution and of which the degree of solubility in an alkaline developing solution is increased as described above and a partial structure which is represented by —COO— in the structure shown in General Formula (KA-1) or (KB-1) below.

It is possible to use any group for the lactone structure which is represented by General Formula (KA-1) as long as the group has a lactone ring; however, a group having a ring lactone structure with 5 to 7 members is preferable, and a group in which another ring structure is condensed in a form which a bicyclo structure and a spiro structure are formed in the ring lactone structure with 5 to 7 members is preferable.

Here, since an ester group (for example, —COO— in acrylate) which is directly bonded with the main chain of a resin in a repeating unit functions poorly as a polarity conversion group, ester groups are not included in the polarity conversion group in the present case.

In addition, the repeating unit (β) need not separately have two of the whole structures which are represented by (KA-1) or (KB-1) and it is understood that the repeating unit (β) includes two polarity conversion groups even in a form where, for example, two ester structures interpose one electron-withdrawing group by partially overlapping, or even in the form of Formula (KY-1) which will be described below.

In addition, in the repeating unit (β*) and the repeating unit (β"), the polarity conversion group is more preferably a partial structure which is represented by —COO— in the structure shown by General Formula (KA-1).

(KA-1)

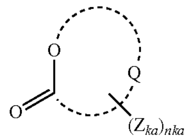

(KB-1)

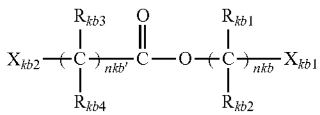

In General Formula (KA-1), $Z_{ka}$ represents an alkyl group, a cycloalkyl group, an ether group, a hydroxyl group, an amide group, an aryl group, a lactone ring group, or an electron-withdrawing group. When a plurality of $Z_{ka}$s are present, the plurality of $Z_{ka}$s may be the same or may be different and the $Z_{ka}$s may form a ring by linking with each other. Examples of rings which $Z_{ka}$s form by linking with each other include a cycloalkyl ring and a hetero ring (a cyclic ether ring, a lactone ring, and the like).

nka represents an integer of 0 to 10. nka is preferably an integer of 0 to 8, more preferably an integer of 0 to 5, even more preferably an integer of 1 to 4, and the most preferably an integer of 1 to 3.

Q represents an atomic group which is necessary for forming a lactone ring with atoms in the formula. The lactone ring is not particularly limited as long as the lactone ring is a group which has a lactone structure as described above; however, the lactone ring is preferably a group which has a ring lactone structure with 5 to 7 members, and a group in which another ring structure is condensed in a form in which a bicyclo structure and a spiro structure are formed in a ring lactone structure with 5 to 7 members is preferable.

In General Formula (KB-1), $X_{kb1}$ and $X_{kb2}$ each independently represent an electron-withdrawing group.

nkb and nkb' each independently represent 0 or 1. Here, a case where nkb and nkb' are 0 indicates that $X_{kb1}$ and $X_{kb2}$ are directly bonded with an ester group (—COO—).

$R_{kb1}$, $R_{kb2}$, $R_{kb3}$, and $R_{kb4}$ each independently represent a hydrogen atom, an alkyl group, a cycloalkyl group, an aryl group, or an electron-withdrawing group. At least two of $R_{kb1}$, $R_{kb2}$, and $X_{kb1}$ may form a ring by linking with each other and at least two of $R_{kb3}$, $R_{kb4}$, and $X_{kb2}$ may form a ring by linking with each other.

Examples of a ring which at least two of $R_{kb3}$, $R_{kb4}$, and $X_{kb2}$ may form by linking with each other preferably include a cycloalkyl group or a hetero ring group and the hetero ring group is preferably a lactone ring group. Examples of the lactone ring include a structure which is represented by, for example, Formulas (LC1-1) to (LC1-17) described above for the resin (A).

Here, a structure which is represented by General Formula (KA-1) or (KB-1) is a monovalent or higher partial structure where at least one arbitrary hydrogen atom is removed in the structure in a case of not having a direct bond as in a case of the structure which is represented by General Formula (KA-1) and the structure which is represented by (KB-1) in a case where $X_{kb1}$ and $X_{kb2}$ are monovalent.

Examples of an electron-withdrawing group in $Z_{ka}$, $X_{kb1}$, $X_{kb2}$, and $R_{kb1}$ to $R_{kb4}$ include a halogen atom, a cyano group, an oxy group, a carbonyl group, a carbonyloxy group, an oxycarbonyl group, a nitrile group, a nitro group, a sulfonyl group, a sulfinyl group, or halo(cyclo)alkyl group or haloaryl group which is represented by —$C(R_{f1})(R_{f2})$—$R_{f3}$, and a combination thereof.

Here, the "halo(cyclo)alkyl group" represents an alkyl group and a cycloalkyl group of which at least a part is halogenated. In a case where an electron-withdrawing group is a divalent or higher group, the remaining direct bonds form a bond with an arbitrary atom or substituent group and may be linked with a main chain of the resin (C) via an additional substituent group.

Here, $R_{f1}$ represents a halogen atom, a perhaloalkyl group, a perhalocycloalkyl group, or a perhaloaryl group, more preferably represents a fluorine atom, a perfluoroalkyl group, or a perfluorocycloalkyl group, and even more preferably represents a fluorine atom or a trifluoromethyl group.

$R_{f2}$ and $R_{f3}$ each independently represent a hydrogen atom, a halogen atom, or an organic group and $R_{f2}$ and $R_{f3}$ may form a ring by linking with each other. The organic group represents, for example, an alkyl group, a cycloalkyl group, an alkoxy group, and the like.

At least two of $R_{f2}$ to $R_{f3}$ may form a ring by linking with each other and examples of the formed ring include a (halo)cycloalkyl ring, a (halo)aryl ring, and the like.

Examples of a (halo)alkyl group in $R_{f1}$ to $R_{f3}$ include the alkyl group in the $Z_{ka}$ and a structure where this group is halogenated.

Examples of a (per)halocycloalkyl group and a (per) haloaryl group in $R_{f1}$ to $R_{f3}$ or in a ring which $R_{f2}$ and $R_{f3}$ form by linking with each other include a structure where the cycloalkyl group in the $Z_{ka}$ is halogenated, and more preferably a fluorocycloalkyl group which is represented by —$C_{(n)}F_{(2n-2)}H$ and a perfluoroaryl group which is represented by —$C_{(n)}F_{(n-1)}$. Here, the number of carbon atoms n is not particularly limited but is preferably 5 to 13 and more preferably 6.

$R_{f2}$ more preferably represents the same group as $R_{f1}$ or forms a ring by linking with $R_{f3}$.

An electron-withdrawing group is preferably a halogen atom or a halo(cyclo)alkyl group or haloaryl group which is represented by —$C(R_{f1})(R_{f2})$—$R_{f3}$ and more preferably —$C(CF_3)_2H$ or —$C(CF_3)_2CH_3$.

Here, with regard to the electron-withdrawing group described above, the fluorine atoms of a part may be substituted with another electron-withdrawing group.

$Z_{ka}$ is preferably an alkyl group, a cycloalkyl group, an ether group, a hydroxyl group, or an electron-withdrawing group and more preferably an alkyl group, a cycloalkyl group, or an electron-withdrawing group. Here, the ether group is preferably an ether group which is substituted with an alkyl group, a cycloalkyl group, or the like, that is, an alkylether group and the like. The electron-withdrawing group is the same as described above.

Examples of the halogen atom as $Z_{ka}$ include a fluorine atom, a chlorine atom, a bromine atom, an iodine atom, and the like, and a fluorine atom is preferable.

The alkyl group as $Z_{ka}$ may have a substituent group and may be either straight-chain or branched. A straight-chain alkyl group preferably has 1 to 30 carbon atoms and more preferably 1 to 20. A branched alkyl group preferably has 3 to 30 carbon atoms and more preferably 3 to 20. An alkyl group with 1 to 4 carbon atoms such as a methyl group, an ethyl group, an n-propyl group, an i-propyl group, an n-butyl group, an i-butyl group, and t-butyl group is preferable.

The cycloalkyl group as $Z_{ka}$ may be a monocyclic type or may be a polycyclic type. In the latter case, the cycloalkyl group may be a bridged type. That is, in this case, the cycloalkyl group may have a bridged structure. Here, some of the carbon atoms in the cycloalkyl group may be substituted with hetero atoms such as an oxygen atom.

A monocyclic type cycloalkyl group preferably has 3 to 8 carbon atoms.

Examples of a polycyclic type cycloalkyl group include a group which has a bicyclo, tricyclo, or tetracyclo structure with 5 or more carbon atoms. The polycyclic type cycloalkyl group preferably has 6 to 20 carbon atoms.

Examples of the preferable alicyclic portion include an adamantyl group, a noradamantyl group, a decaline group, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group. An adamantyl group, a decaline group, a norbornyl group, a cedrol group, a cyclohexyl group, a cycloheptyl group, a cyclooctyl group, a cyclodecanyl group, a cyclododecanyl group, and a tricyclodecanyl group are more preferable.

Examples of a substituent group with an alicyclic structure include an alkyl group, a halogen atom, a hydroxyl group, an alkoxy group, a carboxyl group, and an alkoxy carbonyl group. An alkyl group is preferably a lower alkyl group such as a methyl group, an ethyl group, a propyl group, an isopropyl group, and a butyl group, and more preferably represents a methyl group, an ethyl group, a propyl group, and an isopropyl group. Examples of the alkoxy group preferably include an alkoxy group with 1 to 4 carbon atoms such as a methoxy group, an ethoxy group, a propoxy group, and a butoxy group. Examples of a substituent group which an alkyl group and an alkoxy group may have include a hydroxyl group, a halogen atom, an alkoxy group (preferably with 1 to 4 carbon atoms), and the like.

Examples of an aryl group of $Z_{ka}$ include a phenyl group and a naphthyl group.

Examples of a substituent group which an alkyl group, a cycloalkyl group, and an aryl group of $Z_{ka}$ may further have include a hydroxyl group; a halogen atom; a nitro group; a cyano group; the alkyl groups described above; an alkoxy group such as a methoxy group, an ethoxy group, a hydroxyethoxy group, a propoxy group, a hydroxypropoxy group, an n-butoxy group, an isobutoxy group, a sec-butoxy group, and a t-butoxy group; an alkoxy carbonyl group such as a methoxycarbonyl group and an ethoxycarbonyl group; an aralkyl group such as a benzyl group, a phenethyl group, and a cumyl group; an aralkyloxy group; an acyl group such as a formyl group, an acetyl group, a butyryl group, a benzoyl group, a cyanamide group, and a valeryl group; an acyloxy group such as a butyryloxy group; an alkenyl group; an alkenyloxy group such as a vinyloxy group, a propenyloxy group, an aryloxy group, and a butenyloxy group; the aryl groups described above; an aryloxy group such as a phenoxy group; and an aryloxycarbonyl group such as a benzoyloxy group.

By a polarity conversion group being decomposed due to an effect of an alkaline developing solution and polar conversion occurring, it is possible to reduce the receding contact angle of a resist film with water after the alkali developing.

The receding contact angle of a resist film with water after the alkaline developing is preferably 50° or less at the temperature during exposure, a general room temperature of 23±3° C., and humidity 45±5%, more preferably 40° or less, even more preferably 35° or less, and the most preferably 30° or less.

It is generally known that the receding contact angle is a contact angle which is measured when a contact line on the liquid droplet-top coat layer (or a resist film) interface recedes and is useful when simulating the ease of movement of liquid droplets in a dynamic state. Simply, it is possible to define the receding contact angle as the contact angle when the interface of the liquid droplets recedes when the liquid droplets are drawn into a needle again after the liquid droplets ejected from the needle front end land onto a substrate, and it is possible to measure the receding contact angle using a contact angle measuring method generally referred to as an expanding and shrinking method.

The hydrolyzing speed of the resin (C) with respect to an alkaline developing solution is preferably 0.001 nm/sec or more, more preferably 0.01 nm/sec or more, even more preferably 0.1 nm/sec or more, and most preferably 1 nm/sec or more.

Here, the hydrolyzing speed of the resin (C) with respect to an alkaline developing solution is the speed at which the film thickness when film-forming a resist film using only the resin (C) decreases with respect to a tetramethyl ammonium hydroxide aqueous solution (TMAH) (2.38 mass %) at 23° C.

The lactone ring structure in General Formula (KA-1) is more preferably a group which has a lactone structure which is represented by Formulas (LC1-1) to (LC1-17) described for the resin (A). In addition, a group which has a lactone structure may be directly bonded with the main chain. Preferable lactone structures are (LC1-1), (LC1-4), (LC1-5), (LC1-6), (LC1-13), (LC1-14), and (LC1-17).

The structure which is represented by (KB-1) described above has a high polar conversion ability due to having a structure where an electron-withdrawing group is present at a position which is close to an ester structure.

$X_{kb2}$ is preferably a halogen atom or a halo(cyclo)alkyl group or haloaryl group which is represented by —$C(R_{f1})(R_{f2})$—$R_{f3}$.

At least two polarity conversion groups of the repeating unit (β) are more preferably a partial structure which has two polarity conversion groups shown by General Formula (KY-1) below. Here, the structure which is represented by General Formula (KY-1) is a group which has a monovalent or higher group in which at least one arbitrary hydrogen atom in the structure is removed.

(KY-1)

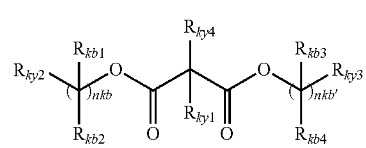

In General Formula (KY-1), $R_{ky1}$ and $R_{ky4}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amide group, or an aryl group. Alternatively, $R_{ky1}$ and $R_{ky4}$ may form a double bond by bonding with the same atom and, for example, $R_{ky1}$ and $R_{ky4}$ may form a part (═O) of a carbonyl group by bonding with the same oxygen atom.

$R_{ky2}$ and $R_{ky3}$ are each independently an electron-withdrawing group or $R_{ky1}$ and $R_{ky3}$ form a lactone ring by linking with each other and $R_{ky2}$ is an electron-withdrawing group. As the formed lactone ring, the structures of (LC1-1)

to (LC1-17) are preferable. Examples of the electron-withdrawing group include the same groups as $X_{kb1}$ in Formula (KB-1) and a halogen atom or a halo(cyclo)alkyl group or haloaryl group which is represented by —$C(R_{f1})(R_{f2})$—$R_{f3}$.

At least two of $R_{ky1}$, $R_{ky3}$, and $R_{ky4}$ may form a monocyclic or polycyclic structure by linking with each other.

$R_{kb1}$ to $R_{kb4}$, nkb, and nkb' are respectively the same as in Formula (KB-1).

Examples of $R_{ky1}$ and $R_{ky4}$ specifically include the same groups as $Z_{ka}$ in Formula (KA-1).

As the lactone ring which $R_{ky1}$ and $R_{ky3}$ form by linking with each other, the structures of (LC1-1) to (LC1-17) are preferable. Examples of the electron-withdrawing group include the same groups as the $X_{kb1}$ in Formula (KB-1).

The structure which is represented by General Formula (KY-1) is more preferably a structure shown by General Formula (KY-2) below. Here, the structure which is represented by General Formula (KY-2) is a group which has a monovalent or higher group in which at least one arbitrary hydrogen atom in the structure is removed.

(KY-2)

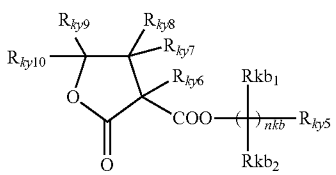

In Formula (KY-2), $R_{ky6}$ to $R_{ky10}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amide group, or an aryl group.

Two or more of $R_{ky6}$ to $R_{ky10}$ may link with each other to form a monocyclic or polycyclic structure.

$R_{ky5}$ represents an electron-withdrawing group. Examples of the electron-withdrawing group include the same groups as in $X_{kb1}$ in Formula (KB-1) and a halogen atom or a halo(cyclo)alkyl group or haloaryl group which is represented by —$C(R_{f1})(R_{f2})$—$R_{f3}$.

$R_{kb1}$, $R_{kb2}$, and nkb are respectively the same as in Formula (KB-1).

Examples of $R_{ky5}$ to $R_{ky10}$ specifically include the same groups as $Z_{ka}$ in Formula (KA-1).

The structure which is represented by Formula (KY-2) is more preferably a partial structure shown by General Formula (KY-3) below.

(KY-3)

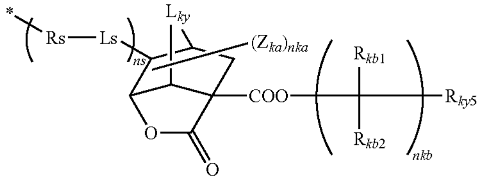

In General Formula (KY-3), Rs represents a chain or cyclic alkylene group and, in a case where there are a plurality thereof, these may be the same or may be different.

Ls represents a single bond, an ether bond, an ester bond, an amide bond, a urethane bond, or a urea bond and, in a case where there are a plurality thereof, these may be the same or may be different.

ns represents the number of repetitions of a linking group which is represented by -(Rs-Ls)- and represents an integer of 0 to 5.

$L_{ky}$ represents an alkylene group, an oxygen atom, or a sulfur atom.

$Z_{ka}$ represents an alkyl group, a cycloalkyl group, an ether group, a hydroxyl group, an amide group, an aryl group, a lactone ring group, or an electron-withdrawing group. When a plurality of $Z_{ka}$s are present, the plurality of $Z_{ka}$s may be the same or may be different and the $Z_{ka}$s may form a ring by linking with each other.

nka represents an integer of 0 to 10.

$R_{kb1}$ and $R_{kb2}$ each independently represent a hydrogen atom, an alkyl group, a cycloalkyl group, an aryl group, or an electron-withdrawing group and at least two of $R_{kb1}$, $R_{kb2}$, and $R_{kb5}$ may form a ring by linking with each other.

nkb represents 0 or 1.

$R_{ky5}$ represents an electron-withdrawing group. * represents a bonding site with the remainder of the repeating unit.

Description will be given of General Formula (KY-3) in more detail.

$Z_{ka}$ and nka are respectively the same as General Formula (KA-1). $R_{ky5}$ is the same as Formula (KY-2).

$R_{kb1}$, $R_{kb2}$, and nkb are respectively the same as in Formula (KB-1).

$L_{ky}$ represents an alkylene group, an oxygen atom, or a sulfur atom as described above. Examples of the alkylene group of $L_{ky}$ include a methylene group, an ethylene group, and the like.

$L_{ky}$ is preferably an oxygen atom or a methylene group and more preferably a methylene group.

Rs represents a chain or cyclic alkylene group as described above and, in a case where there are a plurality thereof, these may be the same or may be different.

Ls represents a single bond, an ether bond, an ester bond, an amide bond, a urethane bond, or a urea bond as described above and in a case where there are a plurality thereof, these may be the same or may be different.

ns represents the number of repetitions of a linking group which is represented by -(Rs-Ls)- and represents an integer of 0 to 5. ns is preferably 0 or 1.

The repeating unit (β) preferably has a structure shown by Formula (K0).

(K0)

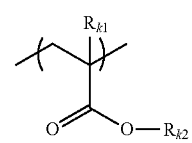

In the formula, $R_{k1}$ represents a hydrogen atom, a halogen atom, a hydroxyl group, an alkyl group, a cycloalkyl group, an aryl group, or a group which has a polarity conversion group.

$R_{k2}$ represents an alkyl group, a cycloalkyl group, an aryl group, or a group which has a polarity conversion group. However, $R_{k1}$ and $R_{k2}$ have two or more polarity conversion groups as a whole.

Here, an ester group which is directly bonded with the main chain of a repeating unit shown in General Formula (K0) is not included in a polarity conversion group in the present invention as described above.

The repeating unit (β) is not limited as long as the repeating unit is obtained by polymerization such as addition polymerization, condensation polymerization, and addition condensation, but is preferably a repeating unit which is obtained by addition polymerization of a carbon-carbon double bond. Examples thereof include an acrylate-based repeating unit (a type which has a substituent group at an α-position or a β-position is also included), a styrene-based repeating unit (a type which has a substituent group at an α-position or a β-position is also included), a vinylether-based repeating unit, a norbornene-based repeating unit, a repeating unit of a maleic acid derivative (maleic anhydride or derivatives thereof, maleimide, and the like), and the like, an acrylate-based repeating unit, a styrene-based repeating unit, a vinylether-based repeating unit, and a norbornene-based repeating unit are preferable, an acrylate-based repeating unit, a vinylether-based repeating unit, and a norbornene-based repeating unit are more preferable, and an acrylate-based repeating unit is most preferable.

Specific examples of the repeating unit (β) will be shown below; however, the present invention is not limited thereto. Ra represents a hydrogen atom, a fluorine atom, a methyl group, or a trifluoromethyl group.

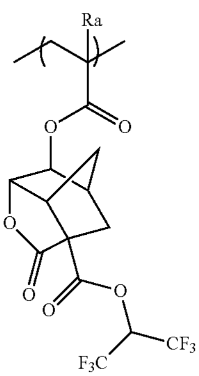

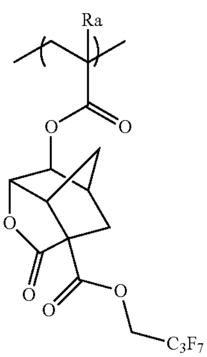

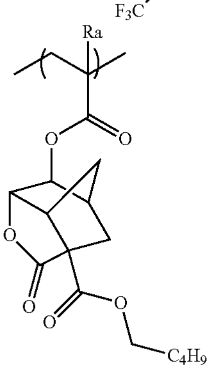

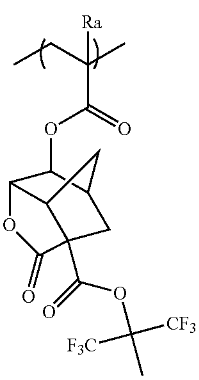

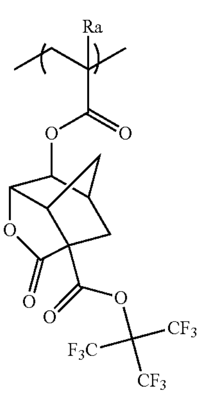

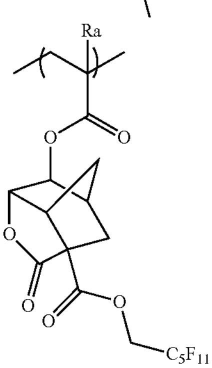

-continued

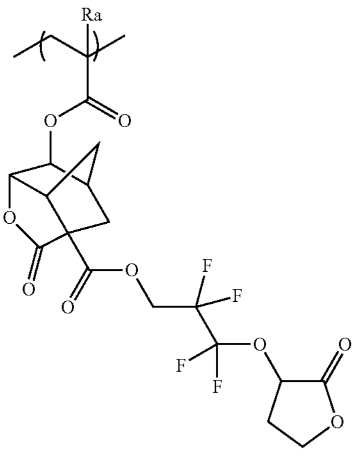

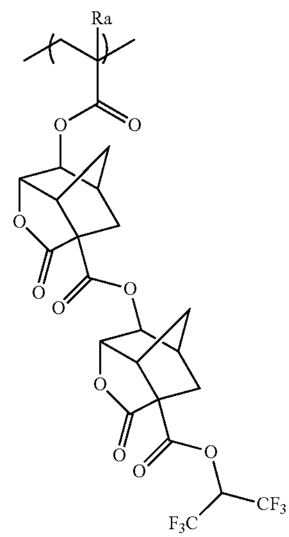

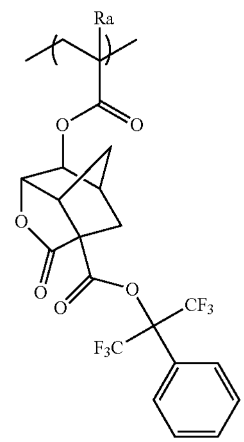

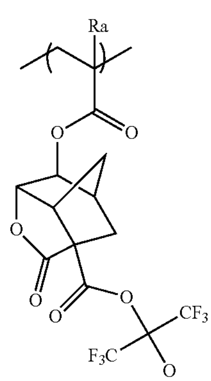

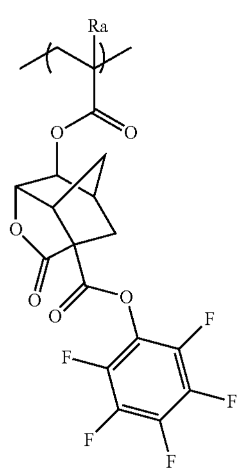

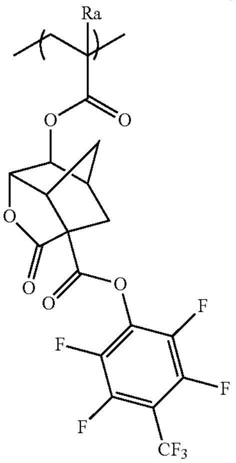
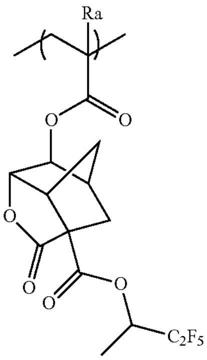
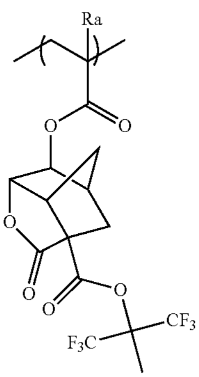
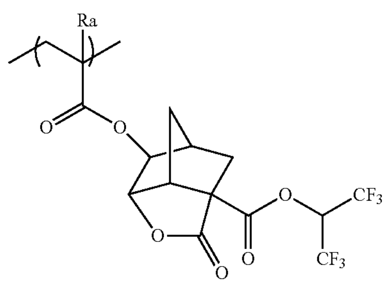
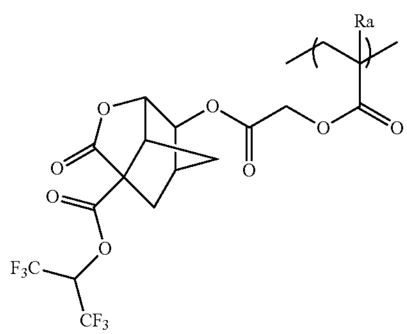
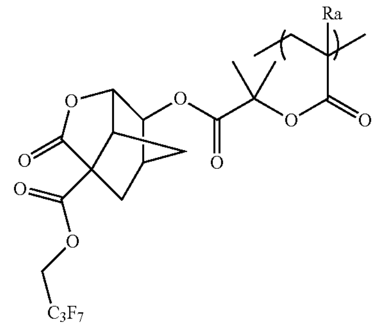
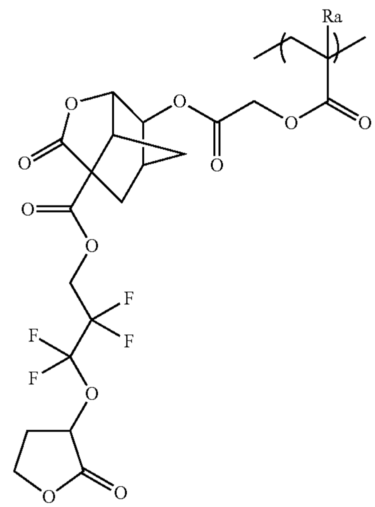
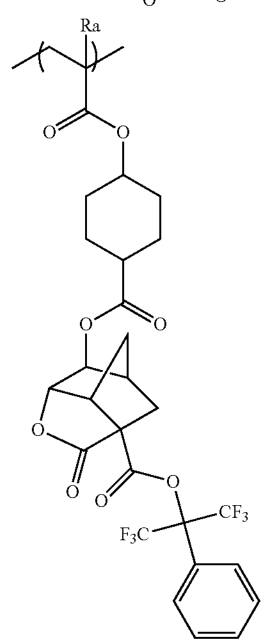
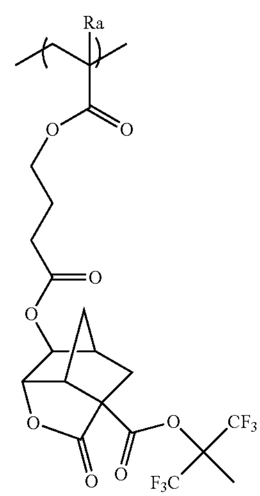
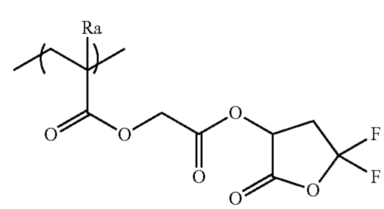

-continued
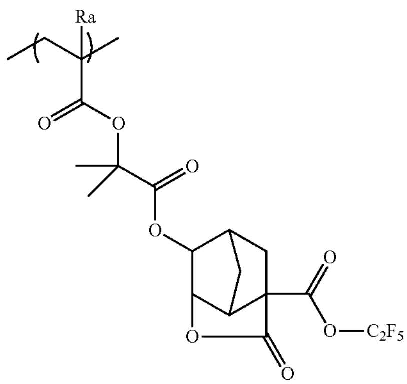
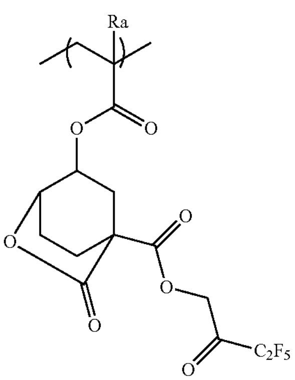
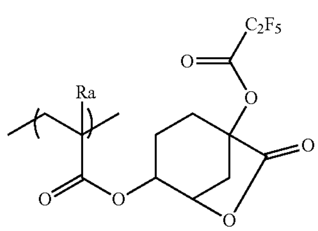
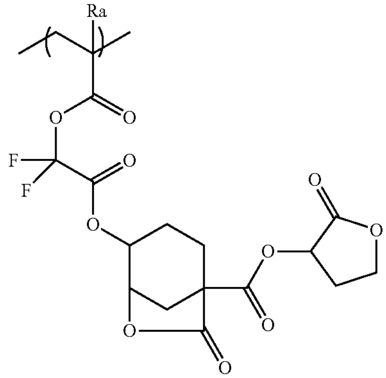
-continued
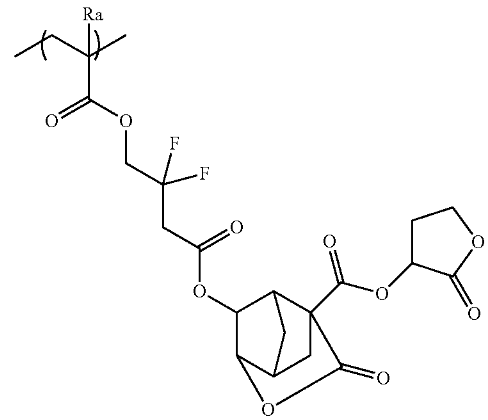
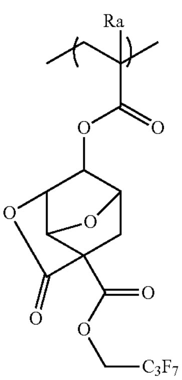
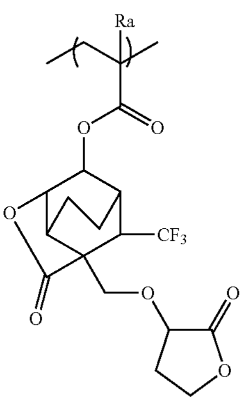
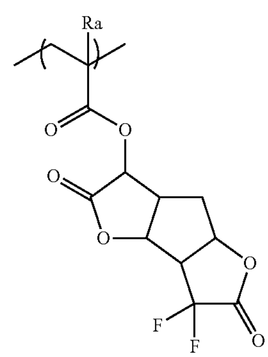
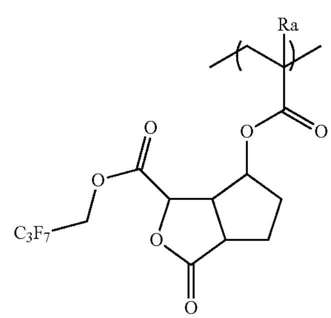

-continued
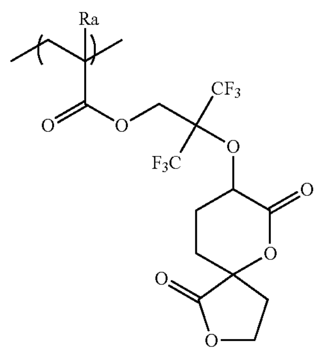
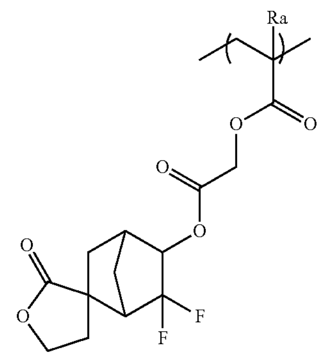
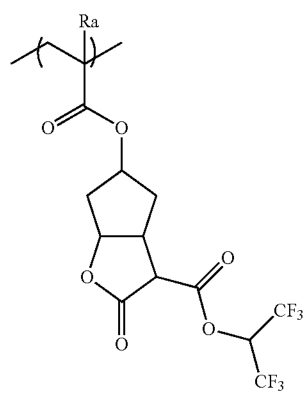
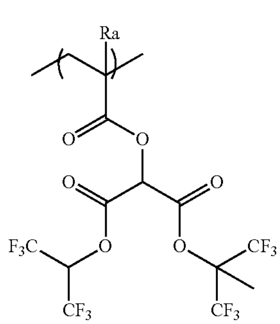
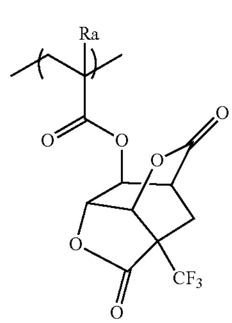
-continued
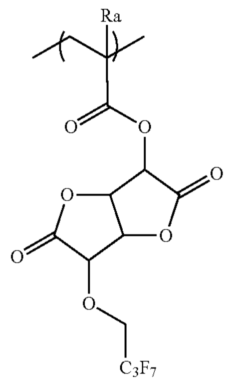
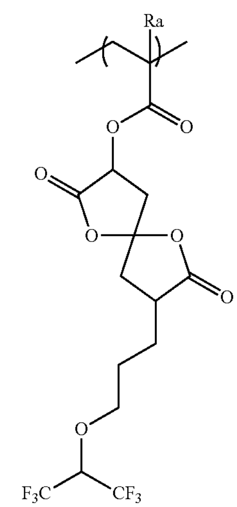
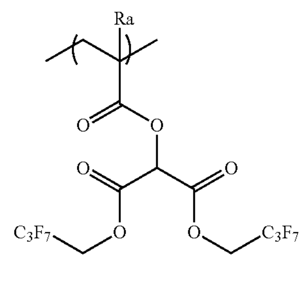
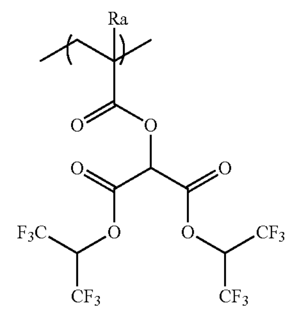
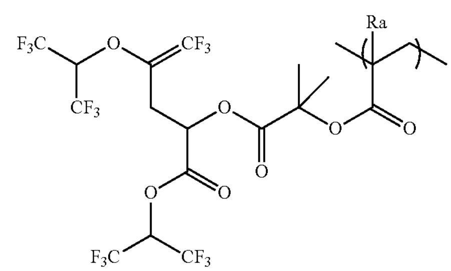
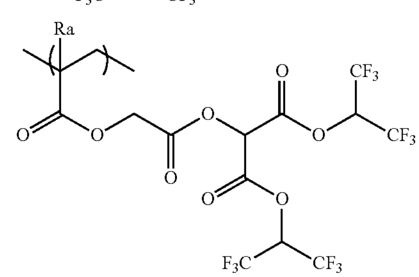
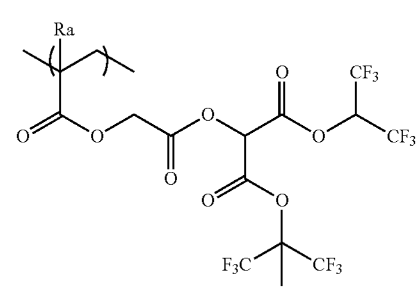

-continued

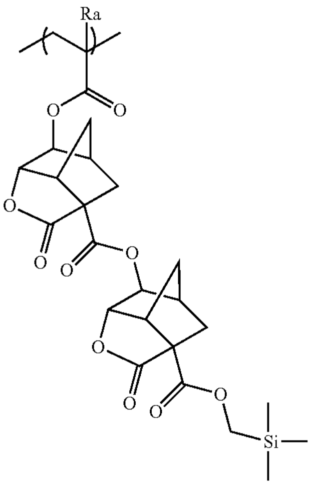

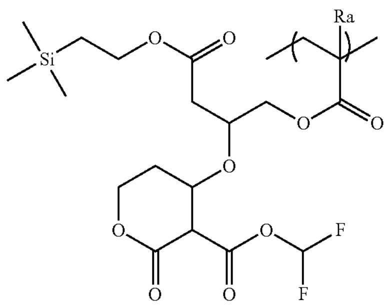

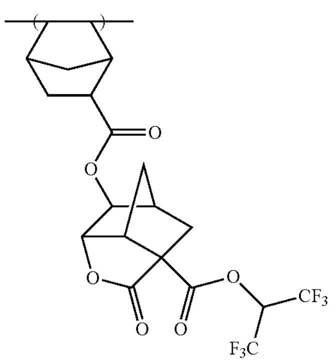

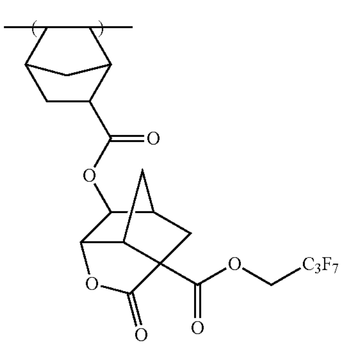

-continued

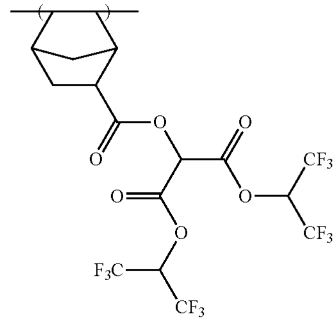

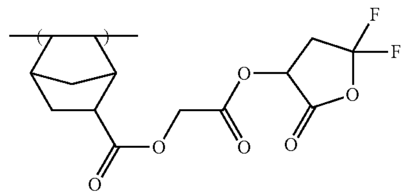

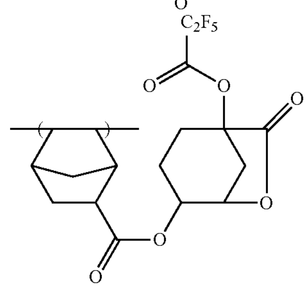

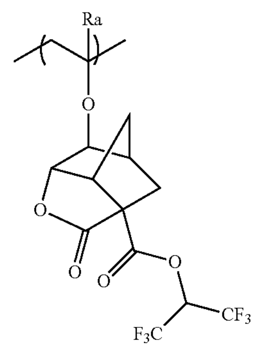

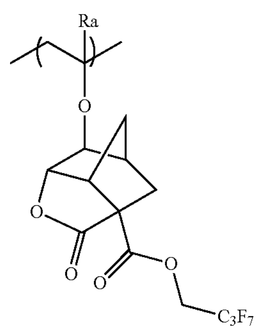

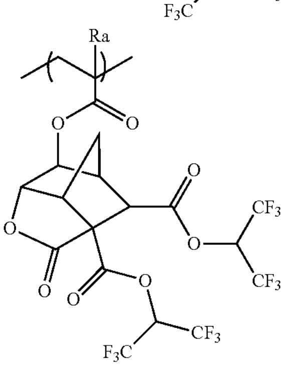

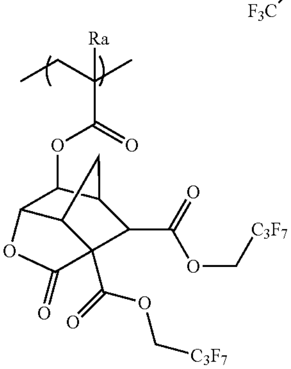

In a case where the resin (C) contains the repeating unit (β), the content ratio of the repeating unit (β) is preferably 10 mol % to 90 mol % with respect to all of the repeating units in the resin (C), more preferably 30 mol % to 85 mol %, and even more preferably 50 mol % to 80 mol %.

The content ratio of the repeating unit (β') is preferably 10 mol % to 90 mol % with respect to all of the repeating units in the resin (C), more preferably 30 mol % to 85 mol %, and even more preferably 50 mol % to 80 mol %.

The content ratio of the repeating unit (β*) is preferably 10 mol % to 90 mol % with respect to all of the repeating units in the resin (C), more preferably 30 mol % to 85 mol %, and even more preferably 50 mol % to 80 mol %.

The content ratio of the repeating unit (β") is preferably 10 mol % to 90 mol % with respect to all of the repeating units in the resin (C), more preferably 30 mol % to 85 mol %, and even more preferably 50 mol % to 80 mol %.

Next, description will be given of the repeating unit (γ) which is derived from a monomer which is represented by General Formula (aa1-1).

(aa1-1)

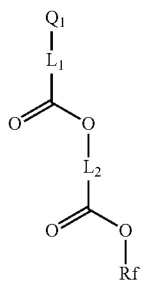

An organic group which includes a polymeric group which is represented by $Q_1$ in the formula is not particularly limited as long as being the organic group includes a polymeric group. Examples of the polymeric group include an acryl group, a methacryl group, a styryl group, a norbornenyl group, a maleimide group, a vinylether group, and the like, and an acryl group, a methacryl group, and a styryl group are particularly preferable.

Examples of a divalent linking group which is represented by $L_1$ and $L_2$ include a substituted or unsubstituted arylene group, a substituted or unsubstituted alkylene group, a substituted or unsubstituted cycloalkylene group, —O—, —CO—, or a divalent linking group combining a plurality thereof.

For example, the arylene group is preferably an arylene group with 6 to 14 carbon atoms and specific examples thereof include a phenylene group, a naphthylene group, an anthrylene group, a phenanthrylene group, a biphenylene group, a terphenylene group, and the like.

The alkylene group and the cycloalkylene group preferably have 1 to 15 carbon atoms and specific examples thereof include alkylene groups and cycloalkylene groups in which one hydrogen atom is removed from the straight-chain, branched, or cyclic alkyl groups exemplified below: a methyl group, an ethyl group, an n-propyl group, an isopropyl group, an n-butyl group, a sec-butyl group, a tert-butyl group, a tert-amyl group, an n-pentyl group, an n-hexyl group, an n-heptyl group, an n-octyl group, an n-nonyl group, an n-decyl group, a cyclopentyl group, a cyclohexyl group, a cyclopentylmethyl group, a cyclopentylethyl group, a cyclopentylbutyl group, a cyclohexylmethyl group, a cyclohexylethyl group, a cyclohexylbutyl group, and an adamantyl group.

Examples of a substituent group which the arylene group, the alkylene group, and the cycloalkylene group described above may have include an alkyl group, an aralkyl group, an alkoxy group, a fluorine atom, and the like.

In one aspect of the present invention, $L_1$ is more preferably a single bond, a phenylene group, an ether group, a carbonyl group, and a carbonyloxy group and $L_2$ is more preferably an alkylene group, an ether group, a carbonyl group, and a carbonyloxy group.

An organic group in an organic group which has a fluorine atom as Rf is a group which includes at least one carbon atom and preferably an organic group which includes a carbon-hydrogen bonding portion. Rf is, for example, an alkyl group which is substituted with a fluorine atom or a cycloalkyl group which is substituted with a fluorine atom.

In one aspect, the repeating unit (γ) is preferably a repeating unit which is represented by General Formula (aa1-2-1) or (aa1-3-1) below.

(aa1-2-1)

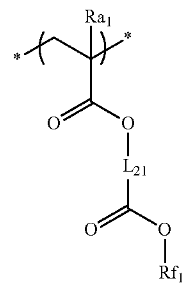

(aa1-3-1)

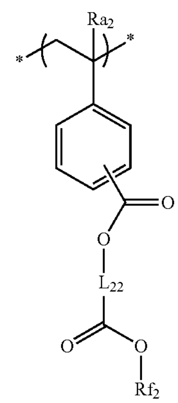

In General Formulas (aa1-2-1) and (aa1-3-1), $Ra_1$ and $Ra_2$ each independently represent a hydrogen atom or an alkyl group. $Ra_1$ and $Ra_2$ are preferably a hydrogen atom or a methyl group.

$L_{21}$ and $L_{22}$ each independently represent a single bond or a divalent linking group and are the same as $L_2$ in General Formula (aa1-1) described above.

$Rf_1$ and $Rf_2$ each independently represent an organic group which has a fluorine atom and are the same as Rf in General Formula (aa1-1).

In addition, in one aspect, the repeating unit (γ) is preferably a repeating unit which is represented by General Formula (aa1-2-2) or (aa1-3-2) below.

(aa1-2-2)

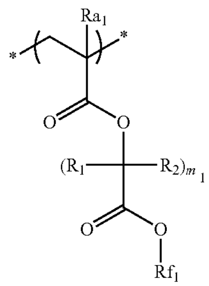

(aa1-3-2)

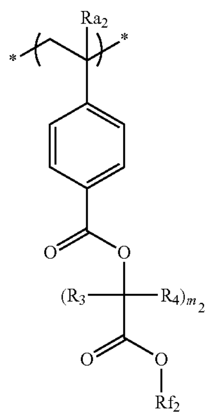

In General Formulas (aa1-2-2) and (aa1-3-2), $Ra_1$ and $Ra_2$ each independently represent a hydrogen atom or an alkyl group.

$R_1$, $R_2$, $R_3$, and $R_4$ each independently represent a hydrogen atom or an alkyl group.

$m_1$ and $m_2$ each independently represent an integer of 0 to 5.

$Rf_1$ and $Rf_2$ each independently represent an organic group which has a fluorine atom.

$Ra_1$ and $Ra_2$ are preferably a hydrogen atom or a methyl group.

An alkyl group which is represented by $R_1$, $R_2$, $R_3$, and $R_4$ is preferably, for example, a straight-chain or branched chain alkyl group with 1 to 10 carbon atoms. The alkyl group may have a substituent group and examples of the substituent group include an alkoxy group, an aryl group, a halogen atom, and the like.

$m_1$ and $m_2$ are preferably an integer of 0 to 3, more preferably 0 or 1, and most preferably 1.

The organic group which has a fluorine atom as $Rf_1$ and $Rf_2$ is the same as Rf in General Formula (aa1-1).

In addition, in one aspect, the repeating unit (γ) is preferably a repeating unit which is represented by General Formula (aa1-2-3) or (aa1-3-3) below.

(aa1-2-3)

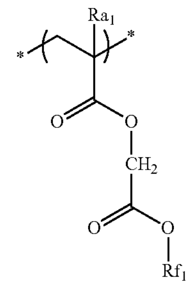

(aa1-3-3)

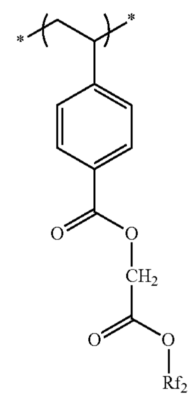

In General Formulas (aa1-2-3) and (aa1-3-3), $Ra_1$ represents a hydrogen atom or a methyl group.

$Rf_1$ and $Rf_2$ each independently represent an organic group which has a fluorine atom and are the same as Rf in General Formula (aa1-1).

Specific examples of the repeating unit (γ) will be shown below; however, the present invention is not limited thereto.

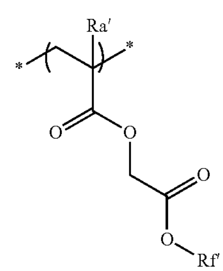

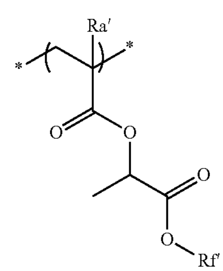

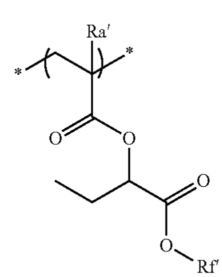

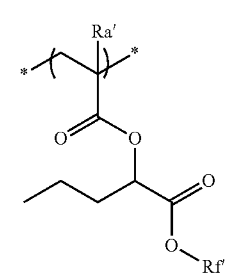

-continued
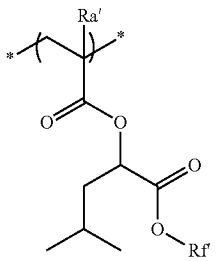
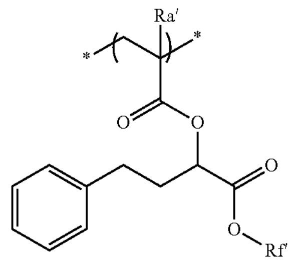
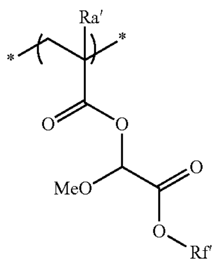
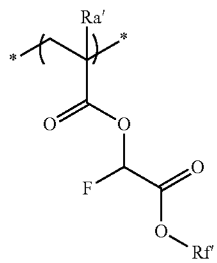
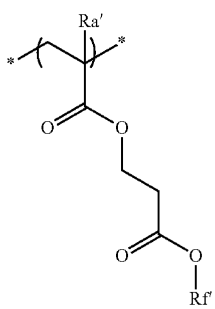
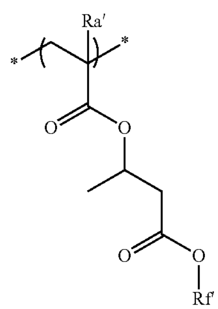
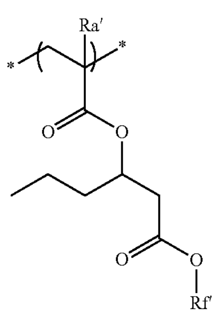
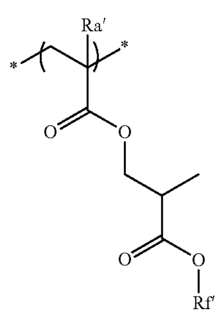
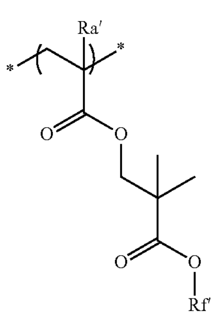
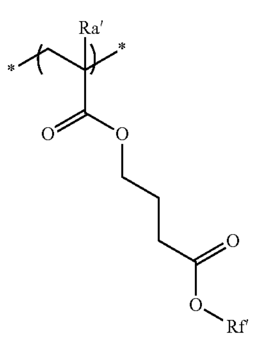
-continued
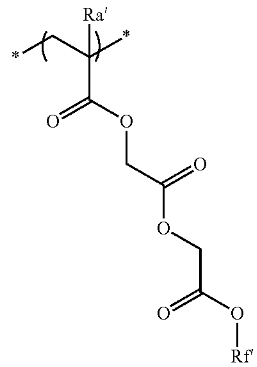
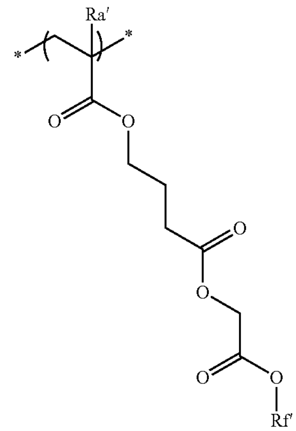
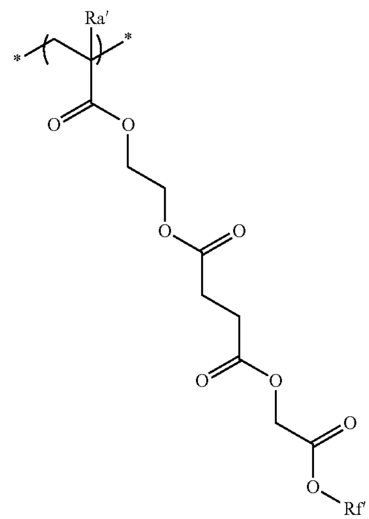
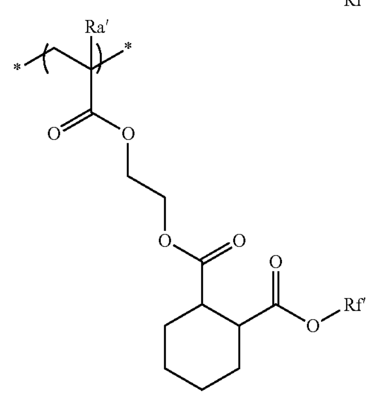
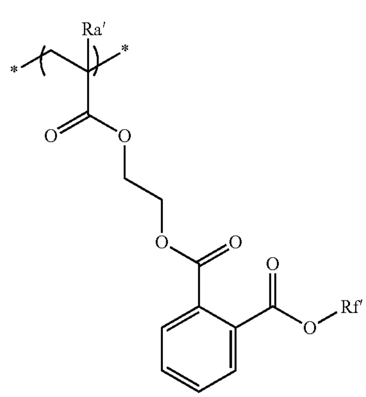
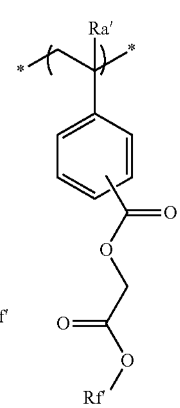

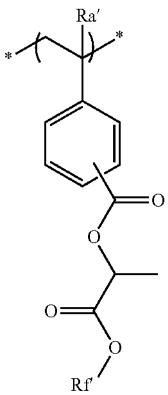
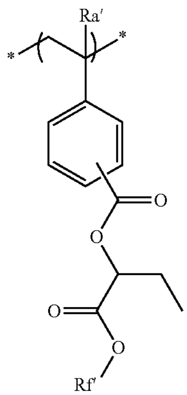
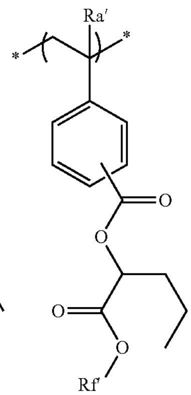
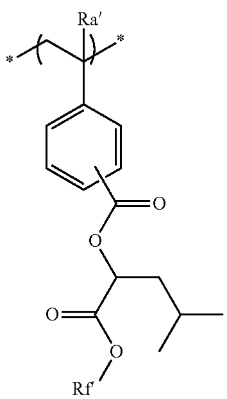
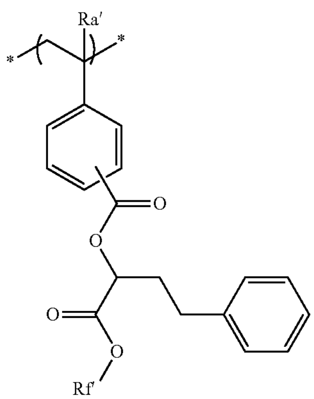
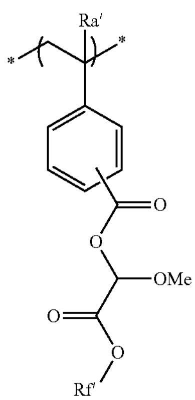
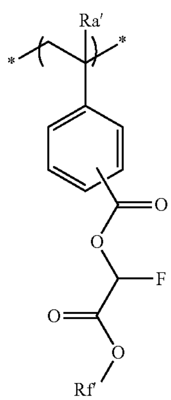
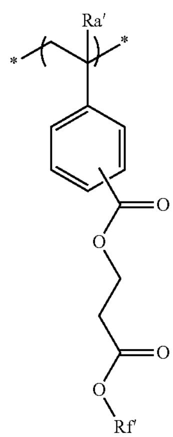
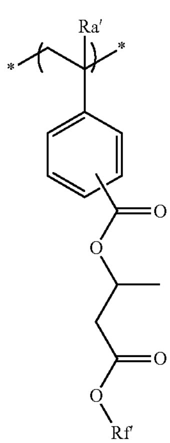
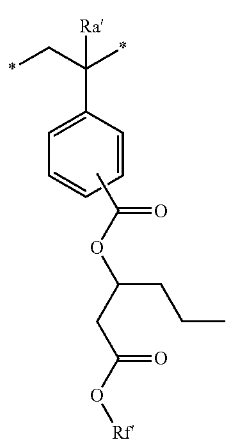
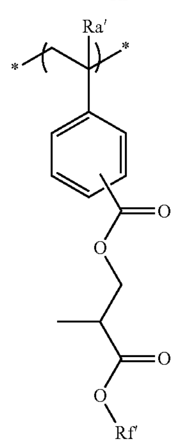
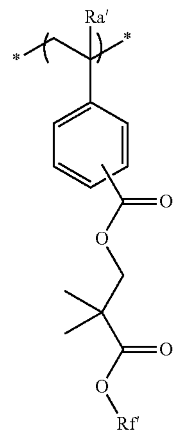
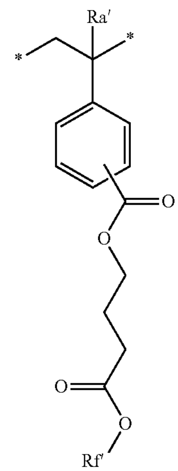
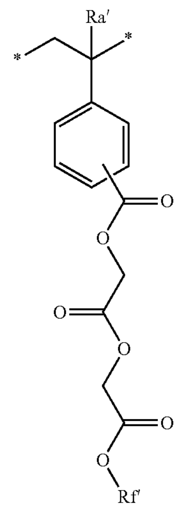
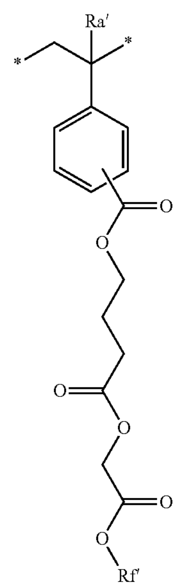
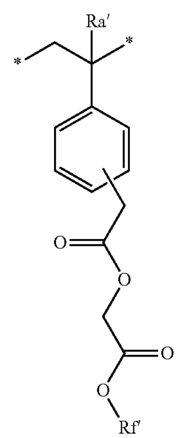
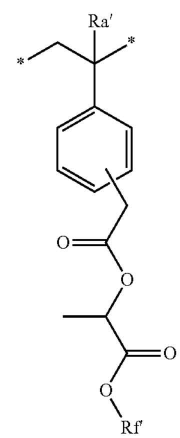
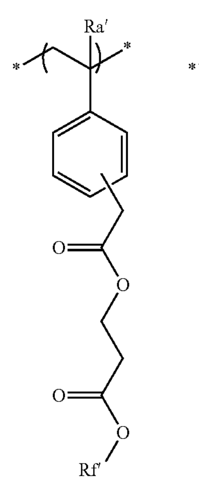
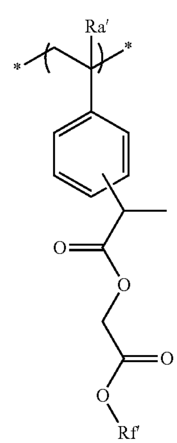
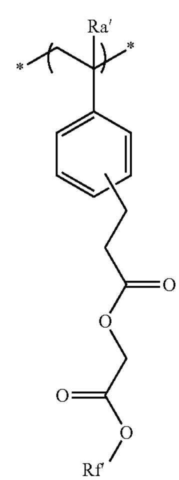

-continued
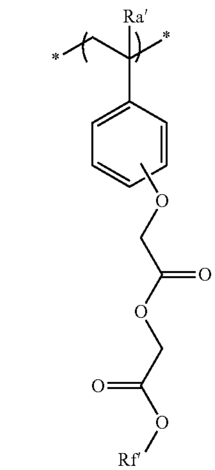
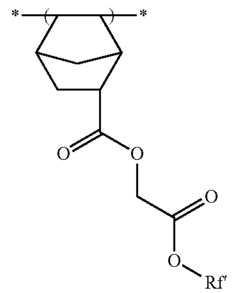
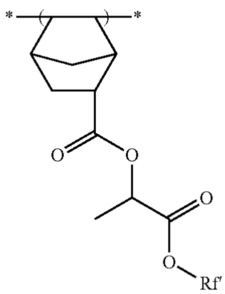
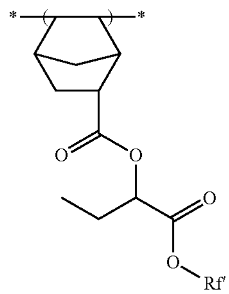
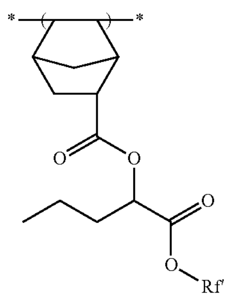
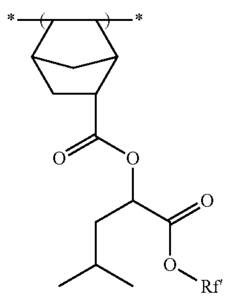
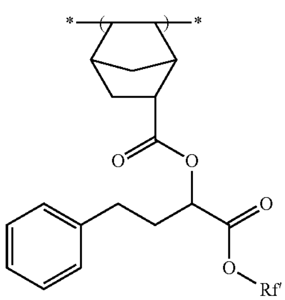
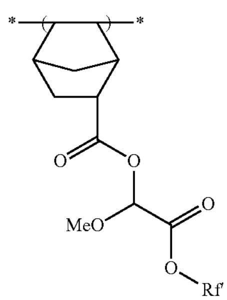
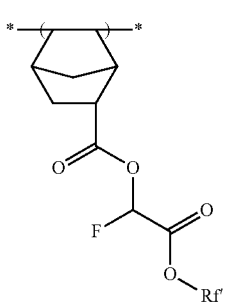
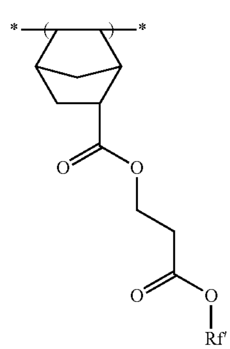
-continued
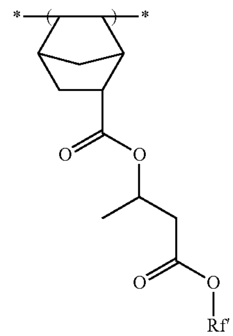
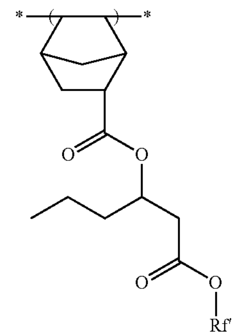
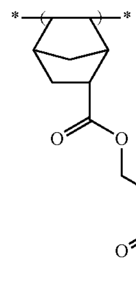
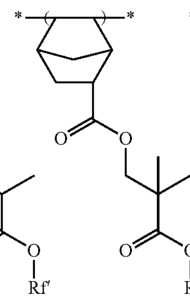
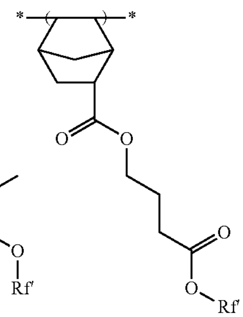
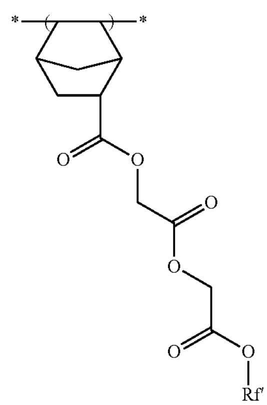
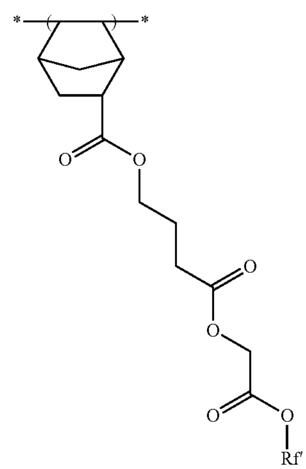
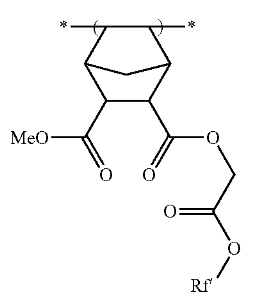
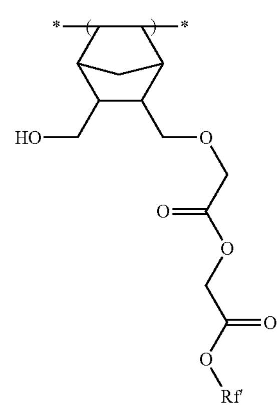

-continued
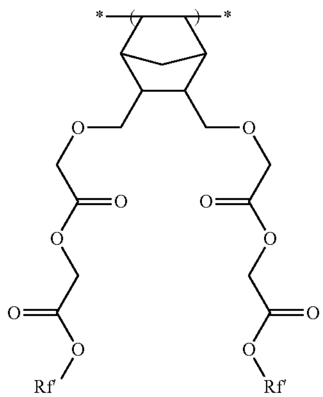
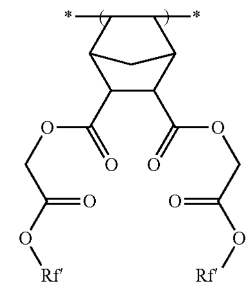
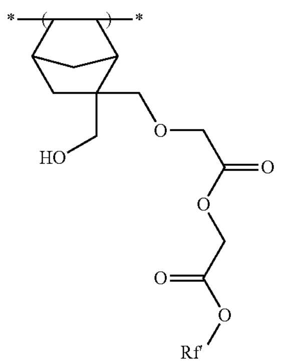
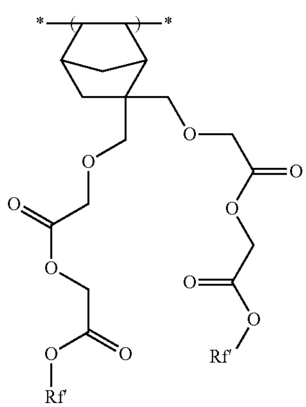
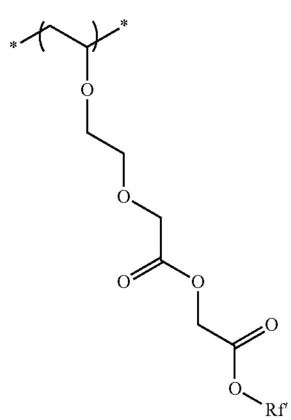
-continued
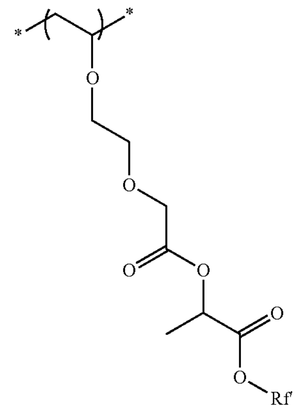
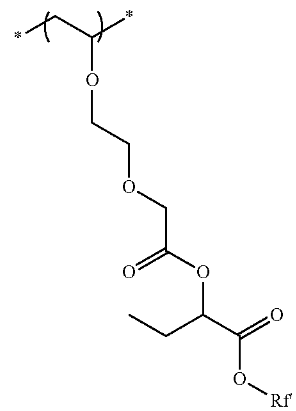
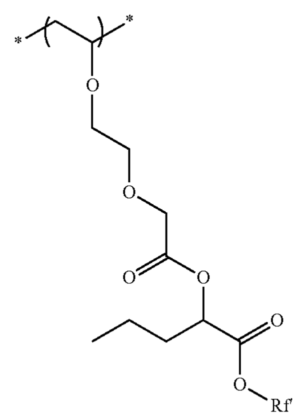
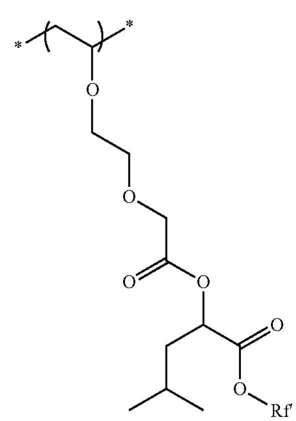

-continued
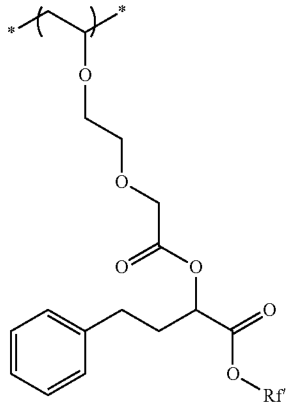
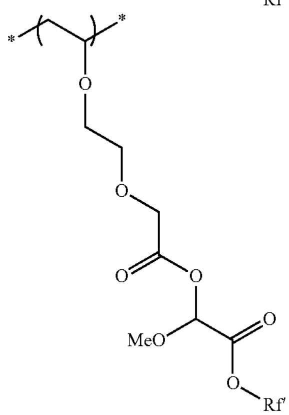
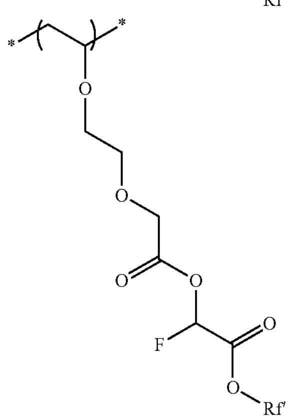
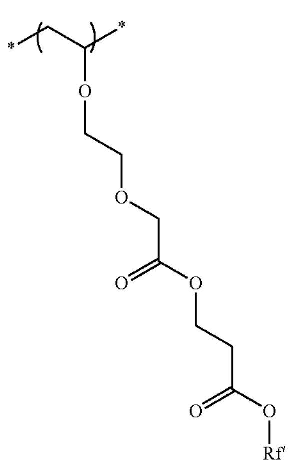
-continued
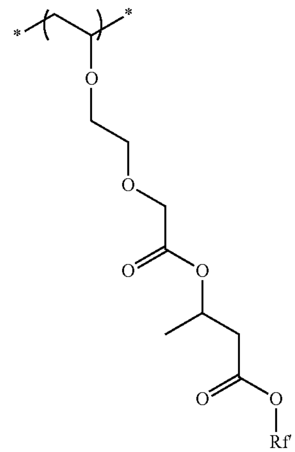
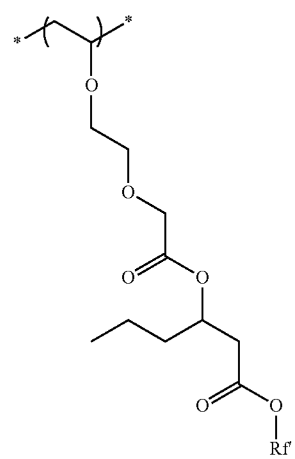
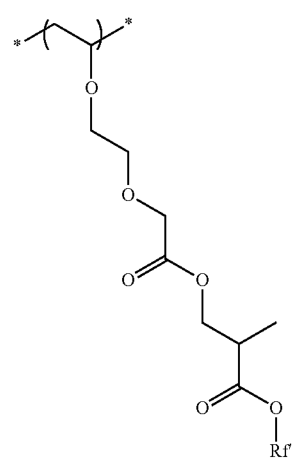

-continued
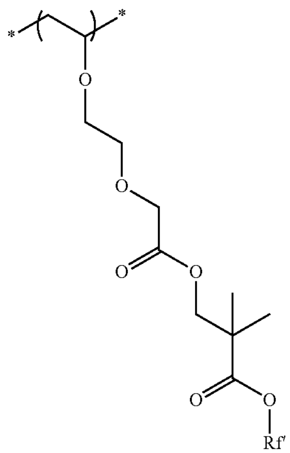
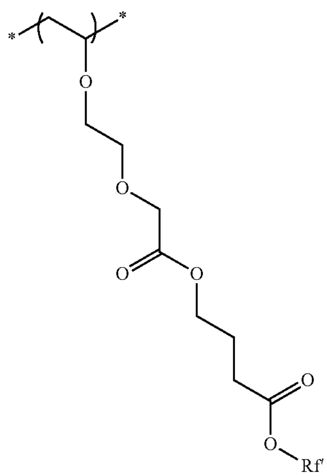
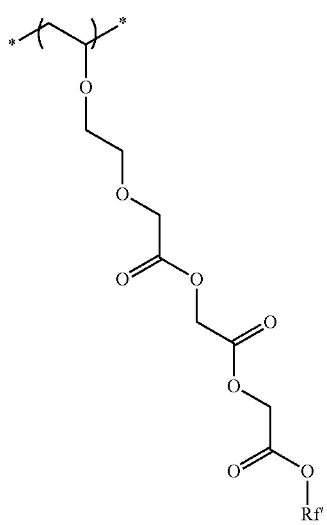
-continued
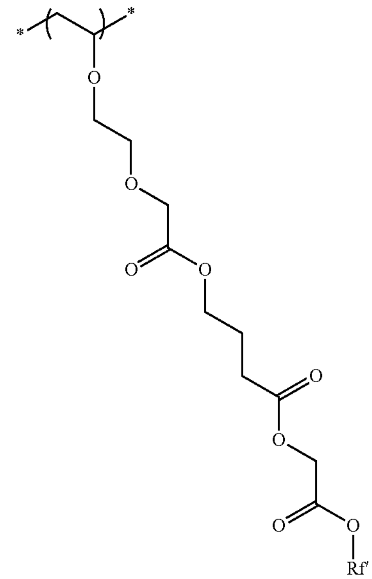
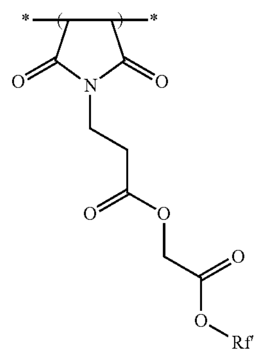
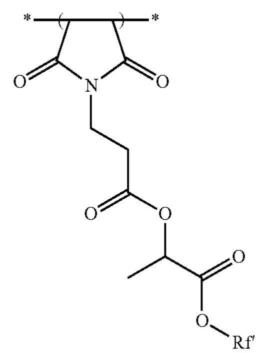
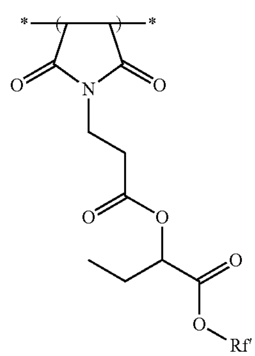
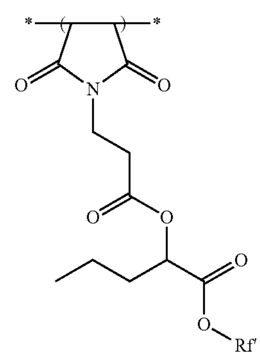
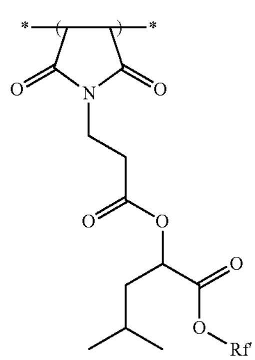
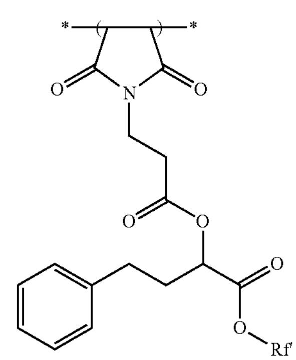

-continued
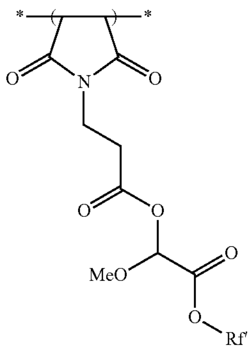
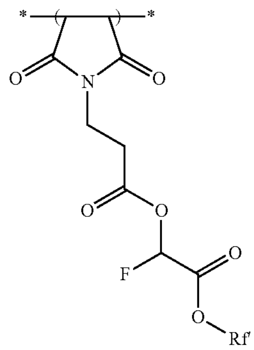
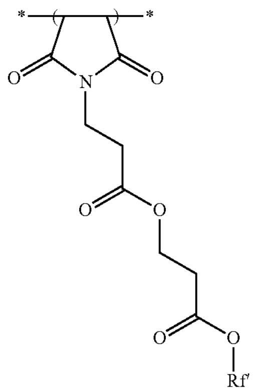
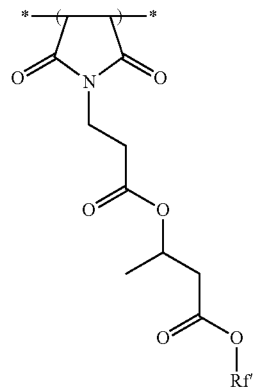
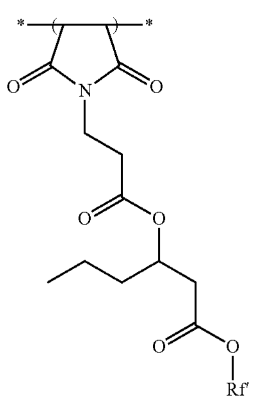
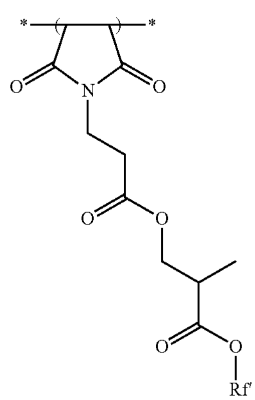
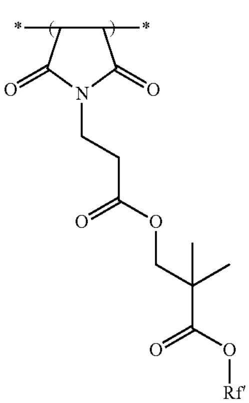
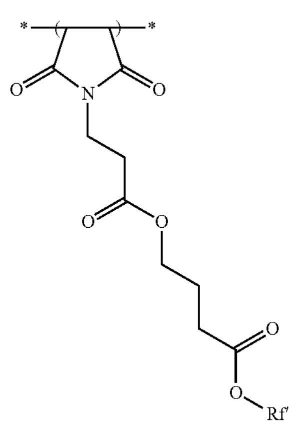
-continued
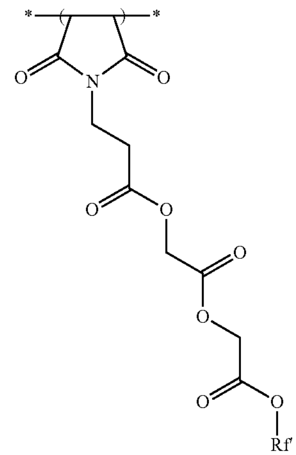
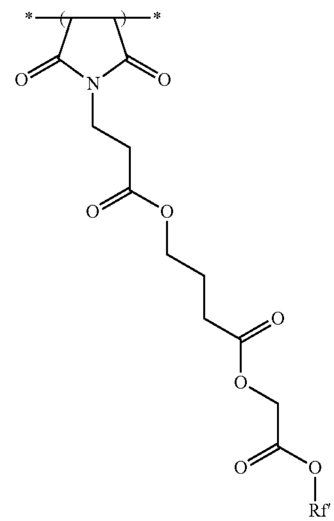
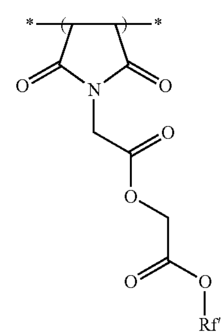
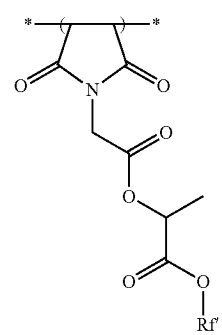
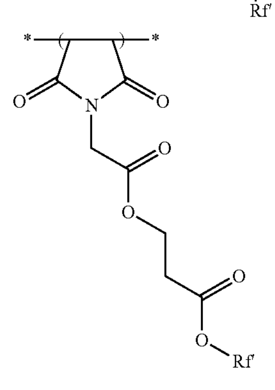
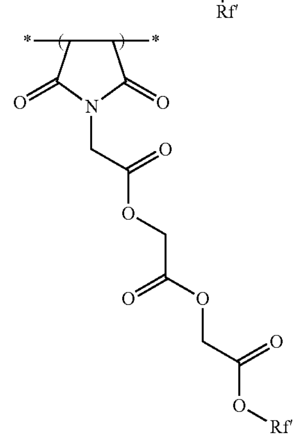

-continued

Ra' = H, $CH_3$

Rf' = $CH_2CF_3$, $CH_2C_2F_5$, $CH_2C_4F_9$, $CH(CF_3)_2$, $CH_2CF_2CHF_2$, $CH_2(CF_2)_3CHF_2$,

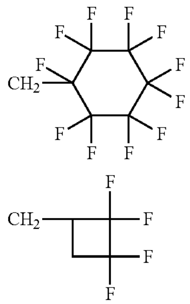

The content of the repeating unit (γ) in the resin (C) is preferably 30 mol % to 99 mol % with respect to all of the repeating units in the resin (C), more preferably 40 mol % to 99 mol %, even more preferably 50 mol % to 99 mol %, and particularly preferably 70 mol % to 99 mol %.

The resin (C) preferably further has a repeating unit which has a group which changes its solubility with respect to a developer due to the effect of an acid. Due to this, the resin (C) is acid decomposed due to exposure, it is possible to remove the developing, and it is possible to use the resin (C) in an amount sufficient for uneven distribution on the film surface. Furthermore, by using the repeating units (β) or (γ) described above together, it is also possible to achieve better reduction in the contact angle after the developing.

In addition, by the resin (C) further having a repeating unit which has a group which changes its solubility with respect to a developer due to the effect of an acid, it is possible to suppress a T-top effect in the pattern and it is possible to further improve the resolving power, LWR, and pattern shape.

A repeating unit which has a group which changes its solubility with respect to a developer due to the effect of an acid is more preferably a repeating unit which is represented by any of General Formulas (Ca1) to (Ca4) below.

(Ca1)

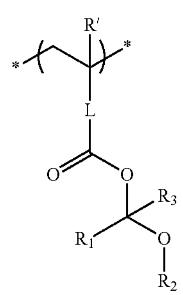

(Ca2)

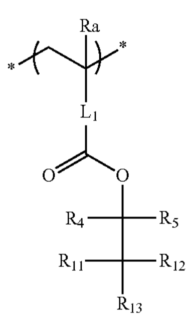

-continued (Ca3)

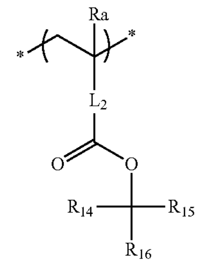

(Ca4)

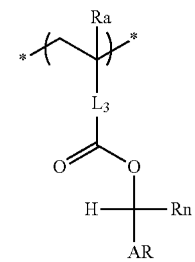

In General Formula (Ca1), R' represents a hydrogen atom or an alkyl group.

L represents a single bond or a divalent linking group.

$R_1$ represents a hydrogen atom or a monovalent substituent group.

$R_2$ represents a monovalent substituent group. $R_1$ and $R_2$ may bond with each other and form a ring with an oxygen atom in the formula.

$R_3$ represents a hydrogen atom, an alkyl group, or a cycloalkyl group.

In General Formula (Ca2), Ra represents a hydrogen atom, an alkyl group, a cyano group, or a halogen atom.

$L_1$ represents a single bond or a divalent linking group.

$R_4$ and $R_5$ each independently represent an alkyl group.

$R_{11}$ and $R_{12}$ each independently represent an alkyl group and $R_{13}$ represents a hydrogen atom or an alkyl group. $R_{11}$ and $R_{12}$ may form a ring by linking with each other and $R_{11}$ and $R_{13}$ may form a ring by linking with each other.

In General Formula (Ca3), Ra is the same as Ra in General Formula (Ca2) and the specific examples and the preferable examples thereof are also the same.

$L_2$ is the same as $L_1$ in General Formula (Ca2) and the specific examples and the preferable examples thereof are also the same.

$R_{14}$, $R_{15}$, and $R_{16}$ each independently represent an alkyl group. Two of $R_{14}$ to $R_{16}$ may form a ring by linking with each other.

In General Formula (Ca4), Ra is the same as Ra in General Formula (Ca2) and the specific examples and the preferable examples thereof are also the same.

$L_3$ is the same as $L_1$ in General Formula (Ca2) and the specific examples and the preferable examples thereof are also the same.

AR represents an aryl group. Rn represents an alkyl group, a cycloalkyl group, or an aryl group. Rn and AR may form a non-aromatic ring by bonding with each other.

In General Formula (Ca1) above, an alkyl group of R' is preferably an alkyl group with 1 to 10 carbon atoms.

R' is preferably a hydrogen atom or an alkyl group with 1 to 5 carbon atoms, more preferably a hydrogen atom, a methyl group, or an ethyl group, and even more preferably a hydrogen atom.

Examples of a divalent linking group which is represented by L include an alkylene group, an aromatic ring group, a cycloalkylene group, —COO-$L_1$'-, —O-$L_1$'-, —CONH—, a group which is formed by combining two or more thereof, and the like. Here, $L_1$' represents an alkylene group (preferably with 1 to 20 carbon atoms), a cycloalkyl group (preferably 3 to 20 carbon atoms), a group which has a lactone structure, an aromatic ring group, and a group which combines an alkylene group and an aromatic ring group.

Preferable examples of an alkylene group as a divalent linking group which is represented by L include an alkylene group with 1 to 8 carbon atoms.

A cycloalkylene group as the divalent linking group which is represented by L is preferably a cycloalkylene group with 3 to 20 carbon atoms.

Preferable examples of an aromatic ring group as a divalent linking group which is represented by L include an aromatic ring group with 6 to 18 carbon atoms (more preferably with 6 to 10 carbon atoms) or an aromatic ring group which includes a hetero ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring, and a benzene ring group is particularly preferable.

The definitions and the preferable ranges of the alkylene group, cycloalkylene group, and aromatic ring group which are represented by $L_1$' are the same as in the alkylene group, cycloalkylene group, and aromatic ring group as the divalent linking group which is represented by L.

It is possible to use any group which has a lactone structure which is represented by $L_1$' as long as the group has a lactone structure; however, a ring lactone structure with 5 to 7 members is preferable, and a group in which another ring structure is condensed in a form in which a bicyclo structure and a spiro structure are formed in a ring lactone structure with 5 to 7 members is preferable.

The definitions and the preferable ranges of the alkylene group and the aromatic ring group in a group combining the alkylene group and the aromatic ring group which are represented by $L_1$' are the same as in the alkylene group and the aromatic ring group as the divalent linking group which is represented by L.

L is preferably a single bond, an aromatic ring group, a norbornane ring group, or an adamantane ring group, more preferably a single bond, a norbornane ring group, or an adamantane ring group, even more preferably a single bond or a norbornane ring group, and particularly preferably a single bond.

A monovalent substituent group of $R_1$ is preferably a group which is represented by *—C($R_{111}$)($R_{112}$)($R_{113}$). * represents a direct bond which is linked with a carbon atom in a repeating unit which is represented by General Formula (Ca1). $R_{111}$ to $R_{113}$ each independently represent a hydrogen atom, an alkyl group, a cycloalkyl group, an aryl group, an aralkyl group, or a hetero ring group.

The alkyl group of $R_{111}$ to $R_{113}$ is preferably an alkyl group with 1 to 15 carbon atoms. An alkyl group of $R_{111}$ to $R_{113}$ is preferably a methyl group, an ethyl group, a propyl group, an isopropyl group, or a t-butyl group.

At least two of $R_{111}$ to $R_{113}$ each independently represent an alkyl group, a cycloalkyl group, an aryl group, an aralkyl group, or a hetero ring group, and all of $R_{111}$ to $R_{113}$ preferably represent an alkyl group, a cycloalkyl group, an aryl group, an aralkyl group, or a hetero ring group.

The cycloalkyl group of $R_{111}$ to $R_{113}$ may be a monocyclic type or may be a polycyclic type and is preferably a cycloalkyl group with 3 to 15 carbon atoms. The cycloalkyl group of $R_{111}$ to $R_{113}$ is preferably a cyclopropyl group, a cyclopentyl group, or a cyclohexyl group.

The aryl group of $R_{111}$ to $R_{113}$ is preferably an aryl group with 6 to 15 carbon atoms and also includes a structure where a plurality of aromatic rings are linked with each other via a single bond (for example, a biphenyl group and a terphenyl group). The aryl group of $R_{111}$ to $R_{113}$ is preferably a phenyl group, a naphthyl group, or a biphenyl group.

The aralkyl group of $R_{111}$ to $R_{113}$ is preferably an aralkyl group with 6 to 20 carbon atoms. Specific examples of the aralkyl group of $R_{111}$ to $R_{113}$ include a benzyl group, a phenethyl group, a naphthylmethyl group, a naphthylethyl group, and the like.

The hetero ring group of $R_{111}$ to $R_{113}$ is preferably a hetero ring group with 6 to 20 carbon atoms. Specific examples of the hetero ring group of $R_{111}$ to $R_{113}$ include a pyridyl group, a pyrazyl group, a tetrahydrofuranyl group, a tetrahydropyranyl group, a tetrahydrothiophene group, a piperidyl group, a piperadyl group, a furanyl group, a pyranyl group, a chromanyl group, and the like.

An alkyl group, a cycloalkyl group, an aryl group, an aralkyl group, and a hetero ring group as $R_{111}$ to $R_{113}$ may further have a substituent group.

Examples of a substituent group which an alkyl group as $R_{111}$ to $R_{113}$ may further have include a cycloalkyl group, an aryl group, an amino group, an amide group, an ureide group, a urethane group, a hydroxy group, a carboxy group, a halogen atom, an alkoxy group, an aralkyloxy group, a thioether group, an acyl group, an acyloxy group, an alkoxycarbonyl group, a cyano group, a nitro group, and the like. The substituent groups described above may form a ring by bonding with each other and examples of the ring when the substituent groups described above form a ring by bonding with each other include a cycloalkyl group with 3 to 10 carbon atoms or a phenyl group.

Examples of a substituent group which a cycloalkyl group as $R_{111}$ to $R_{113}$ may further have include an alkyl group and each of the groups described above as specific examples of a substituent group which an alkyl group as $R_{111}$ to $R_{113}$ may further have.

Here, the number of carbon atoms of a substituent group which a cycloalkyl group may further have is preferably 1 to 8.

Examples of a substituent group which an aryl group, an aralkyl group, and a hetero ring group as $R_{111}$ to $R_{113}$ may further have include a nitro group, a halogen atom such as a fluorine atom, a carboxyl group, a hydroxyl group, an amino group, a cyano group, an alkyl group (preferably with 1 to 15 carbon atoms), an alkoxy group (preferably with 1 to 15 carbon atoms), a cycloalkyl group (preferably with 3 to 15 carbon atoms), an aryl group (preferably with 6 to 14 carbon atoms), an alkoxycarbonyl group (preferably with 2 to 7 carbon atoms), an acyl group (preferably with 2 to 12 carbon atoms), an alkoxycarbonyloxy group (preferably with 2 to 7 carbon atoms), and the like.

At least two of $R_{111}$ to $R_{113}$ may form a ring with each other.

In a case where at least two of $R_{111}$ to $R_{113}$ form a ring by bonding with each other, examples of the formed ring include a tetrahydropyran ring, a cyclopentane ring, a cyclohexane ring, an adamantane ring, a norbornene ring, a norbornane ring, and the like. The rings may have a substituent group and examples of the substituent group which the rings may have include an alkyl group and each of the groups described above as specific examples of a substituent group which the alkyl group as $R_{111}$ to $R_{113}$ may further have.

In a case where all of $R_{111}$ to $R_{113}$ form a ring by bonding with each other, examples of a formed ring include an adamantane ring, a norbornane ring, a norbornene ring, a bicyclo[2,2,2]octane ring, and a bicyclo[3,1,1]heptane ring. Among these, an adamantane ring is particularly preferable. These may have a substituent group and examples of the substituent group which these may have include an alkyl group and each of the groups described above as specific examples of a substituent group which the alkyl group as $R_{111}$ to $R_{113}$ may further have.

In one form of the present invention, a monovalent substituent group of $R_2$ is preferably a group formed of two or more types of atoms selected from a carbon atom, a hydrogen atom, an oxygen atom, a nitrogen atom, a silicon atom, and a sulfur atom, more preferably a group formed of two or more types of atoms selected from a carbon atom, a hydrogen atom, an oxygen atom, and a nitrogen atom, even more preferably a group formed of two or more types of atoms selected from a carbon atom, a hydrogen atom, and an oxygen atom, and particularly preferably a group consisting of a carbon atom and a hydrogen atom.

In one form of the present invention, a monovalent substituent group of $R_2$ is preferably a group which is represented by *-M-Q. * represents a direct bond which is linked with an oxygen atom in General Formula (Ca1). M is the same as M in General Formula (VI-A) in the resin (A) and the specific examples and the preferable examples thereof are also the same. Q is the same as Q in General Formula (VI-A) in the resin (A) and the specific examples and the preferable examples thereof are also the same.

$R_2$ is preferably an alkyl group, an alkyl group which is substituted with a cycloalkyl group, a cycloalkyl group, an aralkyl group, an aryloxyalkyl group, or a hetero ring group, and more preferably an alkyl group or a cycloalkyl group.

Specific examples of a substituent group which is represented by $R_2$ include a methyl group, an ethyl group, an isopropyl group, a cyclopentyl group, a cyclohexyl group, a cyclohexylethyl group, a 2-adamantyl group, an 8-tricyclo[5.2.1.0$^{2,6}$]decyl group, a 2-bicyclo[2.2.1]heptyl group, a benzyl group, a 2-phenetyl group, a 2-phenoxyethylene group, and the like.

$R_1$ and $R_2$ may bond with each other and form a ring (an oxygen-containing hetero ring) with an oxygen atom in the formula. The oxygen-containing hetero ring structure may be any of monocyclic, polycyclic, or spirocyclic, preferably a monocyclic oxygen-containing hetero ring structure, and the number of carbon atoms thereof is preferably 3 to 10 and more preferably 4 or 5.

In addition, as described above, in a case where M is a divalent linking group, Q may be bonded with M via a single bond or another linking group and form a ring. Examples of the other linking group described above include an alkylene group (preferably an alkylene group with 1 to 3 carbon atoms) and the formed ring is preferably a ring with 5 or 6 members.

$R_3$ is preferably a hydrogen atom or an alkyl group with 1 to 5 carbon atoms, more preferably a hydrogen atom or an alkyl group with 1 to 3 carbon atoms, even more preferably a hydrogen atom, a methyl group, or an ethyl group, and particularly preferably a hydrogen atom.

In one form of the present invention, one of $R_1$ and $R_3$ is preferably a group which includes two or more carbon atoms.

Specific examples of a repeating unit which is represented by General Formula (Ca1) above will be shown below; however, the present invention is not limited thereto.

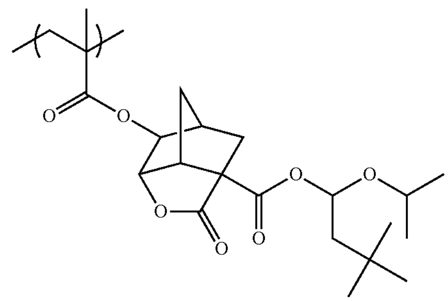

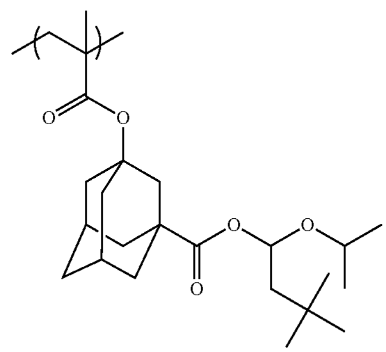

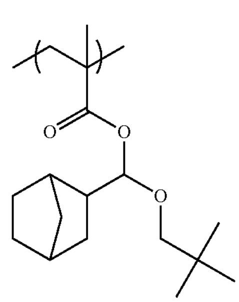

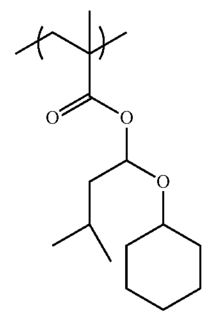

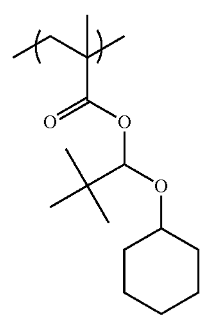

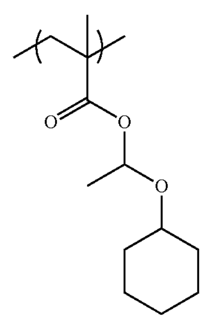

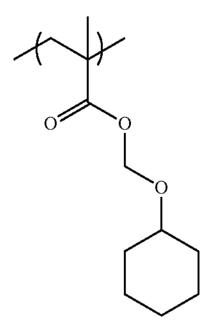

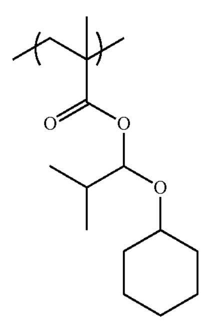

-continued
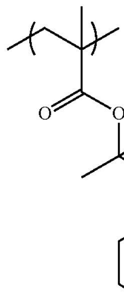
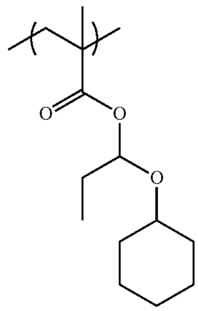
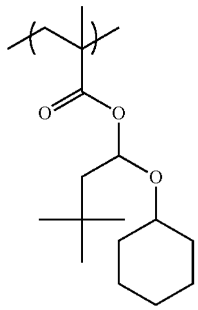
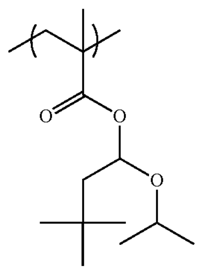
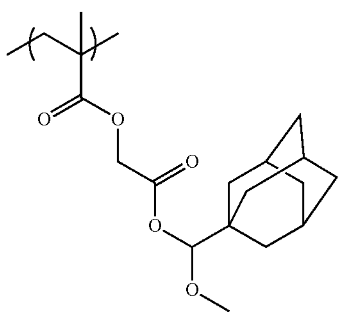
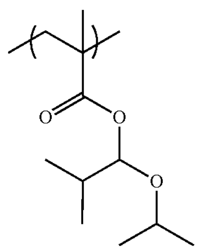
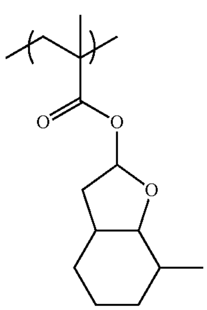
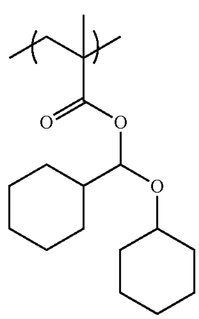
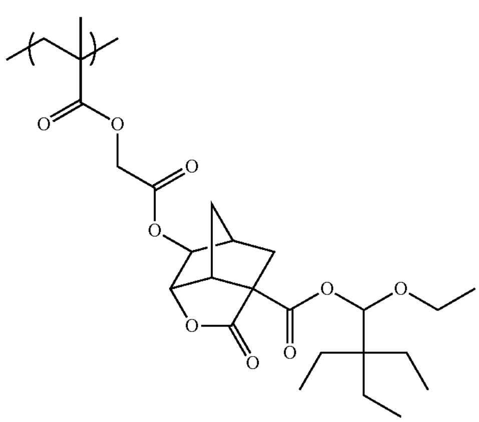
-continued
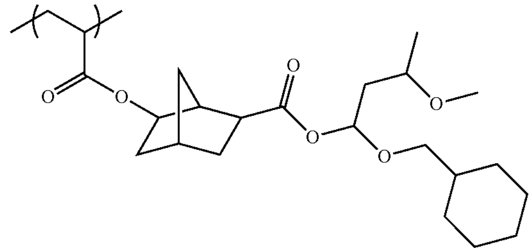
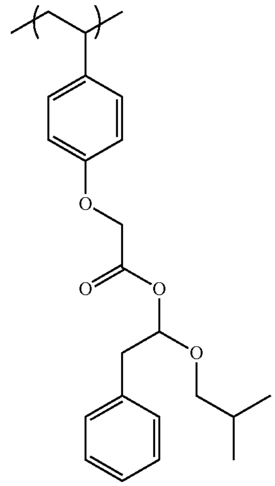
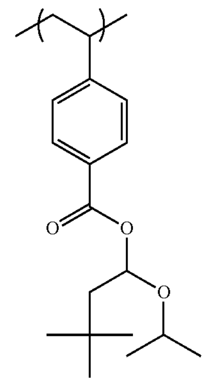
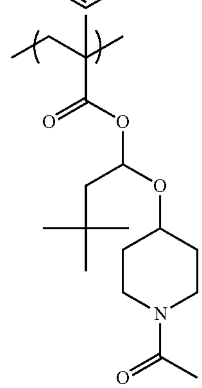
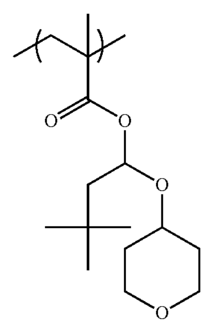
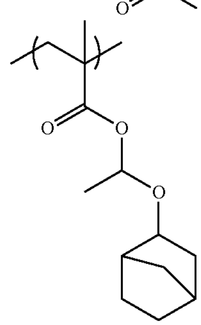
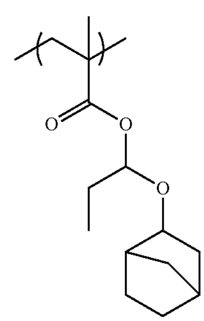
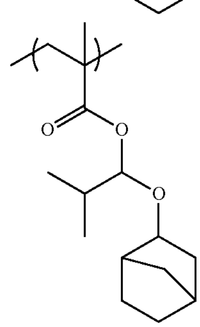
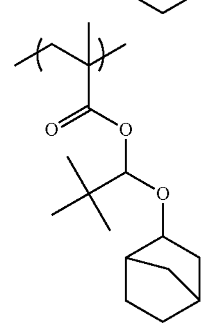

-continued

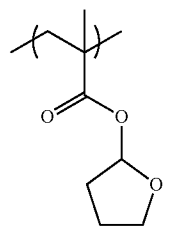

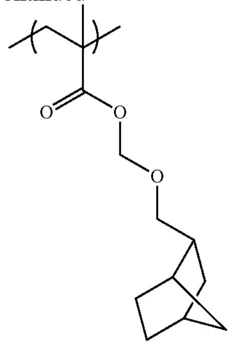

The content of the repeating units which are represented by General Formula (Ca1) described above in the resin (C) (the total thereof in a case of containing a plurality of types) is preferably 5 mol % to 80 mol % with respect to all of the repeating units in the resin (C), more preferably 5 mol % to 60 mol %, and even more preferably 10 mol % to 40 mol %.

In General Formula (Ca2), Ra represents a hydrogen atom, an alkyl group, a cyano group, or a halogen atom.

$L_1$ represents a single bond or a divalent linking group.

$R_4$ and $R_5$ each independently represent an alkyl group. However, the number of carbon atoms which at least one of the alkyl groups has is preferably 2 or more.

$R_{11}$ and $R_{12}$ each independently represent an alkyl group and $R_{13}$ represents a hydrogen atom or an alkyl group. $R_{11}$ and $R_{12}$ may form a ring by linking with each other and $R_{11}$ and $R_{13}$ may form a ring by linking with each other.

In General Formula (Ca2), from the viewpoint of reliably achieving the effects of the present invention, both $R_4$ and $R_5$ are preferably an alkyl group with 2 or more carbon atoms, more preferably an alkyl group with 2 to 10 carbon atoms, and both $R_4$ and $R_5$ are even more preferably an ethyl group.

An alkyl group as $R_{11}$ to $R_{13}$ is preferably an alkyl group with 1 to 10 carbon atoms.

The alkyl group with regard to $R_{11}$ and $R_{12}$ is more preferably an alkyl group with 1 to 4 carbon atoms, even more preferably a methyl group or an ethyl group, and particularly preferably a methyl group.

$R_{13}$ is more preferably a hydrogen atom or a methyl group.

As described above, $R_{11}$ and $R_{12}$ may form a ring by linking with each other and $R_{11}$ and $R_{13}$ may form a ring by linking with each other. The formed ring is preferably, for example, a monocyclic or polycyclic alicyclic hydrocarbon group and, in particular, $R_{11}$ and $R_{12}$ preferably form a monocyclic or polycyclic alicyclic hydrocarbon group by bonding with each other.

A ring which $R_{11}$ and $R_{12}$ form by linking with each other is preferably a ring with 3 to 8 members and more preferably a ring with 5 or 6 members.

The ring which $R_{11}$ and $R_{13}$ form by linking with each other is preferably a ring with 3 to 8 members and more preferably a ring with 5 or 6 members.

An alkyl group as $R_1$, $R_2$, and $R_{11}$ to $R_{13}$ may further have a substituent group. Examples of the substituent group include a cycloalkyl group, an aryl group, an amino group, a hydroxy group, a carboxy group, a halogen atom, an alkoxy group, an aralkyloxy group, a thioether group, an acyl group, an acyloxy group, an alkoxycarbonyl group, a cyano group, a nitro group, and the like.

In addition, a ring which $R_{11}$ and $R_{12}$ form by linking with each other and a ring which $R_{11}$ and $R_{13}$ form by linking with each other may further have a substituent group and examples of the substituent group include an alkyl group (a methyl group, an ethyl group, a propyl group, a butyl group, a perfluoroalkyl group (for example, a trifluoromethyl group), and the like) and each of the groups described above as specific examples of a substituent group which the alkyl group as $R_1$, $R_2$, and $R_{11}$ to $R_{13}$ may further have.

The substituent groups described above may form a ring by bonding with each other and examples of the ring when the substituent groups described above form a ring by bonding with each other include a cycloalkyl group with 3 to 10 carbon atoms or a phenyl group.

As described above, Ra represents a hydrogen atom, an alkyl group, a cyano group, or a halogen atom.

The alkyl group with regard to Ra is preferably an alkyl group with 1 to 4 carbon atoms and may have a substituent group.

Examples of a preferable substituent group which an alkyl group of Ra may have include a hydroxyl group and a halogen atom.

Examples of a halogen atom of Ra include a fluorine atom, a chlorine atom, a bromine atom, and an iodine atom.

Ra is preferably a hydrogen atom, a methyl atom, a hydroxymethyl group, and a perfluoroalkyl group with 1 to 4 carbon atoms (for example, a trifluoromethyl group), and particularly preferably a methyl group from the viewpoint of improving the glass transition point (Tg) of the resin (C) and improving the resolving power and space width roughness.

However, in a case where $L_1$ which will be described below is a phenylene group, Ra is also preferably a hydrogen atom.

Examples of a divalent linking group which is represented by $L_1$ include an alkylene group, a divalent aromatic ring group, —COO-$L_{11}$-, —O-$L_{11}$-, a group which is formed by combining two or more thereof, and the like. Here, $L_{11}$ represents an alkylene group, a cycloalkylene group, a divalent aromatic ring group, and a group combining an alkylene group and a divalent aromatic ring group.

Examples of an alkylene group for $L_1$ and $L_{11}$ include an alkylene group with 1 to 8 carbon atoms.

A cycloalkylene group with regard to $L_{11}$ is preferably a cycloalkylene group with 3 to 20 carbon atoms.

With regard to a cycloalkylene group for $L_{11}$, the carbon which forms the ring (the carbon which contributes to the ring forming) may be a carbonyl carbon, or may be a hetero atom such as an oxygen atom, and may contain an ester bond and form a lactone ring.

A divalent aromatic ring group for $L_1$ and $L_{11}$ is preferably a phenylene group such as a 1,4-phenylene group, a 1,3-phenylene group, and 1,2-phenylene group, or a 1,4-naphthylene group, and more preferably a 1,4-phenylene group.

$L_1$ is preferably a single bond, a divalent aromatic ring group, a divalent group which has a norbornylene group, or a divalent group which has an adamantylene group, and particularly preferably a single bond.

Specific examples of a repeating unit which is represented by General Formula (Ca2) described above will be shown below; however, the present invention is not limited thereto.

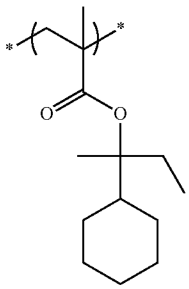
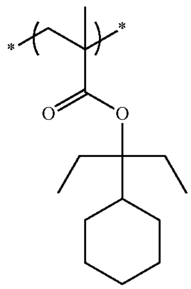
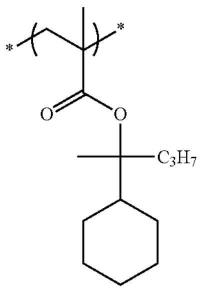
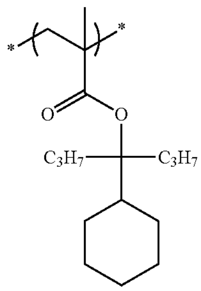
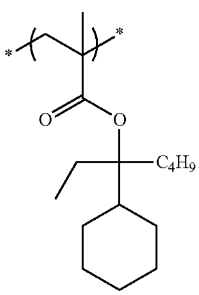
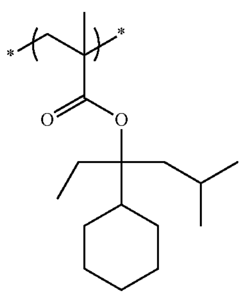
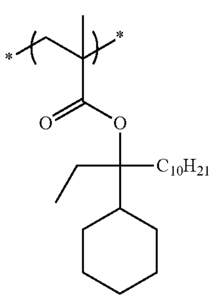
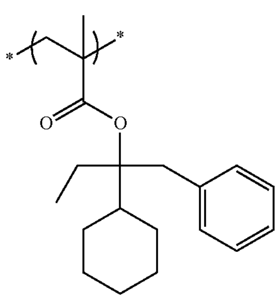
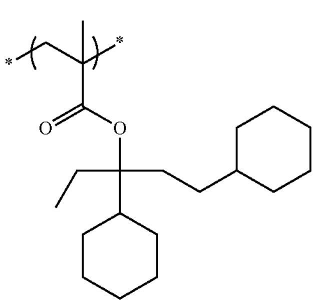
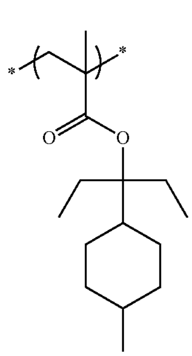
-continued
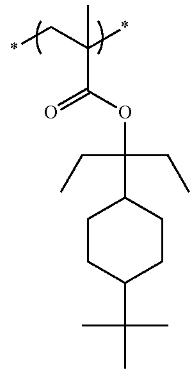
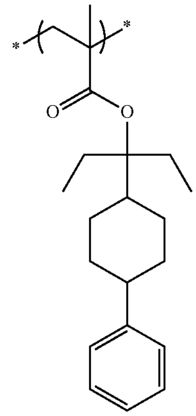
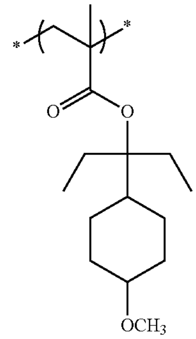
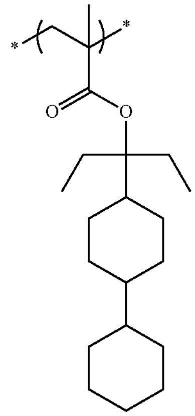
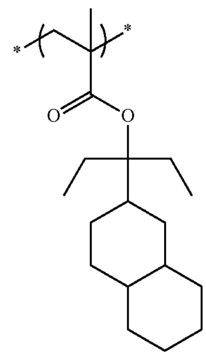
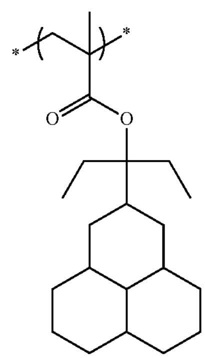
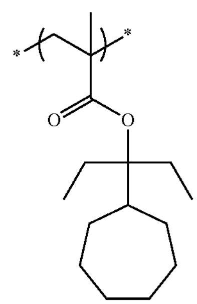
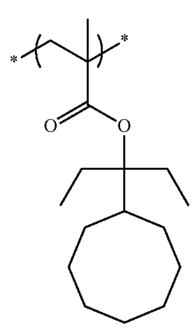
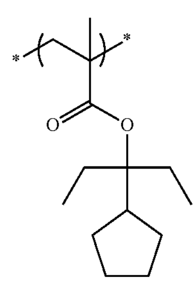
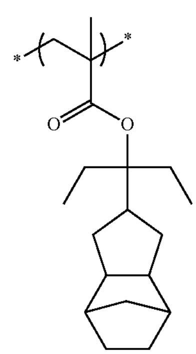

-continued
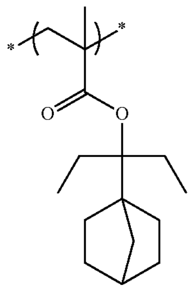
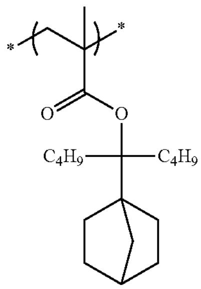
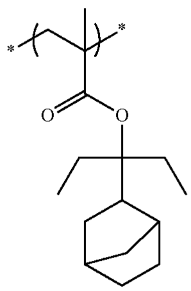
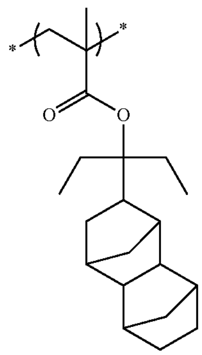
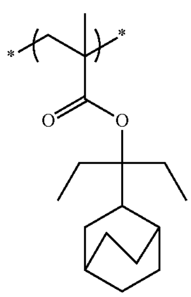
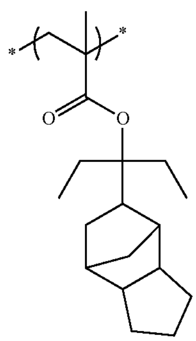
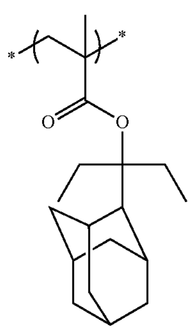
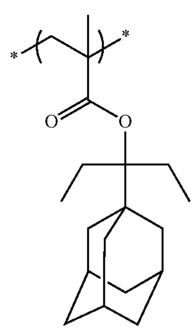
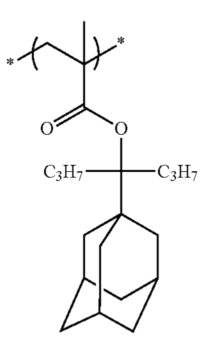
-continued
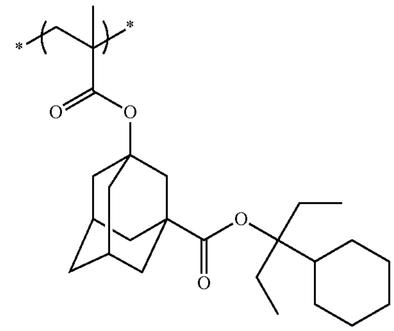
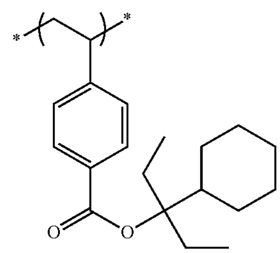
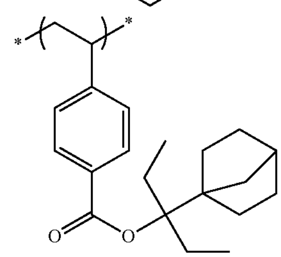
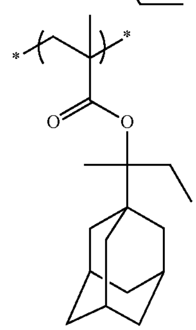
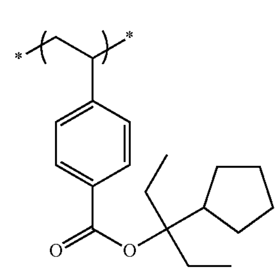
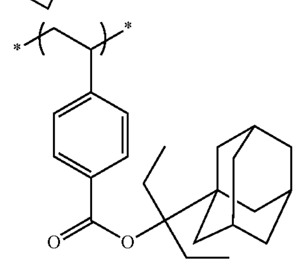
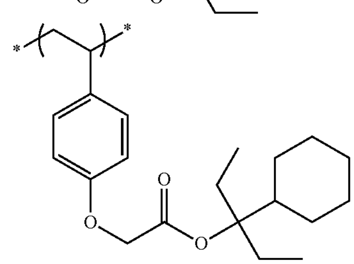
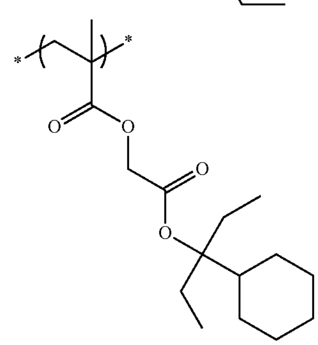

-continued
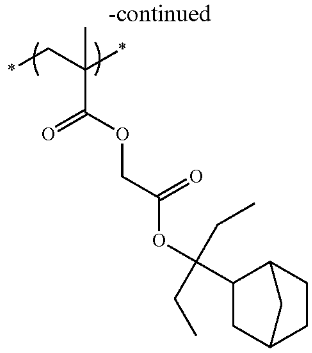
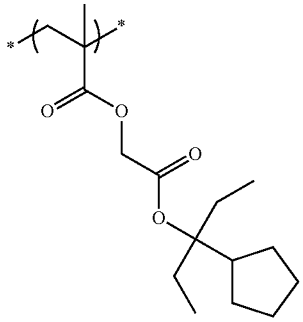
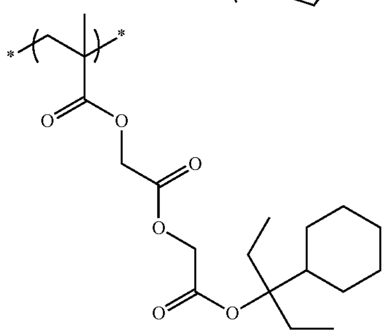
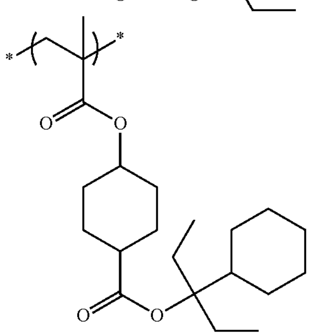
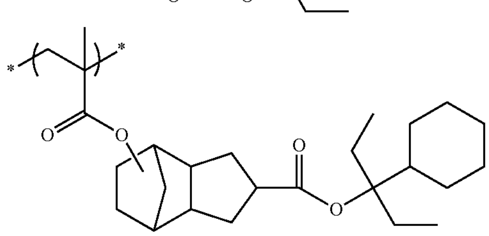
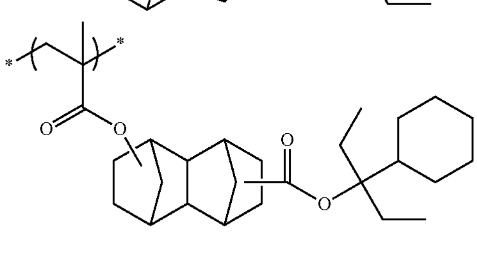
-continued
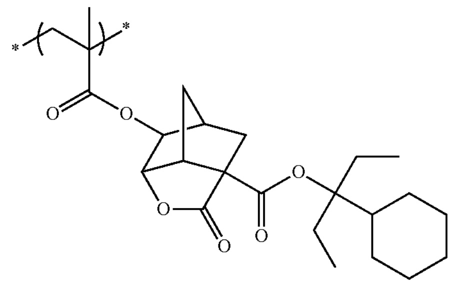
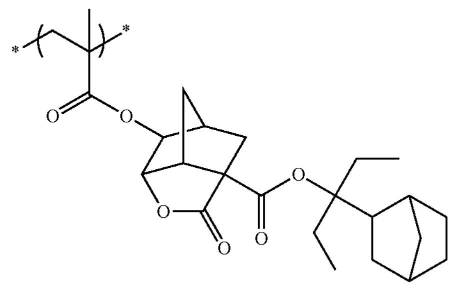
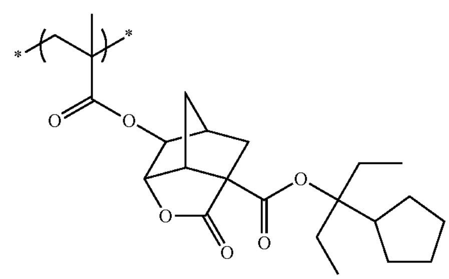
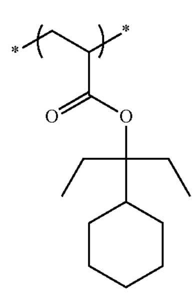
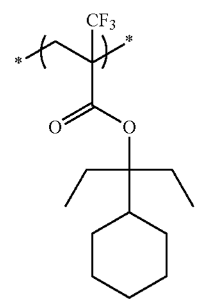
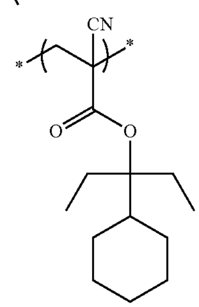
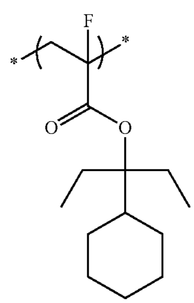
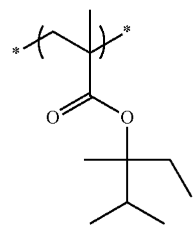
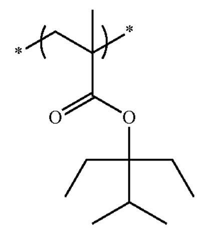
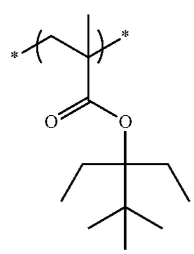
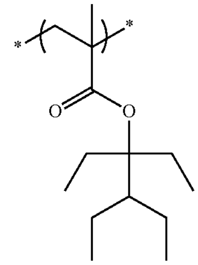

-continued

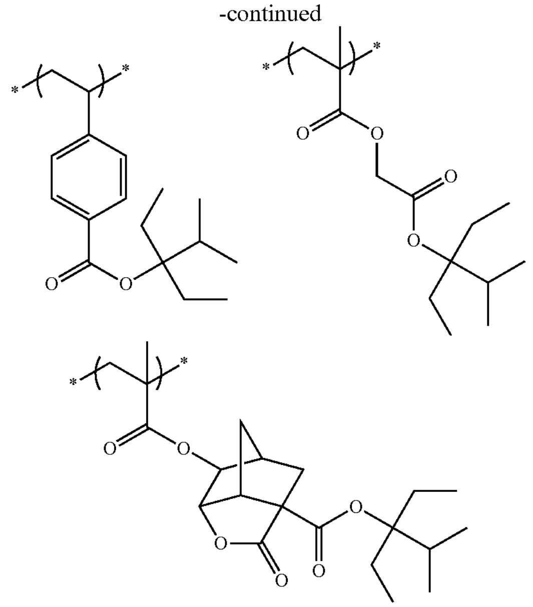

The content ratio of a repeating unit which is represented by General Formula (Ca2) described above in the resin (C) (the total thereof in a case of containing a plurality of types) is preferably 5 mol % to 80 mol % with respect to all of the repeating units in the resin (C), more preferably 5 mol % to 60 mol %, and even more preferably 10 mol % to 40 mol %.

In General Formula (Ca3), Ra is the same as Ra in General Formula (Ca2) and the specific examples and the preferable examples thereof are also the same.

$L_2$ is the same as $L_1$ in General Formula (Ca2) and the specific examples and the preferable examples thereof are also the same.

$R_{14}$, $R_{15}$, and $R_{16}$ each independently represent an alkyl group. Two of $R_{14}$ to $R_{16}$ may form a ring by linking with each other.

An alkyl group of $R_{14}$ to $R_{16}$ is preferably an alkyl group with 1 to 4 carbon atoms such as a methyl group, an ethyl group, an n-propyl group, an isopropyl group, an n-butyl group, an isobutyl group, and a t-butyl group.

A cycloalkyl group which is formed by two of $R_{14}$ to $R_{16}$ being bonded with each other is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and adamantyl group. A monocyclic cycloalkyl group with 5 or 6 carbon atoms is particularly preferable.

Examples of one preferable aspect include an aspect in which $R_{14}$ is a methyl group or an ethyl group and $R_{15}$ and $R_{16}$ form the cycloalkyl group by bonding with each other.

Each of the groups may have a substituent group and examples of the substituent group include a hydroxyl group, a halogen atom (for example, a fluorine atom), an alkyl group (with 1 to 4 carbon atoms), a cycloalkyl group (with 3 to 8 carbon atoms), an alkoxy group (with 1 to 4 carbon atoms), a carboxyl group, an alkoxycarbonyl group (with 2 to 6 carbon atoms), and the like, and the number of carbon atoms is preferably 8 or less.

In General Formula (Ca4), Ra is the same as Ra in General Formula (Ca2) and the specific examples and the preferable examples thereof are also the same.

$L_3$ is the same as $L_1$ in General Formula (Ca2) and the specific examples and the preferable examples thereof are also the same.

AR represents an aryl group. Rn represents an alkyl group, a cycloalkyl group, or an aryl group. Rn and AR may form a non-aromatic ring by bonding with each other.

Specific examples and preferable examples of AR and Rn include the same as the specific examples and the preferable examples of AR and Rn in the repeating unit which is represented by General Formula (BZ) according to paragraphs [0101] to [0131] of JP2012-208447A and the contents thereof are included in the present specification.

Examples of a non-aromatic ring which Rn and AR may form by bonding with each other also include the same as the specific examples and the preferable examples of the non-aromatic ring which Rn and AR may form by bonding with each other in the repeating unit which is represented by General Formula (BZ) according to paragraphs [0101] to [0131] of JP2012-208447A and the contents thereof are included in the present specification.

In a case where the resin (C) has repeating units (Ca1) to (Ca4), the content (the total thereof in a case of containing a plurality of types) is preferably 5 mol % to 30 mol % based on all of the repeating units of the resin (C) and more preferably 10 mol % to 20 mol %.

Furthermore, the resin (C) may have at least one group selected from groups of (x) and (y) below.

(x) Acidic Groups (y) Groups which have a Lactone Structure, Acid Anhydride Groups, or Acid Imide Groups Examples of acidic groups (x) include a phenolic hydroxyl group, a carboxylic acidic group, a fluorinated alcohol group, a sulfonic acidic group, a sulfonamide group, a sulfonylimide group, an (alkyl sulfonyl) (alkyl carbonyl) methylene group, an (alkyl sulfonyl) (alkyl carbonyl)imide group, a bis(alkyl carbonyl)methylene group, a bis(alkyl carbonyl) imide group, a bis(alkyl sulfonyl)methylene group, a bis(alkyl sulfonyl)imide group, a tris(alkyl carbonyl)methylene group, a tris(alkyl sulfonyl)methylene group, and the like.

Examples of a preferable acidic group include a fluorinated alcohol group (preferably hexafluoroisopropanol), a sulfonimide group, a bis(alkyl carbonyl)methylene group.

Examples of a repeating unit which has an acidic group (x) include a repeating unit where an acidic group is directly bonded with a main chain of a resin such as a repeating unit using an acrylic acid and a methacrylic acid, a repeating unit where an acidic group is bonded with the main chain of a resin via a linking group, or the like, and furthermore, by using a polymerization initiator or a chain transfer agent which has an acidic group during polymerization, introduction is also possible to an end of a polymer chain, and any of these cases is preferable. A repeating unit which has an acidic group (x) may have at least one of a fluorine atom or a silicone atom.

The content of the repeating units which have an acidic group (x) is preferably 10 mol % or less with respect to all of the repeating units in the resin (C) and more preferably 5 mol % or less and the resin (C) preferably substantially does not have a repeating unit which has an acidic group (x) (ideally, the content of the repeating units which have an acidic group (x) is 0 mol % with respect to all of the repeating units in the resin (C), that is, there is no repeating unit which has an acidic group (x)).

Specific examples of the repeating unit which has an acidic group (x) will be shown below; however, the present invention is not limited thereto. In the formulas, Rx represents a hydrogen atom, $CH_3$, $CF_3$, or $CH_2OH$.
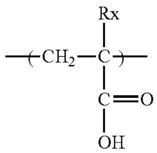
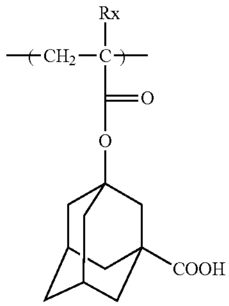
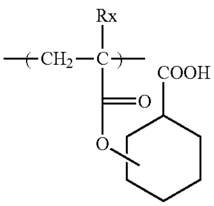
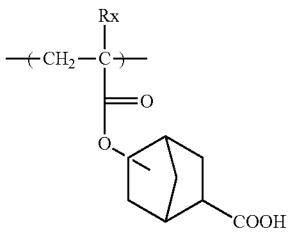
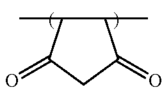
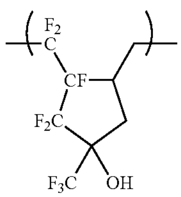
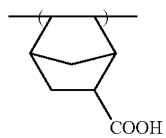
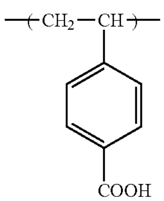
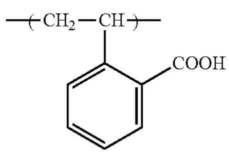
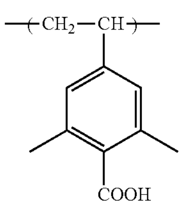
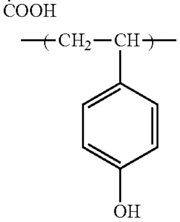
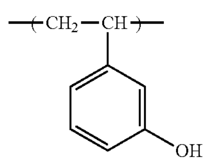
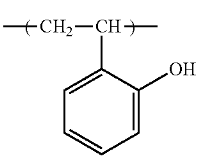
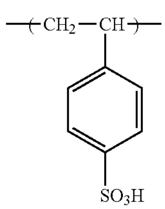
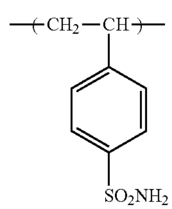
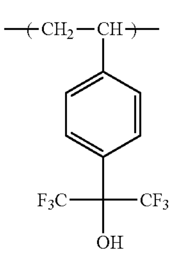
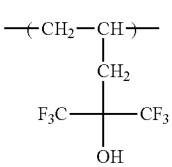
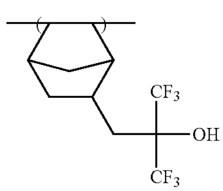
-continued
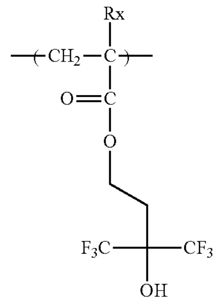
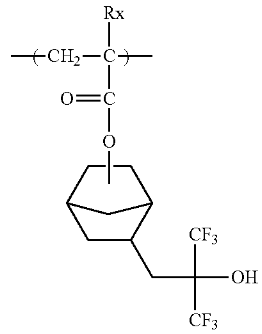
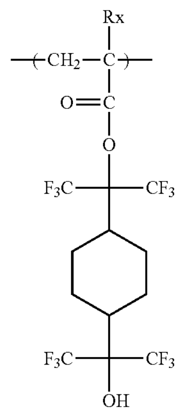
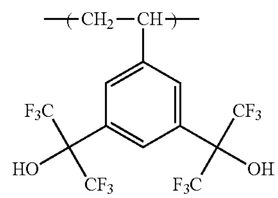
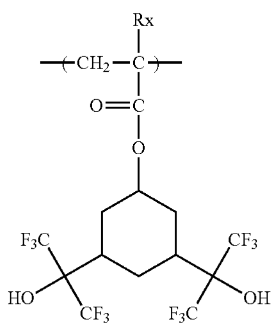
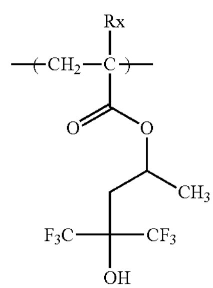
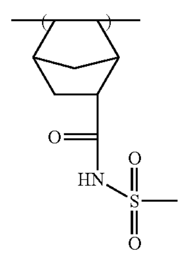
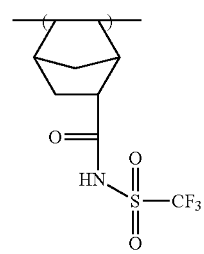
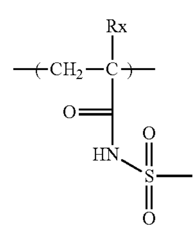
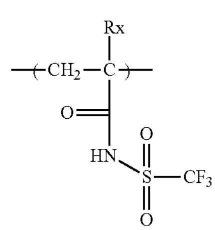
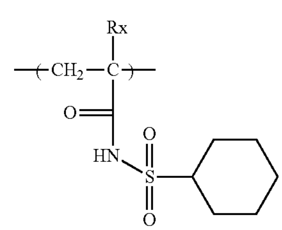

-continued

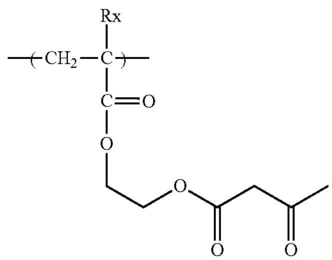

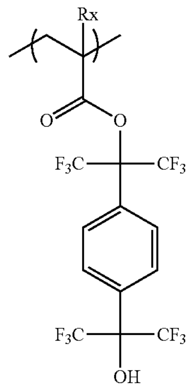

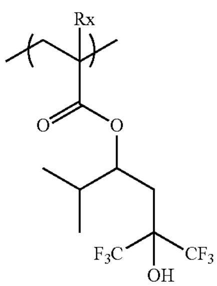

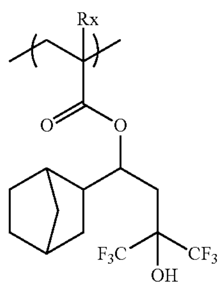

The group (y) which has a lactone structure, an acid anhydride group, or an acid imide group is particularly preferably a group which has a lactone structure.

The repeating unit which include these groups is, for example, a repeating unit where the group is directly bonded with a main chain of a resin such as a repeating unit using acrylic acid ester and methacrylic acid ester. Alternatively, the repeating unit may be a repeating unit where the group is bonded with the main chain of a resin via a linking group. Alternatively, the repeating unit may be introduced to an end of a resin using a polymerization initiator or a chain transfer agent which has the group during polymerization.

Examples of a repeating unit which has a group which has a lactone structure include the same examples as the repeating unit which has a lactone structure previously described in the resin (A).

The content of repeating units which have a group which has a lactone structure, an acid anhydride group, or an acid imide group is preferably 10 mol % or less based on all of the repeating units in a hydrophobic resin and more preferably 5 mol % or less, and the resin (C) preferably substantially does not have a repeating unit which has a group which has a lactone structure, an acid anhydride group, or an acid imide group (ideally, the content of repeating units which have a group which has a lactone structure, an acid anhydride group, or an acid imide group is 0 mol % with respect to all of the repeating units in the resin (C), that is, there is no repeating unit which has a group which has a lactone structure, an acid anhydride group, or an acid imide group).

The resin (C) may further have a repeating unit which is represented by General Formula (CIII) below.

(CIII)

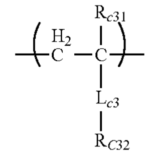

In General Formula (CIII), $R_{c31}$ represents a hydrogen atom, an alkyl group (may be substituted with a fluorine atom and the like), a cyano group, or a —$CH_2$—O—$Rac_2$ group. $Rac_2$ represents a hydrogen atom, an alkyl group, or an acyl group. $R_{c31}$ is preferably a hydrogen atom, a methyl group, a hydroxymethyl group, and a trifluoromethyl group and particularly preferably a hydrogen atom and a methyl group.

$R_{c32}$ represents a group which has an alkyl group, a cycloalkyl group, an alkenyl group, a cycloalkenyl group, or an aryl group. The groups may be substituted with a group which includes a fluorine atom and a silicon atom.

$L_{c3}$ represents a single bond or a divalent linking group.

An alkyl group of $R_{c32}$ in General Formula (CIII) is preferably a straight-chain or branched alkyl group with 3 to 20 carbon atoms.

A cycloalkyl group is preferably a cycloalkyl group with 3 to 20 carbon atoms.

An alkenyl group is preferably an alkenyl group with 3 to 20 carbon atoms.

A cycloalkenyl group is preferably a cycloalkenyl group with 3 to 20 carbon atoms.

An aryl group is preferably an aryl group with 6 to 20 carbon atoms and more preferably a phenyl group and a naphthyl group and these may have a substituent group.

$R_{c32}$ is preferably an unsubstituted alkyl group or an alkyl group which is substituted with a fluorine atom.

A divalent linking group of $L_{c3}$ is preferably an alkylene group (preferably 1 to 5 carbon atoms), an ether bond, a phenylene group, and an ester bond (a group which is represented by —COO—).

The content of repeating units which are represented by General Formula (CIII) is preferably 1 mol % to 100 mol % based on all of the repeating units in a hydrophobic resin, more preferably 10 mol % to 90 mol %, and even more preferably 30 mol % to 70 mol %.

The resin (C) also preferably further has a repeating unit which is represented by General Formula (CII-AB) below.

(CII-AB)

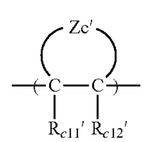

In Formula (CII-AB), $R_{c11}$' and $R_{c12}$' each independently represent a hydrogen atom, a cyano group, a halogen atom, or an alkyl group.

Zc' represents an atomic group for forming an alicyclic structure which includes two bonded carbon atoms (C—C).

The content of repeating units which are represented by General Formula (CII-AB) is preferably 1 mol % to 100 mol % based on all of the repeating units in a hydrophobic resin, more preferably 10 mol % to 90 mol %, and even more preferably 30 mol % to 70 mol %.

Specific examples of the repeating unit which is represented by General Formulas (III) and (CII-AB) will be given below; however, the present invention is not limited thereto. In the formulas, Ra represents H, $CH_3$, $CH_2OH$, $CF_3$ or CN.
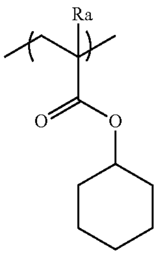
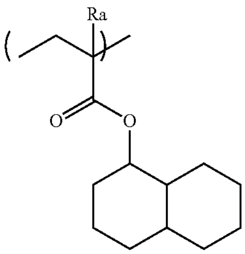
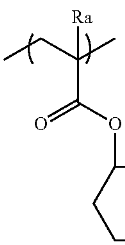
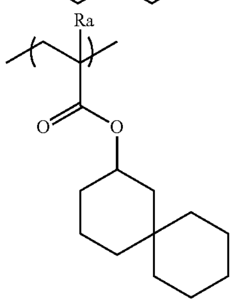
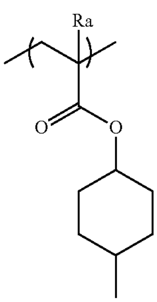
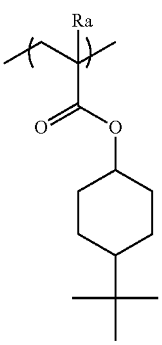
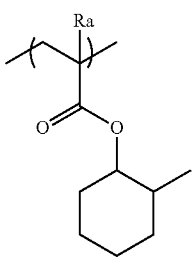
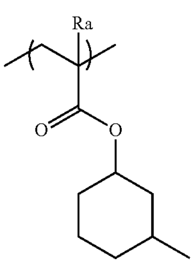
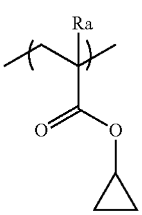
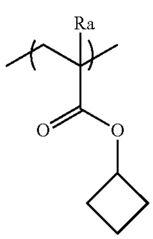
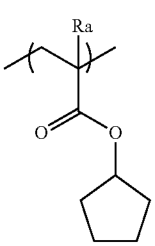
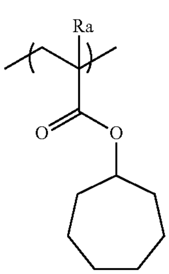
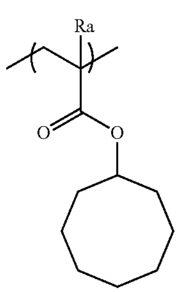
-continued
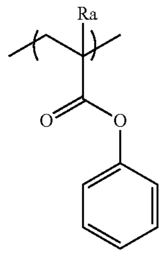
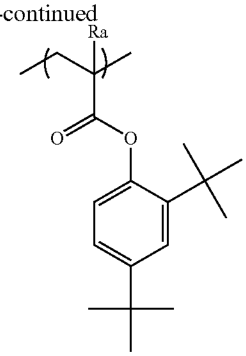
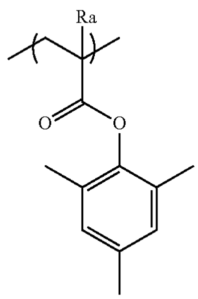
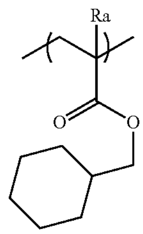
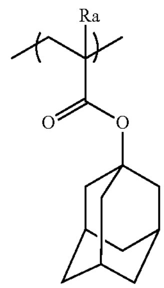
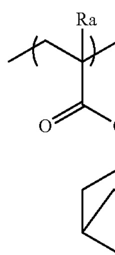
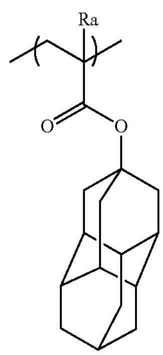
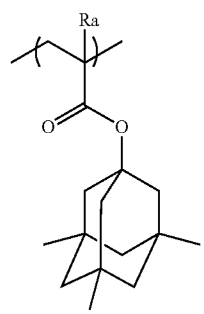
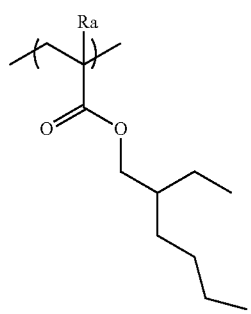
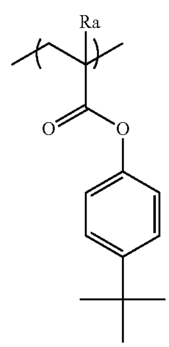
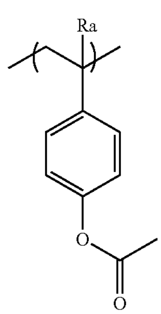
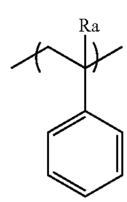
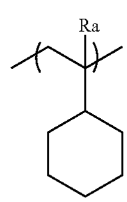

-continued

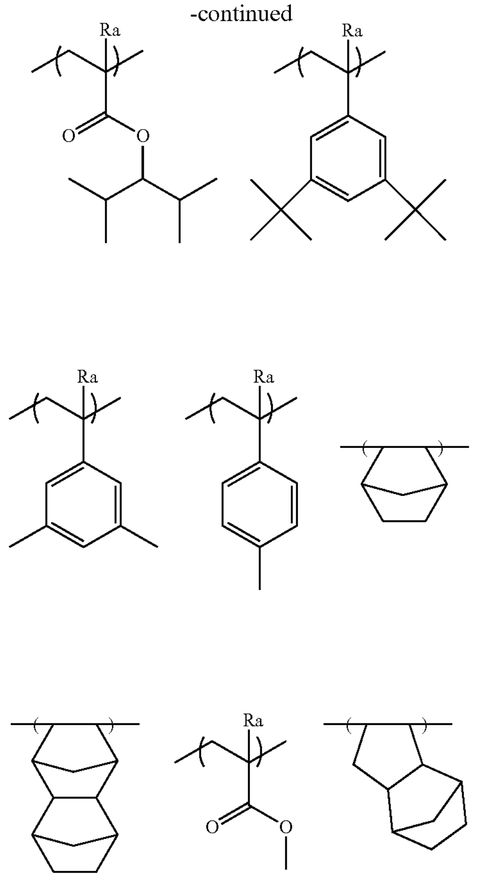

The weight average molecular weight of the resin (C) in standard polystyrene conversion is preferably 1,000 to 100,000, more preferably 1,000 to 50,000, and even more preferably 2,000 to 15,000.

In a case where the resin (C) includes a fluorine atom or a group which has a fluorine atom, the content of repeating units which have a fluorine atom is preferably 5 mol % to 100 mol % based on all of the repeating units of the resin (C) and more preferably 10 mol % to 100 mol %. However, in a case where exposure source is EUV light, due to the reasons described above, the content of repeating units which have a fluorine atom is also preferably 50 mol % or less based on all of the repeating units of the resin (C), also preferably 30 mol % or less, also preferably 10 mol % or less, and also preferably does not have a fluorine atom.

In addition, particularly in a case where the exposure source is EUV light, as described above, the resin (C) preferably has a repeating unit which has an aromatic ring group since the aromatic ring group is able to absorb out-of-band light of EUV light.

In a case where the resin (C) has a repeating unit which has an aromatic ring group, the content of the repeating units which have an aromatic ring group is preferably 3 mol % to 100 mol % based on all of the repeating units of the resin (C), more preferably 5 mol % to 80 mol %, and even more preferably 5 mol % to 70 mol %.

The resin (C) may be used as one type or a plurality of types may be used together. In a case of using a plurality of the resins (C) together, at least one type of the plurality of the resins (C) preferably has an aromatic ring group.

The content of the resins (C) in a composition is preferably 0.01 mass % to 10 mass % with respect to the total solid content in the composition of the present invention, more preferably 0.05 mass % to 8 mass %, and even more preferably 0.1 mass % to 5 mass %.

While the resin (C) naturally has few impurities such as metal in the same manner as the resin (A), the residual monomers or oligomer components are preferably 0.01 mass % to 5 mass %, more preferably 0.01 mass % to 3 mass %, and even more preferably 0.05 mass % to 1 mass %. Due to this, it is possible to obtain an actinic ray-sensitive or radiation-sensitive resin composition which does not have foreign matter in a liquid or changes in the sensitivity or the like over time. In addition, from the point of the resolution, the resist shape, the side wall of a resist pattern, roughness, and the like, the molecular weight distribution (Mw/Mn, also referred to as the dispersity) is preferably in a range of 1 to 5, more preferably 1 to 3, and even more preferably in a range of 1 and 2.

The resin (C) and the resin (A) may each have a repeating unit which has a polar group selected from a hydroxyl group, a cyano group, a lactone group, a carboxylic acidic group, a sulfonic acidic group, an amide group, a sulfonamide group, an ammonium group, a sulfonium group, and a group formed by combining two or more thereof; however, the content ratio (mol %) of the repeating units which have the polar group with respect to all of the repeating units of the resin (C) is preferably 10 mol % or more less than the content ratio (mol %) of the repeating units which have the polar group with respect to all of the repeating units of the resin (A), more preferably 20 mol % or more less, and particularly preferably 30 mol % or more less. As described above, the resin (C) is a resin which has a group with high hydrophobicity; however, regarding the content ratio of repeating units which have a polar group, by satisfying the relationships described above, the resin (C) is relatively sufficiently hydrophobic with respect to the resin (A) and is effectively easily unevenly distributed on a surface of a resist film.

With regard to the resin (C), it is also possible to use various types of commercial products and it is possible to carry out synthesis (for example, radical polymerization) using a general method. Examples of a general synthesis method include a collective polymerization method which performs polymerization by dissolving various monomers and a polymerization initiator in a solvent and carrying out heating, a dripping polymerization method in which drop-wise addition of a solution of various monomers and an initiator to a heated solvent is carried out over 1 to 10 hours, and the like, and the dripping polymerization method is preferable.

The reaction solvent, polymerization initiator, reaction conditions (temperature, concentration, and the like) and the purifying method after reaction are the same as the content described for the resin (A); however, in synthesizing the resin (C), the concentration of the reaction is preferably 30 mass % to 50 mass %.

Specific examples of the resin (C) will be shown below. In addition, the mol ratio of the repeating unit in each resin (corresponding to each repeating unit in order from the left), the weight average molecular weight, and the dispersity are shown in Table 1 and Table 2 below.

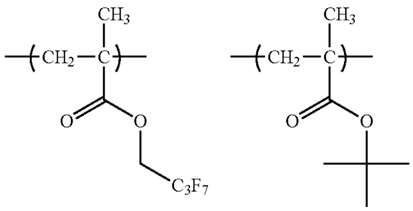
(HR-1)
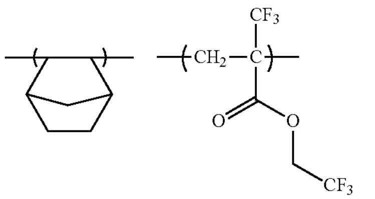
(HR-3)
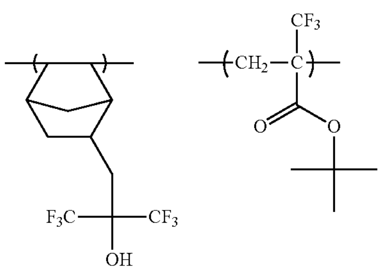
(HR-5)
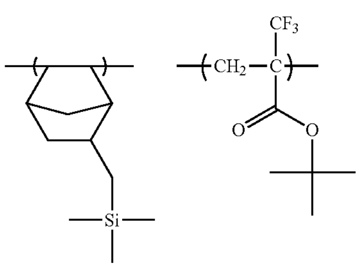
(HR-7)
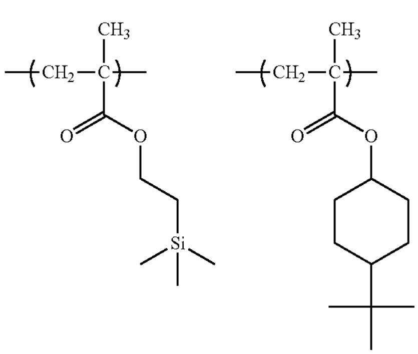
(HR-9)
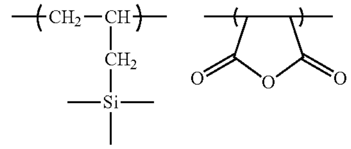
(HR-2)
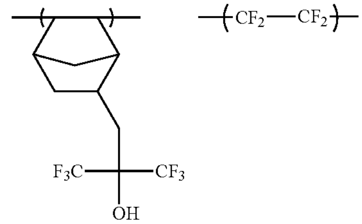
(HR-4)
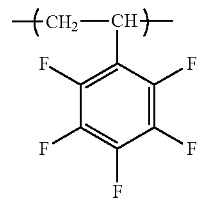
(HR-6)
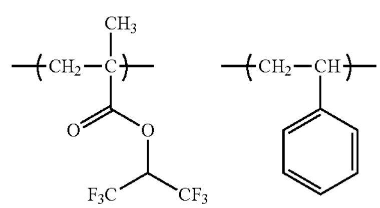
(HR-8)
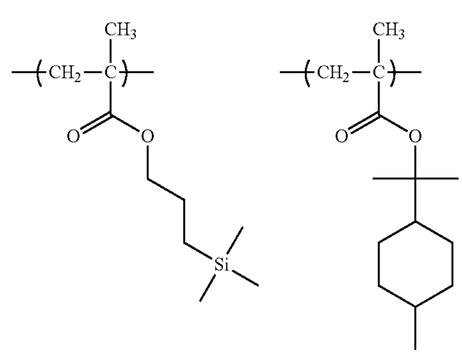
(HR-10)

-continued
(HR-11)
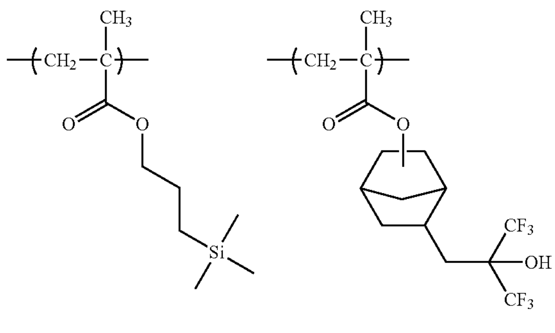
(HR-12)
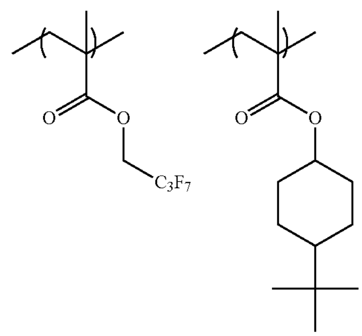
(HR-13)
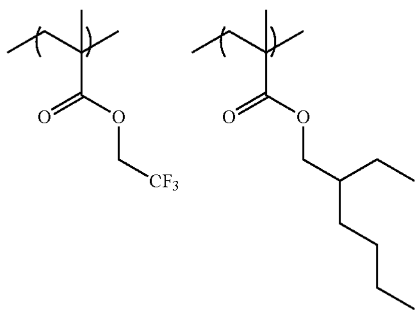
(HR-14)
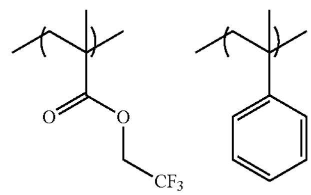
(HR-15)
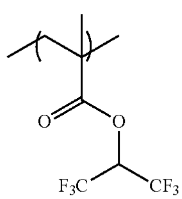
(HR-16)
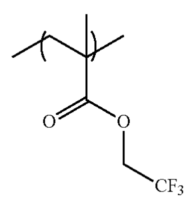
(HR-17)
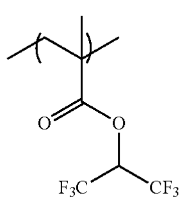
(HR-18)
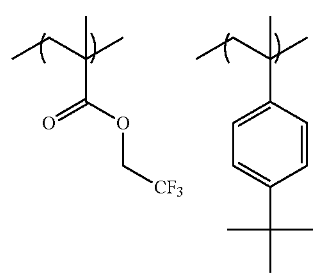
(HR-19)
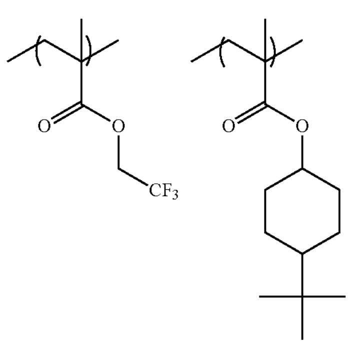
(HR-20)
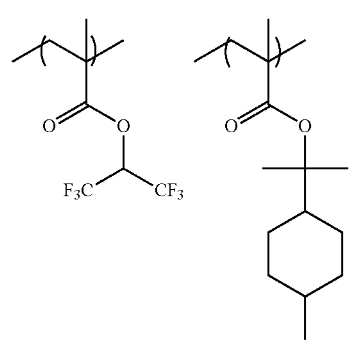

-continued
(HR-21)
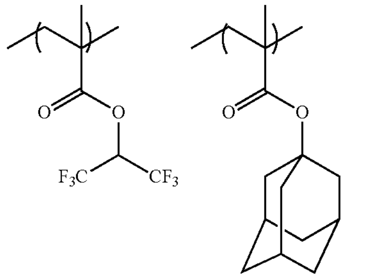
(HR-22)
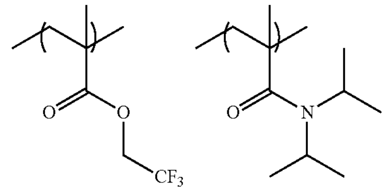
(HR-23)
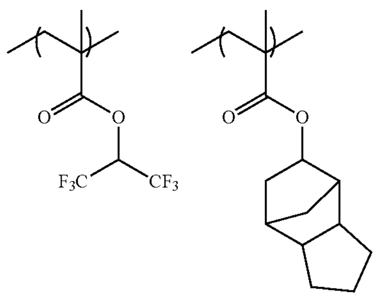
(HR-24)
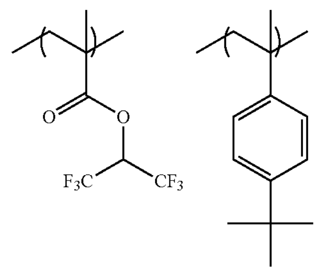
(HR-25)
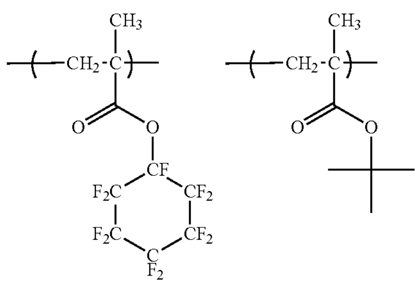
(HR-26)
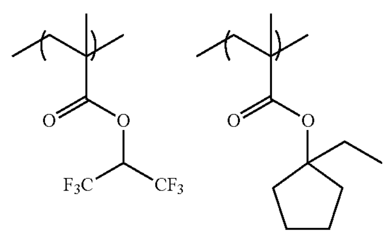
(HR-27)
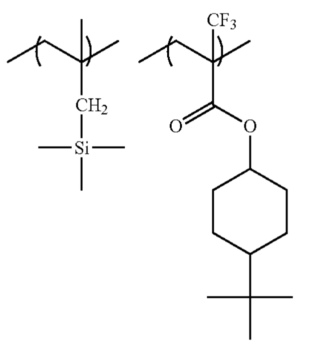
(HR-28)
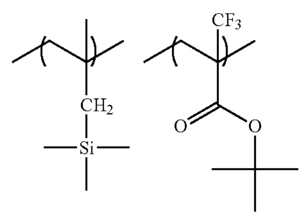
(HR-29)
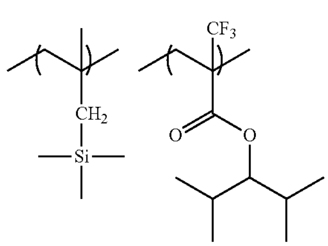
(HR-30)
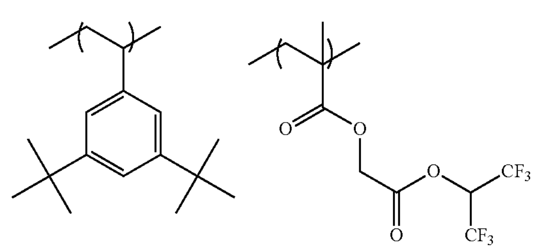

-continued
(HR-31)
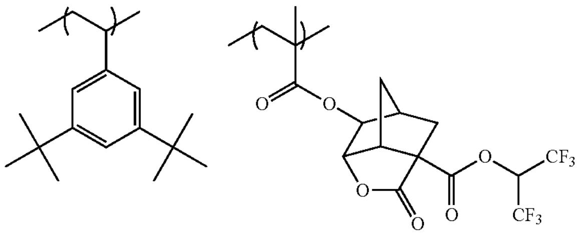
(HR-32)
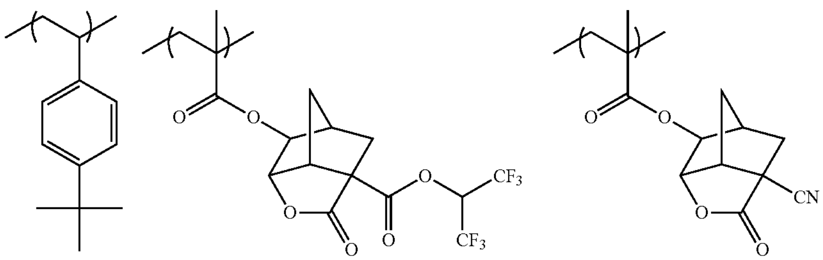
(HR-33)
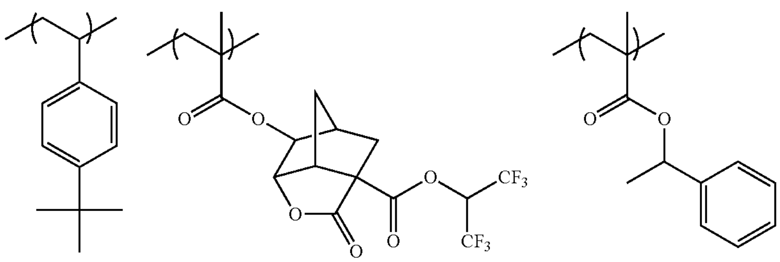
(HR-34)
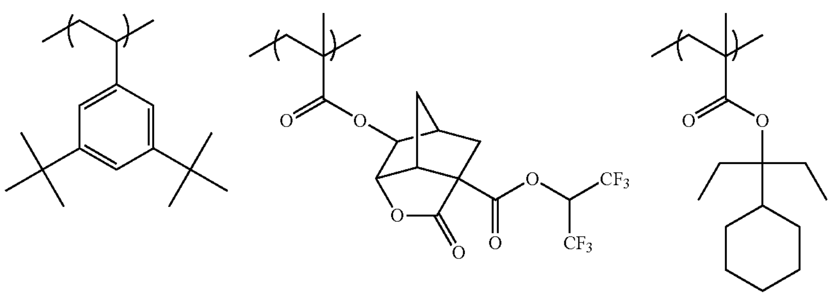
(HR-35)
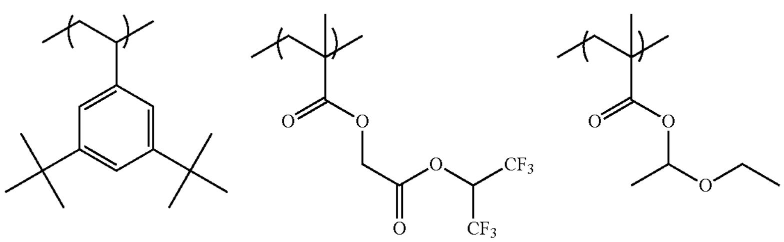
(HR-36)
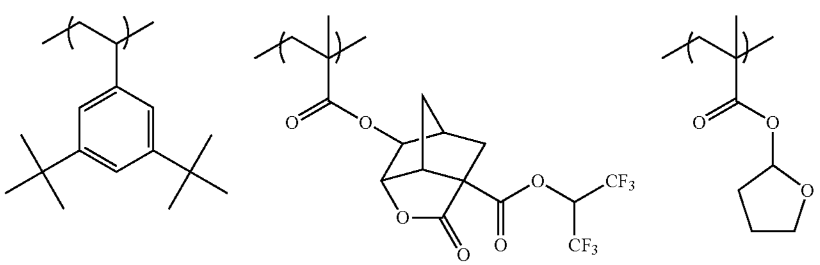

-continued
(HR-37)
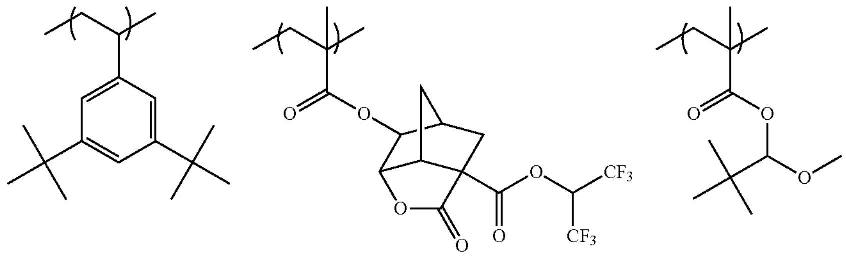
(HR-38)
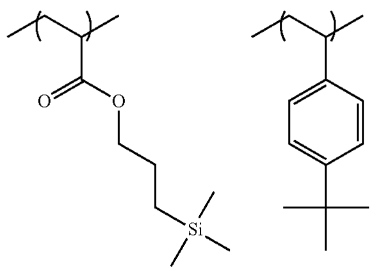
(HR-39)
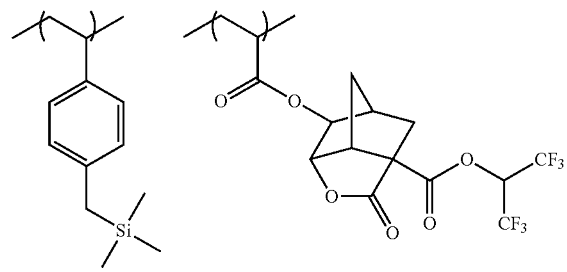
(HR-40)
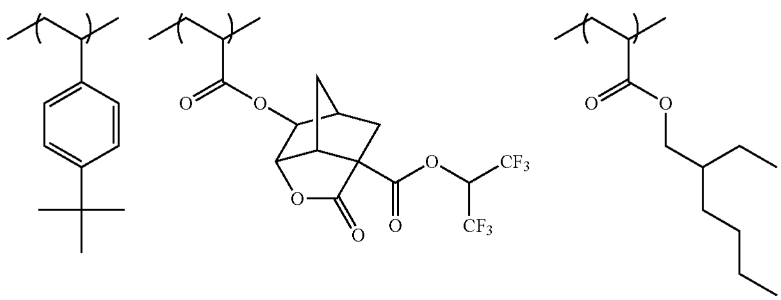
(HR-41)
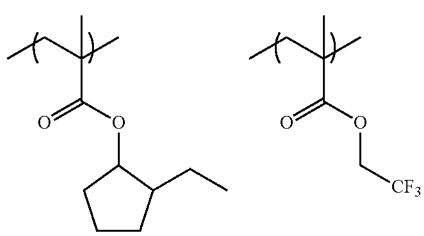
(HR-42)
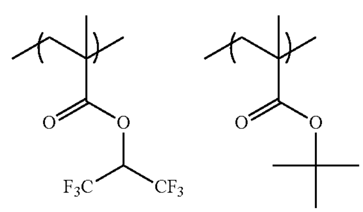
(HR-43)
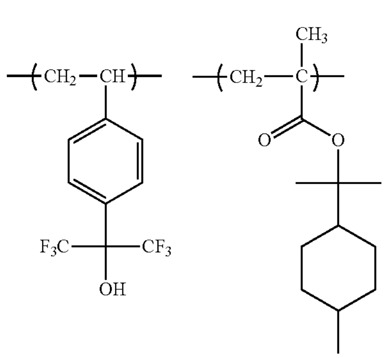
(HR-44)
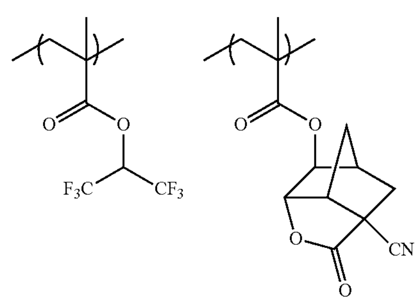

-continued
(HR-45)
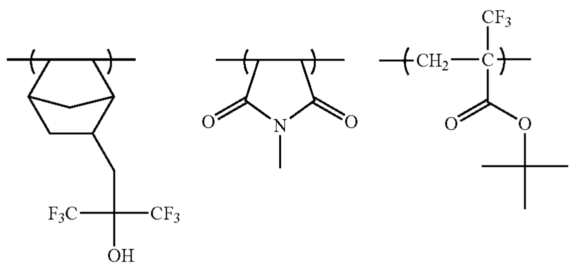
(HR-46)
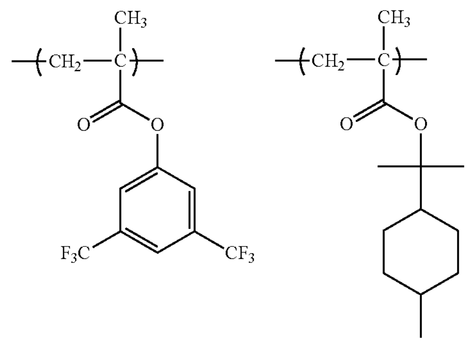
(HR-47)
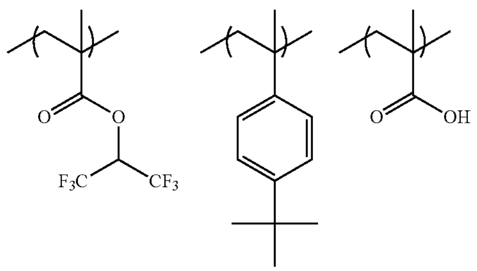
(HR-48)
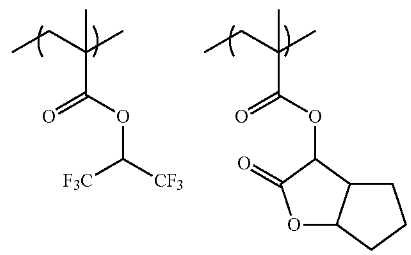
(HR-49)
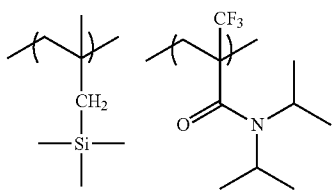
(HR-50)
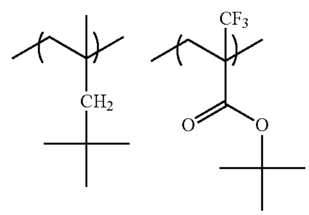
(HR-51)
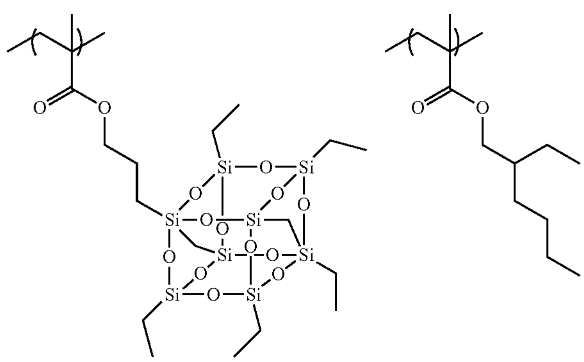
(HR-52)
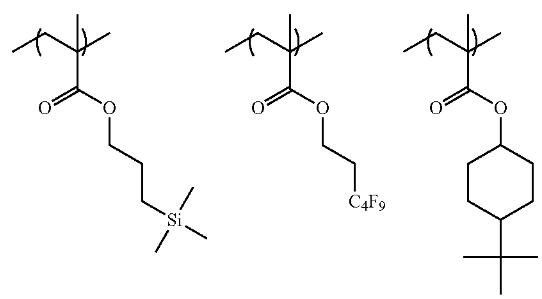
(HR-53)
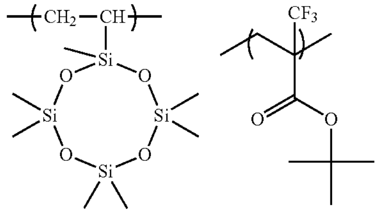
(HR-54)
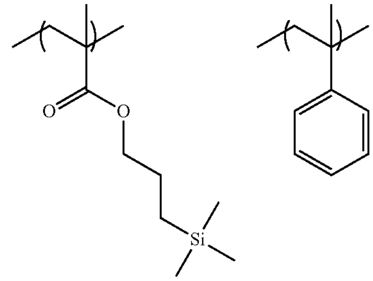

-continued
(HR-55)
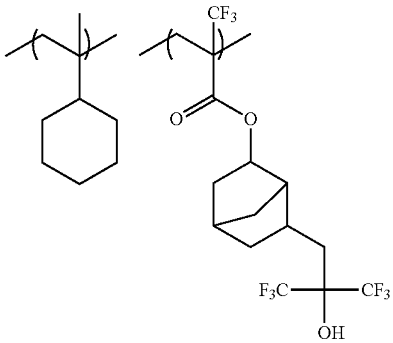
(HR-56)
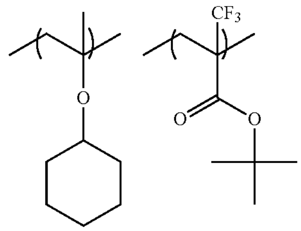
(HR-57)
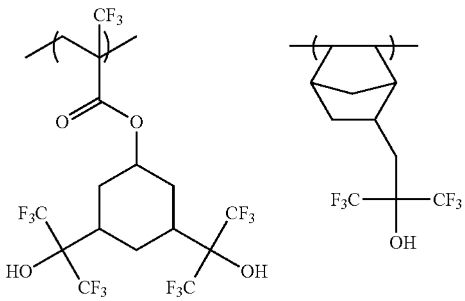
(HR-58)
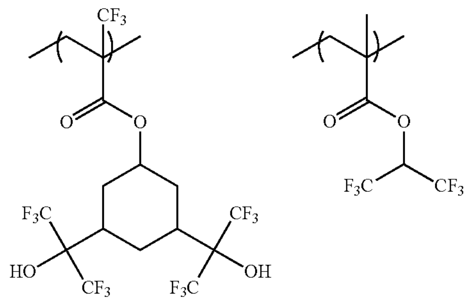
(HR-59)
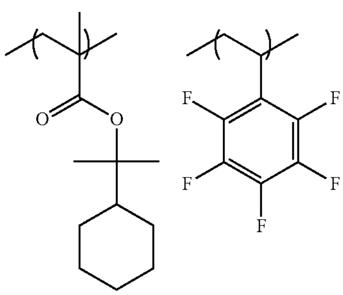
A-1
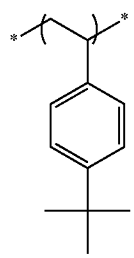
A-2
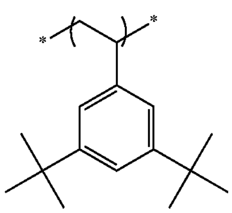
3
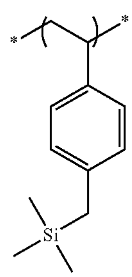
A-4
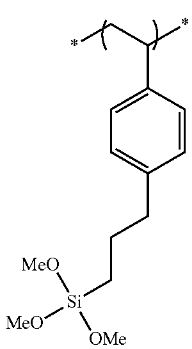
A-5
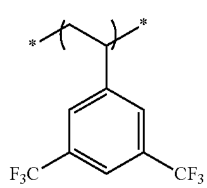

-continued
A-6
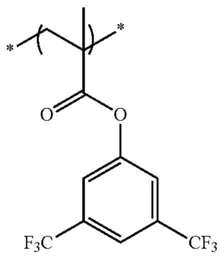
A-7
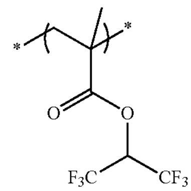
A-8
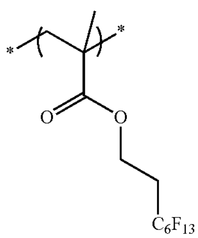
A-9
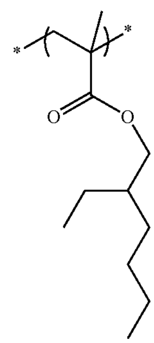
A-10
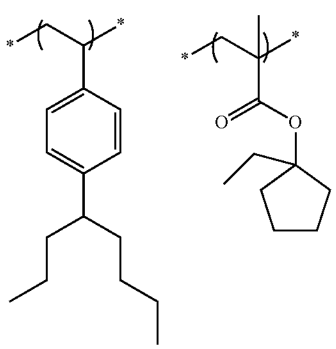
A-11
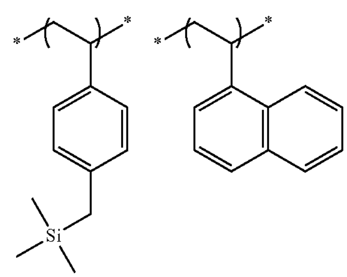
A-12
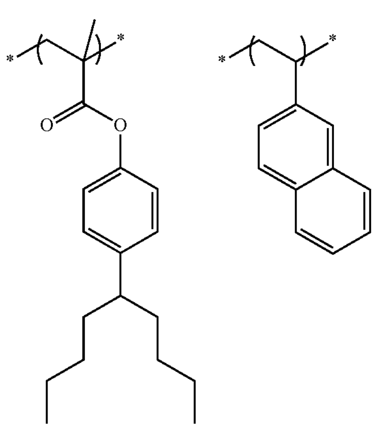
A-13
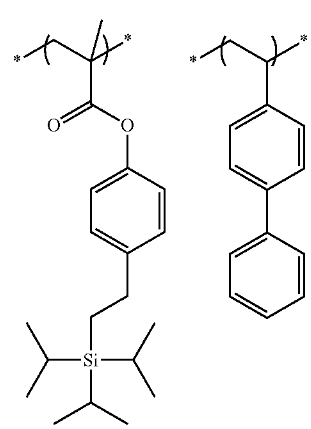

-continued
A-14
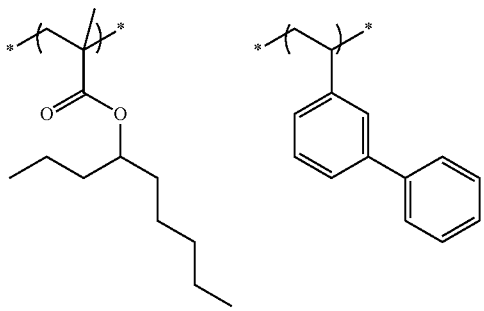
A-15
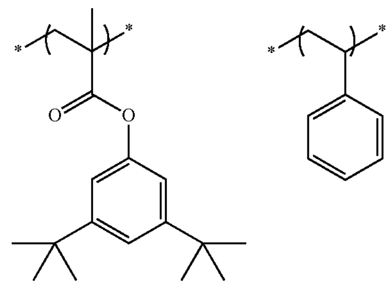
A-16
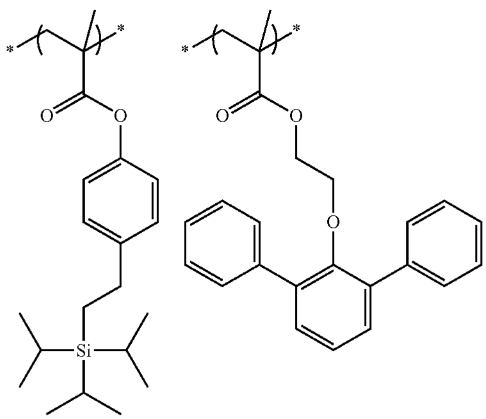
A-17
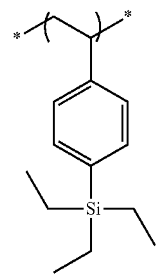
A-18
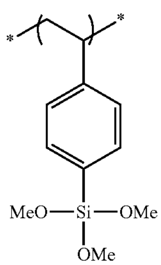
A-19
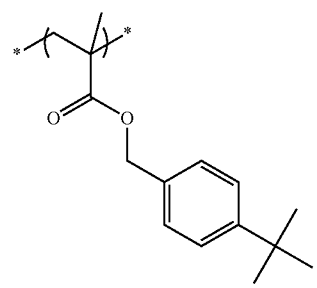
A-20
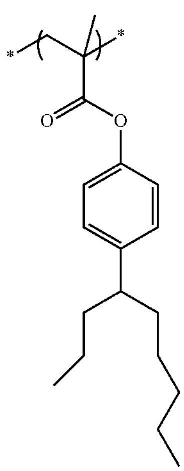
A-21
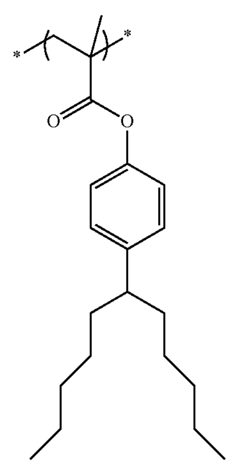

TABLE 1

| Resin | Composition | Mw | Mw/Mn |
|---|---|---|---|
| HR-1 | 90/10 | 8000 | 1.5 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 20000 | 1.6 |
| HR-25 | 30/70 | 5000 | 1.4 |
| HR-26 | 80/20 | 15000 | 1.62 |
| HR-27 | 50/50 | 3500 | 1.3 |
| HR-28 | 50/50 | 6200 | 1.4 |
| HR-29 | 50/50 | 6500 | 1.6 |
| HR-30 | 15/85 | 10000 | 1.52 |
| HR-31 | 10/90 | 8000 | 1.50 |
| HR-32 | 20/70/10 | 9000 | 1.54 |
| HR-33 | 10/75/15 | 18000 | 1.65 |
| HR-34 | 10/80/10 | 11000 | 1.43 |
| HR-35 | 5/80/15 | 6000 | 1.39 |
| HR-36 | 15/75/10 | 13000 | 1.44 |
| HR-37 | 10/80/10 | 10000 | 1.42 |
| HR-38 | 50/50 | 8000 | 1.56 |
| HR-39 | 20/80 | 7000 | 1.52 |
| HR-40 | 15/80/5 | 12000 | 1.47 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 50/50 | 6500 | 1.5 |
| HR-50 | 50/50 | 4500 | 1.4 |
| HR-51 | 30/70 | 5000 | 1.6 |
| HR-52 | 30/30/40 | 6500 | 1.8 |
| HR-53 | 50/50 | 4000 | 1.3 |
| HR-54 | 50/50 | 6500 | 1.7 |
| HR-55 | 50/50 | 6000 | 1.5 |
| HR-56 | 50/50 | 5000 | 1.6 |
| HR-57 | 50/50 | 4000 | 1.4 |
| HR-58 | 20/80 | 6000 | 1.4 |
| HR-59 | 50/50 | 7000 | 1.4 |

TABLE 2

| Resin | Composition ratio | Mass average molecular weight (Mw) | Dispersity (Mw/Mn) |
|---|---|---|---|
| A-1 | 100 | 11000 | 1.40 |
| A-2 | 100 | 12000 | 1.45 |
| A-3 | 100 | 11500 | 1.43 |
| A-4 | 100 | 11800 | 1.42 |
| A-5 | 100 | 11700 | 1.46 |
| A-6 | 100 | 11600 | 1.51 |
| A-7 | 100 | 11800 | 1.48 |
| A-8 | 100 | 11000 | 1.52 |
| A-9 | 100 | 11200 | 1.41 |

TABLE 2-continued

| Resin | Composition ratio | Mass average molecular weight (Mw) | Dispersity (Mw/Mn) |
|---|---|---|---|
| A-10① | 97/3 | 11500 | 1.50 |
| A-10② | 95.5/4.5 | 11600 | 1.48 |
| A-10③ | 94.5/5.5 | 11400 | 1.51 |
| A-10④ | 93/7 | 11500 | 1.48 |
| A-11 | 70/30 | 11000 | 1.48 |
| A-12 | 70/30 | 11300 | 1.43 |
| A-13 | 80/20 | 11300 | 1.45 |
| A-14 | 80/20 | 11500 | 1.44 |
| A-15 | 80/20 | 11400 | 1.50 |
| A-16 | 80/20 | 11600 | 1.51 |
| A-17 | 100 | 11800 | 1.52 |
| A-18 | 100 | 11000 | 1.48 |
| A-19 | 100 | 11200 | 1.51 |
| A-20 | 100 | 11500 | 1.43 |
| A-21 | 100 | 11600 | 1.42 |

[3] Compound (B) which Generates an Acid when Irradiated with Actinic Rays or Radiation The composition of the present invention preferably contains a compound which generates an acid when irradiated with actinic rays or radiation (also referred to below as an "acid generating agent").

The acid generating agent is not particularly limited as long as the agent is known in the art, but is preferably a compound which generates an organic acid, for example, at least any of sulfonic acid, bis(alkyl sulfonyl)imide, or tris (alkyl sulfonyl) methide when irradiated with actinic rays or radiation.

More preferable examples thereof include the compounds which are represented by General Formulas (ZI), (ZII), and (ZIII) below.

(ZI)

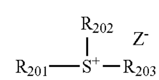

(ZII)

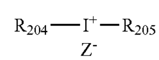

(ZIII)

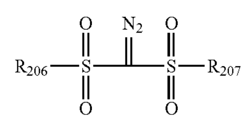

In General Formula (ZI) above, $R_{201}$, $R_{202}$, and $R_{203}$ each independently represent an organic group.

The number of carbon atoms of the organic group as $R_{201}$, $R_{202}$, and $R_{203}$ is generally 1 to 30 and preferably 1 to 20.

In addition, two out of $R_{201}$ to $R_{203}$ may form a ring structure by bonding with each other and may include an oxygen atom, a sulfur atom, an ester bond, an amide bond, and a carbonyl group in a ring. Examples of a group which two out of $R_{201}$ to $R_{203}$ form by bonding with each other include an alkylene group (for example, a butylene group and a pentylene group).

Z— represents a non-nucleophilic anion (an anion of which the ability to cause a nucleophilic reaction is remarkably low).

Examples of an non-nucleophilic anion include a sulfonic acid anion (an aliphatic sulfonic acid anion, an aromatic sulfonic acid anion, a camphor sulfonic acid anion, and the like), a carboxylic acid anion (an aliphatic carboxylic acid anion, an aromatic carboxylic acid anion, an aralkyl carboxylic acid anion, and the like), a sulfonyl imide anion, a bis(alkyl sulfonyl)imide anion, a tris(alkyl sulfonyl) methide anion, and the like.

An aliphatic site in an aliphatic sulfonic acid anion and an aliphatic carboxylic acid anion may be an alkyl group or a cycloalkyl group and preferable examples thereof include a straight-chain or branched alkyl group with 1 to 30 carbon atoms and a cycloalkyl group with 3 to 30 carbon atoms.

An aromatic group in an aromatic sulfonic acid anion and an aromatic carboxylic acid anion is preferably an aryl group with 6 to 14 carbon atoms and examples thereof include a phenyl group, a tolyl group, a naphthyl group, and the like.

The alkyl group, the cycloalkyl group, and the aryl group described above may have a substituent group. Specific examples thereof include a nitro group, a halogen atom such as a fluorine atom, a carboxyl group, a hydroxyl group, an amino group, a cyano group, an alkoxy group (preferably with 1 to 15 carbon atoms), a cycloalkyl group (preferably with 3 to 15 carbon atoms), an aryl group (preferably with 6 to 14 carbon atoms), an alkoxycarbonyl group (preferably with 2 to 7 carbon atoms), an acyl group (preferably with 2 to 12 carbon atoms), an alkoxycarbonyloxy group (preferably with 2 to 7 carbon atoms), an alkylthio group (preferably with 1 to 15 carbon atoms), an alkyl sulfonyl group (preferably with 1 to 15 carbon atoms), an alkylimino sulfonyl group (preferably with 1 to 15 carbon atoms), an aryloxy sulfonyl group (preferably with 6 to 20 carbon atoms), an alkylaryloxy sulfonyl group (preferably with 7 to 20 carbon atoms), a cycloalkylaryloxy sulfonyl group (preferably with 10 to 20 carbon atoms), an alkyloxyalkyloxy group (preferably with 5 to 20 carbon atoms), a cycloalkylalkyloxyalkyloxy group (preferably with 8 to 20 carbon atoms), and the like. Examples of the aryl group and the ring structure of each group further include an alkyl group (preferably with 1 to 15 carbon atoms) as a substituent group.

An aralkyl group in an aralkyl carboxylic acid anion is preferably an aralkyl group with 7 to 12 carbon atoms and examples thereof include a benzyl group, a phenethyl group, a naphthylmethyl group, a naphthylethyl group, a naphthylbutyl group, and the like.

Examples of sulfonyl imide anions include a saccharin anion.

An alkyl group in a bis(alkyl sulfonyl)imide anion and a tris(alkyl sulfonyl) methide anion is preferably an alkyl group with 1 to 5 carbon atoms. Examples of a substituent group of the alkyl groups include a halogen atom, an alkyl group which is substituted with a halogen atom, an alkoxy group, an alkylthio group, an alkyloxy sulfonyl group, an aryloxy sulfonyl group, a cycloalkylaryloxy sulfonyl group, and the like, and a fluorine atom or an alkyl group which is substituted with a fluorine atom is preferable.

In addition, an alkyl group in a bis(alkyl sulfonyl)imide anion may form a ring structure by bonding with each other. Due to this, the acid strength is increased.

Examples of other non-nucleophilic anions include fluorinated phosphorus (for example, $PF_6$—), fluorinated boron (for example, $BF_4$—), fluorinated antimony (for example, $SbF_6$—), and the like.

A non-nucleophilic anion is preferably an aliphatic sulfonic acid anion where at least α-position of sulfonic acid is substituted with a fluorine atom, an aromatic sulfonic acid anion which is substituted with a fluorine atom or a group which has a fluorine atom, a bis(alkyl sulfonyl)imide anion where an alkyl group is substituted with a fluorine atom, and a tris(alkyl sulfonyl) methide anion where an alkyl group is substituted with a fluorine atom. A non-nucleophilic anion is more preferably a perfluoro aliphatic sulfonic acid anion (more preferably with 4 to 8 carbon atoms) and a benzene sulfonic acid anion which has a fluorine atom and even more preferably a nonafluorobutane sulfonic acid anion, a perfluorooctane sulfonic acid anion, a pentafluorobenzne sulfonic acid anion, and a 3,5-bis(trifluoromethyl)benzene sulfonic acid anion.

From the viewpoint of the acid strength, the pKa of the generated acid is preferably −1 or less in order to improve the sensitivity.

In addition, as a preferable aspect, examples of a non-nucleophilic anion also include an anion which is represented by General Formula (AN1) below.

(AN1)

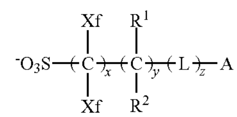

In the formula, Xf each independently represents a fluorine atom or an alkyl group which is substituted with at least one fluorine atom.

$R^1$ and $R^2$ each independently represent a hydrogen atom, a fluorine atom, or an alkyl group and, in a case where there are a plurality thereof, $R^1$ and $R^2$ may each be the same or different.

L represents a divalent linking group and, in a case where there are a plurality thereof, L may be the same or different.

A represents a cyclic organic group.

x represents an integer of 1 to 20, y represents an integer of 0 to 10, and z represents an integer of 0 to 10.

Description will be given of General Formula (AN1) in more detail.

An alkyl group in an alkyl group which is substituted with a fluorine atom of Xf is preferably with 1 to 10 carbon atoms and more preferably with 1 to 4 carbon atoms. In addition, an alkyl group which is substituted with a fluorine atom of Xf is preferably a perfluoroalkyl group.

Xf is preferably a fluorine atom or a perfluoroalkyl group with 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$ and a fluorine atom and $CF_3$ are preferable among these. In particular, both Xfs are preferably a fluorine atom.

An alkyl group of $R^1$ and $R^2$ may have a substituent group (preferably a fluorine atom) and is preferably an alkyl group with 1 to 4 carbon atoms. A perfluoroalkyl group with 1 to 4 carbon atoms is more preferable. Specific examples of the alkyl group of $R^1$ and $R^2$ which has a substituent group include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$ and $CF_3$ is preferable among these.

$R^1$ and $R^2$ are preferably a fluorine atom or $CF_3$.

x is preferably 1 to 10 and more preferably 1 to 5.

y is preferably 0 to 4 and more preferably 0.

z is preferably 0 to 5 and more preferably 0 to 3.

The divalent linking group of L is not particularly limited and examples thereof include —COO—, —OCO—, —CO—, —O—, —S—, —SO—, —$SO_2$—, an alkylene group, a cycloalkylene group, an alkenylene group, a linking group in which a plurality thereof are linked, and the like, and a linking group with 12 or less total carbon atoms is preferable. Among these, —COO—, —OCO—, —CO—, and —O— are preferable, and —COO— and —OCO— are more preferable.

A cyclic organic group of A is not particularly limited as long as the group has a ring structure and examples thereof include an alicyclic group, an aryl group, a hetero ring group (including not only groups having aromaticity but also groups which do not have aromaticity), and the like.

The alicyclic group may be monocyclic or polycyclic and a monocyclic cycloalkyl group such as a cyclopentyl group, a cyclohexyl group, and a cyclooctyl group or a polycyclic cycloalkyl group such as a norbornyl group, a tricyclodecanyl group, a tetracyclodecanyl group, a tetracyclododecanyl group, and an adamantyl group are preferable. Among these, from the viewpoint that it is possible to suppress the in-film diffusibility in the heating step after the exposing and that MEEF is improved, an alicyclic group with 7 or more carbon atoms which has a bulky structure such as a norbornyl group, a tricyclodecanyl group, a tetracyclodecanyl group, a tetracyclododecanyl group, and an adamantyl group are preferable.

Examples of an aryl group include a benzene ring, a naphthalene ring, a phenanthrene ring, and an anthracene ring.

Examples of a hetero ring group include a hetero ring group which is derived from a furan ring, a thiophene ring, a benzofuran ring, a benzothiophene ring, a dibenzofuran ring, a dibenzothiophene ring and a pyridine ring. Among these, a hetero ring group which is derived from a furan ring, a thiophene ring, and a pyridine ring is preferable.

In addition, examples of a cyclic organic group also include a lactone structure and specific examples thereof include the lactone structure which is represented by General Formulas (LC1-1) to (LC1-17) which the resin (A) described above may have.

The cyclic organic groups described above may have a substituent group and examples of the substituent group include an alkyl group (which may be any of straight-chain, branched, and cyclic, preferably with 1 to 12 carbon atoms), a cycloalkyl group (which may be any of monocyclic, polycyclic, and spiro ring, preferably with 3 to 20 carbon atoms), an aryl group (preferably with 6 to 14 carbon atoms), a hydroxy group, an alkoxy group, an ester group, an amide group, a urethane group, a ureide group, a thioether group, a sulfonamide group, a sulfonic acid ester group, and the like. Here, the carbon which forms a cyclic organic group (the carbon which contributes to the ring forming) may be a carbonyl carbon.

Examples of an organic group of $R_{201}$, $R_{202}$, and $R_{203}$ include an aryl group, an alkyl group, a cycloalkyl group, and the like.

At least one out of $R_{201}$, $R_{202}$, and $R_{203}$ is preferably an aryl group and all three are preferably an aryl group. As an aryl group, other than a phenyl group, a naphthyl group, and the like, a hetero aryl group such as an indole residue and a pyrrole residue is also possible. Examples of the alkyl group and the cycloalkyl group of $R_{201}$ to $R_{203}$ preferably include a straight-chain or branched alkyl group with 1 to 10 carbon atoms and a cycloalkyl group with 3 to 10 carbon atoms. Examples of an alkyl group more preferably include a methyl group, an ethyl group, an n-propyl group, an i-propyl group, an n-butyl group, and the like. Examples of a cycloalkyl group more preferably include a cyclopropyl group, a cyclobutyl group, a cyclopentyl group, a cyclohexyl group, a cycloheptyl group, and the like. The groups may further have a substituent group. Examples of the substituent group include a nitro group, a halogen atom such as a fluorine atom, a carboxyl group, a hydroxyl group, an amino group, a cyano group, an alkoxy group (preferably with 1 to 15 carbon atoms), a cycloalkyl group (preferably with 3 to 15 carbon atoms), an aryl group (preferably with 6 to 14 carbon atoms), an alkoxycarbonyl group (preferably with 2 to 7 carbon atoms), an acyl group (preferably with 2 to 12 carbon atoms), an alkoxycarbonyloxy group (preferably with 2 to 7 carbon atoms), and the like; however, the present invention is not limited thereto.

In addition, in a case where two out of $R_{201}$ to $R_{203}$ form a ring structure by bonding, a structure which is represented by General Formula (A1) below is preferable.

(A1)

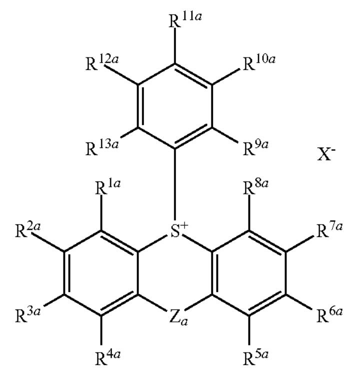

$R^{1a}$ to $R^{13a}$ in General Formula (A1) each independently represent a hydrogen atom or a substituent group.

1 to 3 out of $R^{1a}$ to $R^{13a}$ are preferably not a hydrogen atom and any one of $R^{9a}$ to $R^{13a}$ is more preferably not a hydrogen atom.

Za is a single bond or a divalent linking group.

X— is the same as Z— in General Formula (ZI).

Specific examples of a case where $R^{1a}$ to $R^{13a}$ are not a hydrogen atom include a halogen atom, a straight-chain, branched, and cyclic alkyl group, an alkenyl group, an alkynyl group, an aryl group, a hetero ring group, a cyano group, a nitro group, a carboxyl group, an alkoxy group, an aryloxy group, a silyloxy group, a hetero ring oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl and arylsulfonylamino group, a mercapto group, an alkylthio group, an arylthio group, a hetero ring thio group, a sulfamoyl group, a sulfo group, an alkyl and aryl sulfinyl group, an alkyl and aryl sulfonyl group, an acyl group, an aryloxycarbonyl group, an alkoxycarbonyl group, a carbamoyl group, an aryl and hetero ring azo group, an imide group, a phosphino group, a phosphinyl group, a phosphinyloxy group, a phosphinylamino group, a phosphono group, a silyl group, a hydrazino group, an ureide group, a boronic acidic group ($—B(OH)_2$), a phosphato group ($—OPO(OH)_2$), a sulfato group ($—OSO_3H$), and other substituent groups known in the art.

In a case where $R^{1a}$ to $R^{13a}$ are not a hydrogen atom, a straight-chain, branched, and cyclic alkyl group which is substituted with a hydroxyl group is preferable.

Examples of a divalent linking group of Za include an alkylene group, an arylene group, a carbonyl group, a sulfonyl group, a carbonyloxy group, a carbonylamino group, a sulfonylamide group, an ether bond, a thioether bond, an amino group, a disulfide group, $—(CH_2)_n—CO—$, $—(CH_2)_n—SO_2—$, $—CH=—$, an aminocarbonylamino group, an aminosulfonylamino group, and the like (n is an integer of 1 to 3).

Here, examples of a preferable structure in a case where at least one out of $R_{201}$, $R_{202}$, and $R_{203}$ is not an aryl group include a cation structure of the compounds exemplified as Formulas (I-1) to (I-70) in paragraphs [0046] to [0048] of JP2004-233661A, paragraphs [0040] to [0046] of JP2003-35948A, and in US2003/0224288A1, the compounds exemplified as Formulas (IA-1) to (IA-54) and Formulas (IB-1) to (IB-24) of US2003/0077540A1, and the like.

In General Formulas (ZII) and (ZIII), $R_{204}$ to $R_{207}$ each independently represent an aryl group, an alkyl group, or a cycloalkyl group.

An aryl group, an alkyl group, and a cycloalkyl group of $R_{204}$ to $R_{207}$ are the same as the aryl group described as the aryl group, the alkyl group, and the cycloalkyl group of $R_{201}$ to $R_{203}$ in the compound (ZI).

The aryl group, the alkyl group, and the cycloalkyl group of $R_{204}$ to $R_{207}$ may have a substituent group. Examples of the substituent group also include a substituent group which the aryl group, the alkyl group, and the cycloalkyl group of $R_{201}$ to $R_{203}$ in the compound (ZI) described above may have.

Z— represents a non-nucleophilic anion and examples thereof include the same examples as the non-nucleophilic anion of Z— in General Formula (ZI).

Examples of an acid generating agent also further include compounds which are represented by General Formulas (ZIV), (ZV), and (ZVI) below.

$$Ar_3—SO_2—SO_2—Ar_4 \quad \text{(ZIV)}$$

(ZV)

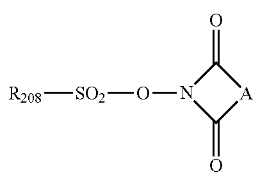

(ZVI)

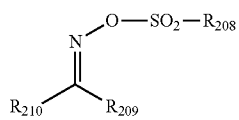

In General Formulas (ZIV) to (ZVI), $Ar_3$ and $Ar_4$ each independently represent an aryl group.

$R_{208}$, $R_{209}$, and $R_{210}$ each independently represent an alkyl group, a cycloalkyl group, or an aryl group.

A represents an alkylene group, an alkenylene group, or an arylene group.

Specific examples of an aryl group of $Ar_3$, $Ar_4$, $R_{208}$, $R_{209}$, and $R_{210}$ include the same examples as the specific examples of an aryl group as $R_{201}$, $R_{202}$, and $R_{203}$ in General Formula (ZI) above.

Specific examples of an alkyl group and a cycloalkyl group of $R_{208}$, $R_{209}$, and $R_{210}$ respectively include the same examples as the specific examples of an alkyl group and a cycloalkyl group as $R_{201}$, $R_{202}$, and $R_{203}$ in General Formula (ZI) above.

Examples of the alkylene group of A include an alkylene group with 1 to 12 carbon atoms (for example, a methylene group, an ethylene group, a propylene group, an isopropylene group, a butylene group, an isobutylene group, and the like), examples of an alkenylene group of A include an alkenylene group with 2 to 12 carbon atoms (for example, an ethenylene group, a propenylene group, a butenylene group, and the like), and examples of an arylene group of A include an arylene group with 6 to 10 carbon atoms (for example, a phenylene group, a tolylene group, a naphthylene group, and the like).

Particularly preferable examples from among the acid generating agents will be given below.

(z1)

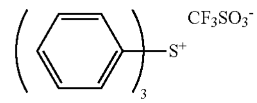

(z2)

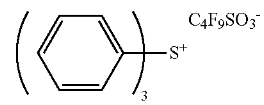

(z3)

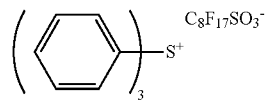

(z4)

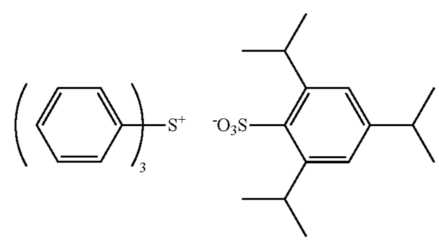

(z5)

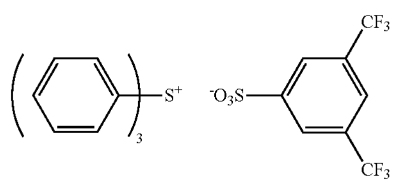

(z6)

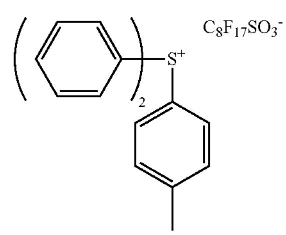

(z7)

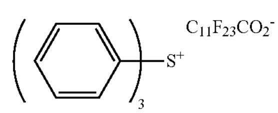

(z8)

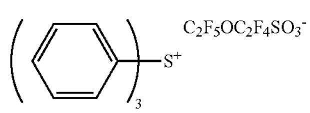

(z9)

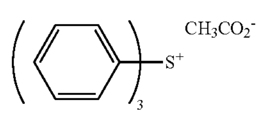

-continued
(z10)
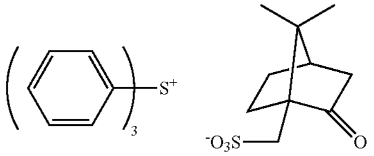
(z11)
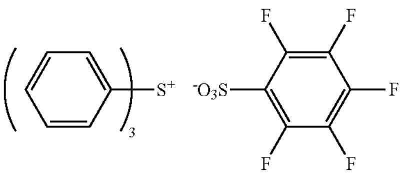
(z12)
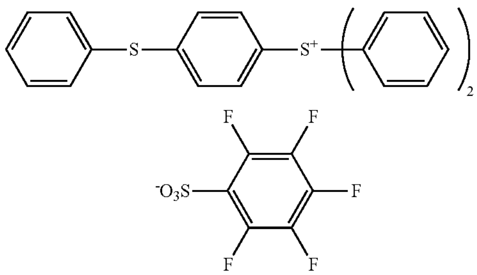
(z13)
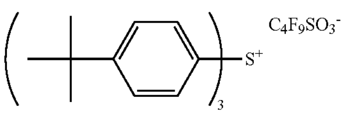
(z14)
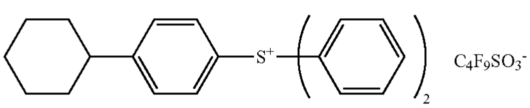
(z15)
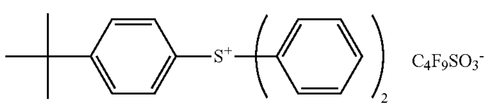
(z16)
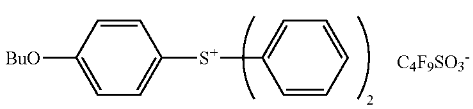
(z17)
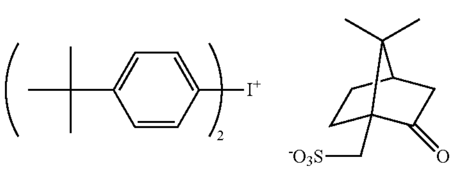
(z18)
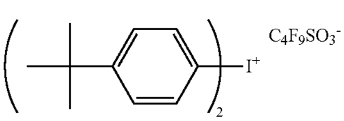
(z19)
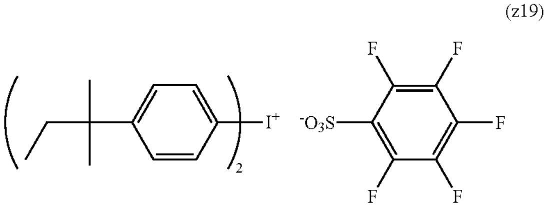
-continued
(z20)
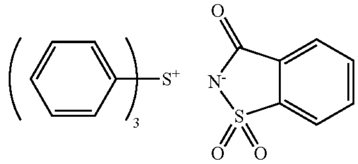
(z21)
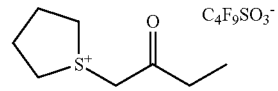
(z22)
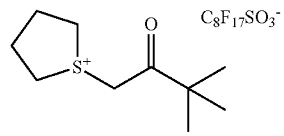
(z23)
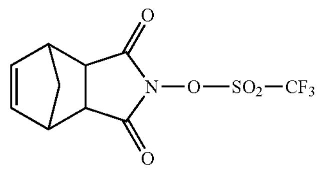
(z24)
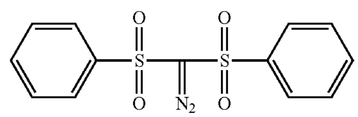
(z25)
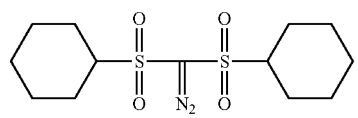
(z26)
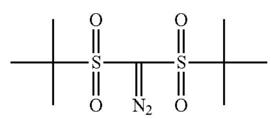
(z27)
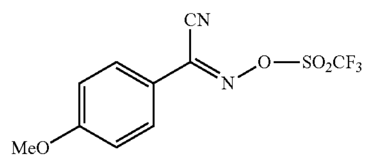
(z28)
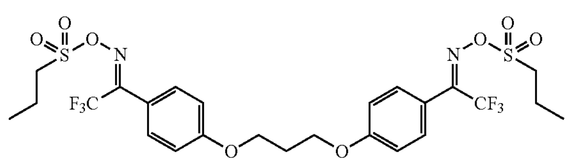
(z29)
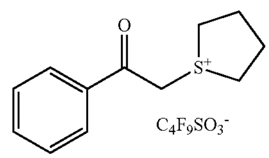
(z30)
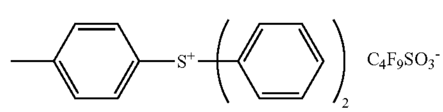

-continued
(z31)
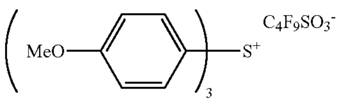
(z32)
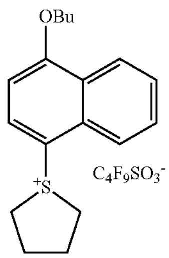
(z33)
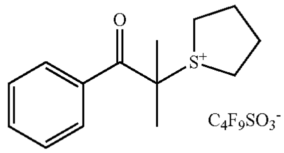
(z34)
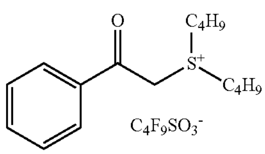
(z35)
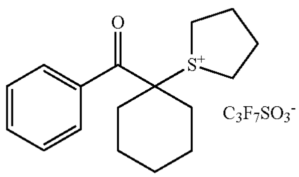
(z36)
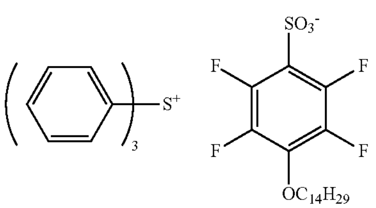
(z37)
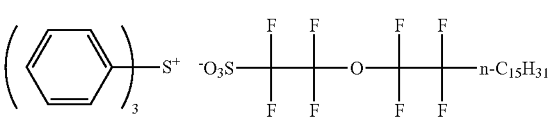
(z38)
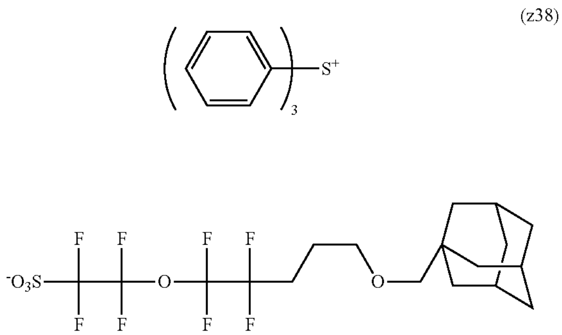
-continued
(z39)
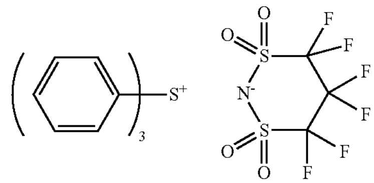
(z40)
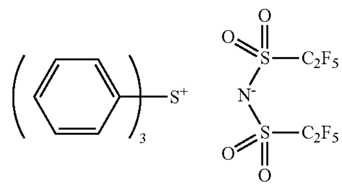
(z41)
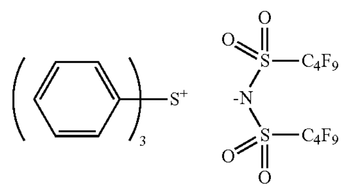
(z42)
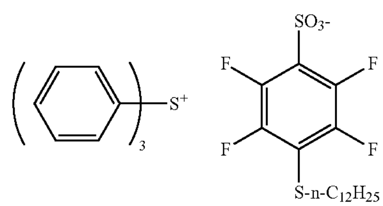
(z43)
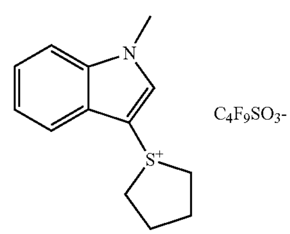
(z44)
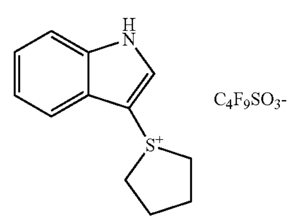
(z45)
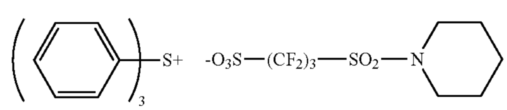
(z46)
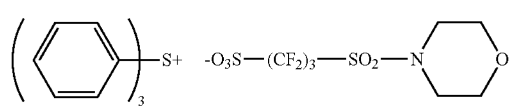
(z47)
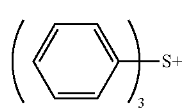

-continued
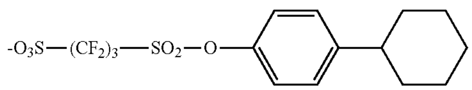
(z48)
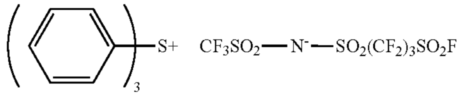
(z49)
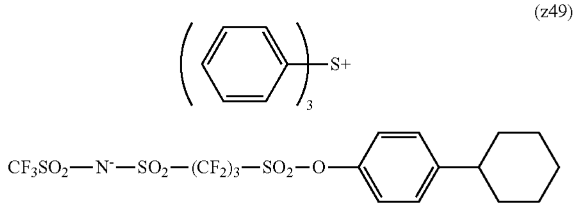
(z50)
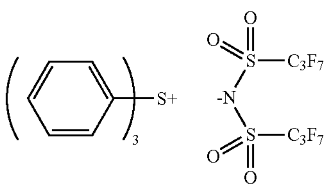
(z51)
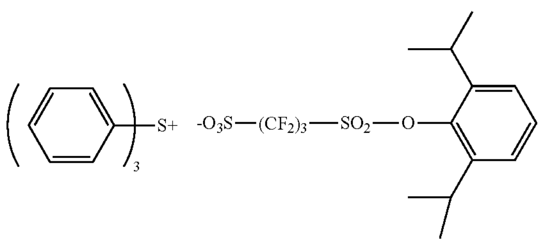
(z52)
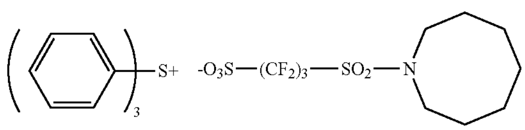
(z53)
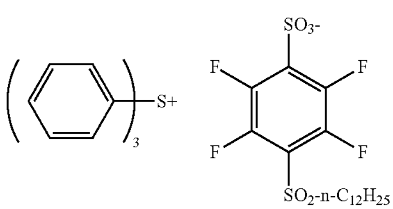
(z54)
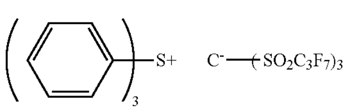
(z55)
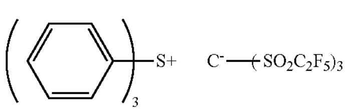
(z56)
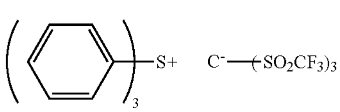
-continued
(z57)
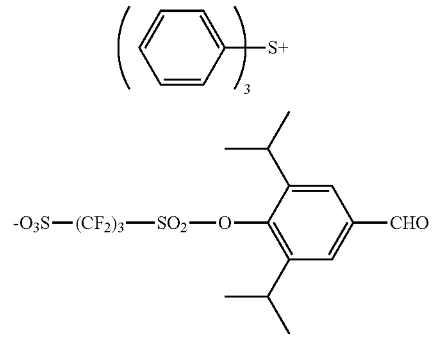
(z58)
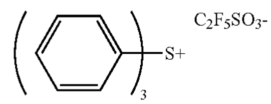
(z59)
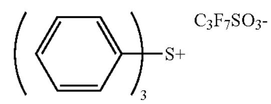
(z60)
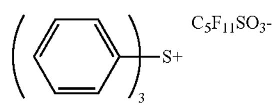
(z61)
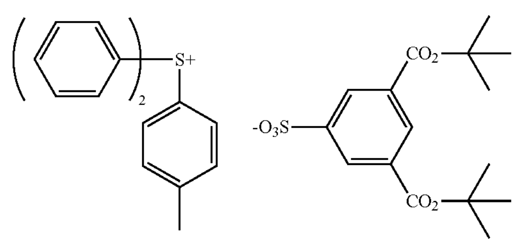
(z62)
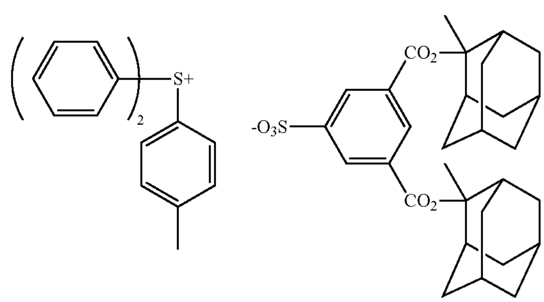
(z63)
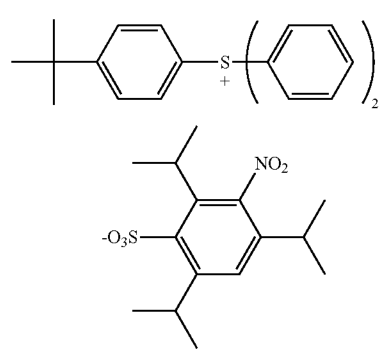

-continued
(z64)
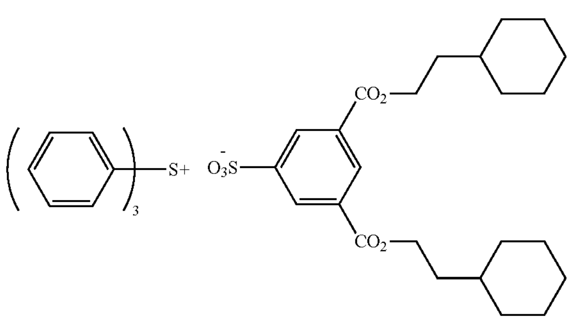
(z65)
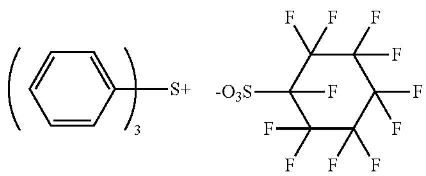
(z66)
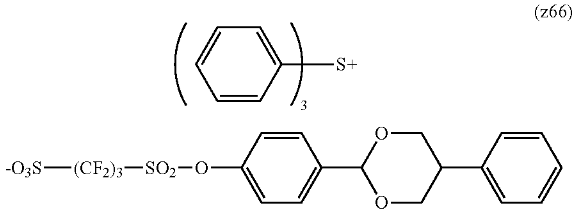
(z67)
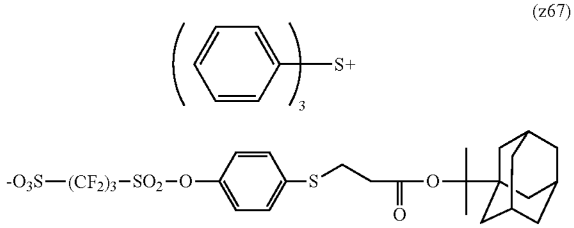
(z68)
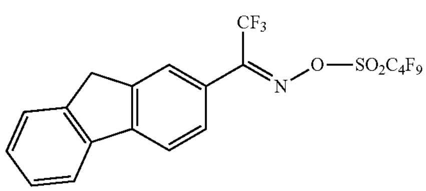
(z69)
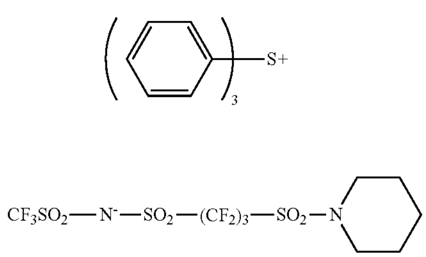
(z70)
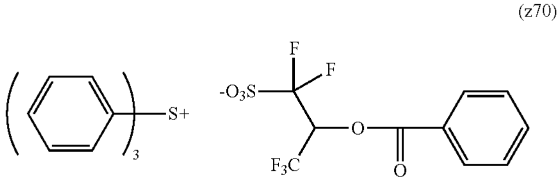
-continued
(z71)
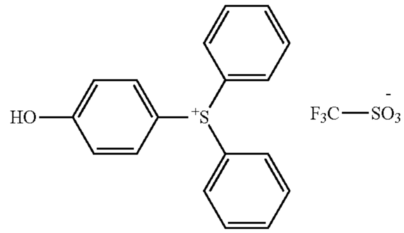
(z72)
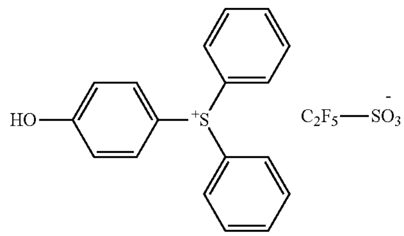
(z73)
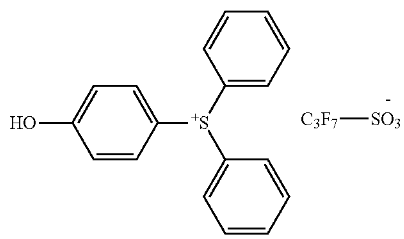
(z74)
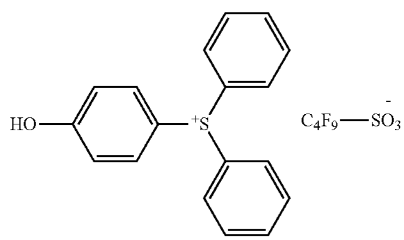
(z75)
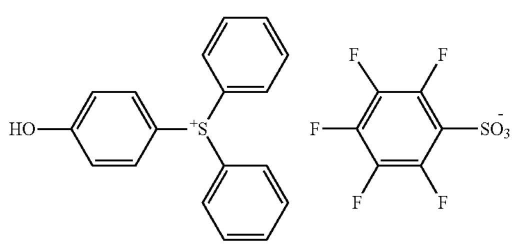
(z76)
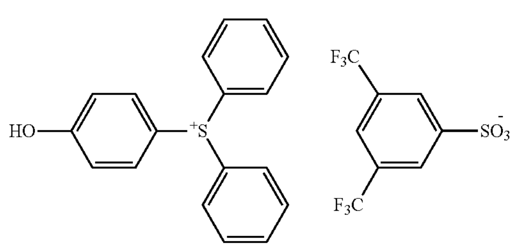

-continued
(z77)
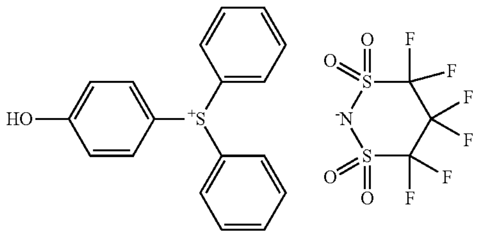
(z78)
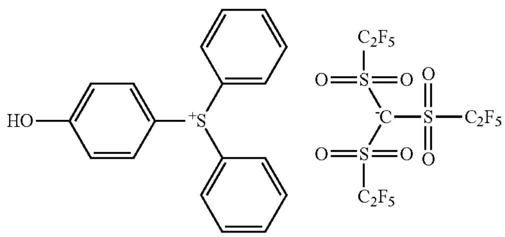
(z79)
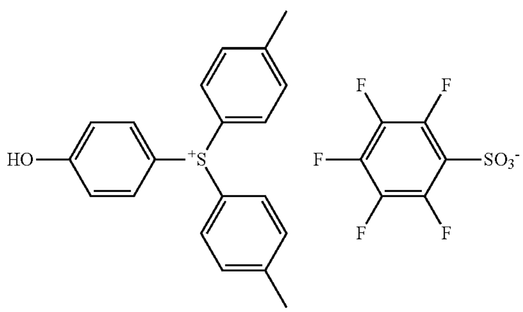
(z80)
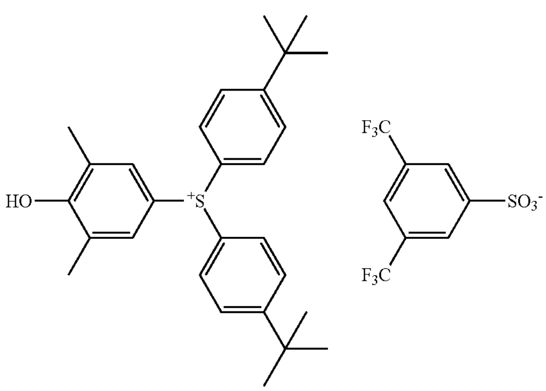
(z81)
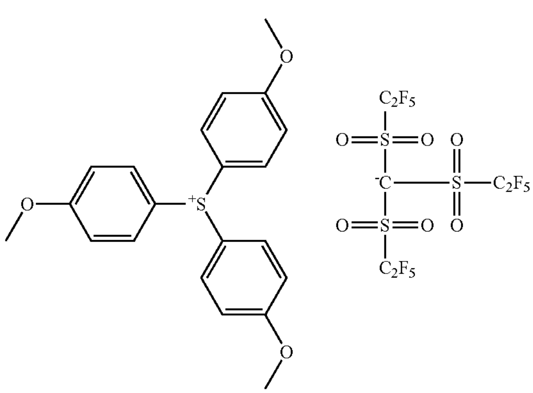
-continued
(z82)
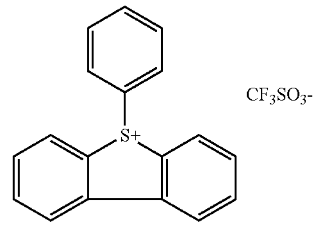
(z83)
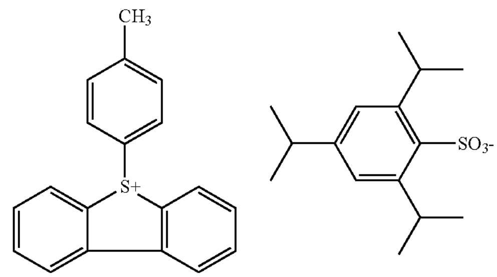
(z84)
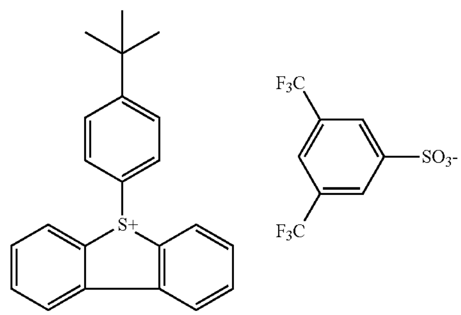
(z85)
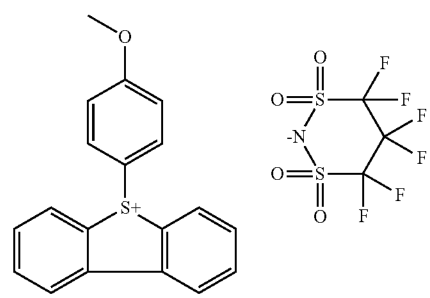
(z86)
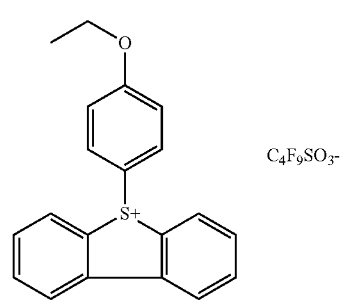

-continued
(z87)
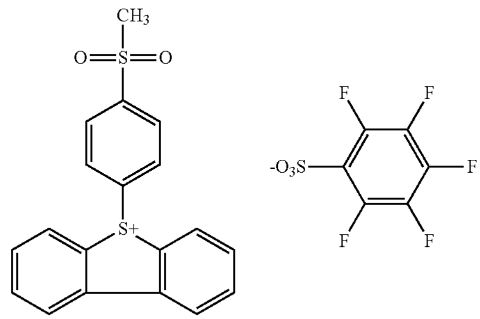
(z88)
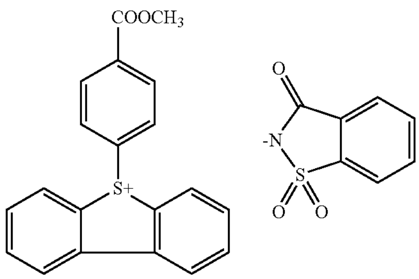
(z89)
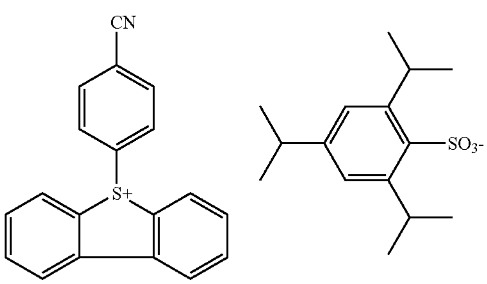
(z90)
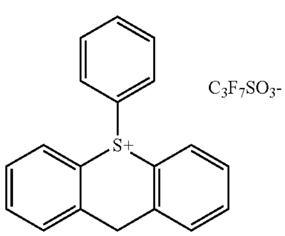
(z91)
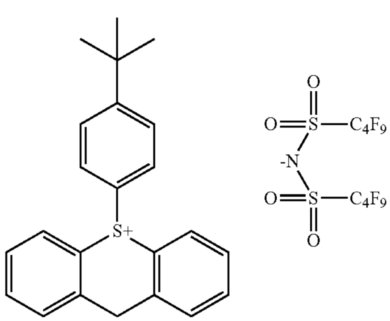
-continued
(z92)
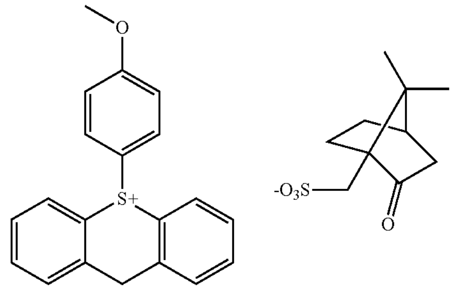
(z93)
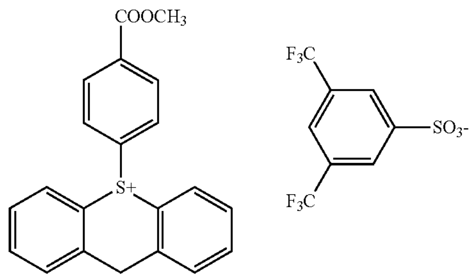
(z94)
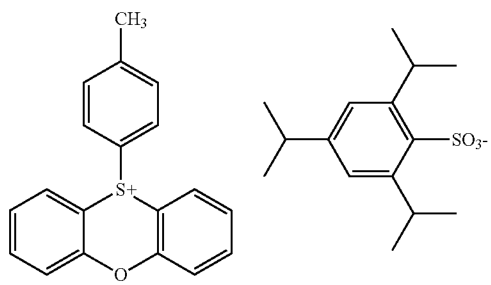
(z95)
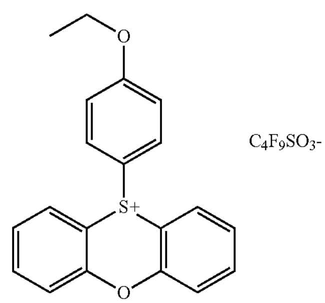
(z96)
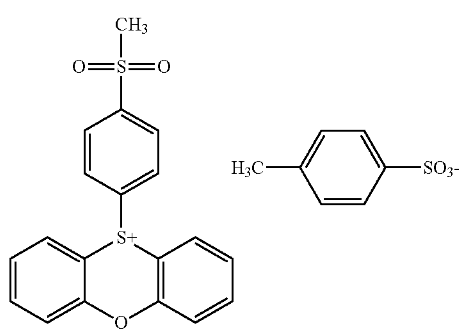

-continued
(z97)
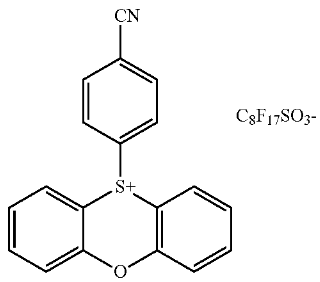
(z98)
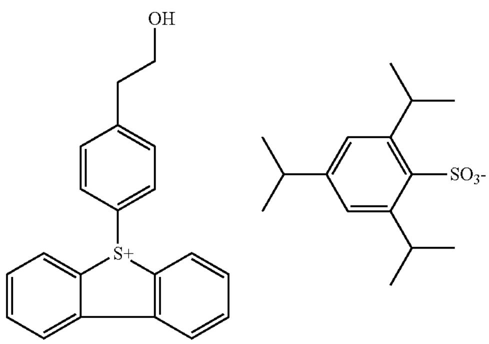
(z99)
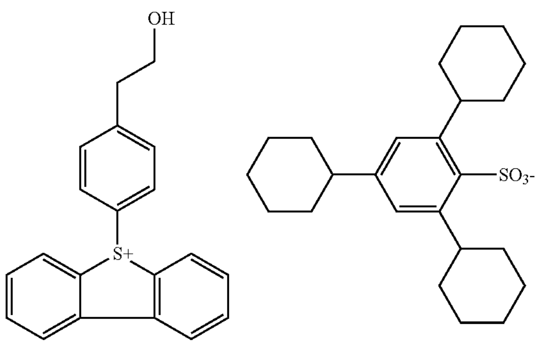
(z100)
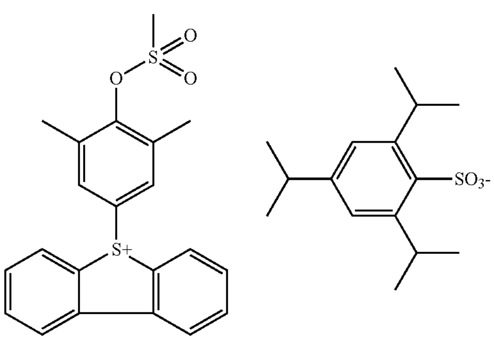
(z101)
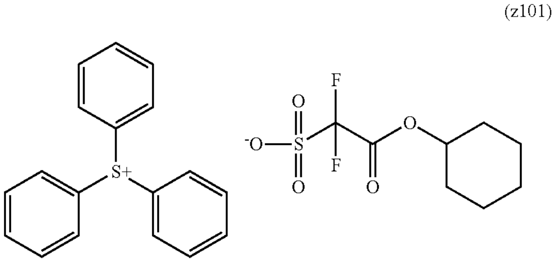
-continued
(z102)
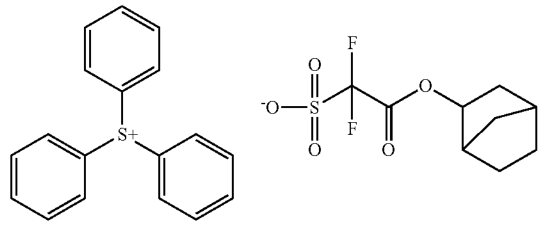
(z103)
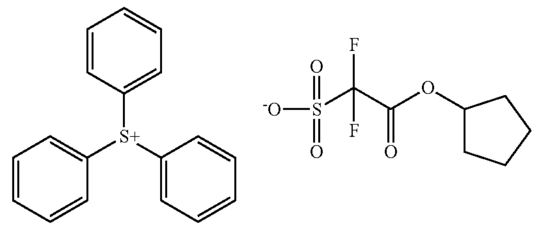
(z104)
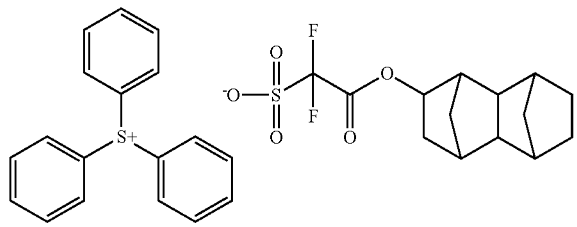
(z105)
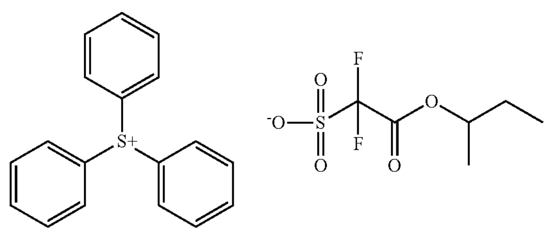
(z106)
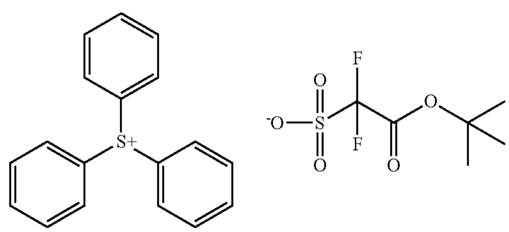
(z107)
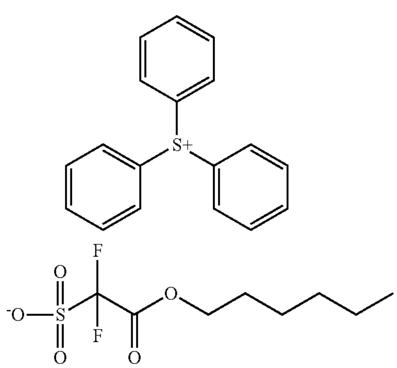

-continued
(z108)
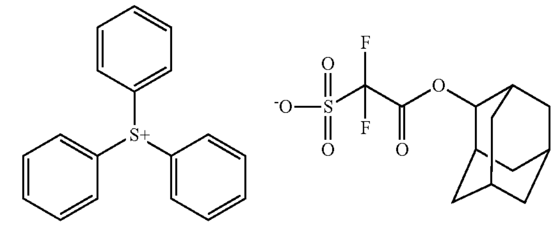
(z109)
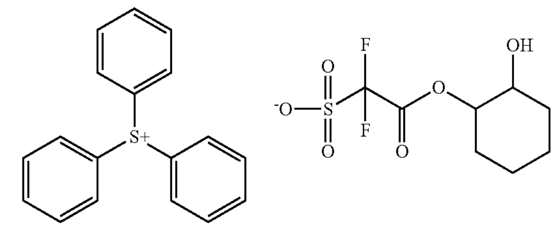
(z110)
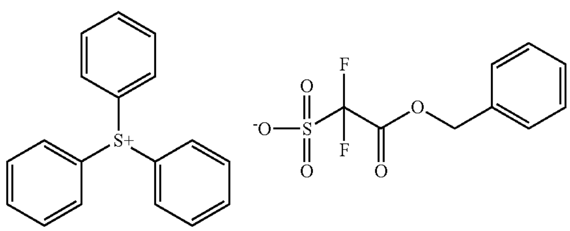
(z111)
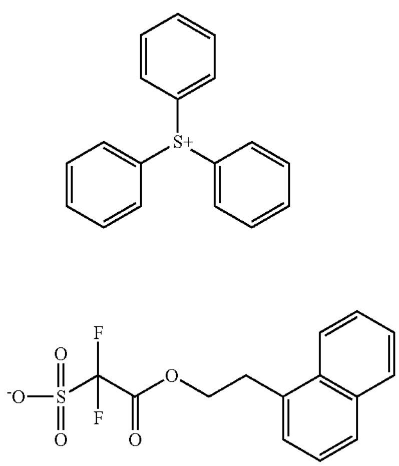
(z112)
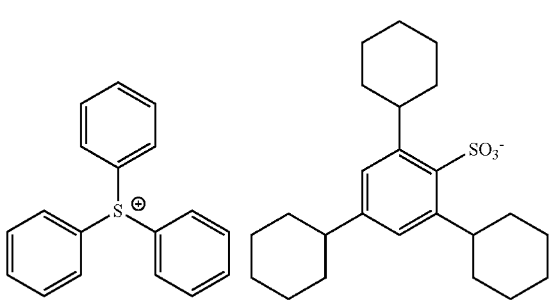
-continued
(z113)
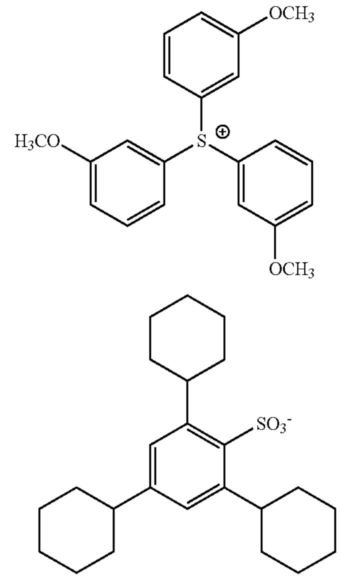
(z114)
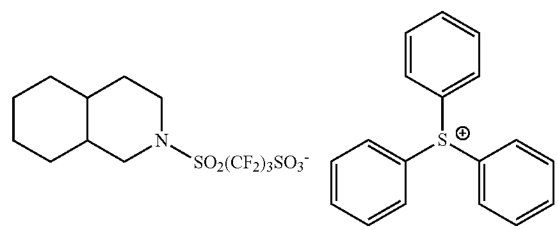
(z115)
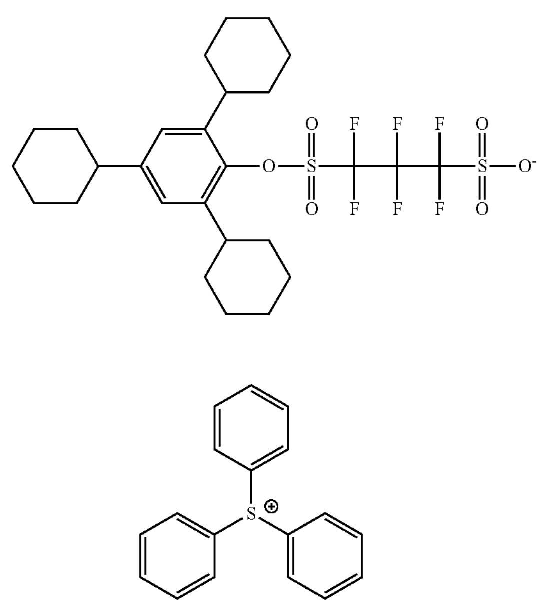
(z116)
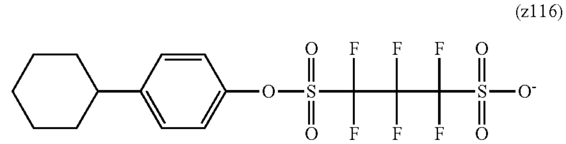

-continued
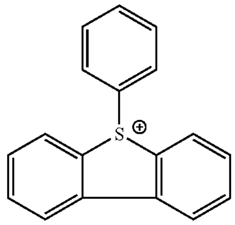
(z117)
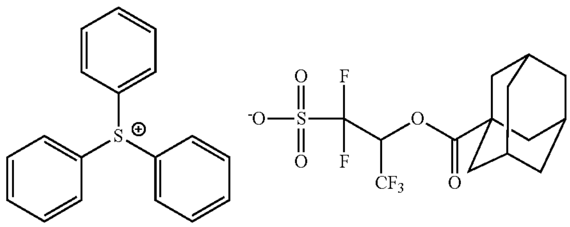
(z118)
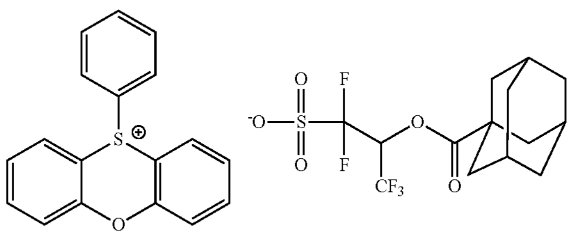
(z119)
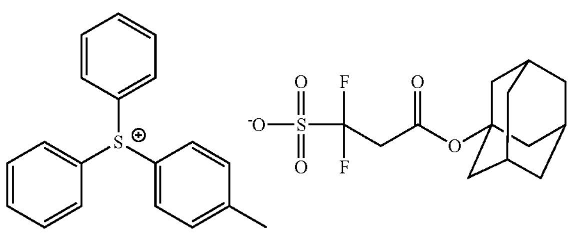
(z120)
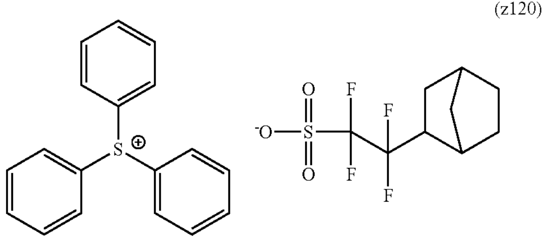
(z121)
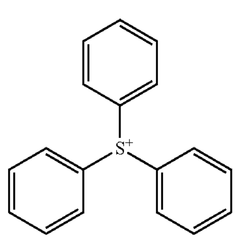
-continued
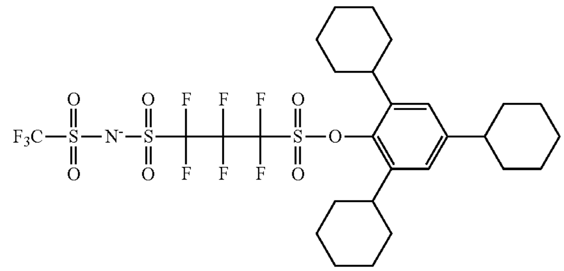
(z122)
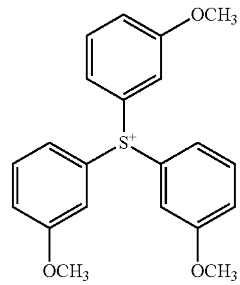
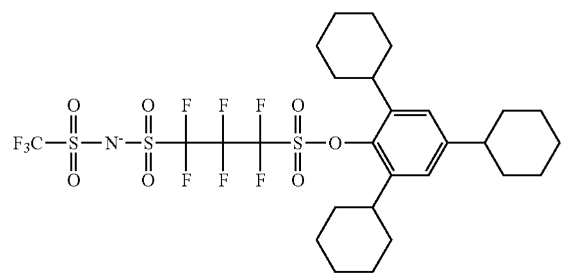
(z123)
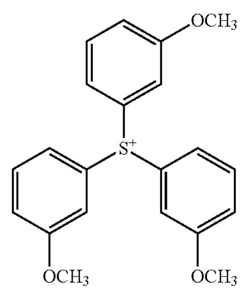
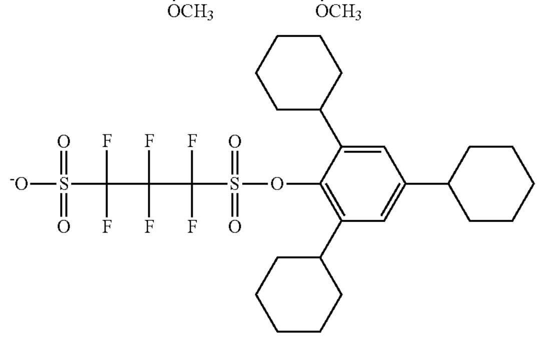
(z124)
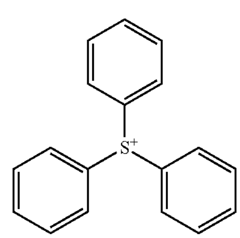

-continued
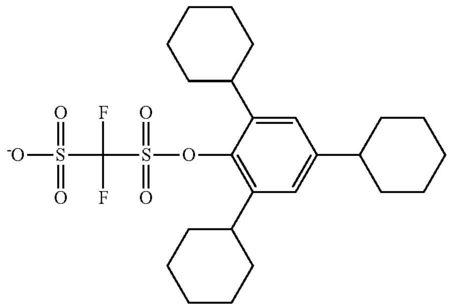
(z125)
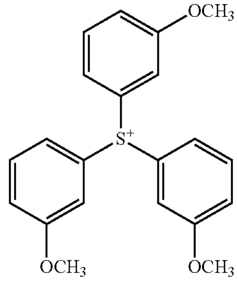
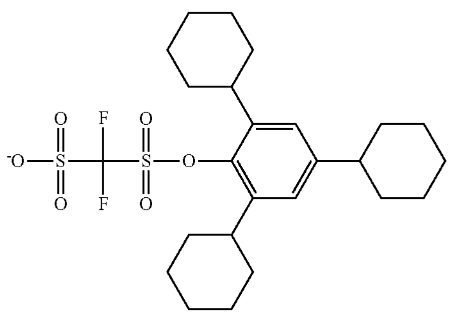
(z126)
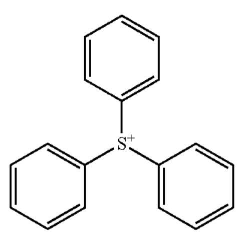
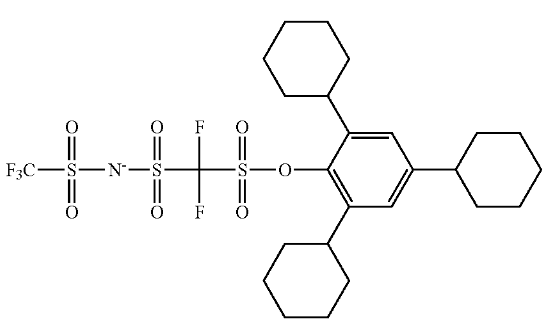
-continued
(z127)
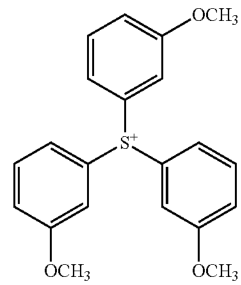
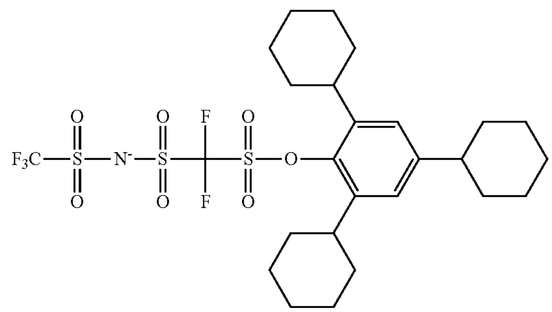
(z128)
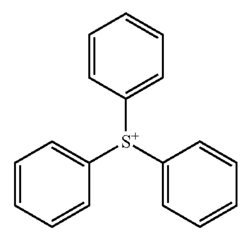
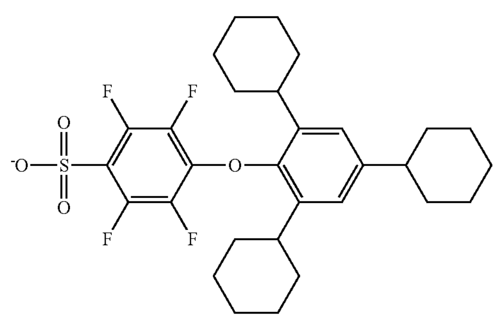
(z129)
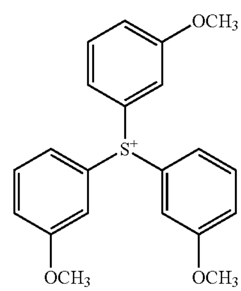

-continued
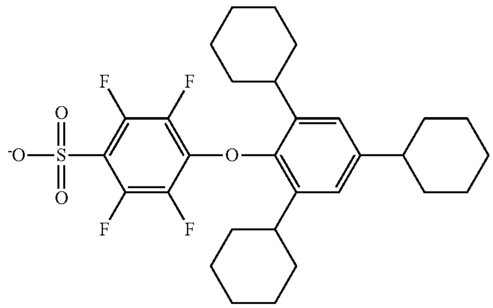
(z130)
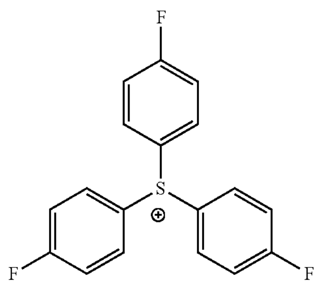
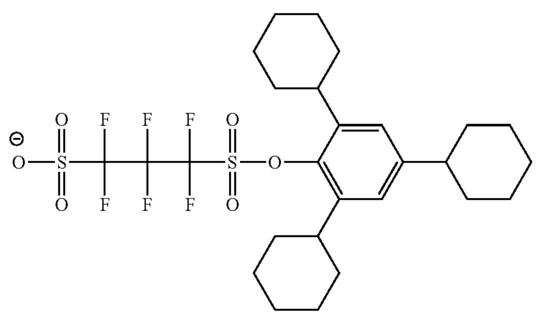
(z131)
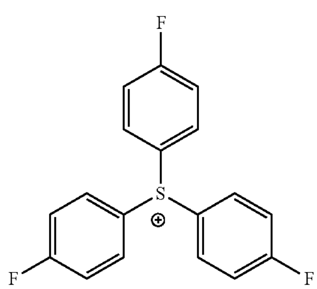
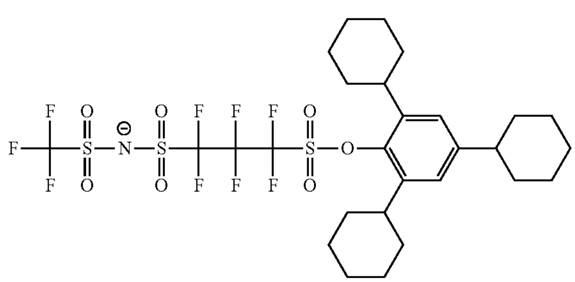
-continued
(z132)
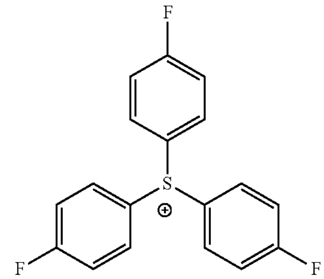
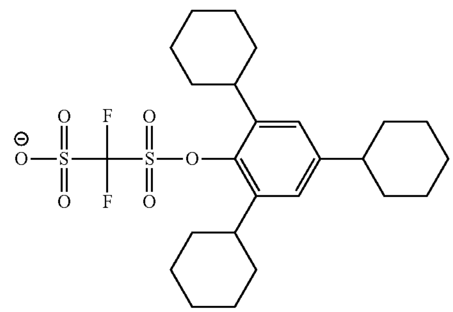
(z133)
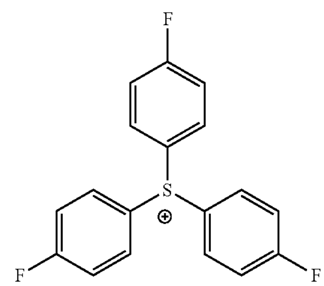
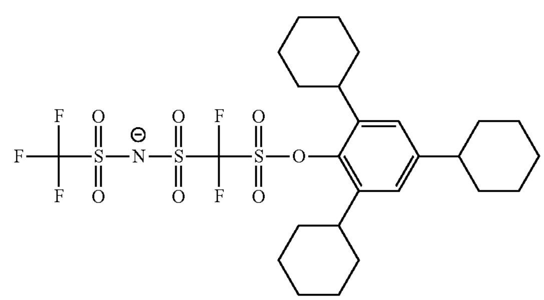
(z134)
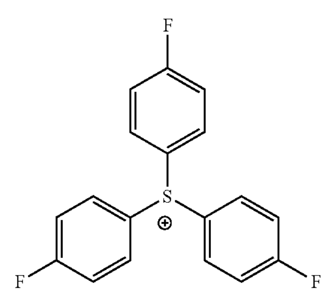

-continued
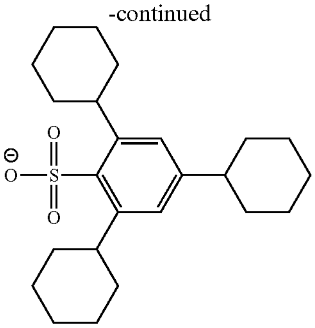
(z135)
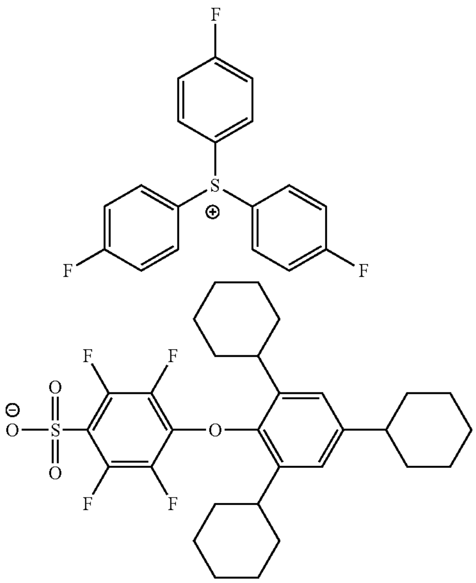
(z136)
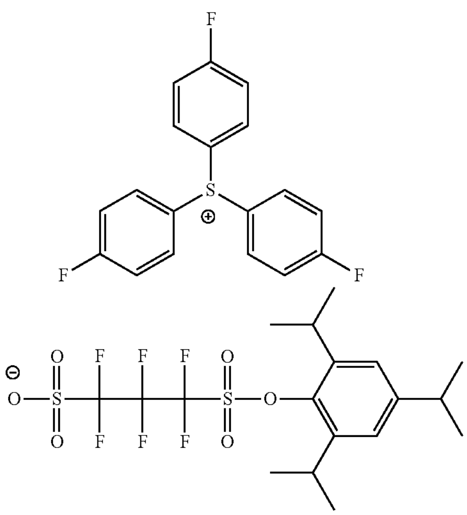
(z137)
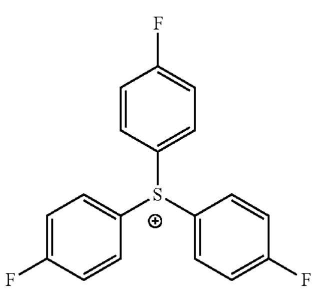
-continued
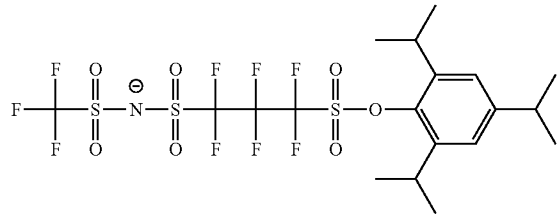
(z138)
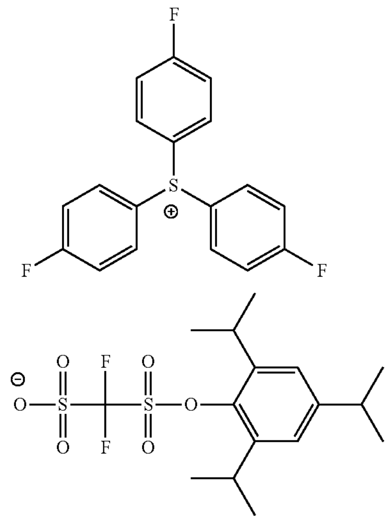
(z139)
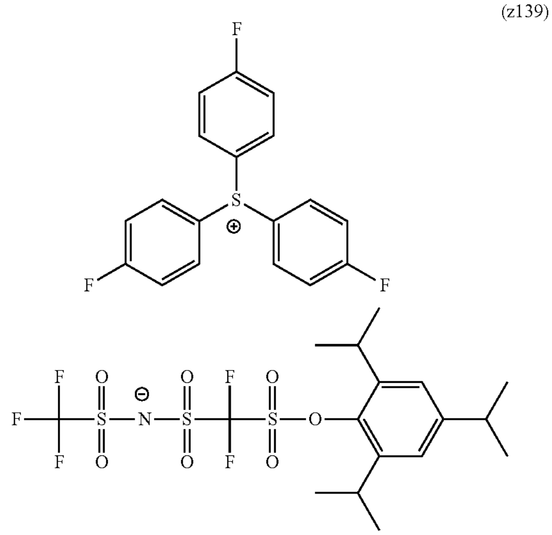
(z140)
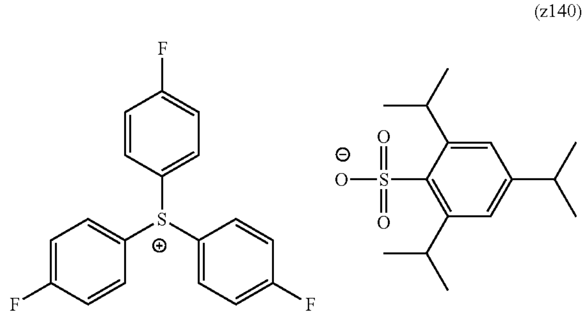

-continued (z141)

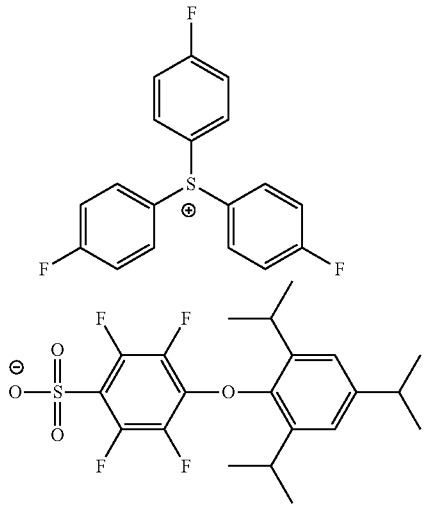

In the present invention, from the viewpoint of suppressing diffusion of an acid which is generated by exposure to an unexposed section and making the resolving power and LWR favorable, the compound (B) which generates an acid is preferably a compound which generates an acid with a size of a volume of 240 $Å^3$ or more when irradiated with actinic rays or radiation, more preferably a compound which generates an acid with a size of a volume of 300 $Å^3$ or more, even more preferably a compound which generates an acid with a size of a volume of 350 $Å^3$ or more, and particularly preferably a compound which generates an acid with a size of a volume of 400 $Å^3$ or more. However, from the viewpoint of the sensitivity or coating solvent solubility, the volume described above is preferably 2000 $Å^3$ or less and more preferably 1500 $Å^3$ or less. The values of the volume described above were obtained using "WinMOPAC" manufactured by Fujitsu Corp. That is, it is possible to calculate the "accessible volume" of each acid by firstly inputting the chemical structure of an acid according to each example, subsequently determining the most stable conformation of each acid by molecular field calculation using an MM3 method with this structure as the initial structure, and then performing molecular trajectory calculation using a PM3 method with regard to the most stable conformations.

Examples of particularly preferable acid generating agents in the present invention will be shown below. Here, the volume calculation value is added to some of the examples (unit $Å^3$). Here, the calculation value which is obtained here is the volume value of an acid where a proton is bonded with an anion section.

585$Å^3$

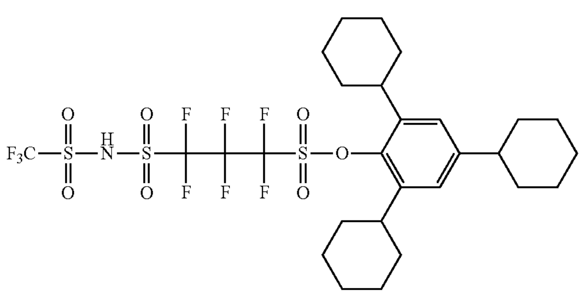

-continued

585$Å^3$

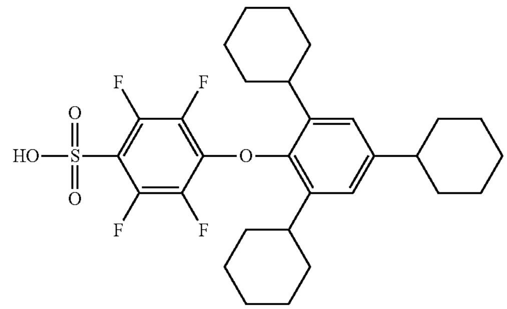

525$Å^3$

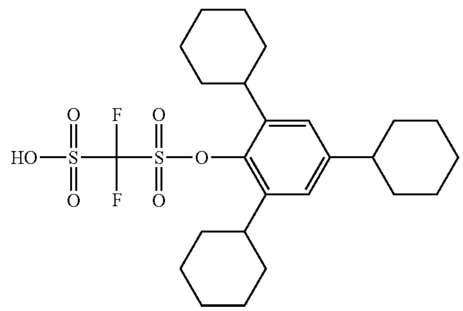

554$Å^3$

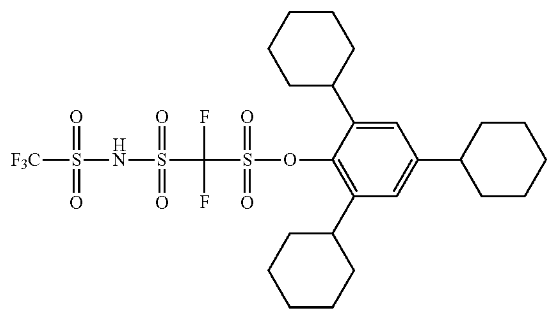

303$Å^3$

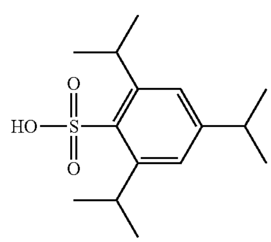

437$Å^3$

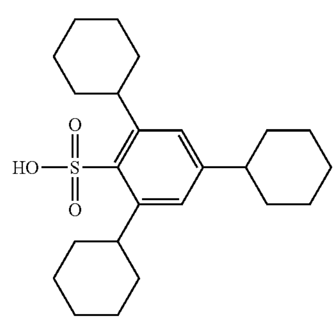

-continued
244Å$^3$
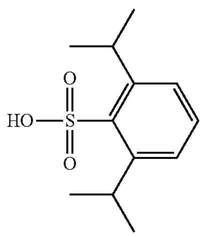
529Å$^3$
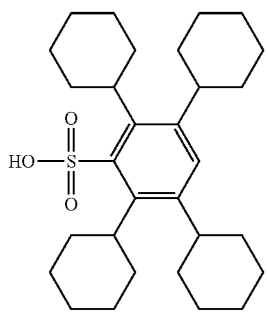
336Å$^3$
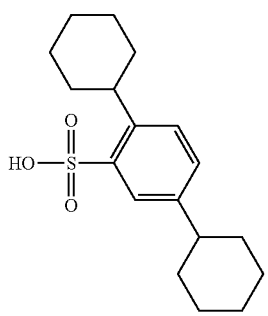
244Å$^3$
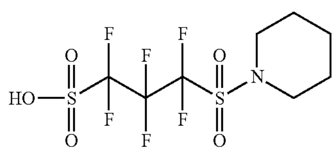
271Å$^3$
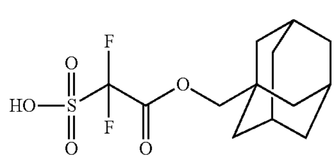
-continued
457Å$^3$
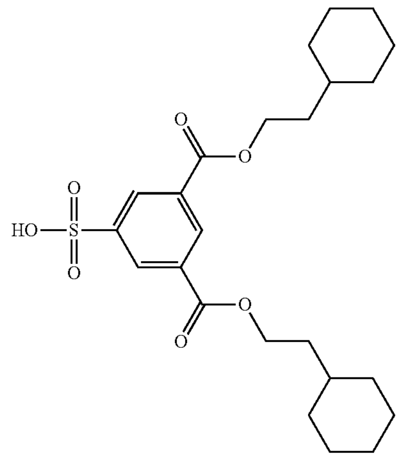
511Å$^3$
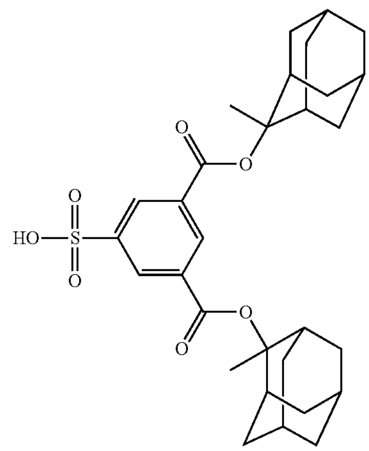
311Å$^3$
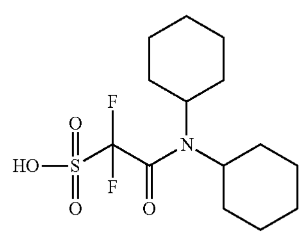
280Å$^3$
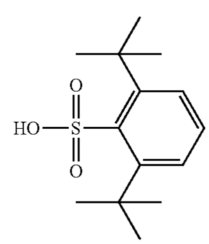
266Å$^3$
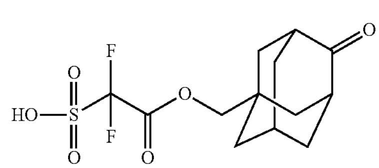

-continued
339Å$^3$
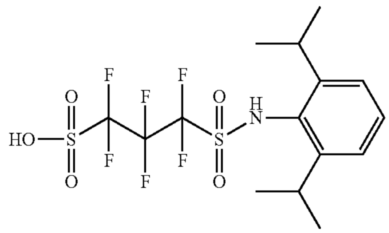
380Å$^3$
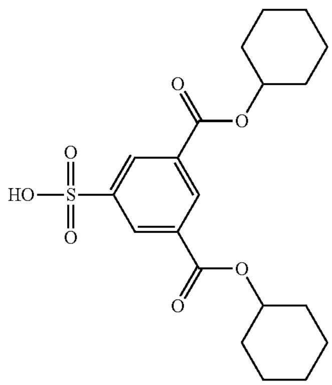
277Å$^3$
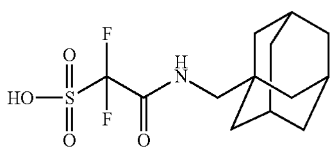
357Å$^3$
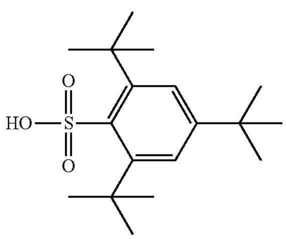
347Å$^3$
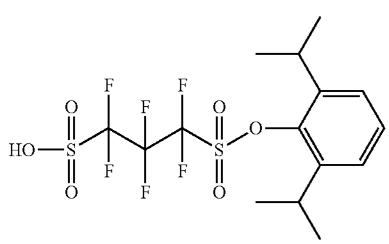
380Å$^3$
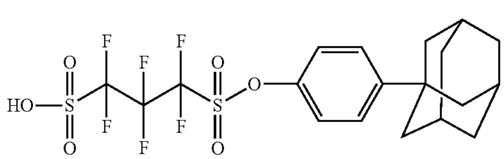
-continued
519Å$^3$
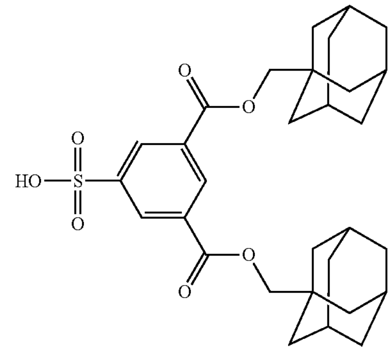
291Å$^3$
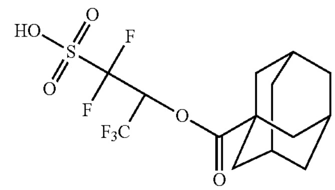
297Å$^3$
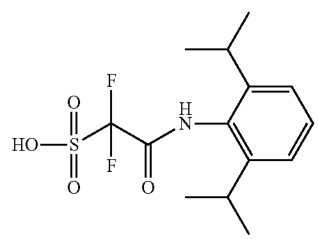
277Å$^3$
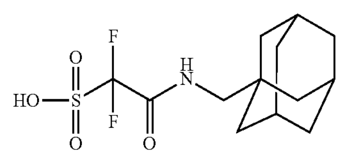
281Å$^3$
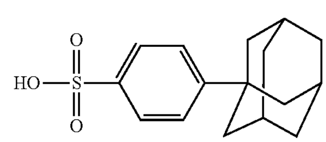
310Å$^3$
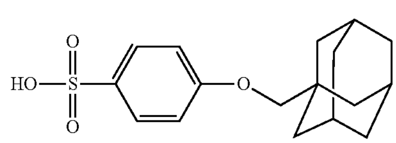
309Å$^3$
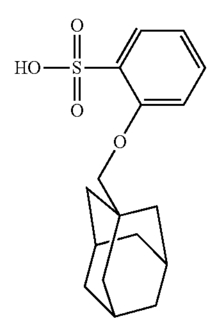

-continued

270Å$^3$

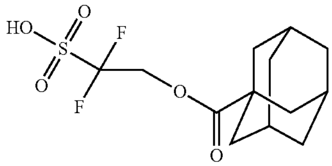

393Å$^3$

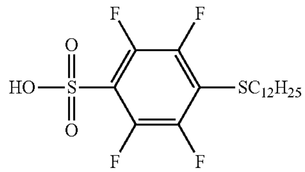

350Å$^3$

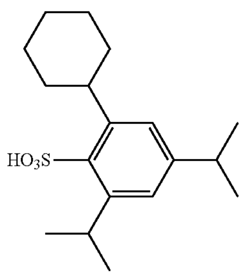

311Å$^3$

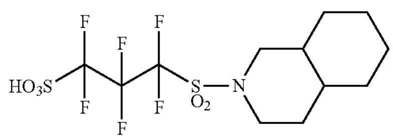

250Å$^3$

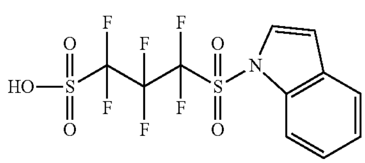

535Å$^3$

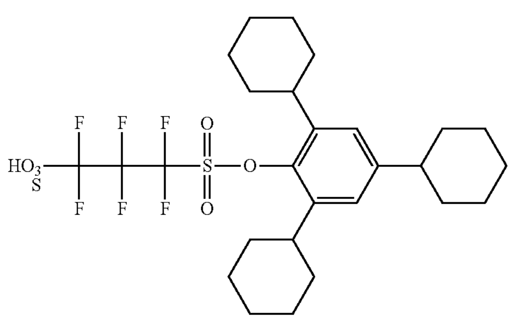

290Å$^3$

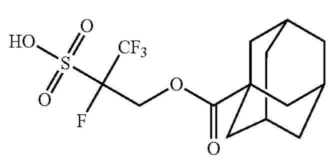

315Å$^3$

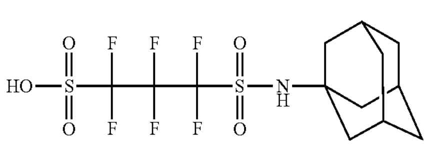

It is possible to use an acid generating agent as one type individually or in a combination of two or more types.

The content ratio of the acid generating agent in the composition is preferably 0.1 mass % to 50 mass % based on the total solid content of the composition, more preferably 0.5 mass % to 45 mass %, and even more preferably 1 mass % to 40 mass %.

[4] Compound which Decomposes Due to an Effect of an Acid and Generates an Acid

The actinic ray-sensitive or radiation-sensitive resin composition of the present invention may further include one type or two or more types of compounds which decompose due to the effect of an acid and generate an acid. The acid which is generated by the compound which decomposes due to an effect of an acid and generates an acid is preferably sulfonic acid, methide acid, or imide acid.

Examples of the compound which decomposes due to the effect of an acid and generates an acid which is able to be used for the present invention will be shown below; however, the present invention is not limited thereto.

(PA-1)

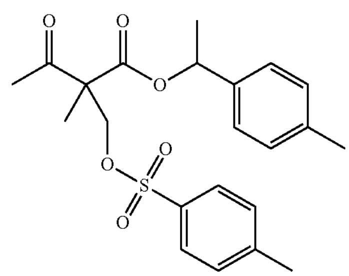

(PA-2)

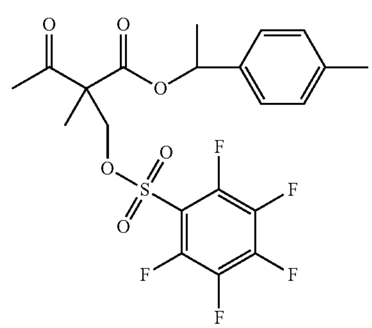

(PA-3)

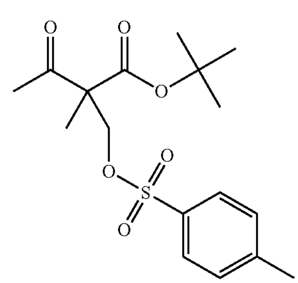

-continued
(PA-4)
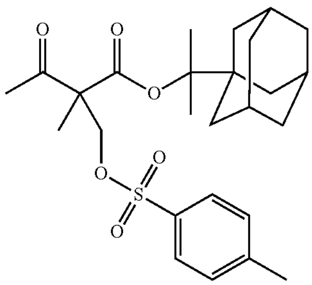
(PA-5)
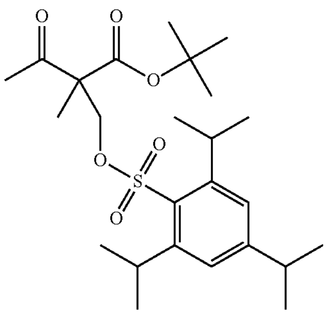
(PA-6)
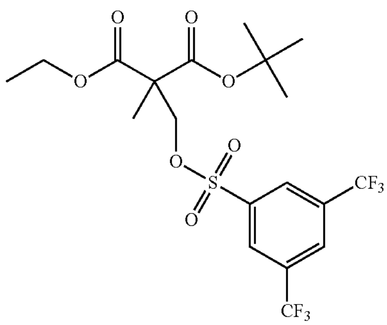
(PA-7)
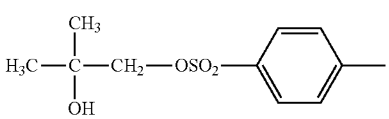
(PA-8)
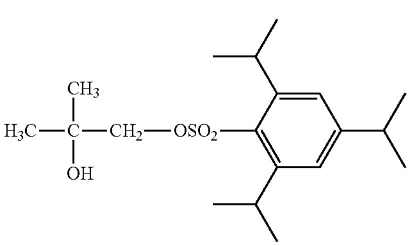
(PA-9)
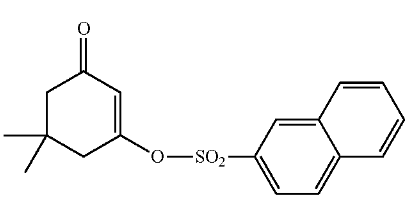
-continued
(PA-10)
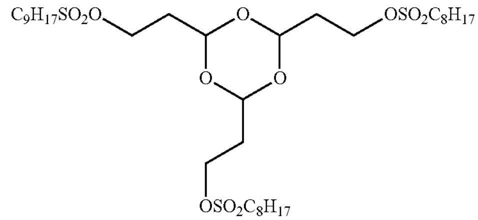
(PA-11)
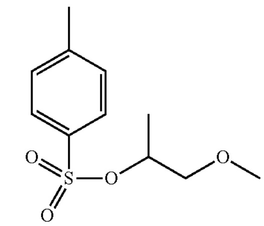
(PA-12)
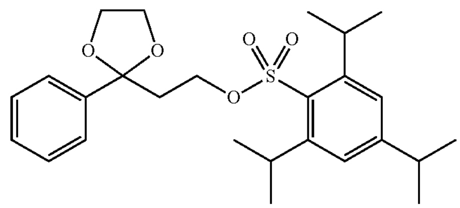
(PA-13)
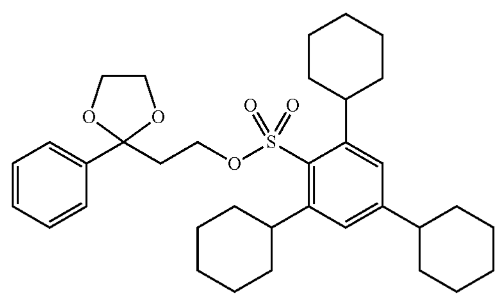
(PA-14)
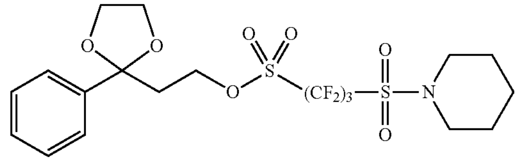
(PA-15)
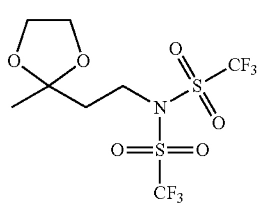

-continued (PA-16)

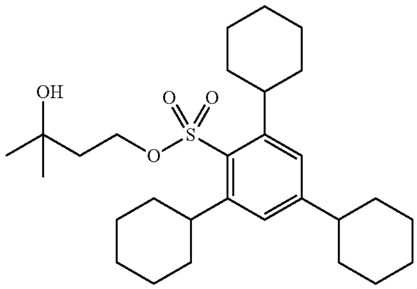

(PA-17)

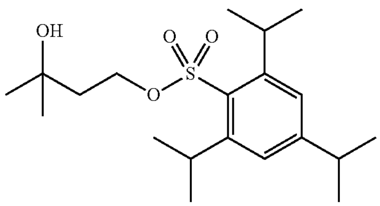

(PA-18)

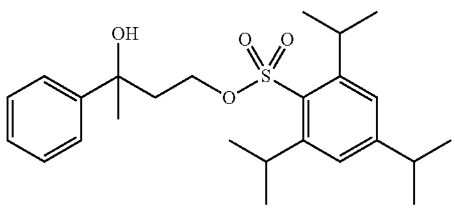

It is possible to use the compound which decomposes due to the effect of an acid and generates an acid as one type individually or in a combination of two or more types.

Here, the content of compounds which decompose due to the effect of an acid and generate an acid is preferably 0.1 mass % to 40 mass % based on the total solid content of the actinic ray-sensitive or radiation-sensitive resin composition, more preferably 0.5 mass % to 30 mass %, and even more preferably 1.0 mass % to 20 mass %.

[5] Solvent (Coating Solvent)

The composition in the present invention preferably contains a solvent.

A solvent which is able to be used when preparing a composition is not particularly limited as long as each component is dissolved; however, examples thereof include alkylene glycol monoalkyl ether carboxylate (propylene glycol monomethyl ether acetate (PGMEA; another name 1-methoxy-2-acetoxy propane) and the like), alkylene glycol monoalkyl ether (propylene glycol monomethyl ether (PGME; another name 1-methoxy-2-propanol) and the like), alkyl lactate ester (ethyl lactate, methyl lactate, and the like), cyclic lactone (γ-butyrolactone and the like, preferably with 4 to 10 carbon atoms), chained or cyclic ketones (2-heptanone, cyclohexanone, and the like, preferably with 4 to 10 carbon atoms), alkylene carbonate (ethylene carbonate, propylene carbonate, and the like), a carboxylic acid alkyl (preferably alkyl acetate such as butyl acetate), alkoxy alkyl acetate(ethyl ethoxy propionate), and the like. Examples of other usable solvents include the solvents described in [0244] and beyond in US2008/0248425A1 and the like.

Among the above, alkylene glycol monoalkyl ether carboxylate and alkylene glycol monoalkyl ether are preferable.

The solvents may be used individually or may be used by mixing two or more types thereof. In a case of mixing two or more types, it is preferable to mix a solvent which has a hydroxyl group and a solvent which does not have a hydroxyl group. The mass ratio of a solvent which has a hydroxyl group and a solvent which does not have a hydroxyl group is preferably 1/99 to 99/1, more preferably 10/90 to 90/10, and even more preferably 20/80 to 60/40.

The solvent which has a hydroxyl group is preferably an alkylene glycol monoalkyl ether and the solvent which does not have a hydroxyl group is preferably alkylene glycol monoalkyl ether carboxylate.

[6] Basic Compound

The actinic ray-sensitive or radiation-sensitive resin composition according to the present invention may further include a basic compound. A basic compound is preferably a compound with stronger basicity compared to phenol. In addition, the basic compound is preferably an organic basic compound and more preferably a nitrogen-containing basic compound.

A usable nitrogen-containing basic compound is not particularly limited; however, it is possible to use, for example, the compounds which are divided into (1) to (7) below.

(1) Compound which is Represented by General Formula (BS-1)

(BS-1)

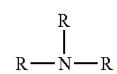

In General Formula (BS-1), R each independently represents a hydrogen atom or an organic group. However, at least one of three Rs is an organic group. The organic group is a straight-chain or branched chain alkyl group, a monocyclic or polycyclic cycloalkyl group, an aryl group, or an aralkyl group.

For description of the compound which is represented by General Formula (BS-1) (description of each group, specific examples of the compound which is represented by General Formula (BS-1), and the like), refer to the description according to paragraphs [0471] to [0481] of JP2013-015572A and the contents thereof are included in the present specification.

(2) Compound which has a Nitrogen-Containing Hetero Ring Structure

The nitrogen-containing hetero ring may have aromaticity or may not have aromaticity. In addition, the nitrogen-containing hetero ring may have a plurality of nitrogen atoms. Furthermore, the nitrogen-containing hetero ring may contain a hetero atom other than nitrogen. In detail, examples thereof include a compound which has an imidazole structure (2-phenyl benzimidazole, 2,4,5-triphenyl imidazole, and the like), a compound which has a piperidine structure [N-hydroxyethyl piperidine and bis(1,2,2,6,6-pentamethyl-4-piperidyl) sebacate, and the like], a compound which has a pyridine structure (4-dimethylamino pyridine and the like), and a compound which has an antipyrine structure (antipyrine, hydroxy antipyrine, and the like).

Examples of a preferable compound which has a nitrogen-containing hetero ring structure include guanidine, aminopyridine, aminoalkylpyridine, aminopyrrolidine, indazole, imidazole, pyrazole, pyrazine, pyrimidine, purine, imidazoline, pyrazoline, piperazine, amino morpholine, and aminoalkyl morpholine. The above may further have a substituent group.

Examples of a preferable substituent group include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Examples of a particularly preferable basic compound include imidazole, 2-methyl imidazole, 4-methyl imidazole, N-methyl imidazole, 2-phenyl imidazole, 4,5-diphenyl imidazole, 2,4,5-triphenyl imidazole, 2-aminopyridine, 3-aminopyridine, 4-aminopyridine, 2-dimethyl aminopyridine, 4-dimethyl aminopyridine, 2-diethyl aminopyridine, 2-(aminomethyl)pyridine, 2-amino-3-methyl pyridine, 2-amino-4-methyl pyridine, 2-amino 5-methyl pyridine, 2-amino-6-methyl pyridine, 3-aminoethyl pyridine, 4-aminoethyl pyrizine, 3-amino pyrrolidine, piperazine, N-(2-aminoethyl) piperazine, N-(2-aminoethyl) piperazine, 4-amino-2,2,6,6 tetramethyl piperadine, 4-piperidino piperadine, 2-imino piperazine, 1-(2-aminoethyl) pyrrolidine, pyrazole, 3-amino-5-methyl pyrazole, 5-amino-3-methyl-1-p-tolyl pyrazole, pyrazine, 2-(aminomethyl)-5 methyl pyrazine, pyrimidine, 2,4-diamino pyrimidine, 4,6-dihydroxy pyrimidine, 2-pyrazoline, 3-pyrazoline, N-amino morpholine, and N-(2-aminoethyl) morpholine.

In addition, a compound which has two or more ring structures is also favorably used. In detail, examples thereof include 1,5-diazabicyclo [4.3.0] nona-5-ene and 1,8-diazabicyclo [5.4.0]-undeca-7-ene.

(3) Amine Compound which has a Phenoxy Group

An amine compound which has a phenoxy group is a compound which is provided with a phenoxy group at the end at the opposite side to an N atom of an alkyl group which is included in the amine compound. The phenoxy group may have a substituent group such as an alkyl group, an alkoxy group, a halogen atom, a cyano group, a nitro group, a carboxy group, a carboxylic acid ester group, a sulfonic acid ester group, an aryl group, an aralkyl group, an acyloxy group, and an aryloxy group.

The compound more preferably has at least one oxyalkylene chain between a phenoxy group and a nitrogen atom. The number of oxyalkylene chains in one molecule is preferably 3 to 9 and more preferably 4 to 6. Among the oxyalkylene chains, —$CH_2CH_2O$— is particularly preferable.

Specific examples thereof include 2-[2-{2-(2,2-dimethoxy-phenoxyethoxy)ethyl}-bis-(2-methoxyethyl)]-amine and the compounds (C1-1) to (C3-3) exemplified in paragraph [0066] in US2007/0224539A1.

An amine compound which has a phenoxy group is obtained, for example, by extraction using an organic solvent such as ethyl acetate or chloroform, after heating and reacting a primary or secondary amine which has a phenoxy group with a haloalkyl ether and adding a strongly basic aqueous solution such as sodium hydroxide, potassium hydroxide, or tetraalkyl ammonium. In addition, it is also possible to obtain an amine compound which has a phenoxy group by extraction using an organic solvent such as ethyl acetate or chloroform after heating and reacting a primary or secondary amine with a haloalkyl ether which has a phenoxy group at an end and adding a strongly basic aqueous solution such as sodium hydroxide, potassium hydroxide, or tetraalkyl ammonium.

(4) Ammonium Salt

It is also possible to appropriately use ammonium salt as a basic compound.

A cation of ammonium salt is preferably a tetraalkyl ammonium cation which is substituted with an alkyl group with 1 to 18 carbon atoms, more preferably a tetramethyl ammonium cation, a tetraethyl ammonium cation, a tetra(n-butyl) ammonium cation, a tetra(n-heptyl) ammonium cation, a tetra(n-octyl) ammonium cation, a dimethylhexadecyl ammonium cation, a benzyltrimethyl cation, and the like, and most preferably a tetra(n-butyl) ammonium cation.

Examples of an anion of ammonium salt include hydroxide, carboxylate, halide, sulfonate, borate, and phosphate. Among these, hydroxide or carboxylate are particularly preferable.

The halide is particularly preferably chloride, bromide, or iodide.

The sulfonate is particularly preferably an organic sulfonate with 1 to 20 carbon atoms. Examples of the organic sulfonate include alkyl sulfonate with 1 to 20 carbon atoms and aryl sulfonate.

An alkyl group which is included in alkyl sulfonate may have a substituent group. Examples of the substituent group include a fluorine atom, a chlorine atom, a bromine atom, an alkoxy group, an acyl group, and an aryl group. Examples of the alkyl sulfonate specifically include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate.

Examples of an aryl group which is included in the aryl sulfonate include a phenyl group, a naphthyl group, and an anthryl group. The aryl groups may have a substituent group. The substituent is preferably a straight-chain or branched chain alkyl group with 1 to 6 carbon atoms and a cycloalkyl group with 3 to 6 carbon atoms. In detail, for example, methyl, ethyl, n-propyl, isopropyl, n-butyl, i-butyl, t-butyl, n-hexyl, and cyclohexyl groups are preferable. Examples of other substituent groups include an alkoxy group with 1 to 6 carbon atoms, a halogen atom, cyano, nitro, and acyl groups and an acyloxy group.

The carboxylate may be an aliphatic carboxylate or an aromatic carboxylate and examples thereof include acetate, lactate, pyruvate, trifluoroacetate, adamantane carboxylate, hydroxyadamantane carboxylate, benzoate, naphthoate, salicylate, phthalate, phenolate, and the like and benzoate, naphthoate, phenolate, and the like are particularly preferable and benzoate is the most preferable.

In this case, the ammonium salt is preferably tetra(n-butyl) ammonium benzoate, tetra(n-butyl) ammonium phenolate, and the like.

In a case of the hydroxide, the ammonium salt thereof is particularly preferably tetraalkyl ammonium hydroxide such as tetraalkyl ammonium hydroxide with 1 to 8 carbon atoms (tetramethyl ammonium hydroxide, tetraethyl ammonium hydroxide and tetra-(n-butyl) ammonium hydroxide).

(5) Compound (PA) which has a Proton-Accepting Functional Group and which Decomposes when Irradiated with Actinic Rays or Radiation to Generate a Compound in which the Proton-Accepting Property is Reduced or Lost or in which the Proton-Accepting Property is Changed to Acidity As a basic compound, the composition according to the present invention may further have a compound [also referred to below as a compound (PA)] which has a proton-accepting functional group and which decomposes when irradiated with actinic rays or radiation to generate a compound in which the proton-accepting property is reduced or lost or in which the proton-accepting property is changed to acidity.

For the compound (PA) which has a proton-accepting functional group and which decomposes when irradiated with actinic rays or radiation to generate a compound in which the proton-accepting property is reduced or lost or in which the proton-accepting property is changed to acidity, refer to the description of paragraphs [0379] to [0425] of JP2012-32762A (corresponding to [0386] to [0435] in US2012/0003590A) and the contents thereof are included in the present specification.

In the composition of the present invention, the blending ratio of the compound (PA) in the entire composition is preferably 0.1 mass % to 10 mass % of the total solid content and more preferably 1 mass % to 8 mass %.

(6) Guanidine Compound

The composition of the present invention may further have a guanidine compound.

For the guanidine compound, refer to the description of paragraphs [0374] to [0378] of JP2012-32762A (corresponding to [0382] to [0385] of US2012/0003590A) and the contents thereof are included in the present specification.

(7) Low Molecular Compound which has a Group which has a Nitrogen Atom and Desorbs Due to an Effect of an Acid The composition of the present invention is able to contain a low molecular compound which has a group which has a nitrogen atom and desorbs due to the effect of an acid (also referred to below as a "low molecular compound (D)" or a "compound (D)"). The low molecular compound (D) preferably has basicity after the group which desorbs due to an effect of an acid desorbs.

For the low molecular compound (D), refer to the description of paragraphs [0324] to [0337] of JP2012-133331A and the contents thereof are included in the present specification.

In the present invention, it is possible to use the low molecular compound (D) as one type individually or by mixing two or more types.

The composition of the present invention may not contain the low molecular compound (D); however, when contained, the content of the compound (D) is generally 0.001 mass % to 20 mass % based on the total solid content of the composition which is combined with the basic compound described above, preferably 0.001 mass % to 10 mass %, and more preferably 0.01 mass % to 5 mass %.

In addition, in a case where the composition of the present invention contains an acid generating agent, the usage ratio of the acid generating agent and the compound (D) in the composition is preferably acid generating agent/[compound (D)+basic compound below] (mol ratio)=2.5 to 300. That is, the mol ratio is preferably 2.5 or more from the point of the sensitivity and resolution and preferably 300 or less from the point of suppressing reduction in the resolution due to the resist pattern thickening over time until the heating process after the exposing. The acid generating agent/[compound (D)+basic compound above] (mol ratio) is more preferably 5.0 to 200 and even more preferably 7.0 to 150.

Examples of others which are able to be used for the composition according to the present invention include the compounds which are synthesized in examples in JP2002-363146A, the compounds described in paragraph [0108] in JP2007-298569A, and the like.

A photosensitive basic compound may be used as a basic compound. It is possible to use the compounds described in JP2003-524799A, J. Photopolym. Sci & Tech. Vol. 8, P. 543-553 (1995), and the like as the photosensitive basic compound.

The molecular weight of the basic compound is generally 100 to 1500, preferably 150 to 1300, and more preferably 200 to 1000.

The basic compounds may be used as one type individually or may be used in a combination of two or more types.

In a case where the composition according to the present invention includes a basic compound, the content is preferably 0.01 mass % to 10.0 mass % based on the total solid content of the composition, more preferably 0.1 mass % to 8.0 mass %, and particularly preferably 0.2 mass % to 5.0 mass %.

The mol ratio of a basic compound with respect to a photoacid generator is preferably 0.01 to 10, more preferably 0.05 to 5, and even more preferably 0.1 to 3. When the mol ratio is excessively increased, there are cases where the sensitivity and/or the resolution decreases. When the mol ratio is excessively decreased, there is a possibility that pattern thinning will be generated between the exposure and the heating (post bake). 0.05 to 5 is more preferable and 0.1 to 3 is even more preferable. Here, the photoacid generator in the mol ratio described above is based on the total amount of the repeating unit (B) of the resin described above and the photoacid generator which may be further included in the resin described above.

[7] Surfactant

The composition according to the present invention may further include a surfactant. By containing a surfactant, in a case of using exposure light source with wavelength of 250 nm or less, particularly 220 nm or less, it is possible to form a pattern with less adhesion and development defects with favorable sensitivity and resolution.

It is particularly preferable to use a fluorine-based and/or silicon-based surfactant as the surfactant.

Examples of the fluorine-based and/or silicon-based surfactant include the surfactants described in paragraph [0276] in US2008/0248425A. In addition, Eftop EF301 or EF303 (manufactured by Shin Akita Kasei Co., Ltd.), Fluorad FC430, 431, or 4430 (manufactured by Sumitomo 3M Inc.), Megafac F171, F173, F176, F189, F113, F110, F177, F120, and R08 (manufactured by DIC Inc.), Surflon S-382, SC101, 102, 103, 104, 105, or 106 (manufactured by Asahi Glass Co., Ltd.), Troyzol S-366 (manufactured by Troy Chemical Industries, Inc.), GF-300 or GF-150 (manufactured by Toagosei Co., Ltd.), Surflon S-393 (manufactured by Seimi Chemical Co., Ltd.), Eftop EF121, EF122A, EF122B, RF122C, EF125M, EF135M, EF351, EF352, EF801, EF802, or EF601 (manufactured by Gemco Inc.), PF636, PF656, PF6320, or PF6520 (manufactured by OMNOVA Corp.), or FTX-204G, 208G, 218G, 230G, 204D, 208D, 212D, 218D, or 222D (manufactured by Neos Co., Ltd.) may be used. In addition, it is also possible to use polysiloxane polymer KP-341 (manufactured by Shin-Etsu Chemical Co., Ltd.) as a silicon-based surfactant.

In addition, other than the surfactants known in the art as described above, the surfactant may be synthesized using a fluoro aliphatic compound which is manufactured by a telomerization method (also referred to as a telomer method) or an oligomerization method (also referred to as an oligomer method). In detail, a polymer which is provided with the fluoro aliphatic group which is derived from the fluoro aliphatic compound may be used as a surfactant. It is possible to synthesize the fluoro aliphatic compound, for example, using the method described in JP2002-90991A.

The polymer which has the fluoro aliphatic group is preferably a copolymer of a monomer which has a fluoro aliphatic group and (poly(oxyalkylene)) acrylate or methacrylate and/or (poly(oxyalkylene)) methacrylate and may be irregularly distributed or may be block-copolymerized.

Examples of a poly(oxyalkylene) group include a poly (oxyethylene) group, a poly(oxypropylene) group, and a poly(oxybutylene) group. In addition, the poly(oxyalkylene) group may be a unit which has an alkylene with different chain lengths in the same chain such as poly (block linking body of oxyethylene, oxypropylene, and oxyethylene) and poly (block linking body of oxyethylene and oxypropylene).

Furthermore, a copolymer of a monomer which has a fluoro aliphatic group and (poly(oxyalkylene)) acrylate or methacrylate may be a copolymer with a tertiary or higher compound formed by copolymerizing a monomer which has two or more different types of fluoro aliphatic groups, two or more different types of (poly(oxyalkylene)) acrylate or methacrylate, and the like at the same time.

Examples of commercially available surfactants include Megafac F178, F-470, F-473, F-475, F-476, and F-472 (manufactured by DIC Inc.). Furthermore, examples thereof include a copolymer of an acrylate which has a $C_6F_{13}$ group or methacrylate and (poly(oxyalkylene)) acrylate or methacrylate, a copolymer of an acrylate which has a $C_6F_{13}$ group or methacrylate and (poly(oxyethylene)) acrylate or methacrylate and (poly(oxypropylene)) acrylate or methacrylate, a copolymer of an acrylate which has a $C_8F_{17}$ group or methacrylate and (poly(oxyalkylene)) acrylate or methacrylate, a copolymer of an acrylate which has a $C_8F_{17}$ group or methacrylate and (poly(oxyethylene)) acrylate or methacrylate and (poly(oxypropylene)) acrylate or methacrylate, and the like.

In addition, a surfactant other than the fluorine-based and/or silicon-based surfactants described in paragraph [0280] of US2008/0248425A may be used.

The surfactants may be used as one type individually or may be used in a combination of two or more types.

In a case where the composition according to the present invention includes a surfactant, the content thereof is preferably 0 mass % to 2 mass % based on the total solid content of the composition, more preferably 0.0001 mass % to 2 mass %, and even more preferably 0.0005 mass % to 1 mass %.

[8] Other Additive Agents

The composition of the present invention is able to appropriately contain carboxylic acid, carboxylic acid onium salt, a dissolution inhibiting compound with molecular weight of 3000 or less described in Proceeding of SPIE, 2724, 355 (1996) and the like, dye, a plasticizer, a photosensitizer, a light absorption agent, an antioxidant, and the like other than the components described above.

In particular, carboxylic acid is favorably used for improving the performance. The carboxylic acid is preferably an aromatic carboxylic acid such as benzoate or naphthoic acid.

The content of carboxylic acid is preferably 0.01 mass % to 10 mass % in the total solid content concentration of the composition, more preferably 0.01 mass % to 5 mass %, and even more preferably 0.01 mass % to 3 mass %.

The solid content concentration of the actinic ray-sensitive or radiation-sensitive resin composition in the present invention is generally 1.0 mass % to 10 mass %, preferably 2.0 mass % to 5.7 mass %, and more preferably 2.0 mass % to 5.3 mass %. By setting the solid content concentration to be in these ranges, it is possible to evenly coat a resist solution on a substrate and additionally, it is possible to form a resist pattern with excellent line width roughness. The reason for this is not clear; however, it may be considered probable that, by setting the solid content concentration to be 10 mass % or less, preferably 5.7 mass % or less, aggregation of raw material in the resist solution, particularly, a photoacid generator, is suppressed and as a result, an even resist film is formed.

The solid content concentration is the weight percentage of weight of other resist components excluding the solvent with respect to the total weight of the actinic ray-sensitive or radiation-sensitive resin composition.

The actinic ray-sensitive or radiation-sensitive resin composition in the present invention is used by being coated on a predetermined support body (a substrate) after the components described above are dissolved in a predetermined organic solvent, preferably the mixed solvent, and filter filtration is carried out. The filter which is used for the filter filtration is preferably made of polytetrafluoroethylene, polyethylene, or nylon with a pore size of 0.1 μm or less, more preferably 0.05 μm or less, and even more preferably 0.03 μm or less. In the filter filtration, for example, circular filtration may be performed or filtration may be performed by connecting a plurality of types of filters in series or in parallel as JP2002-62667A. In addition, the composition may be filtered a plurality of times. Furthermore, a degassing process or the like may be performed with respect to the composition before or after the filter filtration.

Top Coat Composition

Description will be given of a top coat composition which is used for forming a top coat layer in the pattern forming method of the present invention.

The top coat composition in the present invention contains a resin (also referred to below simply as a resin (T)).

The resin (T) also preferably has a repeating unit which has an acidic group.

The pKa of an acidic group in the resin (T) of the top coat composition is preferably −10 to 5, more preferably −4 to 4, and particularly preferably −4 to 3.

In addition, the pH of the top coat composition is preferably 0 to 5, more preferably 0 to 4, and particularly preferably 0 to 3.

A repeating unit which has an acidic group which the resin (T) may have is more preferably at least any one of the repeating units which are represented by General Formulas (I-1) to (I-5) below.

General Formula (I-1)

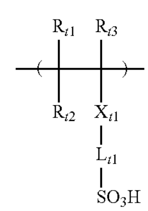

General Formula (I-2)

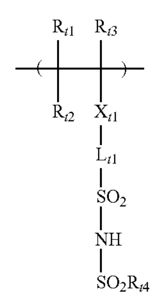

General Formula (I-3)

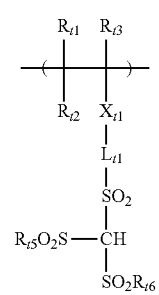

-continued

General Formula (I-4)

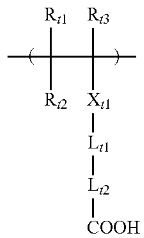

General Formula (I-5)

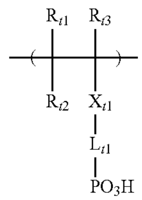

In General Formulas (I-1) to (I-5) above, $R_{t1}$, $R_{t2}$, and $R_{t3}$ each independently represent a hydrogen atom, an alkyl group, a cycloalkyl group, a halogen atom, a cyano group, or an alkoxycarbonyl group. However, $R_{t2}$ may form a ring by bonding with $L_{t1}$.

$X_{t1}$ each independently represents a single bond, —COO— or —CONR$_{t7}$—. $R_{t7}$ represents a hydrogen atom or an alkyl group.

$L_{t1}$ each independently represents a single bond, an alkylene group, an arylene group, or the combination thereof, —O— or —COO— may be inserted therebetween, and $L_{t1}$ may be linked via —O— between $L_{t2}$ and $L_{t1}$ when linking with $L_{t2}$.

$R_{t4}$, $R_{t5}$, and $R_{t6}$ each independently represent an alkyl group or an aryl group.

$L_{t2}$ represents an alkylene group or an arylene group which has at least one electron-withdrawing group.

An alkyl group as $R_{t1}$ to $R_{t3}$ may have a substituent group and examples thereof include an alkyl group with 20 or less carbon atoms such as a methyl group, an ethyl group, a propyl group, an isopropyl group, an n-butyl group, a sec-butyl group, a hexyl group, a 2-ethylhexyl group, an octyl group, and dodecyl group, and an alkyl group with 8 or less carbon atoms is preferable.

An alkyl group which is included in the alkoxycarbonyl group is preferably the same as the alkyl group in $R_{t1}$ to $R_{t3}$ described above.

A cycloalkyl group may be a monocyclic type or polycyclic type and examples thereof preferably include a monocyclic type cycloalkyl group with 3 to 10 carbon atoms such as a cyclopropyl group, a cyclopentyl group, and a cyclohexyl group which may have a substituent group.

Examples of a halogen atom include a fluorine atom, a chloride atom, a bromine atom, and an iodine atom, and a fluorine atom is more preferable.

$R_{t1}$ and $R_{t2}$ are preferably a hydrogen atom and $R_{t3}$ is preferably a hydrogen atom or a methyl group.

Examples of an alkyl group of $R_{t7}$ include the same examples as the alkyl groups of $R_{t1}$ to $R_{t3}$.

$X_{t1}$ is preferably a single bond or —COO—.

$L_{t1}$ each independently represents a single bond, an alkylene group, an arylene group, or the combination thereof, —O— or —COO— may be inserted therebetween, and $L_{t1}$ may be linked via —O— between $L_{t2}$ and $L_{t1}$ when linking with $L_{t2}$.

An alkylene group with regard to $L_{t1}$ may be in a straight-chain form or in a branched form, may have a substituent group, is preferably an alkylene group with 1 to 8 carbon atoms, and examples thereof include a methylene group, an ethylene group, a propylene group, a butylene group, a hexylene group, an octylene group, and the like.

With regard to $L_{t1}$, an arylene group may have a substituent group, is preferably a 1,4-phenylene group, 1,3-phenylene group, 1,2-phenylene group, and 1,4-naphthylene group, and more preferably a 1,4-phenylene group.

When $X_{t1}$ is a single bond, from the viewpoint of removing out-of-band light of EUV light (a so-called EUV out-of-band light filter), $L_{t1}$ is preferably a group which includes an arylene group, and more preferably an arylene group. When $X_{t1}$ is —COO—, $L_{t1}$ is preferably a group which includes an alkylene group.

With regard to $R_{t4}$, $R_{t5}$, and $R_{t6}$, an alkyl group may have a substituent group and is preferably the same as the alkyl group in $R_{t1}$ to $R_{t3}$ described above.

With regard to $R_{t4}$, $R_{t5}$, and $R_{t6}$, an aryl group is preferably an aryl group with 6 to 20 carbon atoms, may be monocyclic or polycyclic, and may have a substituent group. Examples thereof include a phenyl group, a 1-naphthyl group, a 2-naphthyl group, a 4-methylphenyl group, a 4-methoxyphenyl group, and the like.

Examples of a preferable substituent group in each of the groups described above include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, and the like, the number of carbon atoms of the substituent group is preferably 8 or less, and, among these, a fluorine atom is more preferable.

An alkylene group which has at least one or more electron-withdrawing groups with regard to $L_{t2}$ is preferably an alkylene group with 1 to 8 carbon atoms which has at least one or more electron-withdrawing groups and examples thereof include a methylene group, an ethylene group, a propylene group, a butylene group, a hexylene group, an octylene group, and the like which have at least one or more electron-withdrawing groups.

With regard to $L_{t2}$, an arylene group which has at least one or more electron-withdrawing groups is preferably a 1,4-phenylene group, a 1,3-phenylene group, a 1,2-phenylene group, and a 1,4-naphthylene group which have at least one or more electron-withdrawing groups, and more preferably a 1,4-phenylene group.

The electron-withdrawing group is preferably a halogen atom, a cyano group, a nitro group, a hetero ring group, an alkoxycarbonyl group, a carboxyl group, an acyl group, an alkylsulfonyl group, an arylsulfonyl group, a sulfamoyl group, and a sulfonic acidic group, more preferably a fluorine atom, a chloride atom, a cyano group, an alkoxycarbonyl group, a carboxyl group, an acyl group, an alkylsulfonyl group, and an arylsulfonyl group, and most preferably a fluorine atom.

In the repeating units which are represented by General Formulas (I-1) to (I-5), repeating units which are represented by General Formula (I-1), (I-2), (I-3), or (I-5) are preferable, repeating units which are represented by General Formula (I-1), (I-2), or (I-3) are more preferable, and repeating units which are represented by General Formula (I-1) or (I-2) are even more preferable.

Other than the repeating units described above, the resin (T) which is contained in the top coat composition in the present invention is able to have various types of repeating units for a purpose of adjusting (1) the solubility with respect to a coating solvent, (2) the film-forming property (glass transition point), (3) the developing property (particularly the alkali developing property, and the like.

Examples of the repeating structure units include repeating units which are derived from the monomers which will be described below.

Examples of the monomers include a compound and the like which have one addition polymerizable unsaturated bond selected from (meth)acrylic acid, (meth)acrylic acid esters, vinyl esters (for example, vinyl acetate), styrenes (for example, styrene, p-hydroxystyrene), vinylpyrrolidone, (meth)acrylamides, an aryl compound, vinyl ethers, crotonical esters, and the like; however, the present invention is not limited thereto.

In addition, copolymerization may be carried out as long as the compound is an addition polymerizable unsaturated compound which is able to be copolymerized with monomers which are equivalent to the various types of the repeating structure units described above.

In the present invention, particularly when performing EUV exposure, from the viewpoint of functioning as a filter of out-of-band light, the resin (T) preferably has a repeating unit which has an aromatic ring.

From this viewpoint, as described above, $L_{51}$ in General Formulas (I-1) to (I-5) is preferably a group which includes an arylene group, and more preferably an arylene group. In addition, the resin (T) also preferably contains a repeating unit which has an aromatic ring other than the repeating unit which is represented by General Formulas (I-1) to (I-5). Examples of the repeating unit which has an aromatic ring include repeating units which are derived from monomers such as styrene, p-hydroxystyrene, phenyl acrylate, and phenyl methacrylate. It is preferable to have a repeating unit (d) which has a plurality of aromatic ring among these.

Examples of the repeating units (d) which have a plurality of aromatic rings include the same repeating units as for the repeating unit (d) which has a plurality of aromatic rings which is represented by General Formula (d1) which the resin (A) may have.

Among these, the repeating unit which is represented by General Formula (d2) is also preferable in the same manner.

Here, with regard to extreme ultraviolet ray (EUV light) exposure, leaking light (out-of-band light) which is generated in an ultraviolet ray region with a wavelength of 100 nm to 400 nm deteriorates surface roughness and, as a result, there is a tendency for the resolution or LWR performance to be decreased due to bridges between patterns or broken lines in the patterns.

However, the aromatic ring in the repeating unit (d) may function as an inner filter which is able to absorb the out-of-band light described above.

Specific examples of the repeating unit (d) are the same as the specific examples of the repeating unit (d) which the resin (A) may have.

The resin (T) may or may not contain the repeating unit (d); however, when contained, the content ratio of the repeating unit (d) is preferably in a range of 1 mol % to 30 mol % with respect to all of the repeating units of the resin (T) and more preferably in a range of 1 mol % to 20 mol %. The repeating units (d) which are included in the resin (T) may be included in a combination of two or more types.

It is possible to use the resin (C) described in the actinic ray-sensitive or radiation-sensitive resin composition as the resin (T) which is contained in the top coat composition. In particular, this is favorable in a case where the solvent in the top coat composition is an organic solvent.

The resin (T) which is contained in the top coat composition other than the resin (T) may be a water-soluble resin. In particular, this is favorable in a case where the solvent in the top coat composition is water or an alcohol-based solvent. It is considered that it is possible to increase the uniformity of the solubility due to the developer by the resin (T) being a water-soluble resin.

Examples of a preferable water-soluble resin include polyacrylic acid, polymethacrylic acid, polyhydroxystyrene, polyvinylpyrrolidone, polyvinyl alcohol, polyvinyl ether, polyvinyl acetal, polyacrylimide, polyethylene glycol, polyethylene oxide, polyethylene imine, polyester polyol, polyether polyol, polysaccharide, and the like. Polyacrylic acid, polymethacrylic acid, polyhydroxystyrene, polyvinylprrolidone, and polyvinyl alcohol are particularly preferable. Here, the water-soluble resin is not limited to a homopolymer and may be a copolymer. For example, the water-soluble resin may be a copolymer which has a monomer which is equivalent to the repeating unit of the homopolymer described above and other monomer units than this. In detail, it is also possible to use an acrylic acid-methacrylic acid copolymer, an acrylic acid-hydroxystyrene copolymer, and the like for the present invention.

It is possible to obtain commercially available water-soluble resins which may be used for the present invention and specific examples thereof include polyacrylic acid Julymer AC-10L (manufactured by Nihon Junyaku Corp.), poly (N-vinylpyrrolidone) Luviskol K90 (manufactured by BASF Corp.), (vinyl alcohol 60/vinyl acetate 40) copolymer SMR-8M (manufactured by Shin-Etsu Chemical Co., Ltd.), and the like.

In addition, the resin (T) may be used as one type or a plurality thereof may be used together.

The weight average weight molecular of the resin (T) is not particularly limited, but is preferably 2000 to 1000000, more preferably 5000 to 100000, and particularly preferably 6000 to 50000. Here, the weight average molecular weight of the resin indicates a polystyrene conversion molecular weight which is measured by GPC (carrier: THF or N-methyl-2-pyrrolidone (NMP)).

In addition, the dispersity (Mw/Mn) is preferably 1.00 to 5.00, more preferably 1.00 to 3.50, and even more preferably 1.00 to 2.50.

Other components than the resin (T) may be included in the top coat composition; however, the ratio of the resin (T) in the solid content of the top coat composition is preferably 80 mass % to 100 mass %, more preferably 90 mass % to 100 mass %, and particularly preferably 95 mass % to 100 mass %.

Specific examples of the resin (T) which is contained in the top coat composition will be shown below; however, the present invention is not limited thereto. The compositional ratio of each of the repeating units in each of the specific examples is represented by a mol ratio.

T-1

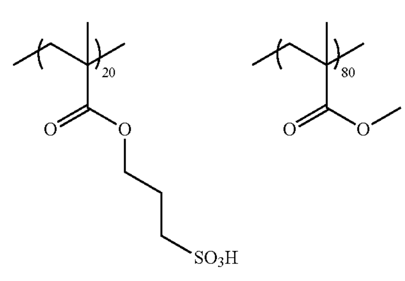

-continued
T-2
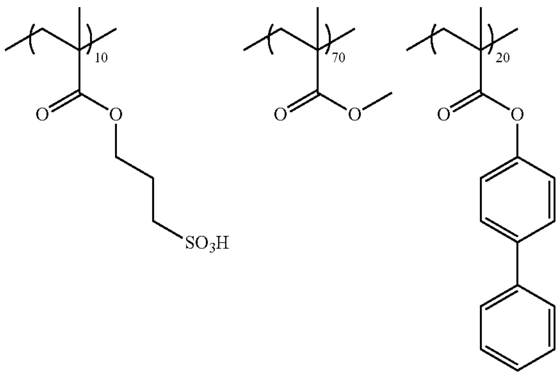
T-3
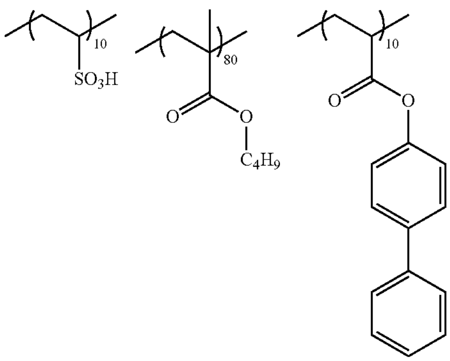
T-4
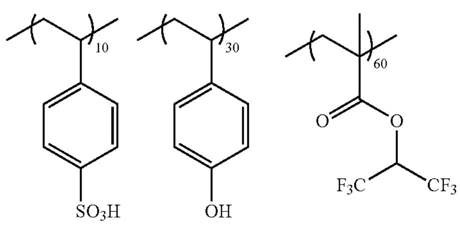
T-5
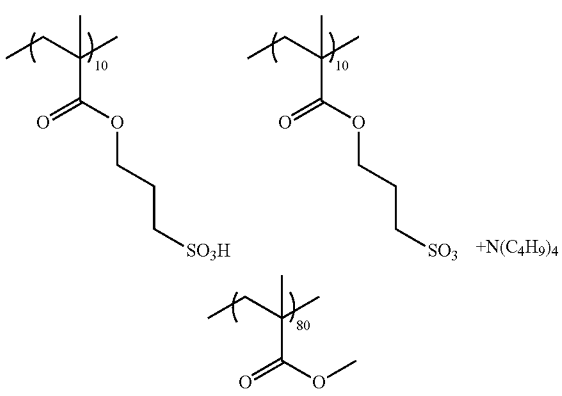
T-6
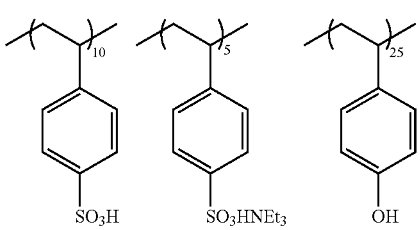
-continued
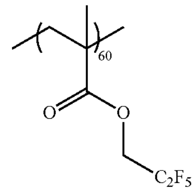
T-7
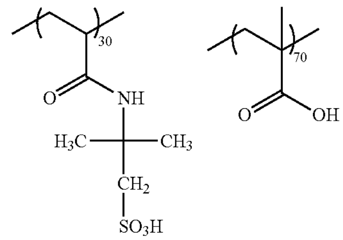
T-8
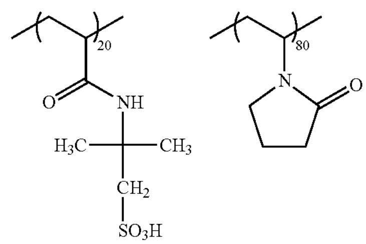
T-9
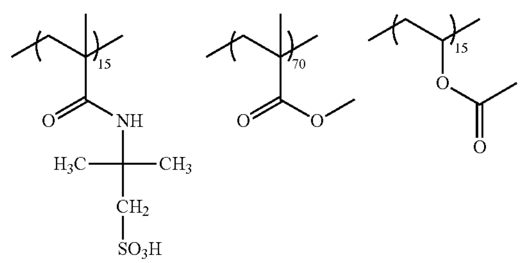
T-10
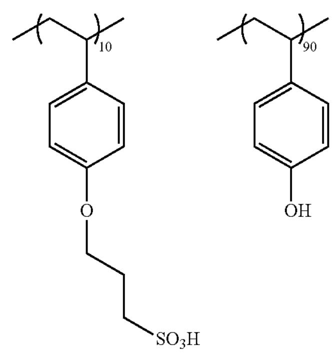
T-11
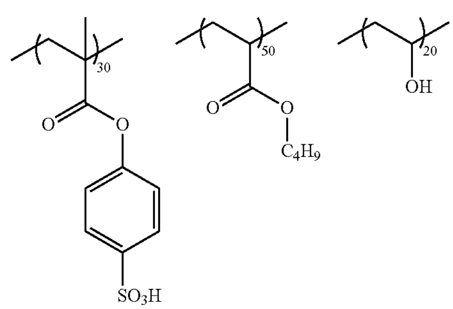

-continued
T-12
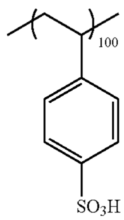
T-13
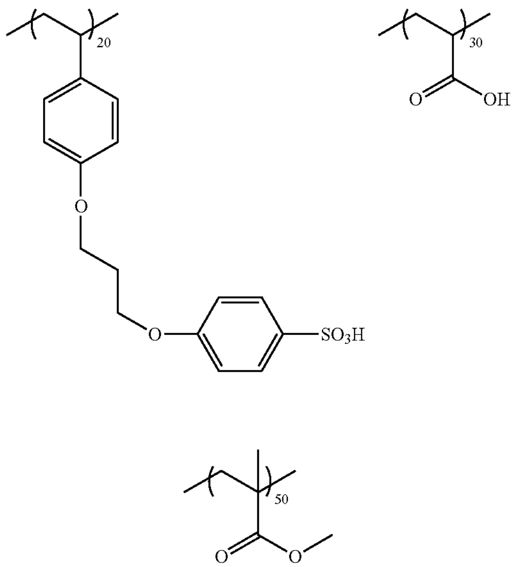
T-14
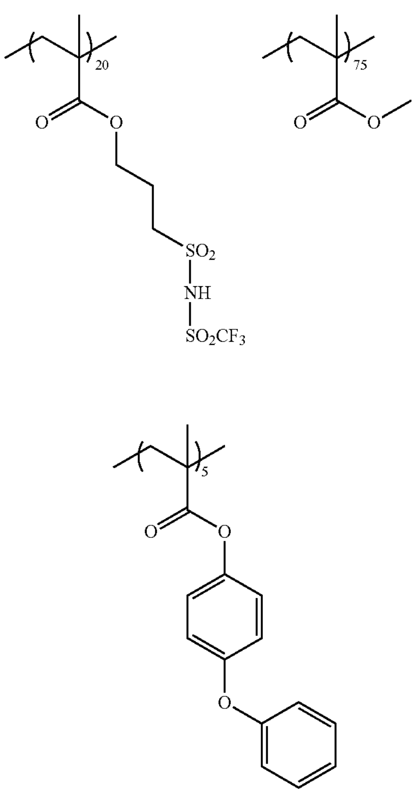
-continued
T-15
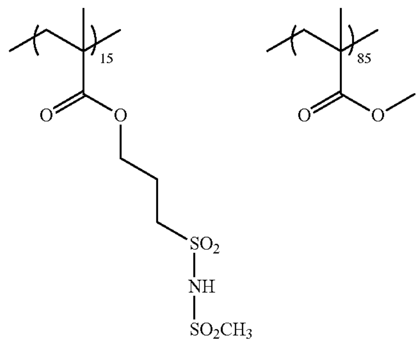
T-16
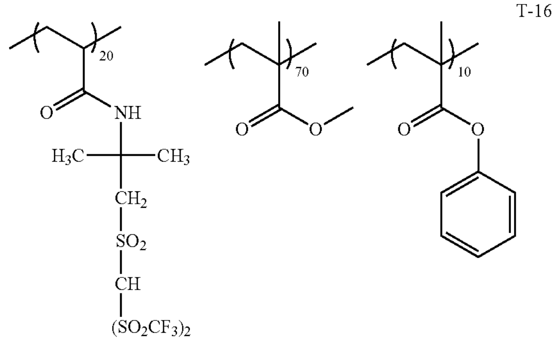
T-17
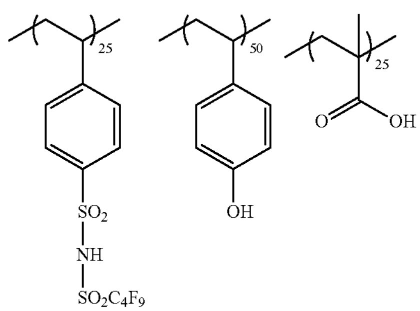
T-18
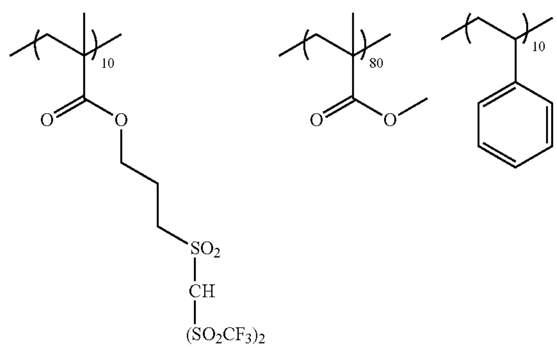

-continued
T-19
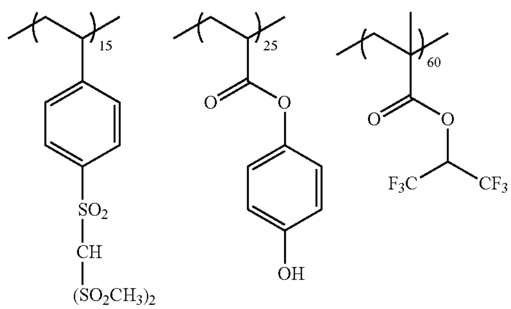
T-20
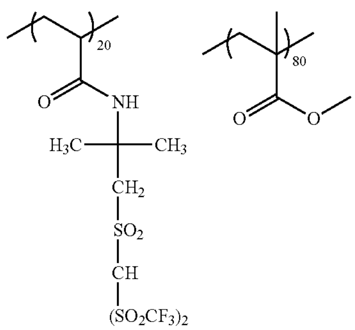
T-21
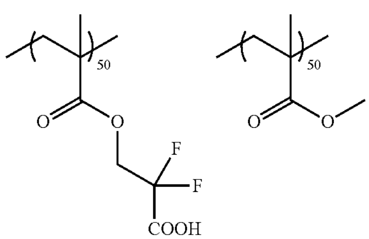
T-22
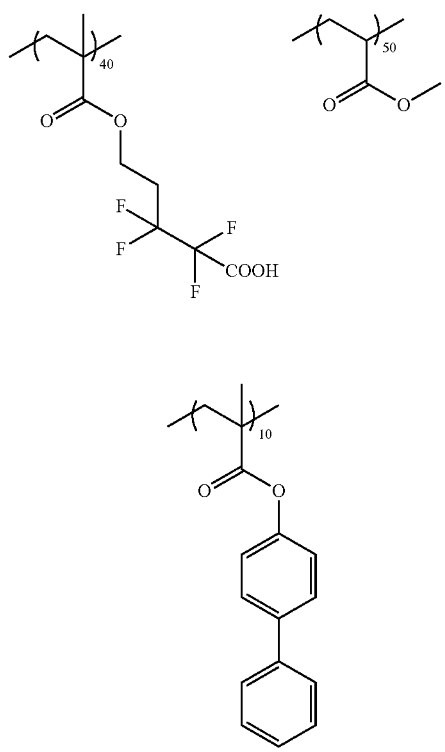
-continued
T-23
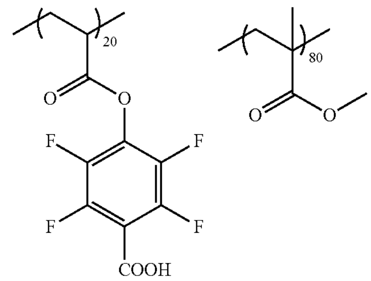
T-24
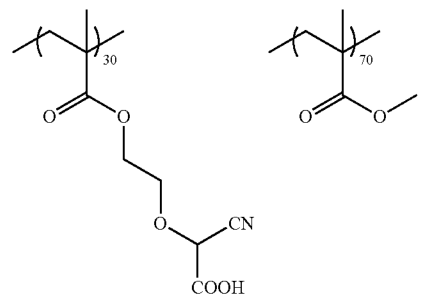
T-25
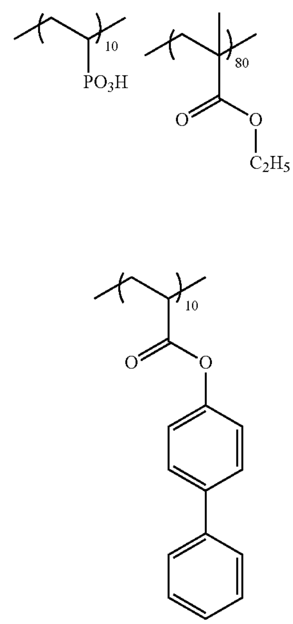
T-26
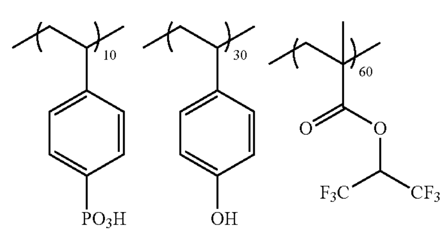

-continued

T-27

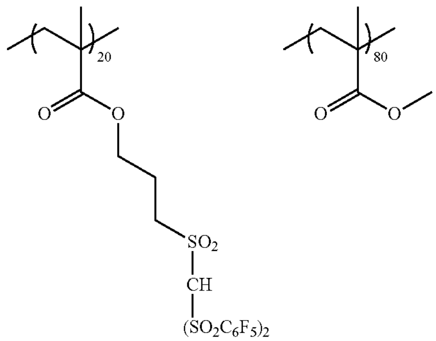

T-28

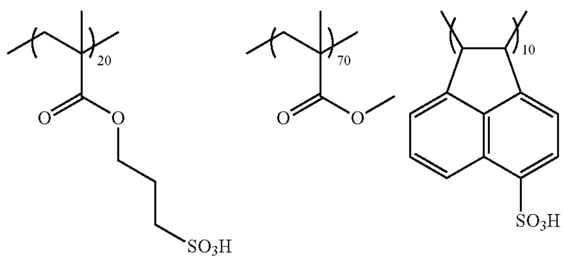

TT-1

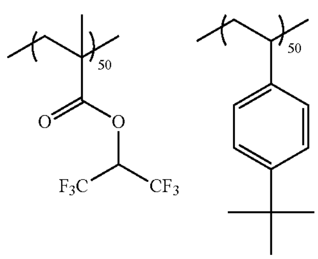

TT-2

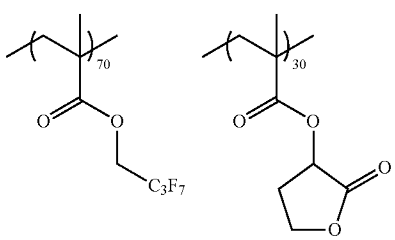

TT-3

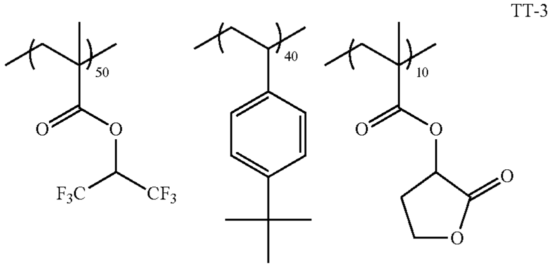

Examples of other components than the resin (T) which may be contained in the top coat composition include a surfactant, a compound which generates an acid when irradiated with actinic rays or radiation, a basic compound, and the like. In a case of including a compound which generates an acid when irradiated with actinic rays or radiation and a basic compound, specific examples thereof and the contents thereof include the same compounds as the compound (B) which generates an acid when irradiated with actinic rays or radiation and the basic compound described in the section for the actinic ray-sensitive or radiation-sensitive resin composition and the contents thereof.

In a case of using a surfactant, the usage amount of the surfactant is preferably 0.0001 mass % to 2 mass % with respect to the solid content mass of the top coat composition, and more preferably 0.001 mass % to 1 mass %.

By adding a surfactant to the top coat composition, the coating property may be improved in a case of coating the top coat composition. Examples of the surfactant include nonionic, anionic, cationic, and amphoteric surfactants.

As a nonionic surfactant, it is possible to use the Plufarac series manufactured by BASF Corp., the ELEBASE series, Finesurf series, and Brownon series manufactured, by Aoki Oil Industrial Co., Ltd., Adeka Pluronic P-103 manufactured by Adeka Corp., the Emulgen series, Ameet series, Aminoon PK-02S, Emanoon CH-25, and Leodol series manufactured by Kao Corp., Surflon S-141 manufactured by AGC Seimi Chemical Co., Ltd., the Noigen series manufactured by DKS Co. Ltd., the Newcalgen series manufactured by Takemono Oil & FAT Co., Ltd., DYNOL 604, EnviroGem AD01, the Olfine EXP series, and Surfynol series manufactured by Nissin Chemical Industry Co., Ltd., Ftergent 300 manufactured by Ryoko Chemical Co., Ltd., and the like.

As an anionic surfactant, it is possible to use Emal 20T and Poise 532A manufactured by Kao Corp., Phosphanol ML-200 manufactured by TOHO Corp., the EMULSOGEN series manufactured by Clariant Japan Corp., Surflon S-111N and Surflon S-211 manufactured by AGC Seimi Chemical Co., Ltd., the Prisurf series manufactured by DKS Co. Ltd., the Pionine series manufactured by Takemono Oil & FAT Co., Ltd., Olfine PD-201 and Olfine PD-202 manufactured by Nissin Chemical Industry Co., Ltd., AKYPO RLM45 and ECT-3 manufactured by Nihon Surfactant Kogyo K.K., Lipon manufactured by Lion Corp., and the like.

As a cationic surfactant, it is possible to use Acetamine 24, Acetamine 86, and the like manufactured by Kao Corp.

As an amphoteric surfactant, it is possible to use Surflon S-131 (manufactured by AGC Seimi Chemical Co., Ltd.), Energicol C-40H and Lipomine LA (both are manufactured by Kao Corp.), and the like. In addition, it is also possible to mix the surfactants for use.

The top coat composition preferably has coating affinity with the resist film upper layer section and is more preferably able to be more evenly coated on the resist film upper layer without being mixed with the resist film.

The top coat composition of the present invention preferably contains water or an organic solvent and more preferably contains water.

In a case where the solvent is an organic solvent, it is preferably a solvent which does not dissolve a resist film. As a solvent which may be used, it is preferable to use an alcohol-based solvent, a fluorine-based solvent, and a hydrocarbon-based solvent, and it is more preferable to use a non-fluorine-based alcohol-based solvent. The alcohol-based solvent is preferably a primary alcohol from the viewpoint of the coating property and more preferably a primary alcohol with 4 to 8 carbon atoms. It is possible to use straight-chain, branched, and cyclic alcohols as the primary alcohol with 4 to 8 carbon atoms; however, straight-chain and branched alcohols are preferable. In detail, examples thereof include 1-butanol, 1-hexanol, 1-pentanol, 3-methyl-1-butanol, and the like.

The solid content concentration of the top coat composition in the present invention is preferably 0.1 mass % to 10 mass %, more preferably 0.2 mass % to 6 mass %, and even more preferably 0.3 mass % to 5 mass %. By setting the solid content concentration to be in these ranges, it is possible to evenly coat the top coat composition on a resist film.

Composition Kit

The present invention also relates to a composition kit which includes the top coat composition described above and the actinic ray-sensitive or radiation-sensitive resin composition.

The composition kit may be favorably applied to the pattern forming method of the present invention.

In addition, the present invention also relates to a resist film which is formed using the composition kit.

Usage

The pattern forming method of the present invention is favorably used for producing a semiconductor fine circuit such as manufacturing super LSI or microchips with a large capacity. Here, when producing a semiconductor fine circuit, after a resist film on which a pattern is formed is used for circuit forming or etching, since the remaining resist film section is ultimately removed by a solvent or the like, unlike a so-called permanent resist which is used for printed substrates and the like, a resist film which is derived from the actinic ray-sensitive or radiation-sensitive resin composition described in the present invention does not remain in the final product such as a microchip.

In addition, the present invention also relates to a manufacturing method of an electronic device which includes the pattern forming method of the present invention described above and an electronic device which is manufactured by the manufacturing method.

The electronic device of the present invention is favorably mounted on electrical and electronic devices (household electrical appliances, OA and media-related devices, optical devices, telecommunication devices, and the like).

EXAMPLES

Detail description will be further given below of the present invention using examples; however, the present invention is not limited to the examples below.

Synthesis Example 1: Synthesizing Resin (P-1)

20.0 g of poly(p-hydroxystyrene) (VP-2500, manufactured by Nippon Soda Co., Ltd.) was dissolved in 80.0 g of propylene glycol monomethyl ether acetate (PGMEA). 10.3 g of 2-cyclohexylethyl vinylether and 10 mg of camphor sulfonic acid were added to the solution and stirred for 3 hours at room temperature (25° C.). After adding 84 mg of triethylamine and stirring for a while, the reaction liquid was transferred to a separating funnel containing 100 mL of ethyl acetate. After cleaning the organic layer with 50 mL of distilled water three times, the organic layer was concentrated using an evaporator. After dissolving the obtained polymer in 300 mL of acetone, 17.5 g of (P-1) was obtained by carrying out dropwise addition into 3000 g of hexane, re-precipitating, and filtering the precipitation.

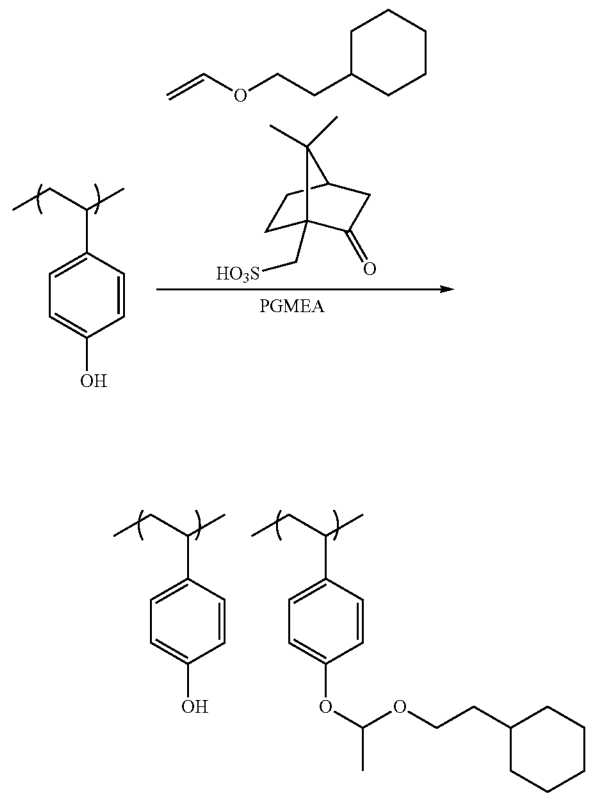

(P-1)

Synthesis Example 2: Synthesizing Resin (P-2)

10.00 g of p-acetoxystyrene was dissolved in 40 g of ethyl acetate and cooled to 0° C. and 4.76 g of sodium methoxide (a 28 mass % methanol solution) was added dropwise for 30 minutes and stirred for 5 hours at room temperature. After adding ethyl acetate and cleaning an organic phase with distilled water three times, 13.17 g of p-hydroxystyrene (a compound which is represented by Formula (1) below, a 54 mass % ethyl acetate solution) was obtained by drying using anhydrous sodium sulfate and distilling off the solvent. The obtained 8.89 g of 54 mass % ethyl acetate solution of p-hydroxystyrene (1) (containing 4.8 g of p-hydroxystyrene), 11.9 g of a compound which is represented by Formula (2) below (manufactured by OKNC Laboratories Co., Ltd.), 2.2 g of the compound which is represented by Formula (3) below (manufactured by Daicel Corp.), and 2.3 g of polymerization initiator V-601 (manufactured by Wako Pure Chemical Industries, Ltd.) were dissolved in 14.2 g of propylene glycol monomethyl ether (PGME). 3.6 g of PGME was put in a reaction container and the prepared solution was added dropwise thereto at 85° C. for 4 hours under a nitrogen gas atmosphere. The reaction solution was heated and stirred for 2 hours and left to cool to room temperature. 15.0 g of (P-2) was obtained by carrying out dropwise addition of the obtained reaction solution into 889 g of a mixed solution of hexane/ethyl acetate (8/2 (mass ratio)), re-precipitating, and filtering the precipitation.

-continued

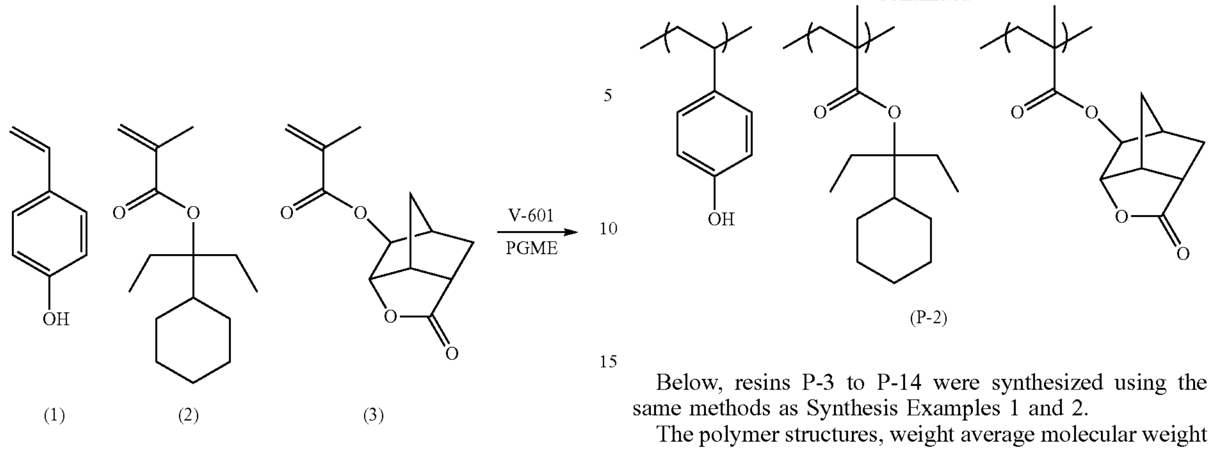

(1) (2) (3) (P-2)

Below, resins P-3 to P-14 were synthesized using the same methods as Synthesis Examples 1 and 2.

The polymer structures, weight average molecular weight (Mw), and dispersity (Mw/Mn) of the resins P-1 to P-14 will be shown below. In addition, the compositional ratio of each repeating unit of the polymer structures below is shown by mol ratio.

P-1

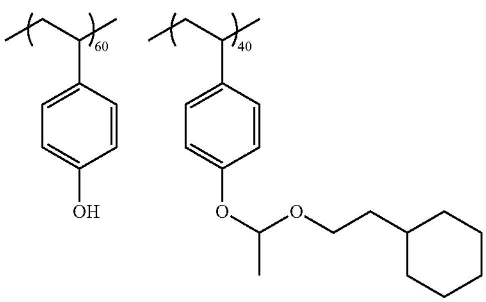

Mw: 4800
Mw/Mn: 1.20

P-2

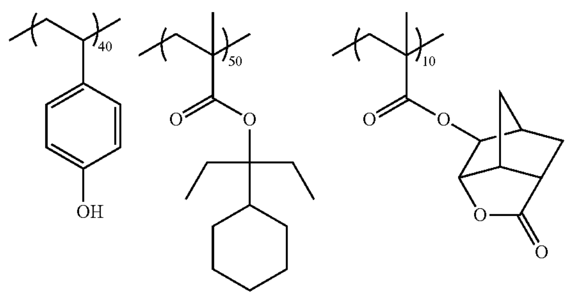

Mw: 13400
Mw/Mn: 1.57

P-3

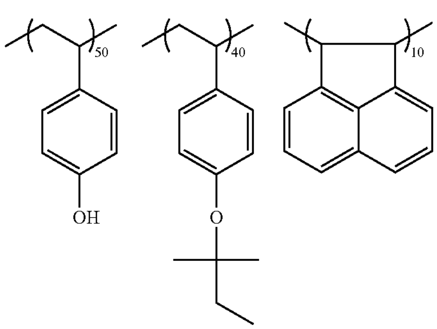

Mw: 13500
Mw/Mn: 1.61

P-4

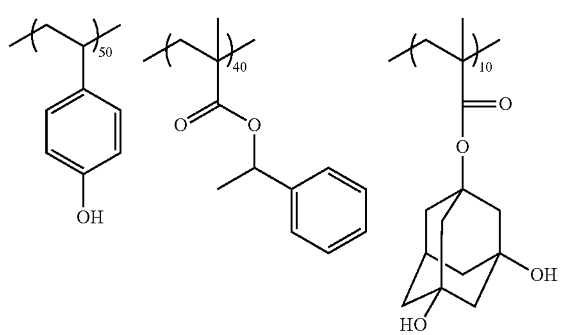

Mw: 15400
Mw/Mn: 1.72

-continued
P-5
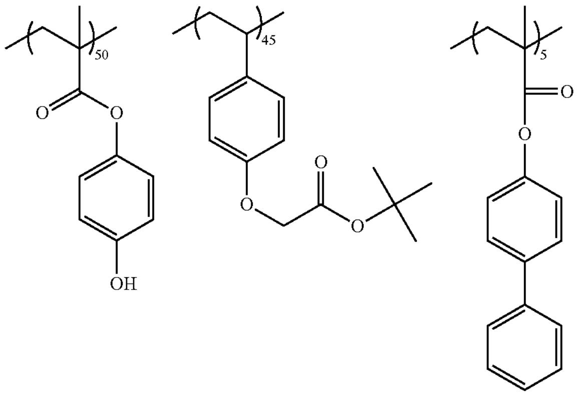
Mw: 10500
Mw/Mn: 1.81
P-6
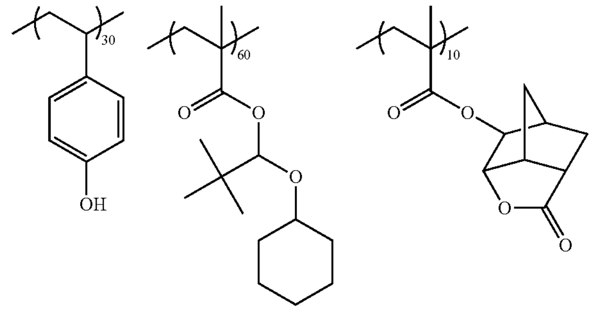
Mw: 13000
Mw/Mn: 1.47
P-7
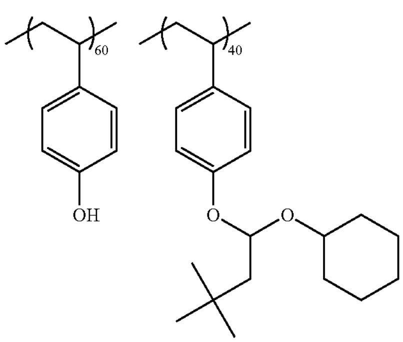
Mw: 4800
Mw/Mn: 1.18
P-8
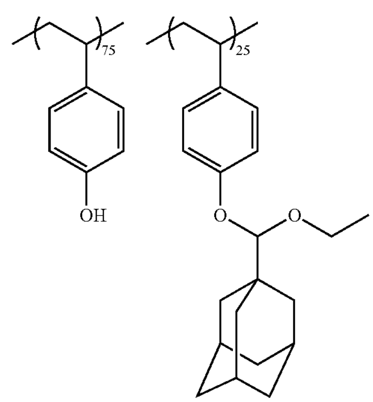
Mw: 9500
Mw/Mn: 1.21
P-9
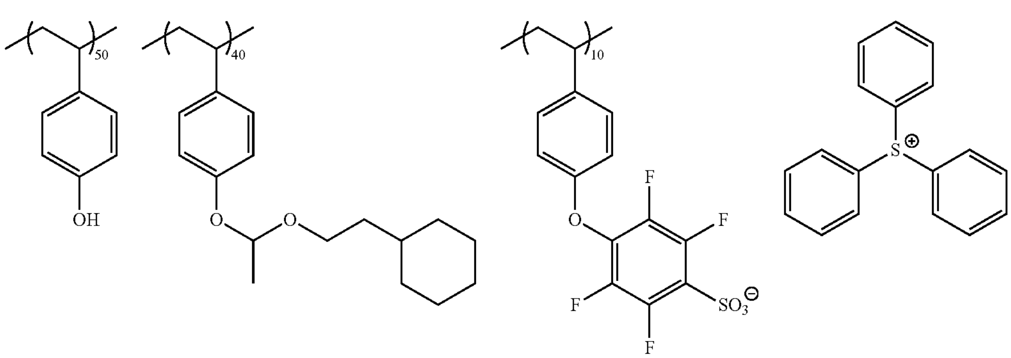
Mw: 12200
Mw/Mn: 1.79

-continued
P-10
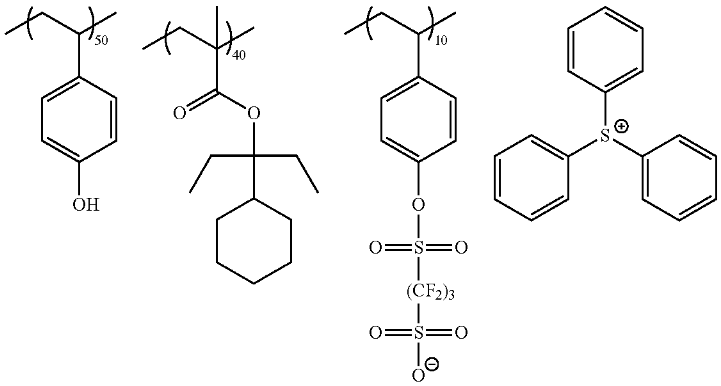
Mw: 12200
Mw/Mn: 1.74
P-11
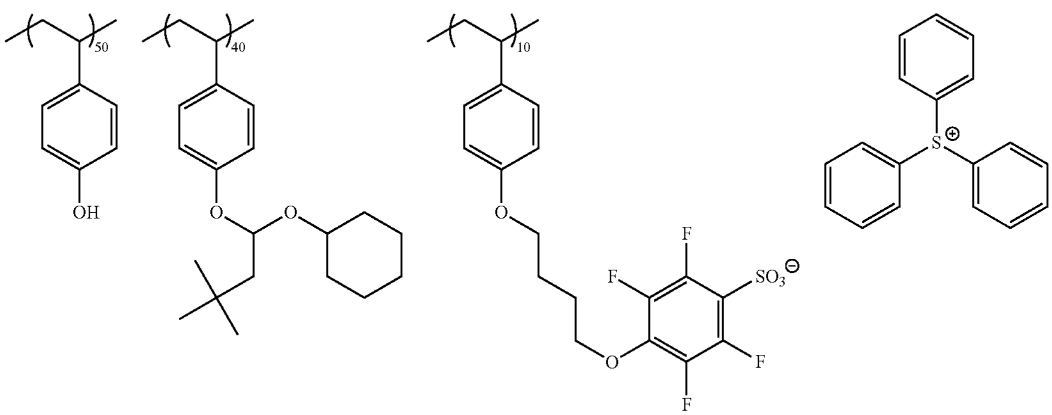
Mw: 10200
Mw/Mn: 1.21
P-12
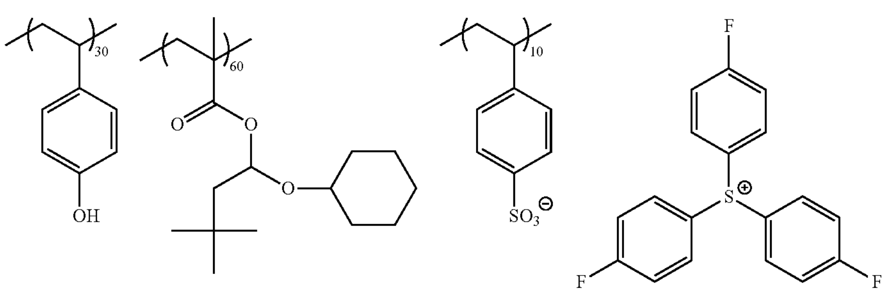
Mw: 13000
Mw/Mn: 1.82

-continued

P-13

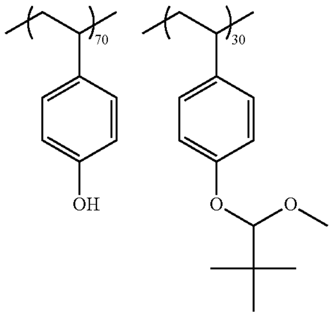

Mw: 4600
Mw/Mn: 1.18

P-14

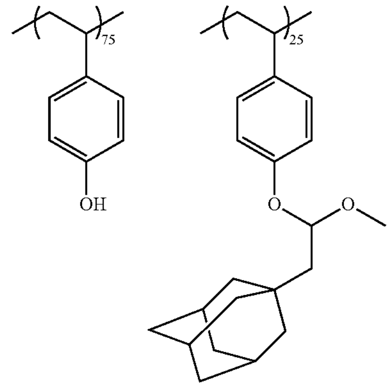

Mw: 6700
Mw/Mn: 1.18

Synthesis Example 3: Synthesizing Resin HR-31

Synthesis was carried out according to the scheme below.

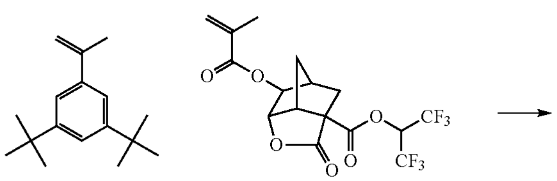

(4) (5)

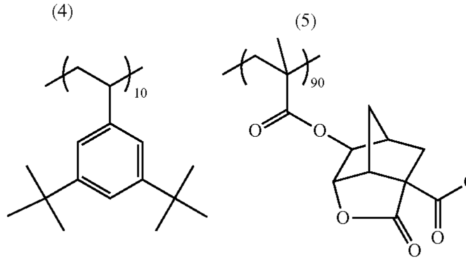

HR-31

1.08 g of a compound (4), 19.77 g of a compound (5), and 0.69 g of polymerization initiator V-601 (manufactured by Wako Pure Chemical Industries, Ltd.) were dissolved in 92.09 g of cyclohexanone. 23.02 g of cyclohexanone was put in a reaction container and dropwise addition thereto was performed at 85° C. for 4 hours under a nitrogen gas atmosphere. The reaction solution was heated and stirred for 2 hours and left to cool to room temperature.

The reaction solution described above was added dropwise to 1350 g of heptane/ethyl acetate=8/2 (mass ratio) and the polymer was precipitated and filtered. Using 400 g of the heptane/ethyl acetate=8/2 (mass ratio), running washing was performed on the filtered solid matter. After that, 9.55 g of a resin (the resin (HR-31)) was obtained by reducing pressure and drying the solid matter after cleaning.

With regard to the resin HR-31, using GPC (manufactured by Tosoh Corp.; HLC-8120; Tskgel Multipore HXL-M) with THF as a solvent, the weight average molecular weight and dispersity were measured. In addition, using NMR (manufactured by Bruker BioSpin K.K.; AVANCEIII400 type), the compositional ratio was calculated by $^{1}$H-NMR or $^{13}$C-NMR. The results are shown in Table 1 above.

In the same manner as the resin HR-31, resins HR-1, HR-24, HR-26, and HR-30 to HR-40 were synthesized. Specific examples of the synthesized polymer structure, composition ratio, weight average molecular weight (Mw), and dispersity (Mw/Mn) are as described above.

Synthesis Example 4: Synthesizing Resin T for Top Coat

Synthesis was carried out according to the scheme below.

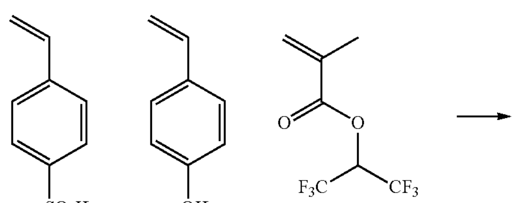

(1) (2) (3)

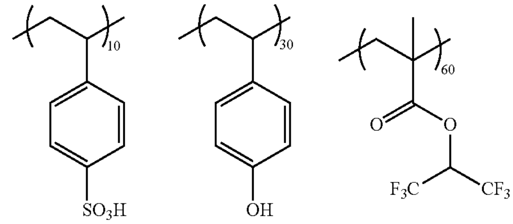

T-4

32.5 g of 1-methoxy-2-propanol was heated to 80° C. under a nitrogen atmosphere. While stirring the liquid, a mixed solvent of 1.53 g of monomer (1), 3.00 g of monomer (2), 11.81 g of monomer (3), 32.5 g of 1-methoxy-2-propanol, and 1.61 g of 2,2'-azobisiso butyric acid dimethyl [V-601, manufactured by Wako Pure Chemical Industries, Ltd.] was added dropwise for 2 hours. After finishing the dropwise addition, the mixed solvent was further stirred at 80° C. for 4 hours. After leaving the reaction liquid to be cooled, 20.5 g of a resin T-4 for a top coat was obtained by performing re-precipitation and vacuum drying using a large amount of hexane.

In the same manner as the resin T-4, resins T-2, T-12, TT-1, TT-2, and TT-3 were synthesized. Specific examples of the synthesized polymer structures are as above.

In addition, the weight average molecular weight (Mw) and dispersity (Mw/Mn) of each resin which was synthesized as above and used in the examples which will be described below are shown in the table below.

TABLE 3

| | Weight average molecular weight | Dispersity |
|---|---|---|
| T-2 | 14000 | 1.68 |
| T-4 | 13000 | 1.45 |
| T-12 | 10000 | 1.50 |
| TT-1 | 8000 | 1.45 |
| TT-2 | 7000 | 1.53 |
| TT-3 | 6000 | 1.48 |

The resins TT-4, TT-5, and TT-6 described below were also used as a top coat resin.

TT-4: Polyacrylic acid Julymer AC-10L (manufactured by Nihon Junyaku Co., Ltd.)

TT-5: Poly(N-vinylpyrrolidone) Luviskol K90 (manufactured by BASF Japan Ltd.)

TT-6: (vinyl alcohol 60/vinyl acetate 40 (mol ratio)) copolymer SMR-8M (manufactured by Shin-Etsu Chemical Co., Ltd.)

Photoacid Generator

A photoacid generator was used by appropriately selecting from the acid generating agents z1 to z141 described above.

Basic Compound

All of the compounds (N-1) to (N-11) described below were used as a basic compound.

N-1

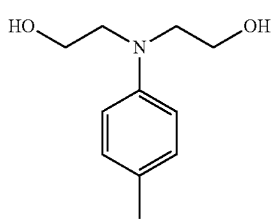

N-2

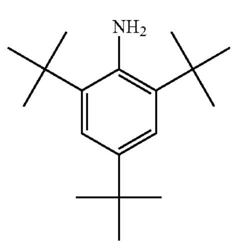

N-3

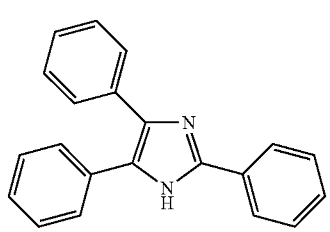

-continued

N-4

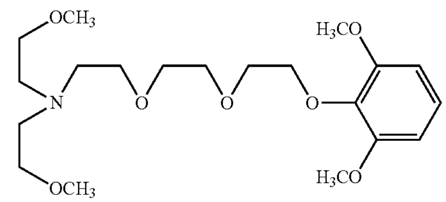

N-5

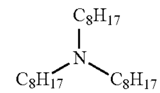

N-6

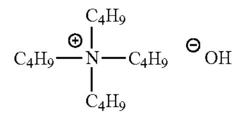

N-7

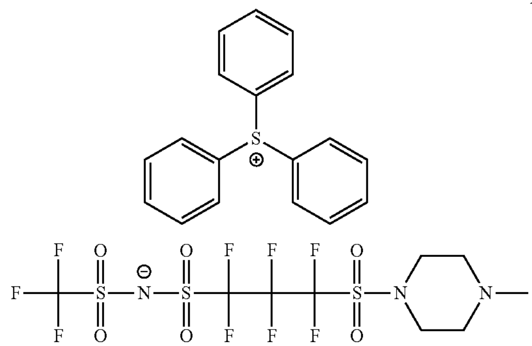

N-8

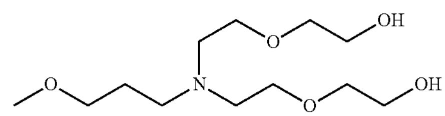

N-9

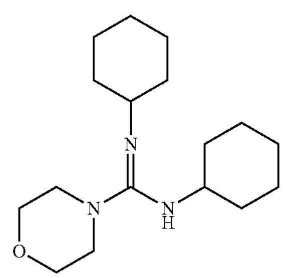

N-10

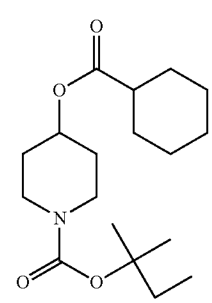

-continued

N-11

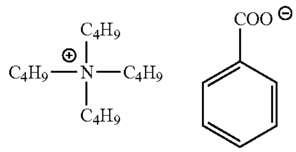

Here, the compound (N-7) described above corresponds to the compound (PA) described above and was synthesized based on the description in paragraph [0354] of JP2006-330098A.

Surfactant

W-1 to W-4 described below were used as surfactants.

W-1: Megafac R08 (manufactured by DIC Inc.; fluorine and silicon-based)

W-2: Polysiloxane polymer KP-341 (manufactured by Shin-Etsu Chemical Co., Ltd.; silicon-based)

W-3: Troyzol S-366 (manufactured by Troy Chemical Industries, Inc.; fluorine-based)

W-4: PF6320 (manufactured by OMNOVA Corp.; fluorine-based)

Resist Coating Solvent

The following were used as resist coating solvents.

S1: Propylene glycol monomethyl ether acetate (PGMEA)

S-2: Propylene glycol monomethyl ether (PGME)

S-3: Ethyl lactate

S-4: Cyclohexanone

Top Coat Coating Solvent

The following were used as top coat coating solvents.

TS-1: Water

TS-2: Methanol

TS-3: Water:methanol=1:1 (mass ratio)

TS-4: Butanol

TS-5: Acetonitrile

Examples 101 to 119 and Comparative Examples 101 to 109 Electron Beams (EB) Exposure (Alkali Developing Positive Type)

(1) Preparation of Top Coat Composition

The resin for a top coat (top coat polymer) shown in the table below was dissolved in the top coat coating solvent shown in the table below, the resultant was filtered using a polytetrafluoroethylene filter with a pore size of 0.1 μm, and a top coat composition with a solid content concentration of 1 mass % was prepared.

(2) Coating Liquid Preparation and Coating of an Actinic Ray-Sensitive or Radiation-Sensitive Resin Composition An actinic ray-sensitive or radiation-sensitive resin composition (a resist composition) solution was obtained by finely filtering a coating liquid composition with a solid content concentration of 3 mass % which has the composition described in the Table below using a membrane filter with a hole diameter of 0.1 μm.

The actinic ray-sensitive or radiation-sensitive resin composition was coated on a 6-inch Si wafer on which a hexamethyldisilazane (HMDS) treatment was carried out in advance using a spin coater Mark 8 manufactured by Tokyo Electron Co., Ltd. and dried on a hot plate at 100° C. for 60 seconds to obtain a resist film with a film thickness of 100 nm.

The prepared top coat composition was evenly coated on the resist film by spin coating, heating and drying were performed on a hot plate at 120° C. for 90 seconds, and a film where the total film thickness of the resist film and the top coat layer was 140 nm was formed.

(3) EB Exposure and Developing

Pattern irradiation was performed on a wafer on which the resist film with the top coat layer which was obtained in (2) described above was coated using an electron beam drawing apparatus (HL750 manufactured by Hitachi Ltd., acceleration voltage 50 KeV). At this time, drawing was performed such that a 1:1 line and space was formed. After the electron beam drawing, after heating on a hot plate at 110° C. for 60 seconds and then dipping for 60 seconds using a 2.38 mass % tetramethyl ammonium hydroxide (TMAH) aqueous solution, a resist pattern of a 1:1 line and space pattern with a line width of 60 nm was obtained by rinsing with water for 30 seconds and drying.

(4) Evaluation of Resist Pattern

Using a scanning electron microscope (S-9220 manufactured by Hitachi Ltd.), the obtained resist pattern was evaluated with regard to the sensitivity, resolving power, LWR, pattern shape, blob defect reduction, and out gas reduction with the methods described below.

(4-1) Sensitivity

The irradiation energy when resolving a pattern where line/space=1:1 with a line width of 60 nm was set as the sensitivity (Eop). A smaller value indicates that the performance is more favorable.

(4-2) Resolving Power

The limit resolving power (the shortest line width at which lines and spaces are separated and resolved) of a line and space pattern (line:space=1:1) for the Eop was obtained. Then, the value was set as the "resolving power (nm)". A smaller value indicates that the performance is more favorable.

(4-3) LWR

Regarding LWR, for 50 arbitrary 0.5 μm points in the longitudinal direction of a resist pattern where the line/space=1:1 in the Eop, the line width was measured, the standard deviation was obtained, and 3σ was calculated. A smaller value indicates that the performance is more favorable.

(4-4) Pattern Shape Evaluation

Evaluation of three phases of rectangular, taper, and reverse taper was performed by observing a cross-sectional shape of a 1:1 line and space pattern with a line width of 60 nm with an irradiation amount which indicates the sensitivity described above using a scanning electron microscope (S-4300 manufactured by Hitachi Ltd.).

(4-5) Blob Defect Reduction Evaluation

With regard to the obtained resist pattern described above, the number of blob defects was measured using KLA-2360 manufactured by KLA-Tencor Corp. An inspection area at this time was 205 $cm^2$ in total, the pixel size was 0.25 μm, the threshold=30, and visible light was used as the inspection light. Evaluation was carried out by setting a value obtained by dividing the obtained numeric value by the inspection area as the number of blob defects (number/$cm^2$). The evaluation was A when the value was less than 1.0, B when the value was 1.0 to less than 3.0, C when the value was 3.0 to less than 5.0, D when the value was 5.0 to less than 10.0, and E when the value was 10.0 or more. A smaller value indicates that the performance is more favorable.

(4-6) Out Gas Reduction Evaluation

The entire surface was exposed using an electron beam irradiation apparatus (HL750 manufactured by Hitachi Ltd., acceleration voltage 50 KeV), when the minimum irradiation energy which is necessary for complete dissolution in the developing was Eth, simplified evaluation was carried out on an out gas amount from a film thickness decreased width (shrink film thickness (nm)) after the exposure after applying irradiation energy which was 1.5 times Eth. Since the shrink film thickness correlates with the amount of components which were volatilized from the resist film by the exposure, it is understood that the smaller the shrink film thickness, the better the out gas characteristics.

The evaluation results are shown in the table below.

TABLE 4

Evaluation result in EB exposure (alkali developing positive type)

| | Resin (A) | Concentration | Acid generating agent | Concentration | Basic compound | Concentration | Resin (C) | Concentration | Resist solvent | Mass ratio |
|---|---|---|---|---|---|---|---|---|---|---|
| Example 101 | P-1 | 64.95 | z113 | 30 | N-6 | 2 | HR-31 | 3 | S1/S2 | 40/60 |
| Example 102 | P-1 | 61.95 | z128 | 30 | N-11 | 2 | HR-33 | 6 | S1/S2 | 40/60 |
| Example 103 | P-2 | 58.95 | z124 | 35 | N-11 | 3 | HR-32 | 3 | S1/S2 | 40/60 |
| Example 104 | P-3 | 73.95 | z108 | 20 | N-8 | 2 | HR-26 | 4 | S1/S3 | 40/60 |
| Example 105 | P-4 | 68.95 | z117 | 25 | N-10 | 2 | HR-1 | 4 | S1/S2 | 40/60 |
| Example 106 | P-5 | 82.00 | z1 | 15 | N-9 | 1 | HR-38 | 2 | S1/S2/S3 | 30/60/10 |
| Example 107 | P-6 | 62.95 | z132 | 30 | N-11 | 2 | HR-36 | 5 | S1/S2 | 40/60 |
| Example 108 | P-6 | 64.95 | z135 | 30 | N-11 | 2 | HR-31 | 3 | S1/S2 | 40/60 |
| Example 109 | P-7 | 50.95 | z113 | 40 | N-11 | 3 | HR-36 | 6 | S1/S2 | 40/60 |
| Example 110 | P-7 | 62.95 | z112/z4 = 1:1 (mass ratio) | 30 | N-7 | 2 | HR-34 | 5 | S1/S4 | 40/60 |
| Example 111 | P-8 | 72.95 | z99 | 20 | N-3 | 1 | HR-37 | 6 | S1/S2 | 40/60 |
| Example 112 | P-8 | 56.95 | z134 | 35 | N-6 | 2 | HR-35 | 6 | S1/S2 | 40/60 |
| Example 113 | P-9 | 94.95 | None | | N-10 | 2 | HR-40 | 3 | S1/S2 | 40/60 |
| Example 114 | P-10 | 94.95 | None | | N-1 | 2 | HR-30 | 3 | S1/S2 | 40/60 |
| Example 115 | P-11 | 90.95 | None | | N-2 | 2 | HR-34 | 7 | S1/S2 | 40/60 |
| Example 116 | P-12 | 93.95 | None | | N-3 | 3 | HR-39 | 3 | S1/S2 | 40/60 |
| Example 117 | P-13 | 62.95 | z113 | 30 | N-11 | 2 | HR-36 | 5 | S1/S4 | 40/60 |
| Example 118 | P-13 | 51.95 | z132 | 40 | N-6 | 2 | HR-37 | 6 | S1/S4 | 40/60 |
| Example 119 | P-14/P-7 = 1:1 (mass ratio) | 64.95 | z121 | 30 | N-5 | 2 | HR-24 | 3 | S1/S2 | 40/60 |
| Comparative Example 101 | P-1 | 67.95 | z113 | 30 | N-6 | 2 | None | | S1/S2 | 40/60 |
| Comparative Example 102 | P-1 | 67.95 | z113 | 30 | N-6 | 2 | None | | S1/S2 | 40/60 |
| Comparative Example 103 | P-1 | 64.95 | z113 | 30 | N-6 | 2 | HR-31 | 3 | S1/S2 | 40/60 |
| Comparative Example 104 | P-6 | 67.95 | z132 | 30 | N-11 | 2 | None | | S1/S2 | 40/60 |
| Comparative Example 105 | P-6 | 67.95 | z132 | 30 | N-11 | 2 | None | | S1/S2 | 40/60 |
| Comparative Example 106 | P-6 | 64.95 | z132 | 30 | N-11 | 2 | HR-36 | 3 | S1/S2 | 40/60 |
| Comparative Example 107 | P-9 | 97.95 | None | | N-10 | 2 | None | | S1/S2 | 40/60 |
| Comparative Example 108 | P-9 | 97.95 | None | | N-10 | 2 | None | | S1/S2 | 40/60 |

TABLE 4-continued

| | | | | | | | | | |
|---|---|---|---|---|---|---|---|---|---|
| Comparative Example 109 | P-9 | 94.95 | None | | N-10 | 2 | HR-40 | 3 | S1/S2 | 40/60 |

| | Surfactant | Concentration | Top coat polymer | Top coat solvent | Sensitivity (μC/cm²) | Resolving power (nm) | LWR (nm) | Pattern form | Blob defects | Out gas (shrink film thickness (nm)) |
|---|---|---|---|---|---|---|---|---|---|---|
| Example 101 | W-1 | 0.05 | TT-1 | TS-4 | 27.0 | 45 | 3.7 | Rectangular | B | 2 |
| Example 102 | W-2 | 0.05 | TT-3 | TS-2 | 27.5 | 45 | 3.7 | Rectangular | B | 2 |
| Example 103 | W-1 | 0.05 | TT-2 | TS-5 | 27.0 | 45 | 3.8 | Rectangular | C | 3 |
| Example 104 | W-1 | 0.05 | TT-5 | TS-4 | 28.0 | 50 | 3.9 | Rectangular | C | 3 |
| Example 105 | W-2 | 0.05 | TT-6 | TS-4 | 28.0 | 50 | 3.9 | Rectangular | C | 3 |
| Example 106 | None | | TT-2 | TS-5 | 29.0 | 50 | 4.0 | Rectangular | C | 3 |
| Example 107 | W-1 | 0.05 | T-4 | TS-2 | 26.0 | 40 | 3.5 | Rectangular | A | 1 |
| Example 108 | W-4 | 0.05 | T-12 | TS-1 | 26.5 | 40 | 3.6 | Rectangular | B | 2 |
| Example 109 | W-1 | 0.05 | T-2/T-4 = 1:1 (mass ratio) | TS-3 | 26.0 | 40 | 3.5 | Rectangular | A | 1 |
| Example 110 | W-1 | 0.05 | T-2 | TS-3 | 26.5 | 40 | 3.6 | Rectangular | A | 2 |
| Example 111 | W-2 | 0.05 | T-4 | TS-2 | 26.0 | 40 | 3.5 | Rectangular | A | 1 |
| Example 112 | W-1/W-2 (mass ratio 1/1) | 0.05 | T-2 | TS-3 | 26.5 | 40 | 3.6 | Rectangular | A | 2 |
| Example 113 | W-3 | 0.05 | TT-4 | TS-4 | 28.0 | 45 | 3.7 | Rectangular | B | 2 |
| Example 114 | W-1 | 0.05 | TT-6 | TS-4 | 28.5 | 45 | 3.8 | Rectangular | C | 3 |
| Example 115 | W-1 | 0.05 | T-12 | TS-3 | 25.0 | 35 | 3.4 | Rectangular | A | 1 |
| Example 116 | W-1 | 0.05 | TT-1/TT-3 = 1:1 (mass ratio) | TS-2 | 26.0 | 40 | 3.6 | Rectangular | C | 2 |
| Example 117 | W-1 | 0.05 | T-2 | TS-3 | 25.5 | 35 | 3.4 | Rectangular | A | 1 |
| Example 118 | W-1 | 0.05 | T-4 | TS-2 | 25.5 | 35 | 3.4 | Rectangular | A | 1 |
| Example 119 | W-1 | 0.05 | TT-4 | TS-4 | 27.5 | 45 | 3.8 | Rectangular | C | 3 |
| Comparative Example 101 | W-1 | 0.05 | None | None | 32.0 | 55 | 4.6 | Reverse taper | E | 7 |
| Comparative Example 102 | W-1 | 0.05 | TT-1 | TS-5 | 31.0 | 55 | 4.4 | Rectangular | E | 4 |
| Comparative Example 103 | W-1 | 0.05 | None | None | 31.0 | 55 | 4.3 | Rectangular | D | 6 |
| Comparative Example 104 | W-1 | 0.05 | None | None | 31.0 | 55 | 4.4 | Reverse taper | E | 9 |
| Comparative Example 105 | W-1 | 0.05 | T-4 | TS-2 | 30.5 | 55 | 4.2 | Rectangular | E | 4 |
| Comparative Example 106 | W-1 | 0.05 | None | None | 30.5 | 55 | 4.1 | Rectangular | D | 8 |
| Comparative Example 107 | W-1 | 0.05 | None | None | 31.0 | 55 | 4.5 | Reverse taper | E | 7 |

TABLE 4-continued

| | | | | | | | | | | |
|---|---|---|---|---|---|---|---|---|---|---|
| Comparative Example 108 | W-1 | 0.05 | TT-4 | TS-4 | 32.0 | 55 | 4.5 | Reverse taper | E | 4 |
| Comparative Example 109 | W-1 | 0.05 | None | None | 30.0 | 55 | 4.3 | Rectangular | D | 6 |

The concentration of each component represents the concentration (mass %) in the total solid content concentration.

As is clear from the results shown in the table above, it is understood that in Comparative Examples 101 to 109 in which either or both of the top coat layer and the resin (C) were not used, there was a great deal of out gas generation, the sensitivity, resolving power, and LWR were also poor, there was also a great deal of generation of blob defects, and the pattern shape was also a reverse taper.

On the other hand, it is understood that in the Examples 101 to 119 which contained the resin (C) and had a top coat layer, there was little out gas generation, the sensitivity, resolving power, and LWR were excellent, there was also little generation of blob defects, and the pattern shape was rectangular.

In more detail, for example, it is understood that in Examples 101, 107, and 113, out gas suppression and blob defect suppression were both excellent with respect to the corresponding Comparative Examples 103, 106, and 109 which were configured of the same components except for not having a top coat layer. From this, it may be considered that, by placing a top coat layer, not only is the volatility of decomposed matter of an acid-decomposable group or a photoacid generator of the resin prevented, but there is also an effect that blob defect suppression is also excellent, probably due to making the resist film surface hydrophilic.

In the same manner, for example, it is understood that in Examples 101, 107, and 113, blob defect suppression and out gas suppression were both excellent with respect to the corresponding Comparative Examples 102, 105, and 108 which were configured of all of the same components except for not having the resin (C). From this, it may be considered probable that, since the resin (C) is hydrophobic, while preventing blob defects by the uneven distribution on a resist film surface and, additionally, by the polarity conversion group decomposing after the alkali developing and being hydrophilic, there is also a further effect of preventing volatility of a decomposed matter of an acid-decomposable group or a photoacid generator of the resin.

Furthermore, the effect described above is also clear from the fact that both the blob defects and out gas were further deteriorated in the Comparative Examples 101, 104, and 107 which had neither the resin (C) nor a top coat layer with respect to the corresponding Examples 101, 107, and 113 which, except for the resin (C) and the top coat layer, were configured of the same components.

In particular, it is understood that in Examples 107, 109 to 112, 115, 117, and 118 in which the resin (C) has an acid-decomposable group, it was possible to increase the usage amount of the resin (C) and the blob defect reduction is the most excellent.

In addition, it is understood that in Examples 101, 102, 107 to 113, and 115 to 118 which have a repeating unit which is represented by General Formula (3) or (4) where the resin (A) has an acid-decomposable group, the sensitivity, resolving power, and LWR were particularly excellent due to activation energy (Ea) of the acid-decomposable group being appropriately low. It is understood that the sensitivity, resolving power, LWR were the most excellent in Examples 109 to 112, 115, 117, and 118 among these where the repeating unit of the resin (A) which has an acid-decomposable group is represented by General Formula (3), Ea is more favorable, and $R_3$ is a group with 2 or more carbon atoms.

Examples 201 to 219 and Comparative Examples 201 to 209 EUV Exposure (Alkali Developing Positive Type)

(1) Preparation of Top Coat Composition

The resin for a top coat shown in the table below was dissolved in the top coat coating solvent shown in the table below, the resultant was filtered using a polytetrafluoroethylene filter with a pore size of 0.1 μm, and a top coat composition with a solid content concentration of 1 mass % was prepared.

(2) Coating Liquid Preparation and Coating of an Actinic Ray-Sensitive or Radiation-Sensitive Resin Composition An actinic ray-sensitive or radiation-sensitive resin composition (a resist composition) solution was obtained by finely filtering a coating liquid composition with a solid content concentration of 3 mass % which had the composition described below using a membrane filter with a hole diameter of 0.1 μm.

The actinic ray-sensitive or radiation-sensitive resin composition was coated on a 6-inch Si wafer on which hexamethyldisilazane (HMDS) treatment was carried out in advance using a spin coater Mark 8 manufactured by Tokyo Electron Co., Ltd. and dried on a hot plate at 100° C. for 60 seconds to obtain a resist film with a film thickness of 50 nm.

The prepared top coat composition was evenly coated on the resist film by spin coating, heating and drying were performed on a hot plate at 120° C. for 90 seconds, and a film where the total film thickness of the resist film and the top coat layer is 90 nm was formed.

(3) EUV Exposure and Developing

Pattern exposure was performed on a wafer on which the resist film with the top coat layer which was obtained in (2) described above was coated using an EUV exposure apparatus (Micro Exposure Tool manufactured by Exitech Co., Ltd., NA 0.3, Quadrupole, outer sigma 0.68, inner sigma 0.36) and an exposure mask (line/space=1/1). After the irradiation, following heating on a hot plate at 110° C. for 60 seconds and then dipping for 60 seconds using a 2.38 mass % tetramethyl ammonium hydroxide (TMAH) aqueous solution, a resist pattern with a 1:1 line and space pattern with a line width of 30 nm was obtained by rinsing with water for 30 seconds and drying.

(4) Evaluation of Resist Pattern

Using a scanning electron microscope (S-9220 manufactured by Hitachi Ltd.), the obtained resist pattern was evaluated with regard to the sensitivity, resolving power, LWR, and pattern shape with the methods described below.

(4-1) Sensitivity

The irradiation energy when resolving a pattern of line/space=1:1 with a line width of 30 nm was set as the sensitivity (Eop). A smaller value indicates that the performance is more favorable.

(4-2) Resolving Power

The limit resolving power (the shortest line width at which the line and space are separated and resolved) of a line and space pattern (line:space=1:1) for the Eop was obtained. Then, the value was set as the "resolving power (nm)". A smaller value indicates that the performance is more favorable.

(4-3) LWR

Regarding LWR, for 50 arbitrary 0.5 μm points in the longitudinal direction of a resist pattern where the line/space=1:1 in the Eop, the line width was measured, the standard deviation was obtained, and 3σ was calculated. A smaller value indicates that the performance is more favorable.

(4-4) Pattern Shape Evaluation

Evaluation of three phases of rectangular, taper, and reverse taper was performed by observing a cross-sectional shape of a 1:1 line and space pattern with a line width of 30 nm with an irradiation amount which indicates the sensitivity described above using a scanning electron microscope (S-4300 manufactured by Hitachi Ltd.).

(4-5) Blob Defect Reduction Evaluation

With regard to the obtained resist pattern described above, the number of blob defects was measured using KLA-2360 manufactured by KLA-Tencor Japan Ltd. The inspection area at this time was 205 $cm^2$ in total, the pixel size was 0.25 μm, the threshold=30, and visible light was used for the inspection light. Evaluation was carried out by setting a value obtained by dividing the obtained numeric value by the inspection area as the number of blob defects (number/$cm^2$). The evaluation was A when the value was less than 1.0, B when the value was 1.0 to less than 3.0, C when the value was 3.0 to less than 5.0, D when the value was 5.0 to less than 10.0, and E when the value was 10.0 or more. A smaller value indicates that the performance is more favorable.

(4-6) Out Gas Reduction Evaluation

The entire surface was exposed using an EUV exposure apparatus (Micro Exposure Tool manufactured by Exitech Co., Ltd., NA 0.3, Quadrupole, outer sigma 0.68, inner sigma 0.36), when the minimum exposure energy which is necessary for complete dissolution in the developing was Eth, simplified evaluation was carried out on the out gas amount from a film thickness decreased width (a shrink film thickness (nm)) after the exposure after applying exposure energy which was 1.5 times Eth. Since the shrink film thickness correlates with the amount of components which were volatilized from the resist film by the exposure, it is understood that the smaller the shrink film thickness, the better the out gas characteristics.

The evaluation results are shown in the table below.

TABLE 5

Evaluation result in EUV exposure (alkali developing positive type)

| | Resin (A) | ConCentration | Acid generating agent | Concentration | Basic compound | ConCentration | Resin (C) | Concentration | Resist solvent | Mass ratio |
|---|---|---|---|---|---|---|---|---|---|---|
| Example 201 | P-1 | 64.95 | z113 | 30 | N-6 | 2 | HR-31 | 3 | S1/S2 | 40/60 |
| Example 202 | P-1 | 61.95 | z128 | 30 | N-11 | 2 | HR-33 | 6 | S1/S2 | 40/60 |
| Example 203 | P-2 | 58.95 | z124 | 35 | N-11 | 3 | HR-32 | 3 | S1/S2 | 40/60 |
| Example 204 | P-3 | 73.95 | z108 | 20 | N-8 | 2 | HR-26 | 4 | S1/S3 | 40/60 |
| Example 205 | P-4 | 68.95 | z117 | 25 | N-10 | 2 | HR-1 | 4 | S1/S2 | 40/60 |
| Example 206 | P-5 | 82 | z1 | 15 | N-9 | 1 | HR-38 | 2 | S1/S2/S3 | 30/60/10 |
| Example 207 | P-6 | 62.95 | z132 | 30 | N-11 | 2 | HR-36 | 5 | S1/S2 | 40/60 |
| Example 208 | P-6 | 64.95 | z135 | 30 | N-11 | 2 | HR-31 | 3 | S1/S2 | 40/60 |
| Example 209 | P-7 | 50.95 | z113 | 40 | N-11 | 3 | HR-36 | 6 | S1/S2 | 40/60 |
| Example 210 | P-7 | 62.95 | z112/z4 = 1:1 (mass ratio) | 30 | N-7 | 2 | HR-34 | 5 | S1/S4 | 40/60 |
| Example 211 | P-8 | 72.95 | z99 | 20 | N-3 | 1 | HR-37 | 6 | S1/S2 | 40/60 |
| Example 212 | P-8 | 56.95 | z134 | 35 | N-6 | 2 | HR-35 | 6 | S1/S2 | 40/60 |
| Example 213 | P-9 | 94.95 | None | | N-10 | 2 | HR-40 | 3 | S1/S2 | 40/60 |
| Example 214 | P-10 | 94.95 | None | | N-1 | 2 | HR-30 | 3 | S1/S2 | 40/60 |
| Example 215 | P-11 | 90.95 | None | | N-2 | 2 | HR-34 | 7 | S1/S2 | 40/60 |
| Example 216 | P-12 | 93.95 | None | | N-3 | 3 | HR-39 | 3 | S1/S2 | 40/60 |
| Example 217 | P-13 | 62.95 | z113 | 30 | N-11 | 2 | HR-36 | 5 | S1/S4 | 40/60 |
| Example 218 | P-13 | 51.95 | z132 | 40 | N-6 | 2 | HR-37 | 6 | S1/S4 | 40/60 |

TABLE 5-continued

| | | | | | | | | | | |
|---|---|---|---|---|---|---|---|---|---|---|
| Example 219 | P-14/P-7 = 1:1 (mass ratio) | 64.95 | z121 | 30 | N-5 | 2 | HR-24 | 3 | S1/S2 | 40/60 |
| Comparative Example 201 | P-1 | 67.95 | z113 | 30 | N-6 | 2 | None | | S1/S2 | 40/60 |
| Comparative Example 202 | P-1 | 67.95 | z113 | 30 | N-6 | 2 | None | | S1/S2 | 40/60 |
| Comparative Example 203 | P-1 | 64.95 | z113 | 30 | N-6 | 2 | HR-31 | 3 | S1/S2 | 40/60 |
| Comparative Example 204 | P-6 | 67.95 | z132 | 30 | N-11 | 2 | None | | S1/S2 | 40/60 |
| Comparative Example 205 | P-6 | 67.95 | z132 | 30 | N-11 | 2 | None | | S1/S2 | 40/60 |
| Comparative Example 206 | P-6 | 64.95 | z132 | 30 | N-11 | 2 | HR-36 | 3 | S1/S2 | 40/60 |
| Comparative Example 207 | P-9 | 97.95 | None | | N-10 | 2 | None | | S1/S2 | 40/60 |
| Comparative Example 208 | P-9 | 97.95 | None | | N-10 | 2 | None | | S1/S2 | 40/60 |
| Comparative Example 209 | P-9 | 94.95 | None | | N-10 | 2 | HR-40 | 3 | S1/S2 | 40/60 |

| | Surfactant | Concentration | Top coat polymer | Top coat solvent | Sensitivity (mJ/cm$^2$) | Resolving power (nm) | LWR (nm) | Pattern form | Blob defects | Out gas (shrink film thickness (nm)) |
|---|---|---|---|---|---|---|---|---|---|---|
| Example 201 | W-1 | 0.05 | TT-1 | TS-4 | 22.0 | 24.0 | 3.9 | Rectangular | B | 2 |
| Example 202 | W-2 | 0.05 | TT-3 | TS-2 | 22.0 | 24.0 | 3.9 | Rectangular | B | 2 |
| Example 203 | W-1 | 0.05 | TT-2 | TS-5 | 22.5 | 24.5 | 4.0 | Rectangular | C | 3 |
| Example 204 | W-1 | 0.05 | TT-5 | TS-4 | 23.0 | 25.0 | 4.1 | Rectangular | C | 3 |
| Example 205 | W-2 | 0.05 | TT-6 | TS-4 | 23.0 | 25.0 | 4.1 | Rectangular | C | 3 |
| Example 206 | None | | TT-2 | TS-5 | 24.0 | 26.0 | 4.2 | Rectangular | C | 3 |
| Example 207 | W-1 | 0.05 | T-4 | TS-2 | 20.0 | 22.0 | 3.6 | Rectangular | A | 1 |
| Example 208 | W-4 | 0.05 | T-12 | TS-1 | 20.5 | 22.5 | 3.8 | Rectangular | B | 2 |
| Example 209 | W-1 | 0.05 | T-2/T-4 = 1:1 (mass ratio) | TS-3 | 20.0 | 22.0 | 3.7 | Rectangular | A | 1 |
| Example 210 | W-1 | 0.05 | T-2 | TS-3 | 20.5 | 22.5 | 3.8 | Rectangular | A | 2 |
| Example 211 | W-2 | 0.05 | T-4 | TS-2 | 20.0 | 22.0 | 3.6 | Rectangular | A | 2 |
| Example 212 | W-1/W-2 (mass ratio 1/1) | 0.05 | T-2 | TS-3 | 20.5 | 22.5 | 3.8 | Rectangular | A | 2 |
| Example 213 | W-3 | 0.05 | TT-4 | TS-4 | 22.0 | 24.0 | 3.9 | Rectangular | B | 2 |
| Example 214 | W-1 | 0.05 | TT-6 | TS-4 | 22.0 | 24.0 | 4.0 | Rectangular | C | 3 |
| Example 215 | W-1 | 0.05 | T-12 | TS-3 | 18.0 | 21.0 | 3.5 | Rectangular | A | 1 |
| Example 216 | W-1 | 0.05 | TT-1/TT-3 = 1:1 (mass ratio) | TS-2 | 21.0 | 23.0 | 3.8 | Rectangular | C | 2 |
| Example 217 | W-1 | 0.05 | T-2 | TS-3 | 19.0 | 21.0 | 3.5 | Rectangular | A | 1 |
| Example 218 | W-1 | 0.05 | T-4 | TS-2 | 19.0 | 21.0 | 3.5 | Rectangular | A | 1 |

TABLE 5-continued

| | | | | | | | | | | |
|---|---|---|---|---|---|---|---|---|---|---|
| Example 219 | W-1 | 0.05 | TT-4 | TS-4 | 22.5 | 24.5 | 4.0 | Rectangular | C | 3 |
| Comparative Example 201 | W-1 | 0.05 | None | None | 28.0 | 28.0 | 4.8 | Reverse taper | E | 8 |
| Comparative Example 202 | W-1 | 0.05 | TT-1 | TS-5 | 27.0 | 27.5 | 4.6 | Rectangular | E | 4 |
| Comparative Example 203 | W-1 | 0.05 | None | None | 27.0 | 27.5 | 4.5 | Rectangular | D | 6 |
| Comparative Example 204 | W-1 | 0.05 | None | None | 27.0 | 27.0 | 4.6 | Reverse taper | E | 9 |
| Comparative Example 205 | W-1 | 0.05 | T-4 | TS-2 | 26.0 | 26.5 | 4.4 | Rectangular | E | 4 |
| Comparative Example 206 | W-1 | 0.05 | None | None | 26.0 | 26.5 | 4.3 | Rectangular | D | 8 |
| Comparative Example 207 | W-1 | 0.05 | None | None | 28.0 | 28.0 | 4.7 | Reverse taper | E | 7 |
| Comparative Example 208 | W-1 | 0.05 | TT-4 | TS-4 | 29.0 | 28.0 | 4.7 | Reverse taper | E | 4 |
| Comparative Example 209 | W-1 | 0.05 | None | None | 27.0 | 27.5 | 4.5 | Rectangular | D | 6 |

The concentration of each component represents concentration (mass %) in the total solid content concentration.

As is clear from the results shown in the table above, it is understood that in the Comparative Examples 201 to 209 in which either or both of the top coat layer and the resin (C) were not used, there was a great deal of out gas generation, the sensitivity, resolving power, and LWR were also poor, there was also a great deal of generation of blob defects, and the pattern shape was also a reverse taper.

On the other hand, it is understood that in examples 201 to 219 which contain the resin (C) and have a top coat layer, there was little out gas generation, the sensitivity, resolving power, and LWR were excellent, there was also little generation of blob defects, and the pattern shape was rectangular.

In more detail, for example, it is understood that in examples 201, 207, and 213, out gas suppression and blob defect suppression were both excellent with respect to the corresponding Comparative Examples 203, 206, and 209 which, except for not having a top coat layer, were configured of the same components. From this, it may be considered probable that, by placing a top coat layer, not only is the volatility of decomposed matter of a polymer acid-decomposable protective group or a photoacid generator prevented, but there is also an effect that blob defect suppression is also excellent by making the resist film surface hydrophilic.

In the same manner, for example, it is understood that in examples 201, 207, and 213, blob defect suppression and out gas suppression were both excellent with respect to the corresponding Comparative Examples 202, 205, and 208 which, except for not having the resin (C), were configured of the same components. From this, it may be considered probable that since the resin (C) is hydrophobic, while preventing blob defects possibly by being unevenly distributed on a resist film surface and additionally, a polarity conversion group decomposing after the alkali developing and being hydrophilic, and additionally, there is also an effect of preventing volatility of a decomposed matter of a polymer acid-decomposable protective group or a photoacid generator.

Furthermore, the effect described above is also clear from the fact that both blob defects and out gas were further deteriorated in the Comparative Examples 201, 204, and 207 which had neither the resin (C) nor a top coat layer with respect to the corresponding examples 201, 207, and 213 which, except for the resin (C) and the top coat layer, were configured of the same components.

In particular, it is understood that in examples 207, 209 to 212, 215, 217, and 218 in which the resin (C) has an acid-decomposable group, it is possible to increase the usage amount of the resin (C) and the blob defect reduction is the most excellent.

In addition, it is understood that in examples 201, 202, 207 to 213, and 215 to 218 which have a repeating unit which is represented by General Formula (3) or (4) where the resin (A) has an acid-decomposable group, the sensitivity, resolving power, and LWR are particularly excellent due to the activation energy (Ea) of the acid-decomposable group being appropriately low. It is understood that, among these, the sensitivity, resolving power, LWR are the most excellent in examples 209 to 212, 215, 217, and 218 in which the repeating unit of the resin (A) which has an acid-decomposable group is represented by General Formula (3), Ea is more favorable, and $R_3$ is a group with 2 or more carbon atoms.

INDUSTRIAL APPLICABILITY

According to the present invention, it is possible to provide a pattern forming method which reduces blob defects and is particularly excellent in suppressing out gas generation without adversely affecting sensitivity, resolving power, LWR, or pattern shape in the forming of fine patterns with a line width of 50 nm or less, a composition kit, a resist film using the composition kit, a manufacturing method of an electronic device, and an electronic device.

Description was given of the present invention in detail and with reference to specific embodiments; however, it is clear to persons skilled in the art that it is possible to add various changes or modifications without departing from the spirit and the range of the present invention.

The present application is based on Japanese patent (JP2013-094403A) which was applied for on Apr. 26, 2013 and the content is included here as a reference.

What is claimed is:

1. A pattern forming method comprising:

(i) forming a film on a substrate using an actinic ray-sensitive or radiation-sensitive resin composition which contains (A) a resin which decomposes due to an action of an acid to change its solubility with respect to a developer, (B) a compound which generates an acid by actinic rays or radiation, and (C) a resin which has one or more groups selected from the group consisting of a fluorine atom, a group which has a fluorine atom, a group which has a silicon atom, an alkyl group, a cycloalkyl group, an aryl group, an aralkyl group, an aromatic ring group which is substituted with at least one alkyl group, and an aromatic ring group which is substituted with at least one cycloalkyl group;

(ii) forming a top coat layer using a top coat composition which contains a resin (T) on the film;

(iii) exposing the film which has the top coat layer to actinic rays or radiation; and (iv) forming a pattern by developing the film which has the top coat layer after the exposing, wherein the resin (A) has a repeating unit which is represented by General Formula (1) below and a repeating unit which is represented by General Formula (3) or (4) below:

(1)

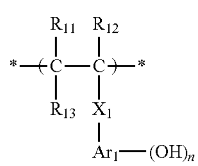

in General Formula (1), $R_{11}$, $R_{12}$, and $R_{13}$ each independently represents a hydrogen atom, an alkyl group, a cycloalkyl group, a halogen atom, a cyano group, or an alkoxycarbonyl group, $R_{13}$ may form a ring by bonding with $Ar_1$ and $R_{13}$ in this case represents an alkylene group, $X_1$ represents a single bond or a divalent linking group, $Ar_1$ represents an (n+1) valent aromatic ring group and represents an (n+2) valent aromatic ring group when forming a ring by bonding with $R_{13}$, and n represents an integer of 1 to 4;

(3)

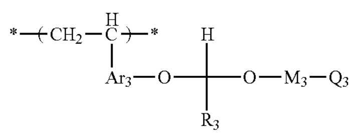

in General Formula (3), $Ar_3$ represents an aromatic ring group, $R_3$ represents an alkyl group, a cycloalkyl group, an aryl group, an aralkyl group, an alkoxy group, an acyl group, or a hetero ring group, $M_3$ represents a single bond or a divalent linking group, $Q_3$ represents an alkyl group, a cycloalkyl group, an aryl group, or a hetero ring group, and at least two of $Q_3$, $M_3$, and $R_3$ may form a ring by bonding with each other;

(4)

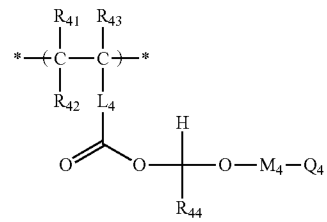

in General Formula (4), $R_{41}$, $R_{42}$, and $R_{43}$ each independently represents a hydrogen atom, an alkyl group, a cycloalkyl group, a halogen atom, a cyano group, or an alkoxycarbonyl group, $R_{42}$ may form a ring by bonding with $L_4$ and $R_{42}$ in this case represents an alkylene group, $L_4$ represents a single bond or a divalent linking group and represents a trivalent linking group when forming a ring with $R_{42}$, $R_{44}$ represents an alkyl group, a cycloalkyl group, an aryl group, an aralkyl group, an alkoxy group, an acyl group, or a hetero ring group, $M_4$ represents a single bond or a divalent linking group, $Q_4$ represents an alkyl group, a cycloalkyl group, an aryl group, or a hetero ring group, and at least two of $Q_4$, $M_4$, and $R_{44}$ may form a ring by bonding with each other.

2. The pattern forming method according to claim 1, wherein the resin (C) contains a repeating unit which has at least two or more groups which are represented by —COO— in a structure which is represented by General Formula (KA-1) or (KB-1) below, or at least one type of a repeating unit which is derived from a monomer which is represented by General Formula (aa1-1) below:

(KA-1)

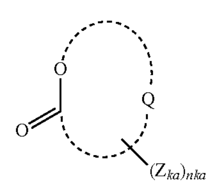

(KB-1)

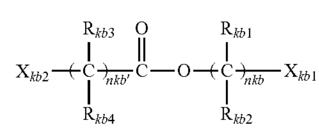

in General Formula (KA-1), $Z_{ka}$ represents an alkyl group, a cycloalkyl group, an ether group, a hydroxyl group, an amide group, an aryl group, a lactone ring group, or an electron-withdrawing group, when a plurality of $Z_{ka}$s are present, the plurality of $Z_{ka}$s are the same or are different and $Z_{ka}$s may form a ring by linking with each other, nka represents an integer of 0 to 10, Q represents an atomic group which is necessary for forming a lactone ring with atoms in the formula; and in General Formula (KB-1), $X_{kb1}$ and $X_{kb2}$ each independently represents an electron-withdrawing group, nkb and nkb' each independently represents 0 or 1, $R_{kb1}$, $R_{kb2}$, $R_{kb3}$, and $R_{kb4}$ each independently represents a hydrogen atom, an alkyl group, a cycloalkyl group, an aryl group, or an electron-withdrawing group, at least two of $R_{kb1}$, $R_{kb2}$, and $X_{kb1}$ may form a ring by linking with each other, and at least two of $R_{kb3}$, $R_{kb4}$, and $X_{kb2}$ may form a ring by linking with each other:

(aa1-1)

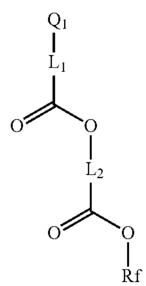

in General Formula (aa1-1) above, $Q_1$ represents an organic group which includes a polymeric group, $L_1$ and $L_2$ each independently represents a single bond or a divalent linking group, and Rf represents an organic group which has a fluorine atom.

3. The pattern forming method according to claim 2, wherein the resin (C) contains a repeating unit which has at least two or more groups which are represented by —COO— in the structure which is represented by General Formula (KA-1) or (KB-1).

4. The pattern forming method according to claim 1, wherein the resin (C) further has a repeating unit which has a group which changes its solubility with respect to a developer due to an effect of an acid.

5. The pattern forming method according to claim 4, wherein the repeating unit which has a group which changes its solubility with respect to a developer due to an effect of an acid is a repeating unit which is represented by any of General Formulas (Ca1) to (Ca4) below:

(Ca1)

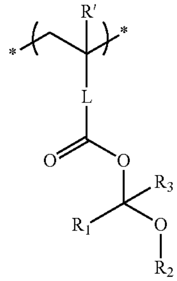

-continued (Ca2)

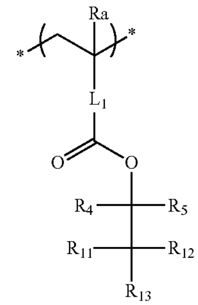

(Ca3)

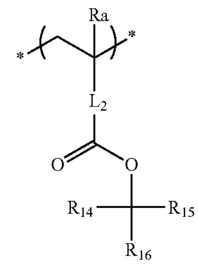

(Ca4)

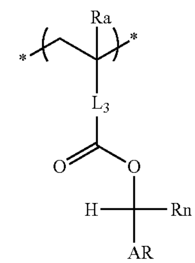

in General Formula (Ca1),

R' represents a hydrogen atom or an alkyl group,

L represents a single bond or a divalent linking group, $R_1$ represents a hydrogen atom or a monovalent substituent group, $R_2$ represents a monovalent substituent group, $R_1$ and $R_2$ may bond with each other and form a ring with an oxygen atom in the formula, and $R_3$ represents a hydrogen atom, an alkyl group, or a cycloalkyl group;

in General Formula (Ca2),

Ra represents a hydrogen atom, an alkyl group, a cyano group, or a halogen atom, $L_1$ represents a single bond or a divalent linking group, $R_4$ and $R_5$ each independently represents an alkyl group, $R_{11}$ and $R_{12}$ each independently represents an alkyl group and $R_{13}$ represents a hydrogen atom or an alkyl group, $R_{11}$ and $R_{12}$ may form a ring by linking with each other, and $R_{11}$ and $R_{13}$ may form a ring by linking with each other;

in General Formula (Ca3),

Ra represents a hydrogen atom, an alkyl group, a cyano group, or a halogen atom, $L_2$ represents a single bond or a divalent linking group, $R_{14}$, $R_{15}$, and $R_{16}$ each independently represents an alkyl group, two of $R_{14}$ to $R_{16}$ may form a ring by linking with each other; and in General Formula (Ca4), Ra represents a hydrogen atom, an alkyl group, a cyano group, or a halogen atom, $L_3$ represents a single bond or a divalent linking group, AR represents an aryl group, Rn represents an alkyl group, a cycloalkyl group, or an aryl group, and Rn and AR may form a non-aromatic ring by bonding with each other.

6. The pattern forming method according to claim 1, wherein the resin (C) has a repeating unit which is represented by any of General Formulas (C-Ia) to (C-Id) below:

(C-Ia)

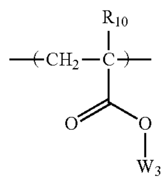

(C-Ib)

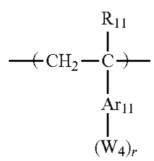

(C-Ic)

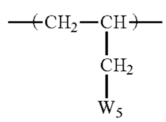

(C-Id)

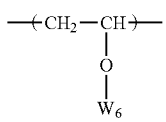

in the General Formulas above, $R_{10}$ and $R_{11}$ each independently represents a hydrogen atom, a fluorine atom, or an alkyl group, $W_3$, $W_5$, and $W_6$ each independently represents an organic group which has one or more selected from the group consisting of a group which has a fluorine atom, a group which has a silicon atom, an alkyl group, a cycloalkyl group, an aryl group, and an aralkyl group, $W_4$ represents an organic group which has one or more selected from the group consisting of a group which has a fluorine atom, a group which has a silicon atom, an alkyl group, and a cycloalkyl group, $Ar_{11}$ represents an (r+1) valent aromatic ring group, and r represents an integer of 1 to 10.

7. The pattern forming method according to claim 1, wherein the content of the resin (C) is in a range of 0.01 mass % to 10 mass % based on the total solids content in the composition.

8. The pattern forming method according to claim 1, wherein the resin (A) has a repeating unit which is represented by General Formula (1) and a repeating unit which is represented by General Formula (3), and $R_3$ in General Formula (3) is a group with 2 or more carbon atoms.

9. The pattern forming method according to claim 8, wherein the resin (A) has a repeating unit which is represented by General Formula (1) and a repeating unit which is represented by General Formula (3), and $R_3$ in General Formula (3) is a group which is represented by General Formula (3-2) below:

(3-2)

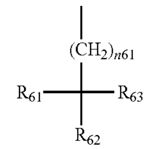

in General Formula (3-2) above, $R_{61}$, $R_{62}$, and $R_{63}$ each independently represents an alkyl group, an alkenyl group, a cycloalkyl group, or an aryl group, n61 represents 0 or 1, and at least two of $R_{61}$ to $R_{63}$ may form a ring by linking with each other.

10. The pattern forming method according to claim 1, wherein the resin (T) has a repeating unit which has an aromatic ring.

11. The pattern forming method according to claim 1, wherein the resin (T) has a repeating unit which has an acidic group.

12. The pattern forming method according to claim 1, wherein (B) the compound which generates an acid by actinic rays or radiation is a compound which generates an acid with a size of a volume of 240 $Å^3$ or more.

13. The pattern forming method according to claim 1, wherein the exposing is performed using electron beams or EUV.

14. The pattern forming method according to claim 1, wherein an optical image resulting from the exposing has a line section with a line width of 50 nm or less or a hole section with a hole diameter of 50 nm or less as an exposed section or an unexposed section.

15. A method for manufacturing an electronic device, comprising:

providing a substrate suitable for a component in the electronic device;

forming a pattern on the substrate by a method comprising the following steps; and assembling the electronic device from the component having the patterned substrate and other suitable parts, where the pattern is formed by a method comprising the following steps:

(i) forming a film on the substrate using an actinic ray-sensitive or radiation-sensitive resin composition which contains (A) a resin which decomposes due to an action of an acid to change its solubility with respect to a developer, (B) a compound which generates an acid by actinic rays or radiation, and (C) a resin which has one or more groups selected from the group consisting of a fluorine atom, a group which has a fluorine atom, a group which has a silicon atom, an alkyl group, a cycloalkyl group, an aryl group, an aralkyl group, an aromatic ring group which is substituted with at least one alkyl group, and an aromatic ring group which is substituted with at least one cycloalkyl group;

(ii) forming a top coat layer using a top coat composition which contains a resin (T) on the film;

(iii) exposing the film which has the top coat layer to actinic rays or radiation; and (iv) forming a pattern by developing the film which has the top coat layer after the exposing, wherein the resin (A) has a repeating unit which is represented by General Formula (1) below and a repeating unit which is represented by General Formula (3) or (4) below:

(1)

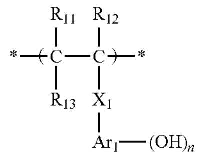

in General Formula (1), $R_{11}$, $R_{12}$, and $R_{13}$ each independently represents a hydrogen atom, an alkyl group, a cycloalkyl group, a halogen atom, a cyano group, or an alkoxycarbonyl group, $R_{13}$ may form a ring by bonding with $Ar_1$ and $R_{13}$ in this case represents an alkylene group, $X_1$ represents a single bond or a divalent linking group, $Ar_1$ represents an (n+1) valent aromatic ring group and represents an (n+2) valent aromatic ring group when forming a ring by bonding with $R_{13}$, and n represents an integer of 1 to 4;

(3)

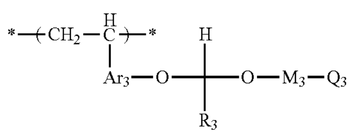

in General Formula (3), $Ar_3$ represents an aromatic ring group, $R_3$ represents an alkyl group, a cycloalkyl group, an aryl group, an aralkyl group, an alkoxy group, an acyl group, or a hetero ring group, $M_3$ represents a single bond or a divalent linking group, $Q_3$ represents an alkyl group, a cycloalkyl group, an aryl group, or a hetero ring group, and at least two of $Q_3$, $M_3$, and $R_3$ may form a ring by bonding with each other;

(4)

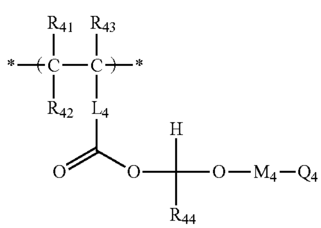

in General Formula (4), $R_{41}$, $R_{42}$, and $R_{43}$ each independently represents a hydrogen atom, an alkyl group, a cycloalkyl group, a halogen atom, a cyano group, or an alkoxycarbonyl group, $R_{42}$ may form a ring by bonding with $L_4$ and $R_{42}$ in this case represents an alkylene group, $L_4$ represents a single bond or a divalent linking group and represents a trivalent linking group when forming a ring with $R_{42}$, $R_{44}$ represents an alkyl group, a cycloalkyl group, an aryl group, an aralkyl group, an alkoxy group, an acyl group, or a hetero ring group, $M_4$ represents a single bond or a divalent linking group, $Q_4$ represents an alkyl group, a cycloalkyl group, an aryl group, or a hetero ring group, and at least two of $Q_4$, $M_4$, and $R_{44}$ may form a ring by bonding with each other.

16. The pattern forming method according to claim 1, wherein the resin (C) is a resin having one or more groups selected from the group consisting of a fluorine atom, a group which has a fluorine atom, a group which has a silicon atom, an alkyl group with 6 or more carbon atoms, an aralkyl group, an aromatic ring group which is substituted with at least one alkyl group, and an aromatic ring group which is substituted with at least one cycloalkyl group.

17. The pattern forming method according to claim 16, wherein the content of the resin (C) is in a range of 0.01 mass % to 10 mass % based on the total solids content in the composition.

18. A pattern forming method comprising:

(i) forming a film on a substrate using an actinic ray-sensitive or radiation-sensitive resin composition which contains (A) a resin which decomposes due to an action of an acid to change its solubility with respect to a developer, (B) a compound which generates an acid by actinic rays or radiation, and (C) a resin which has one or more groups selected from the group consisting of a fluorine atom, a group which has a fluorine atom, a group which has a silicon atom, an alkyl group, a cycloalkyl group, an aryl group, an aralkyl group, an aromatic ring group which is substituted with at least one alkyl group, and an aromatic ring group which is substituted with at least one cycloalkyl group;

(ii) forming a top coat layer using a top coat composition which contains a resin (T) on the film;

(iii) exposing the film which has the top coat layer to actinic rays or radiation; and (iv) forming a pattern by developing the film which has the top coat layer after the exposing, wherein the resin (A) has a repeating unit which is represented by General Formula (1) below, a repeating unit which is represented by General Formula (3) or (4) below, and a repeating unit represented by General Formula (P) below:

(1)

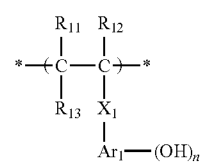

in General Formula (1), $R_{11}$, $R_{12}$, and $R_{13}$ each independently represents a hydrogen atom, an alkyl group, a cycloalkyl group, a halogen atom, a cyano group, or an alkoxycarbonyl group, $R_{13}$ may form a ring by bonding with $Ar_1$ and $R_{13}$ in this case represents an alkylene group, $X_1$ represents a single bond or a divalent linking group, $Ar_1$ represents an (n+1) valent aromatic ring group and represents an (n+2) valent aromatic ring group when forming a ring by bonding with $R_{13}$, and n represents an integer of 1 to 4;

(3)

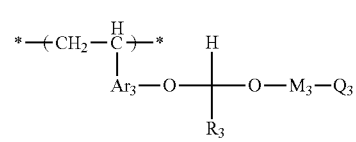

in General Formula (3), $Ar_3$ represents an aromatic ring group, $R_3$ represents an alkyl group, a cycloalkyl group, an aryl group, an aralkyl group, an alkoxy group, an acyl group, or a hetero ring group, $M_3$ represents a single bond or a divalent linking group, $Q_3$ represents an alkyl group, a cycloalkyl group, an aryl group, or a hetero ring group, and at least two of $Q_3$, $M_3$, and $R_3$ may form a ring by bonding with each other;

(4)

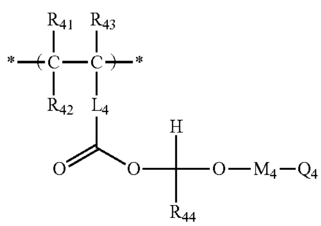

in General Formula (4), $R_{41}$, $R_{42}$, and $R_{43}$ each independently represents a hydrogen atom, an alkyl group, a cycloalkyl group, a halogen atom, a cyano group, or an alkoxycarbonyl group, $R_{42}$ may form a ring by bonding with $L_4$ and $R_{42}$ in this case represents an alkylene group, $L_4$ represents a single bond or a divalent linking group and represents a trivalent linking group when forming a ring with $R_{42}$, $R_{44}$ represents an alkyl group, a cycloalkyl group, an aryl group, an aralkyl group, an alkoxy group, an acyl group, or a hetero ring group, $M_4$ represents a single bond or a divalent linking group, $Q_4$ represents an alkyl group, a cycloalkyl group, an aryl group, or a hetero ring group, and at least two of $Q_4$, $M_4$, and $R_{44}$ may form a ring by bonding with each other;

(P)

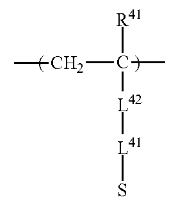

in General Formula (P), $R^{41}$ represents a hydrogen atom or a methyl group, $L^{41}$ represents a single bond or a divalent linking group, $L^{42}$ represents a divalent linking group, and S represents a structure site which decomposes when irradiated with actinic rays or radiation to generate an acid on a side chain.

* * * * *